US006150842A

United States Patent [19]

Agrawal et al.

[11] Patent Number: 6,150,842
[45] Date of Patent: Nov. 21, 2000

[54] VARIABLE GRAIN ARCHITECTURE FOR FPGA INTEGRATED CIRCUITS

[75] Inventors: Om P. Agrawal, Los Altos; Herman M. Chang, Cupertino; Bradley A. Sharpe-Geisler; Giap H. Tran, both of San Jose, all of Calif.

[73] Assignee: Vantis Corporation, Sunnyvale, Calif.

[21] Appl. No.: 09/472,645

[22] Filed: Dec. 27, 1999

Related U.S. Application Data

[63] Continuation of application No. 08/948,306, Oct. 9, 1997.

[51] Int. Cl.[7] .......................... H01L 25/00; H03K 19/177
[52] U.S. Cl. .................................................. 326/41; 326/47
[58] Field of Search .................................. 326/39, 40, 41, 326/47

[56] References Cited

U.S. PATENT DOCUMENTS

| | | | |
|---|---|---|---|
| 5,455,525 | 10/1995 | Ho et al. | 326/41 |
| 5,537,057 | 7/1996 | Leong et al. | 326/41 |
| 5,598,109 | 1/1997 | Leong et al. | 326/41 |
| 5,682,107 | 10/1997 | Tavana et al. | 326/41 |
| 5,815,003 | 9/1998 | Pedersen | 326/39 |

*Primary Examiner*—Michael Tokar
*Assistant Examiner*—Daniel D. Chang
*Attorney, Agent, or Firm*—Fliesler, Dubb, Meyer & Lovejoy LLP; Gideon Gimlan

[57] ABSTRACT

A Variable Grain Architecture is disclosed wherein Variable Grain Blocks (VGB's) are wedged together in mirror opposition to one another to define super-VGB structures. The super-VGB structures are arranged as a matrix within an FPGA device. Each VGB includes progressive function synthesizing layers for forming more complex function signals by folding together less complex function signals of preceding layers. A function spawning layer containing a set of function spawning lookup tables (LUT's) is provided near the periphery of the corresponding super-VGB structure. In one case, the function spawning layer is L-shaped and includes a symmetrical distribution of Configurable Building Blocks. A signal-acquiring layer interfaces with adjacent interconnect lines to acquire input terms for the LUT's and controls. A decoding layer is interposed between the signal-acquiring layer and the function spawning layer for providing strapping and intercept functions. Each VGB has a common controls section, a wide-gating section and a carry-propagating section. Each super-VGB has a centrally-shared section of longline drivers that may be accessed from any of the constituent VGB's. A diversified spectrum of interconnect lines, including 2×L, 4×L, 8×L and direct connect surround each super-VGB to provide different kinds of interconnect.

13 Claims, 46 Drawing Sheets

| LLDi | DyOE_J | SupOE_J' | J_Kz0 (IN0) | J_Kz1 (IN1) | J'_Kz2 (IN2) | J'_Kz3 (IN3) | FTK_J0 (IN4) | FTK_J1 (IN5) | FTK_J'2 (IN6) | FTK_J'3 (IN7) |
|---|---|---|---|---|---|---|---|---|---|---|
| N1 | DyOE_A | DyOE_B | B_Yz | B_Xz | A_Yz | A_Xz | FTX1_B | FTX2_B | FTX1_A | FTX2_A |
| N2 | DyOE_A | DyOE_B | B_Wz | B_Zz | A_Wz | A_Zz | FTX1_B | FTX2_B | FTX1_A | FTX2_A |
| N3 | DyOE_A | DyOE_B | B_Yz | B_Zz | A_Yz | A_Zz | FTX1_B | FTX2_B | FTX1_A | FTX2_A |
| N4 | DyOE_A | DyOE_B | B_Wz | B_Xz | A_Wz | A_Xz | FTX1_B | FTX2_B | FTX1_A | FTX2_A |
| E1 | DyOE_B | DyOE_D | D_Xz | D_Yz | B_Xz | B_Yz | FTY1_D | FTY2_D | FTY1_B | FTY2_B |
| E2 | DyOE_B | DyOE_D | D_Zz | D_Wz | B_Zz | B_Wz | FTY1_D | FTY2_D | FTY1_B | FTY2_B |
| E3 | DyOE_B | DyOE_D | D_Xz | D_Wz | B_Xz | B_Wz | FTY1_D | FTY2_D | FTY1_B | FTY2_B |
| E4 | DyOE_B | DyOE_D | D_Zz | D_Yz | B_Zz | B_Yz | FTY1_D | FTY2_D | FTY1_B | FTY2_B |
| S1 | DyOE_D | DyOE_C | C_Yz | C_Xz | D_Yz | D_Xz | FTX1_C | FTX2_C | FTX1_D | FTX2_D |
| S2 | DyOE_D | DyOE_C | C_Wz | C_Zz | D_Wz | D_Zz | FTX1_C | FTX2_C | FTX1_D | FTX2_D |
| S3 | DyOE_D | DyOE_C | C_Yz | C_Zz | D_Yz | D_Zz | FTX1_C | FTX2_C | FTX1_D | FTX2_D |
| S4 | DyOE_D | DyOE_C | C_Wz | C_Xz | D_Wz | D_Xz | FTX1_C | FTX2_C | FTX1_D | FTX2_D |
| W1 | DyOE_C | DyOE_A | A_Xz | A_Yz | C_Xz | C_Yz | FTY1_A | FTY2_A | FTY1_C | FTY2_C |
| W2 | DyOE_C | DyOE_A | A_Zz | A_Wz | C_Zz | C_Wz | FTY1_A | FTY2_A | FTY1_C | FTY2_C |
| W3 | DyOE_C | DyOE_A | A_Xz | A_Wz | C_Xz | C_Wz | FTY1_A | FTY2_A | FTY1_C | FTY2_C |
| W4 | DyOE_C | DyOE_A | A_Zz | A_Yz | C_Zz | C_Yz | FTY1_A | FTY2_A | FTY1_C | FTY2_C |
| FIG. 17B | FROM COMMON CONTROL 758's | | FROM CSE 1428's | | | | FEEDTHROUGHS (FROM FIG. 12A) | | | |

VARIABLE GRAIN ARCHITECTURE FOR FPGA INTEGRATED CIRCUITS

CROSS REFERENCE TO RELATED APPLICATIONS

This application continues from Ser. No. 08/948,306, filed Oct. 9, 1997. The disclosures of said application are incorporated herein by reference.

The following copending U.S. patent application(s) are assigned to the assignee of the present application, and their disclosures are incorporated herein by reference:

(A) Ser. No. 08/828,520 filed Apr. 1, 1997 by Bradley A. Sharpe-Geisler and originally entitled, "MEMORY BITS USED TO COUPLE LOOK UP TABLE INPUTS TO FACILITATE INCREASED AVAILABILITY TO ROUTING RESOURCES PARTICULARLY FOR VARIABLE SIZED LOOK UP TABLES FOR A FIELD PROGRAMMABLE GATE ARRAY (FPGA)";

(B) Ser. No. 08/931,798, filed Sep. 16, 1997 by Bradley A. Sharpe-Geisler and originally entitled, "CIRCUITRY TO PROVIDE FAST CARRY" and (C) Ser. No. 08/700,616 filed Aug. 16, 1996 by Om Agrawal et al (as a continuing divisional with chained cross referencing back to Ser. No. 07/394,221 filed Aug. 15, 1989).

The following U.S. patent(s) are assigned to the assignee of the present application, and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

BACKGROUND

1. Field of the Invention

The invention is generally directed to integrated circuits, more specifically to architectural and physical layouts for Programmable Logic Devices (PLD's), and even more specifically to a subclass of PLD's known as Field Programmable Gate Arrays (FPGA's).

2. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a paradigm known as Complex PLD's or CPLD's. This paradigm is characterized by devices such as the Advanced Micro Devices MACH™ family. Examples of CPLD circuitry are seen in U.S. Pat. Nos. 5,015,884 (issued May 14, 1991 to Om P. Agrawal et al.) and 5,151,623 (issued Sep. 29, 1992 to Om P. Agrawal et al.).

Another evolutionary chain in the art of field programmable logic has branched out along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means. Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

Modern FPGA's tend to be fairly complex. They typically offer a large spectrum of user-configurable options with respect to how each of many CLB's should be configured, how each of many interconnect resources should be configured, and how each of many IOB's should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools'.

In the partitioning phase, an original circuit design (which is usually relatively large and complex) is divided into smaller chunks, where each chunk is made sufficiently small to be implemented by a single CLB, the single CLB being a yet-unspecified one of the many CLB's that are available in the yet-unprogrammed FPGA device. Differently designed FPGA's can have differently designed CLB's with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLB's of the FPGA device, using the interconnect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of interconnect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary interconnections may have not been completed through those congested parts. Alternatively, all necessary interconnections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit.

In either case, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. Another example is 'control logic' which is less random than fully 'random logic' but less regular than 'bus oriented' designs. There may be many more taxonomical descriptions. The point is that some FPGA structures may be better suited for implementing random logic while others may be better suited for implementing bus oriented designs or other kinds of designs.

If the FPGA configuring software fails in a first run, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. More preferably, they would want to see a fast turnaround time of no more than, say 30 minutes, for successful completion of the FPGA configuring software when executing on a 80486-80686 PC platform (that is, a so-commercially specified, IBM compatible personal computer) and implementing a 25000 gate or less, design in a target FPGA device.

FPGA users also usually want the circuit implemented by the FPGA to provide an optimal emulation of the original design in terms of function packing density, cost, speed, power usage, and so forth irrespective of whether the original design is taxonomically describable generally as 'random logic', or as 'bus oriented', or as a combination of these, or otherwise.

When multiple FPGA's are required to implement a very large original design, high function packing density and efficient use of FPGA internal resources are desired so that implementation costs can be minimized in terms of both the number of FPGA's that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGA's can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of, the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

An improved FPGA architecture that helps FPGA configuring software to better reach its goals was disclosed in U.S. Pat. No. 5,212,652, issued May 18, 1993 to Agrawal et al. The improvement provided a symmetrically balanced distribution of logic function resources and routing resources in both horizontal and vertical directions so that placement and routing was not directionally constrained to, for example, a left-to right signal flow orientation. Balanced availability of logic function-implementing resources and signal-routing resources was provided to give the FPGA configuring software more degrees of freedom in each of the partitioning, placement, and routing phases. This increased the likelihood that congestion would be avoided during placement and routing because circuit implementation could be more uniformly distributed instead of being concentrated along a particular direction. It also increased the probability that more efficient solutions would be found in the iterative optimization phases because optimization attempts would not be constrained by pre-existing congestions.

A further improvement was provided in U.S. application Ser. No. 08/080,658, filed Jun. 18, 1993 by Agrawal et al. This further improvement provided a constant-delay, 'floating-pins' architecture which provided symmetrical choice among a subset of package pinout options without change in performance (without change in signal propagation time).

Further advances in integrated circuit manufacturing technologies have now enabled higher densities of logic function-implementing circuits and higher densities of signal routing resources. This presents opportunities for further-improvements.

SUMMARY OF THE INVENTION

An improved FPGA layout architecture in accordance with the invention features a repeating pattern of logic-implementing, Variable Grain Blocks or 'VGB's'.

Each VGB has a plurality of internal resources that can be operated separately to provide elemental levels of functionality but which resources are capable of being merged, cascaded and/or operated in parallel to provide relatively higher levels of functionality as appropriate for a given taxonomic organization of a circuit design originally supplied to the FPGA configuring software.

For example, in one embodiment, the internal resources of each VGB can be merged to implement any Boolean function {f(6T)} of up to 6 independent input terms or they can be cascaded to implement one of a more limited subset of Boolean functions {f'(16T)} each being a function of up to 16 independent input terms. In the same embodiment, each VGB can be partitioned to instead provide 8 Boolean functions, each being any desired function {f(3T)} of up to 3 independent input terms.

In the same embodiment, input-acquiring resources of small-grained elements (so-called CBE's) can be strapped together so that such elements operate in parallel on a common or semi-common set of input term signals. This enables efficient implementations of dynamic multiplexer circuits and adding/subtracting circuits as will be seen.

Such merging or cascading or parallel-operating of VGB elemental resources can be carried out over a relatively wide spectrum of granularities and along different directions. This spectrum of options enables FPGA configuring software to make efficient use of available resources within each VGB and to find more optimal solutions for a wide variety of circuit-implementation problems, including those that are taxonomically describable as bus oriented, or matrix oriented, or as random logic.

In a preferred class of embodiments, plural VGB's are symmetrically arranged and wedged together in a manner similar to slices of a symmetrically-cut pie. The congregated or 'wedged-together' VGB's form a super-VGB structure. Each such super-VGB includes centralized means for merging together the resources of its respective VGB's so that the super-VGB can offer even higher levels of functionality than are provided by each of its constituent VGB's. In the example where each VGB can provide a limited set of Boolean functions each of up to 16 independent input terms, the corresponding super-VGB can merge 2 or 4 VGB's together to correspondingly provide a limited set of Boolean functions each of up to 32 or 64 independent input terms. FPGA configuring software is therefore given the options of merging together the VGB's of a given super-VGB to implement a fewer number of more complex functions or to use the VGB's individually and thereby implement a larger number of less complex functions.

In further accordance with the invention, plural super-VGB's are distributed in a matrix across an FPGA device. VGB-to-VGB interconnect lines extend along sides of the super-VGB's. In a preferred embodiment, there are at least four VGB's in each super-VGB. Each of these four VGB's preferably has an L-shaped (or V-shaped) internal organization that lies adjacent to, or forms a peripheral part of the super-VGB.

Within each such L-shaped internal organization, there is provided a symmetrical distribution of function-spawning units. These function-spawning units, which are also referred to herein as 'Configurable Building Elements' or CBE's, may be used to acquire input signals and to initiate the synthesis of a spectrum of functions of increasing complexity within the corresponding VGB. Function complexity generally increases as more and more CBE's are compounded or 'folded together' to synthesize larger, function-implementing entities. Synthesis can be carried out with CBE's of a particular row or column or with CBE's that lie along crossing rows and columns.

In one embodiment, there is a same, even number of CBE's along each leg (each primary typographic stroke) of the L-shaped internal organization of each VGB. Input decoder means are provided for linking together input term acquiring resources of neighboring CBE's and allowing such CBE's to share acquired input term signals so that such neighboring CBE's can process same signals in parallel. This sharing of acquired input term signals allows for efficient folding together or compounding of elemental resources as will be detailed below.

Each function-spawning unit (CBE) has a user-configurable signal-acquiring means (CIE) for acquiring a subset of LUT input terms from adjacent interconnect lines. A user-configurable lookup table (LUT) is further provided within each of the function-spawning units (CBE's) for processing corresponding ones of the acquired LUT input terms. A decoding section (which is part of the above-mentioned input decoder means) is additionally provided between the CIE and LUT of each CBE for supporting the function synthesis process wherein plural CBE's (Configurable Building Elements) are compounded to define higher levels of functionality.

In one embodiment, each super-VGB is surrounded by diversified set of interconnect resources. These diversified interconnect resources may include: general bidirectional interconnect lines of varying lengths; switch boxes that provide programmable interconnection between the general bidirectional interconnect lines; and unidirectional direct connect lines. The combination of each super-VGB and its immediately surrounding set of diversified interconnect resources defines a core-tile. A set of core-tiles are tiled across a core portion of the FPGA device to define an FPGA core matrix. The FPGA core matrix is then surrounded by and coupled to a complementary array of input/output blocks (IOB's).

In one particular embodiment, each super-VGB is a square structure having four mirror-opposed VGB's respectively defining the four corners of the square. Each such square-organized super-VGB may be characterized as having mirror symmetry of resources not only about its horizontal and vertical center lines, but also as having substantial mirror symmetry of programmable resources about its diagonals.

In the same one embodiment, each square-organized super-VGB includes a plurality of at least 8 CBE's (Configurable Building Elements) symmetrically distributed about its periphery. As explained above, a 'CBE' is an elemental structure that may be used to acquire input signals and responsively spawn synthesis of higher level functions. Pairs of CBE's are incorporated into an encompassing second structure, referred to herein as a 'Configurable Building Block' (or CBB). In addition to its two CBE's, each CBB of the one embodiment contains a function-combining multiplexer and a Configurable Sequential Element (CSE). The function-combining multiplexer may be used in combination with the decoding sections of the two CBE's to fold together the LUT resources of the two CBE's. The function-combining multiplexer may be additionally used in combination with the decoding sections of the two CBE's to emulate large sized, dynamic multiplexers (e.g., 4:1). The CSE contains data storage resources and data output resources.

In one embodiment, there at least 16 CBB's symmetrically distributed about the periphery of each super-VGB. Pairs of CBB's (Configurable Building Blocks) are programmably combinable to provide more functionally-rich entities. Such combined entities are each referred to herein as a 'set of paired-CBB's'. Two sets of paired-CBB's are programmably combinable to provide even more functionally-rich entities. Such further combined entities are each referred to herein as a 'set of quadrupled-CBB's'. In the one embodiment, each set of quadrupled-CBB's may be contained within and consume the function spawning capabilities of a single VGB (Variable Grain Block) such that no further programmable combining of this type is provided for within the VGB proper. However, pairs of VGB's are further combinable to provide yet more functionally-rich entities within the encompassing super-VGB. It is within the contemplation of the invention to allow for larger numbers of CBE's or CBB's within each VGB, to allow for larger numbers of VGB's within each super-VGB if desired, and to allow for programmable formation of octupled-CBB's and so forth.

As mentioned, each CBE (Configurable Building Element) of one embodiment has its own Configurable Input Element (CIE) for programmably acquiring from a first set of neighboring signals, a smaller first subset that defines input terms for the CBE's LUT. The first set of neighboring signals are carried by a respective, first set of interconnect lines that are immediately adjacent to the CIE. The encompassing CBB of respective pairs of CBE's may be viewed as having the combined input acquiring resources of the two CIE's found in the corresponding CBE's. Such combining of input acquiring resources increases the likelihood that the FPGA configuring software will find an unconsumed one of the resources for bringing into the CBB an input term signal riding on a particular one of the immediately adjacent interconnect lines (AIL's).

Each CIE may optionally include control acquiring means that are user-configurable to select and acquire from a second set of neighboring signals, a second subset that defines control signals for the corresponding VGB. The second set of neighboring signals are carried by respective interconnect lines that are immediately adjacent to the CIE. The sets of interconnect lines that carry control signals may overlap fully or partially with the set that carries input term signals. Control signals selected by the CIE may be optionally used by the Configurable Sequential Element (CSE) of the respective CBE. In one embodiment, control signals acquired by all CIE's of a given VGB (Variable Grain Block) may be shared by all the CSE's (Configurable Sequential Elements) of that given VGB. Control signals acquired by all VGB's of a given super-VGB may also be shared within the given super-VGB.

In addition to its plurality of wedged-together VGB's, each of the super-VGB's preferably further includes shared resources that are centrally-placed within the super-VGB and made programmably available for shared use by the peripheral CBB's of that super-VGB. An example of such centrally-shared resources is a set of longline drive amplifiers and associated shared logic which is discussed in more detail below.

The combinable CBB's (Configurable Building Blocks) of each VGB are not the only resources within each such Variable Grain Block. Each of the VGB's additionally has common resources placed diagonally relative to its L-shaped internal organization for shared use by the L-organized resources (by the CBE's or CBB's) of that VGB. Examples of such VGB-common resources include: a common controls developing section, a wide-gating section, and a carry propagating section, each of which is discussed in more detail below.

Aside from being combinable to form higher levels of functionality, the function-implementing resources of adjacent VGB's can be efficiently chained together to defined high-speed, chained functions. An example of such chaining is a string of VGB's that are programmably linked together to function as a relatively long, binary adding or subtracting circuit. Carry bits ripple through carry propagating sections of the linked together VGB's. The mirror-opposed L-organized structures of the VGB's can support zig zagging propagation of carry bits or linear propagation. This will be discussed in more detail below.

As indicated above, each CBB includes its own Configurable Sequential Element (CSE), which CSE is shared by the incorporated CBE's of that CBB. Each CSE contains at least one data storage element such as a flip flop for providing clock-sequenced operations. Each CSE further contains at least three differently powered (differently-tuned) line drivers. The differently-powered line-drivers are used to drive output signals of the CSE onto adjacent, but differently-loaded interconnect lines. Examples of differently-loaded interconnect lines include: quad-length, bidirectional interconnect lines (4×L lines); octal-length, bidirectional interconnect lines (8×L lines); VGB-local feedback lines (FBL's); and unidirectional direct connect lines (DCL's); which lines are discussed in more detail below.

In one embodiment that has 32 CBE's inside each square-shaped super-VGB, there are 2 generally equivalent, CBB's (W&Y or X&Z) provided along each leg of the L-shaped peripheral portion of each VGB. The L-shaped peripheral portion of each VGB neighbors a crossing of orthogonally-extending interconnect resources (e.g., interconnect channels extending in x and y directions). The configurable input element (CIE) of each CBE cross couples with a sub-population of the immediately neighboring interconnect lines for selectively acquiring from such immediately neighboring interconnect lines, respective subsets of function input-term signals and output-control signals.

The programmable lookup table (LUT) of each such CBE may be coupled through an input decoding section to receive the CIE-acquired input-term signals of that CBE. The CBE's LUT then responsively generates a first-level function signal from the respectively acquired input-term signals of that CBE. The programmable lookup table of each such CBE may be alternatively coupled by the input decoding section (which section is detailed below) to receive one or more of the acquired input-term signals of adjacent CBE's and to responsively generate the first-level function signal from those signals instead.

In one embodiment, the configurable input-acquiring element (CIE) of each CBE can acquire up to 3 function input-term signals and one output-control signal from an immediately neighboring, interconnect channel having 56 signal-carrying lines plus 2 or 3 dedicated control lines. Each encompassing CBB can therefore acquire up to 6 function-term input signals and 2 control input signals in that embodiment. Each VGB that forms from a combined set of 4 such CBB's can therefore acquire 24 function-term input signals and 8 control input signals. In a variant of that one embodiment, each VGB can further acquire 4 clock signals and a global reset (GR) signal from its neighboring interconnect resources. Each super-VGB that has 4 such VGB's can therefore acquire 96 function-term input signals and 32 control input signals (not counting the global signals, GR and CLK0–CLK3) from its surrounding interconnect lines.

In briefer summation therefore, the Variable Grain Architecture (VGA) described herein includes granularizable function-implementing resources and a diversified assortment of interconnect capabilities, arranged in a packing-wise efficient manner that provides FPGA configuring software with symmetrically balanced choices of different resources in multiple directions.

Consequences of the Variable Grain Architecture

The Variable Grain Architecture (VGA) described herein enables a plurality of advantageous cooperations and consequences.

First, function input-term signals can be symmetrically and equivalently routed by interconnect resources to any one of the plural CBE's or CBB's that symmetrically line each neighboring leg of each L-organized VGB. This assists the place and route software by providing directionally-unconstrained, and balanced, access from the neighboring interconnect to the distributed resources of each VGB. Such omni-directiveness is particularly useful when implementing random logic.

Second, local feed conductors that are included in each Configurable Building Element (CBE) for feeding its LUT with input term signals, can be made of minimal length as a result of each CBB being placed along the periphery of the super-VGB, immediately adjacent to the neighboring interconnect lines. The minimized length of such feed conductors (MIL's plus some decode length) advantageously reduces delay time and increases packing density. Unlike prior designs, all input signals do not have to travel to a function synthesizing core for processing in that core. Instead, input processing and return of result signals may occur in a peripheral layer of the VGB, near the neighboring interconnect lines.

A third advantageous cooperation and/or consequence of the described architecture is that the L-organized, and symmetrically granularizable (partitionable) structure of each VGB helps the FPGA configuring software to perform each of the partitioning, placement and routing operations with relatively wide degrees of freedom and few directional constraints.

During placement for example, the FPGA configuring software may equivalently choose any CBE of the VGB for receiving a like-sized, circuit chunk. If the circuit chunk turns out to be too complex to be accommodated by a single CBE (e.g., because the circuit chunk has too many input terms), the FPGA configuring software may choose to use two CBE's in folded together combination (within a CBB) for implementing the chunk. In so doing, the FPGA configuring software may equivalently choose among differently located pairs of CBE's within a given VGB. Any not-yet-consumed CBB may be used to receive such a comparably-sized circuit chunk during the placement phase. This is so because of the symmetrical positioning and basic interchangeability of the CBB's along the legs of each VGB's L-shaped internal portion.

In one embodiment, the CBB's that line each leg of each VGB's L-shaped portion are made essentially (but not necessarily fully) identical to one another such that a partitioned chunk from an original circuit design—provided it can fit in a single Configurable Building Block—can be equally placed in, and implemented by, any one of the plural CBB's (X or Z or W or Y) of the L-organized VGB.

Note that placement interchangeability is provided within each leg of the L-shape (in other words, linearly along each of the x and y directions). Such placement interchangeability along-a-leg may be advantageous in cases where placement on a particularly directed leg (one extending horizontally or vertically) is desired. For example, it may be desirable to place circuitry chunks on vertically-directed legs, adjacent to a vertical interconnect channel, when bus-oriented systems or like parallel-operating systems are being implemented. In general, placement along particularly-directed legs may be helpful and placement interchangeability along such directed-legs may be additionally advantageous.

Note that placement interchangeability is also provided around the combined length of both legs of the L-shaped structure (in other words, irrespective of x and y directional orientations). Such placement interchangeability can give the FPGA configuring software wide degrees of freedom and hence a greater chance of finding an optimal solution for partitioning, placement and routing problems.

More specifically, bus oriented designs may be more efficiently placed and packed using the interchangeability of collinearly positioned CBB's along colinear first legs of each of multiple, L-organized structures. Random logic oriented designs may be more efficiently placed and packed using the interchangeability of CBB's distributed about both legs of each of multiple, L-organized structures.

A further advantageous consequence of the described architecture arises from the ability to combine, or fold together equivalent functional resources along each leg of each L-organized structure (within each VGB) and to then fractally combine, or further fold together the combined resources of both legs, as needed. The latter combining of on-the-leg resources can be viewed as a folding of peripheral x and y resources into a shared diagonal of the L-organization.

A spectrum of selectable granulations of functionality is provided by this ability to equivalently fold resources together along either of the x and y directed legs, or to alternatively fold together resources along the diagonal. This spectrum of selectable granulations provides a wide range of choices during the partitioning and placement phases.

For example, if a partitioned chunk is too large to fit into a single 'CBB', the FPGA configuring software has the option of combining, or folding together, the resources of two adjacent, CBB's to in effect produce the higher capacity, 'set of paired-CBB's'. If the partitioned chunk is found to be still too large to fit into a single set of paired-CBB's, the FPGA configuring software has the further option of combining, or folding together, the resources of two adjacent, sets of paired-CBB's to thereby produce an even higher capacity, implementing structure, namely the 'set of quadrupled-CBB's'. If the partitioned chunk is found to be even still too large to fit into a set of quad-CBB's, the FPGA configuring software has the further option of combining, or folding together, the resources of two VGB's within a super-VGB to thereby produce an even higher capacity, implementing structure, namely a 'set of paired-VGB's'.

On the other hand, suppose the FPGA configuring software had carried out one run of partitioning, placement, and routing and had not yet found an acceptable solution. Suppose that during a subsequent, iterative repartitioning, a particular circuit chunk is to be made smaller than it was before. Suppose the newly-downsized chunk can now fit into a set of paired-CBB's where as before, the chunk needed a set of quadrupled-CBB's. In such a case, the FPGA configuring software has the option of splitting the previously 'consumed' set of quadrupled-CBB's into one consumed set of paired-CBB's and one free (not-yet-consumed) set of paired-CBB's. This makes more efficient use of FPGA resources and frees up the excess resources (the not-consumed set of paired-CBB's) for other use.

Placement can proceed in either of two ways during each downsizing repartition because the split of functional resources is symmetric between the consumed and not-consumed set of paired-CBB's. As such, the post-repartitioning placement choice can be made such that it will enable less congestion or higher speed in a subsequent routing selection.

While the example given above involves a down-sizing from the level of a set of quadrupled-CBB's to the level of a set of paired-CBB's, similar down-sizing and freedom of placement can occur at lower levels wherein a set of paired-CBB's are split into individual CBB's and even where individual CBB's are split into CBE's.

Yet another advantageous consequence of the architecture described herein arises from the ability to combine control-acquiring resources (CIE's) provided along each leg of each L-organized VGB and to use the combined control-acquiring resources (CIE's) as needed to define common control signals for each VGB (and for each super-VGB) from signals made available along the legs of each respective VGB. The VGB-common control signals may be used to control functions such as: clock (CLK), clock-enable (CLKEN), flip flop reset (RST), flip flop set (SET), or other like controllable features of each CBB.

Still another advantageous consequence of the super-VGB organization described has to do with efficient area utilization within the integrated circuit. Wedged-together VGB's may be packed tightly in mirror opposed fashion within each super-VGB such that essentially no space is provided between the in-gathered VGB's for through-running interconnect channels. Instead, interconnect channels are provided around the periphery of the corresponding super-VGB, in close proximity to the peripherally-provided configurable input elements (CIE's). Input term acquisition and function synthesis begin at the periphery of the super-VGB. Function synthesis proceeds inwardly toward the core of the super-VGB structure in a progressive, graduated manner as functions of higher complexity are synthesized. The most complex functions are preferably synthesized at, or close to the core of the super-VGB structure.

As will be seen, some space is preferably provided at the core of each super-VGB for shared, high-powered line-driving amplifiers. These high-powered amplifiers are located centrally within each super-VGB and shared by the constituent VGB's of that super-VGB. The high-powered amplifiers are used for driving output signals onto heavily-loaded (e.g., high capacitance) interconnect lines such as the maximum-length interconnect lines (MaxL lines) of the FPGA device.

At the same time, less-powerful line-driving amplifiers are dedicatedly distributed on a per CBB basis (in each CSE) and are used to drive less heavily-loaded interconnect resources (e.g., so-called 'double-length short-haul' lines and direct connect lines, as will be detailed below). The less-powerful amplifiers include those tuned for driving a first load of direct connect lines and those that are differently tuned for driving a different, second load of bidirectional interconnect lines (2×L, 4×L, 8×L).

The higher-powered line-driving amplifiers at the core of each super-VGB provide relatively high slew rates during switching as needed for the MaxL lines. This compensates for the higher electrical capacitance that such long lines tend to have. The less-powerful line-driving amplifiers provide relatively lower slew rates during switching as is acceptable for their corresponding less-heavily loaded (shorter) interconnect lines.

As is known, high-powered amplifiers tend to each consume more of the area of an integrated circuit than do each of comparatively less-powerful drive amplifiers. In accordance with the invention therefore, a trade off is made between the area consumed by line-driving amplifiers and the number of function-implementing circuits they service. The larger, more powerful amplifiers are placed in sharing regions in the core of each super-VGB for shared use by all the VGB's of that super-VGB. In contrast, the smaller, less-powerful amplifiers are distributed about the periphery of each super-VGB and dedicated to servicing each respective VGB (or each respective CBB of each VGB). In one embodiment, pairs of CBE's share the drive amplifier resources of a shared CSE (a Configurable Sequential Element).

In complement to placement of the larger-sized, higher-powered amplifiers within the core of each super-VGB, the input signal-acquiring and logic function-implementing circuits of each super-VGB,—namely the CIE's and LUT's—are preferentially packed densely around the of each of the partitionable logic blocks (VGB's). The CIE's and LUT's can be made relatively small because they do not have high-powered line-driving outputs. This provides a more scalable architecture than was seen in prior designs.

A further feature in accordance with the invention is that super-VGB's are arranged along interconnect channels in symmetrical fashion. Horizontally-extending interconnect channels (HIC's) and vertically-extending interconnect channels (VIC's) are provided with essentially same and symmetrically balanced interconnect resources for their respective horizontal (x) and vertical (y) directions. These interconnect resources include a diversified and granulated assortment of MaxL lines, 2×L lines, 4×L lines and 8×L lines as well as corresponding 2×L switch boxes, 4×L switch boxes, and 8×L switch boxes. In one embodiment, most 2×L lines span a distance corresponding to four CBB's (or 8 CBE's).

Other aspects of the invention will become apparent from the below detailed description.

BRIEF DESCRIPTION OF THE DRAWINGS

The below detailed description makes reference to the accompanying drawings, in which:

FIG. 17B is a matrix showing input and control connections for one plurality of circuits such as shown in FIG. 17A;

DETAILED DESCRIPTION

Figure 1:
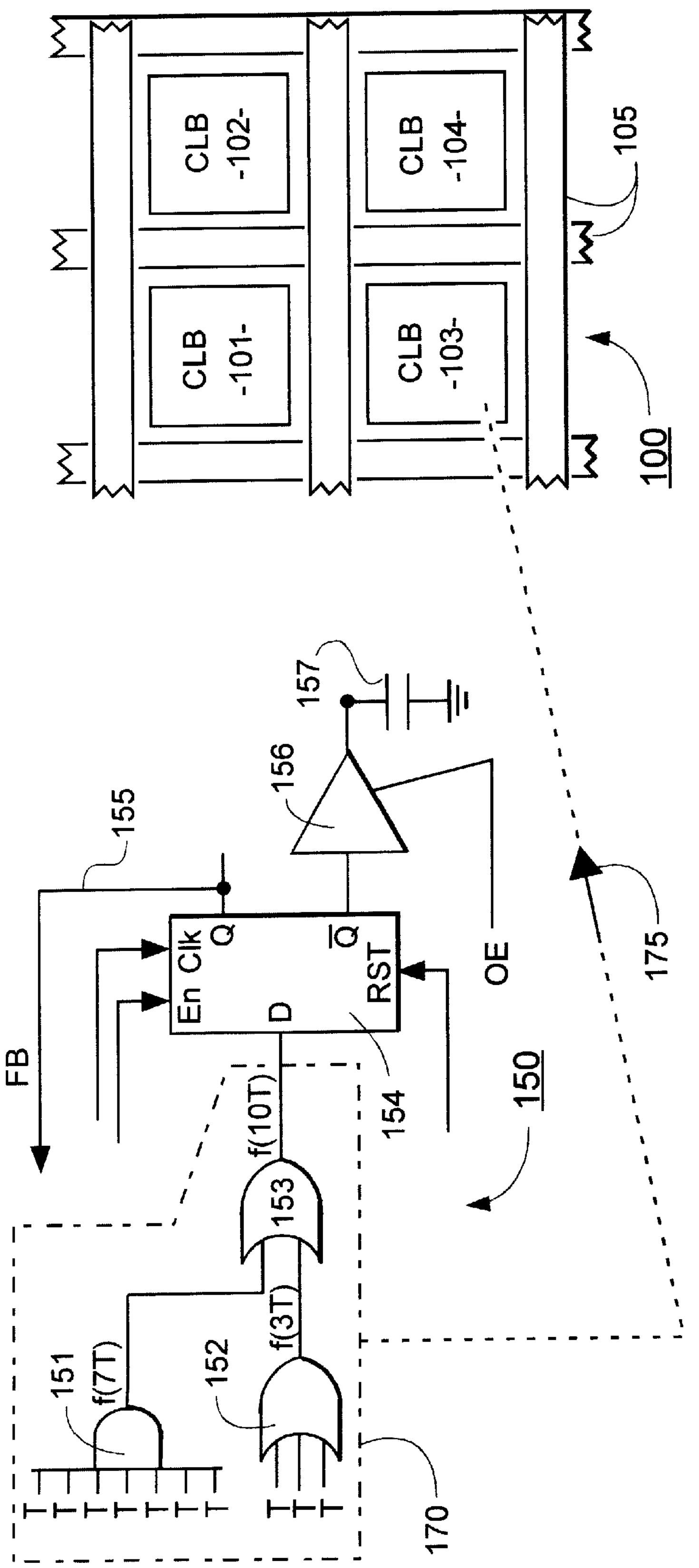
FIG. 1 illustrates an example of partitioning and placement as applied to a generic FPGA device.

FIG. 1 shows at 100 a basic FPGA architecture in which a matrix of configurable logic blocks (CLB's) 101–104 are distributed within an interconnect mesh 105. This basic FPGA architecture 100 will be used to illustrate some aspects of FPGA design and configuration.

A number of FPGA terms will be used throughout the specification. The term 'CLB' as used herein generally refers to a Boolean function generating block whose structure is essentially repeated throughout the device. Each CLB usually has at least one programmable lookup table (LUT), but may have more LUT's. Each CLB may have other resources such as data-storage elements (e.g., flip flops) and local feedback means for creating sequential state machines.

The term 'interconnect mesh' as used herein generally refers to a repeated pattern of connection-providing resources which carry signal traffic between CLB's. An analogy can be made to the mesh of public highways (expressways) and public streets that carry vehicle traffic in modern cities. The interconnect mesh of an FPGA may also include connection-providing resources that can carry signal traffic between CLB's and input/output blocks (IOB's). As used herein, 'IOB' refers to a repeated structure (not shown in FIG. 1) that provides interface between points outside the FPGA device and FPGA-internal components.

The term 'intra-connection' resources (note the 'ra' sequence before the hyphen) is used herein to refer to connection-providing resources that are dedicated to carrying signals essentially only inside a particular entity such as a CLB or an IOB. Such intra-connection resources are to be distinguished from 'inter-connection resources' (note the 'er' sequence before the hyphen). In general, intraconnection is a relative term which should accompany the entity to which it is dedicated. Thus CLB-intraconnection refers to connection resources that are dedicated to carrying signals essentially only inside a particular CLB.

The term 'inter-connection resources' is used herein to refer to connection-providing resources that can carry signals between two or more CLB's and/or between two or more IOB's and/or between a CLB and an IOB.

To distinguish intra-connection resources over interconnection resources, an analogy can be made to the private driveway of a private house as distinguished from an adjacent public highway (expressway) or an adjacent public street, where the latter generally carries passing-by general traffic as well as private traffic of the private driveway.

Interconnection resources in the FPGA include both those that provide programmable routing of signals between any desired CLB's and/or IOB's and those that provide fixed routing (hardwired transmission) of signals between specific IOB's and/or specific CLB's. One type of fixed-route interconnect resource is a line that is always (fixedly) driven by a dedicated output but can have its carried signal programmably coupled to one or more inputs. Such unidirectional, fixed-route lines are generally referred to herein as 'direct connect lines'.

Interconnect resources which provide programmably-definable routing of signals between CLB's and/or IOB's can include 'maximum length' lines (MaxL lines) which span essentially the full workable length of the FPGA device along one of its major axes (e.g., the horizontally-extending x axis or the vertically-extending y axis). MaxL lines are also referred to as 'longlines'.

The programmably-configurable interconnect resources can further include 'short-haul segments' which extend for lengths significantly less than those of the longlines. Short-haul segments generally terminate on both ends at interconnect 'switch boxes'. The switch boxes provide programmably-definable interconnections between terminal ends of short-haul connectors merging into the switch boxes.

Once a specific interconnect line is 'consumed' for carrying a first signal, that interconnect resource cannot be used to at the same time carry a second signal. Similarly, once a specific, logic function-providing resource is 'consumed' for carrying out a first logic function, that same logic function-providing resource cannot be used to at the same time carry out a completely different, second logic function.

When an FPGA is used to implement a given, original circuit design, successive portions of the FPGA's interconnect resources and logic function-providing resources are consumed by corresponding portions of the original circuit design.

Partitioning and Placement Example

FIG. 1 shows at 150 an example of a circuit design portion whose functionality is to be implemented within generic FPGA device 100. Sample circuit section 150 may include a first logic gate 151 (an AND gate) having seven inputs and one output. Each of the input signals is referred to as a Boolean 'term' (T) . The output signal of gate 151 is therefore a function of seven terms and this is denoted by the shorthand, 'f(7T)'.

Similarly, a second gate 152 (OR gate) in original design 150 is shown to have three independent input terms and its output function is therefore denoted as f(3T).

A third gate 153 (OR) receives the f(7T) and f(3T) outputs of gates 151 and 152 and produces therefrom an output signal f(10T) which is a Boolean function of all ten input terms.

Element 154 of original design 150 represents a data storage device such as a D-type flip-flop. Storage element 154 includes a data input terminal (D), a stored-data output terminal (Q), an inverted output terminal (Qbar), a reset terminal (RST), a clock input terminal (Clk) and a clock enable terminal (En).

Line 155 represents a high speed feedback (FB) connection which couples an output of storage device 154 either to define one of the input terms (T) of gates 151–152 or to define an input of another, not-shown logic gate which closely precedes one of gates 151–152. In general, nets can have different mixes of short, high speed lines and longer, low speed lines (with greater RC/L time constants). This varies from design to design.

Element 156 of original design 150 represents a 3-state output driver (tri-state drive) which outputs a binary signal when enabled and whose output goes into a high impedance state when its output enable (OE) control terminal is deactivated. When not in the high impedance state, the output of driver 156 charges and/or discharges a capacitive load 157. The capacitive load can be in the form of a cable, or a system bus line, and/or a set of further gate inputs. Those skilled in the art can appreciate that a driven line may be represented as a complex load having resistive (R), capacitive (C) and inductive (L) components and a corresponding RC/L time constant. The respective contributions of the R, C, and L components tends to vary as a function of line length, line width and line material (e.g., metal versus doped silicon), as provided for in the physical circuit.

Dashed box 170 represents a possible first partitioning of original circuit portion 150 into a circuit chunk that is to be placed within, and implemented by, a specific CLB, say the one at 103. Dashed line 175 represents this specific placement.

If the initially assigned CLB 103 contains enough not-yet-consumed resources to implement the first partition 170, the initial placement of partition 170 completes and the same resources of CLB 103 are deemed to be consumed by the now placed, partition 170.

After such successful placement of partition 170 in CLB 103, another partitioned portion of the original design 150 (e.g., flip flop 154) is placed elsewhere, say in CLB 102. Thereafter, the interconnect resources of interconnect mesh 105 are consumed to reconnect the partitions. Eventually, a series of further placements and interconnect routings completes the implementation of circuit 150 in target FPGA 100.

Figure 2:
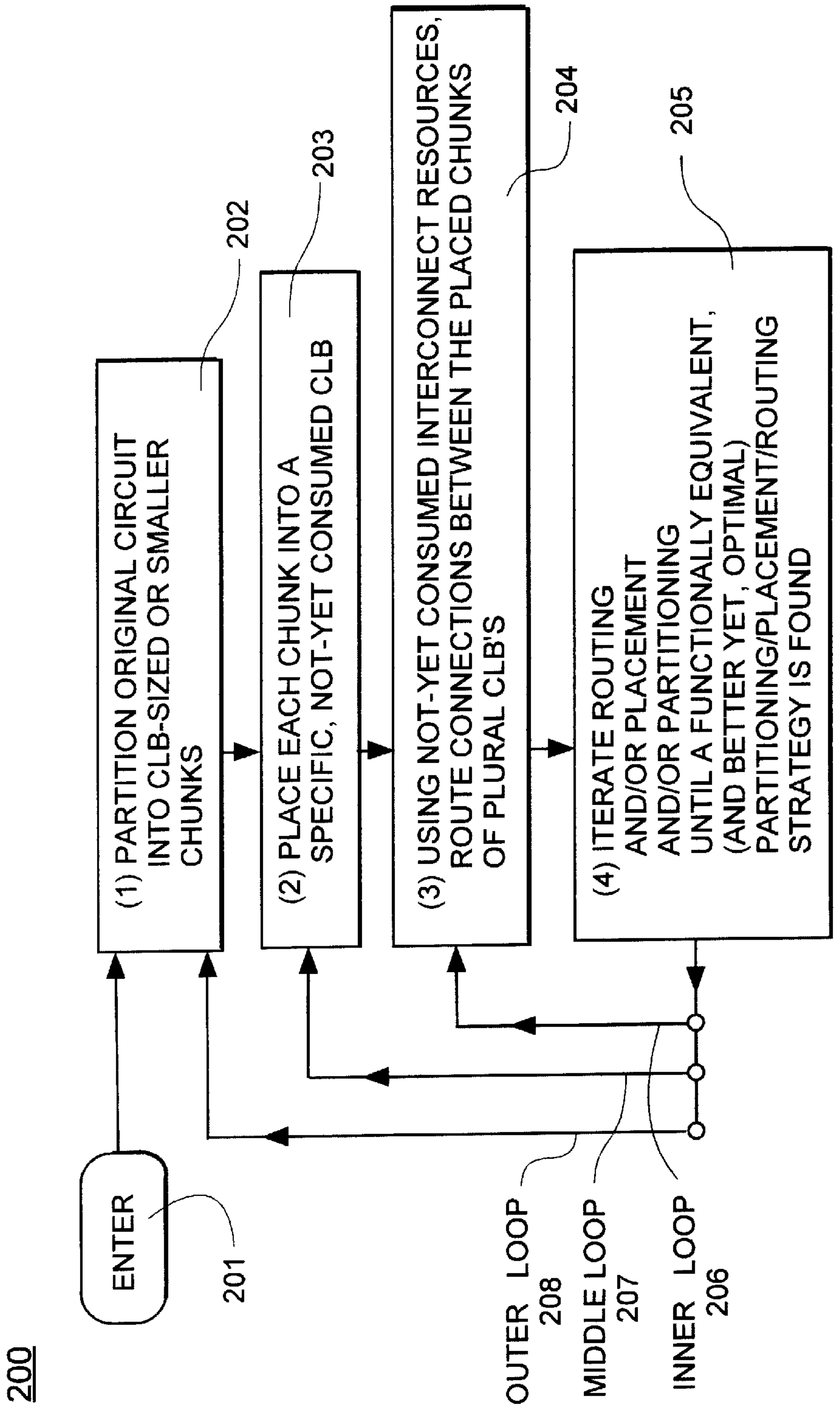
FIG. 2 shows a generalized flow chart for FPGA configuring software.

FIG. 2 outlines the general procedure for an FPGA configuring software module 200. Module 200 receives specifications for an original circuit design such as 150 at entrance point 201. Its task is to configure a designated FPGA such as 100 to implement the functions of the original circuit design 150. This is to be done under the constraints of the finite number of logic function-providing resources 101–104 and interconnect resources provided in FPGA 100.

At step 202, the FPGA-configuring software module 200 partitions the original circuit design (150) into a plurality of CLB-sized or smaller chunks. A ‘CLB-sized chunk’, or a smaller chunk, is a partitioned circuit portion that can be fully implemented by the target CLB (e.g., 103). Such implementation includes: (1) timely receipt of all input signals flowing into the partitioned chunk (for example all ten independent input terms or T’s of partition 170); (2) timely carrying out of all the data processing functions of the partition (e.g., producing the ten term output, f(10T)); and (3) timely provision of a sufficient number of outputs at sufficient speed and power.

Partitioning and placement are not always successful on first try. Assume by way of example that CLB 103 contains only one, not-yet-consumed, lookup table (LUT) capable of handling up to, but not more than eight input terms (8T). In such a case, partition 170 would not fit into CLB 103 and cannot be placed there. Either the initial partition has to be reduced or another CLB with greater not-yet-consumed resources has to be found.

If the re-partitioning strategy is followed here, the illustrated partition 170 might be shrunk to encompass only the 3-input termed OR gate 152 instead gates 151, 152 and 153. Of course, that would be an inefficient use of the f(8T) function-providing capabilities of CLB 103. The smarter step for the FPGA configuring software 200 would have been to shrink partition 170 to encompass only the 7-input termed AND gate 151. Then gates 152 and 153 would be moved into a different partition. This is just an example of the strategy problems that are encountered by the FPGA configuring software and not indicative of any specific algorithm.

In general, partitioning step 202 tries to adjust its operations to closely match the function-providing resources available within each CLB 101–104 so that the partitioning chunks are neither larger than what can be accommodated nor too small.

As indicated for the following step 203, each partitioned chunk is virtually ‘placed’ in a specific, not-yet-consumed CLB. Once the partition-implementing resources of a specific CLB (e.g., 103) are consumed by one or more chunks already placed therein, that CLB is no longer available for supporting further chunks. In such a case, for each next chunk, the placement step 203 looks for another CLB with not-yet-consumed resources to support that next chunk.

At subsequent routing step 204, an attempt is made to use the available interconnect resources 105 to re-establish connections between the partitioned and placed chunks. As indicated, successive ones of not-yet consumed interconnect resources are consumed in turn in an attempt to route connections between the specifically placed chunks in the various CLB’s. The goal is to reconstruct the original design 150.

At step 205, the FPGA-implemented solution that results from the prior partitioning, placement and routing steps 202–204 is examined to see whether a functionally equivalent implementation of the original circuit design 150 has been successfully obtained using the available resources of FPGA 100.

If some connections are still incomplete or are too slow, inner iteration loop 206 may be followed. In loop 206, different routing strategies are tried using the available interconnect resources 105 of the FPGA to see if a better routing solution can be found.

If the re-routing attempts are not successful by themselves, middle iteration loop 207 may be attempted to try different placement strategies in hopes of obtaining a functional or better implementation.

Finally, if trials with different placements 207 and different routings 206 do not succeed, outer iteration loop 208 may be followed in an attempt to try different partitioning strategies as well.

If the outer most loop 208 fails to provide a functional and acceptable result after a predefined number of attempts, the software module 200 will typically report an inability to implement the original circuit design 150 in the target FPGA 100. The user may be asked to retry with another FPGA having more resources and/or a different architecture.

Suppose that step 205 determines that a functional implementation for the original circuit 150 has been obtained after only one run of each of steps 202–204. Even here, it is often desirable to continue the inner, middle, and even outer iterations loops 206–208 in hopes of finding more optimal implementations of the original circuit design 150. The more optimal implementations may provide higher operating speeds, less power usage, or denser packing within the implementing FPGA 100.

After step 205 obtains a functional final implementation, the inputs of unused gates, if any, are normally configured so as to be tied to a steady logic 1 or logic 0. This is done to avoid having floating inputs that in the presence of switching noise, may cause their respective gate outputs to switch and generate further noise.

Although the partitioning, placement and routing phases have been presented above as being carried out in a specific order (partitioning first, then placement, then routing), there is nothing requisite about this order. Those skilled in the art will appreciate that the phases can be intermixed according to a variety of orderings. For example, during optimization some routings may be defined first and then the effects of different placements may be investigated while the defined routings are temporarily held fixed.

Improvements can and have been made to FPGA configuring software modules such as the one shown in FIG. 2. However, there is a limit to how far such improvements can proceed on the software side. This is so because the FPGA configuring software module 200 is inherently constrained by the quantities, types, granulations, and distribution of resources provided within the target FPGA device 100.

At some point, the design of the FPGA 100 itself must be improved in some substantial way in order to obtain better implementations of the original design 150.

A First Symmetric Architecture

Figure 3A:
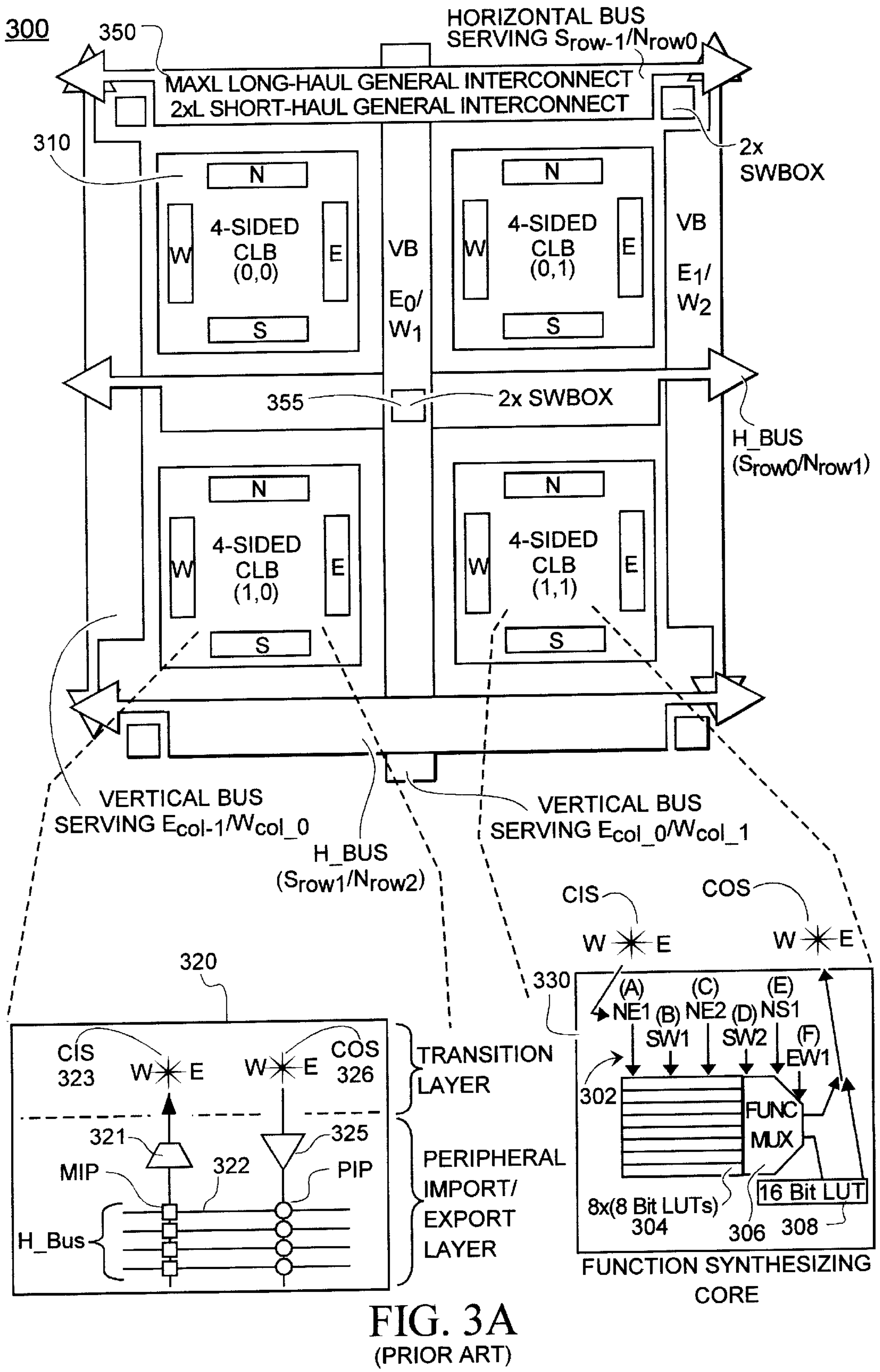
FIG. 3A schematically illustrates a previously suggested symmetric architecture having 4-sided CLB's with function synthesizing cores.

FIG. 3A schematically illustrates a symmetrical organization 300 of a type previously suggested in U.S. Pat. No. 5,212,652. In this architecture 300, each CLB such as 310 is topologically organized as a four-sided symmetrical object. The four illustrated CLB's are identified by relative row and column as (0,0), (0,1), (1,0) and (1,1). Equivalent input/output ports are symmetrically distributed about the periphery of each four-sided CLB. A function synthesizing core is provided at the center of each four-sided CLB.

In FIG. 3A, these four peripheral ports of each CLB are denoted as N, E, S and W according to the points of the compass. Each of the input/output ports (N, E, S, W) has specialized input terminals for respectively receiving direct connect signals, or longline signals, or signals from short-haul general-interconnect segments.

Exploded view 320 shows selected details from the south one of these input/output ports and its adjacent horizontal bus (H_Bus). The other ports are understood to have identical structures. FIG. 3C provides a legend for some of the symbols used in exploded view 320. The legend is discussed later.

More specifically, view 320 of FIG. 3A is to be understood as indicating that a plurality of user-configurable input multiplexers (only one shown at 321) are provided with their respective inputs (MIP's, or multiplexer input points) cross coupled with the adjacent interconnect bus (H_Bus) to allow for user-specified routing of signals from respective ones of adjacent interconnect lines (e.g., 322) to a Configurable Input Star (CIS) 323. The CIS 323 extends through and forms part of a transitional layer that separates the peripheral multiplexers (e.g., 321) from the function synthesizing core (330).

While first exploded view 320 is sampled from a periphery one of the identical CLB's, the second exploded view 330 is sampled from a core or central area of one of these identical CLB's. The Configurable Input Star 323 is to be understood as an entity that receives signals collected from all four sides (N,S,E,W) of the CLB, reduces their number, and delivers the reduced subset to the function synthesizing core 330. Signal sub-subset 302 of view 330 is an example of part of the reduced subset. Sub-subset 302 includes a first signal (A)_NE1 which is routable from either the N port or the E port in accordance with user-configuration. Sub-subset 302 further includes other signals (B)_SW1, (C)_NE2, (D)_SW2, (E)_NS1 and (F)_EW1 whose routability from corresponding ones of the N,S,E,W ports is understood by their respective names. In one embodiment, the Configurable Input Star (CIS) 323 is formed out of a cascade of multiplexers that collect the inputs from all four sides (N, E, S, W), select a subset, and bring the collected subset of inputs into the center of the CLB. CIS 323 feeds its centrally-collected signals to a plurality of same-sized lookup tables (LUT's) 304 and also to control terminals of a set of centrally-disposed function-defining multiplexers 306.

In one embodiment, the lookup table plurality 304 consists of eight 8-bit LUT's. The eight 8-bit LUT's are formed of 64 bits of configuration memory and eight, 8-input multiplexers which each receive a subset of the centrally-collected input signals and which each respectively outputs the state of a corresponding one of its eight configuration memory bits. In this embodiment, signals (A)_NE1, (B)_SW1, and (C)_NE2 feed one of the 8-bit LUT's. As such the output of that LUT is a function whose 3 input terms are routable from any of the CLB's four sides (N, E, S, W). The other 7 LUT's are similarly fed by signals routable from any of the CLB's four sides.

Figure 3B:
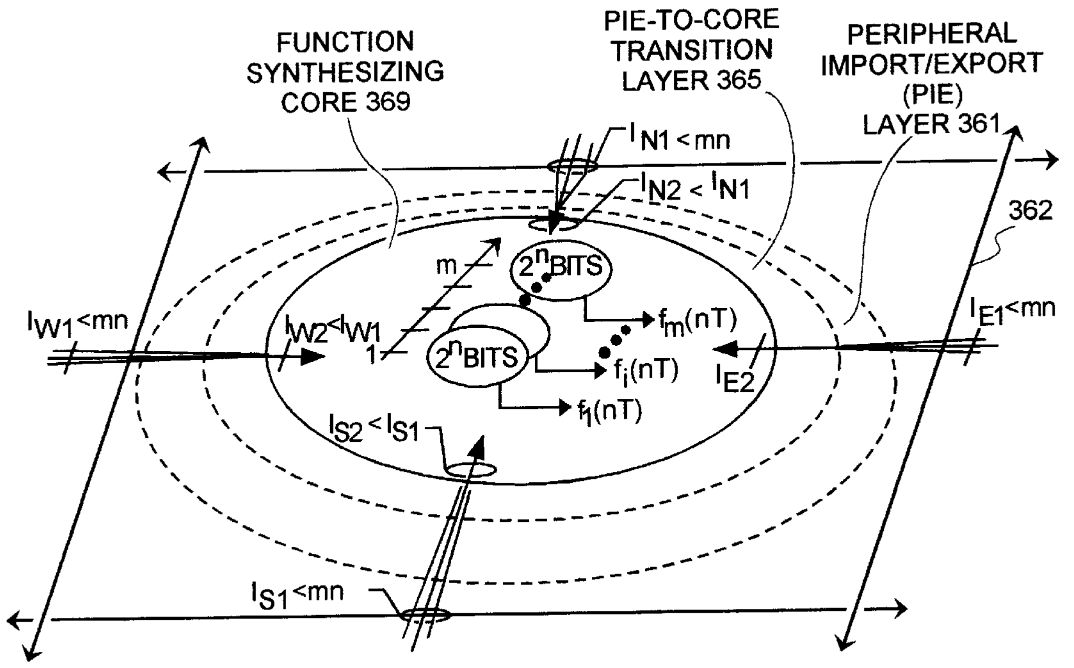
FIG. 3B diagrams an upward scaling problem for the 4-sided CLB architecture of FIG. 3A.
Figure 3C:
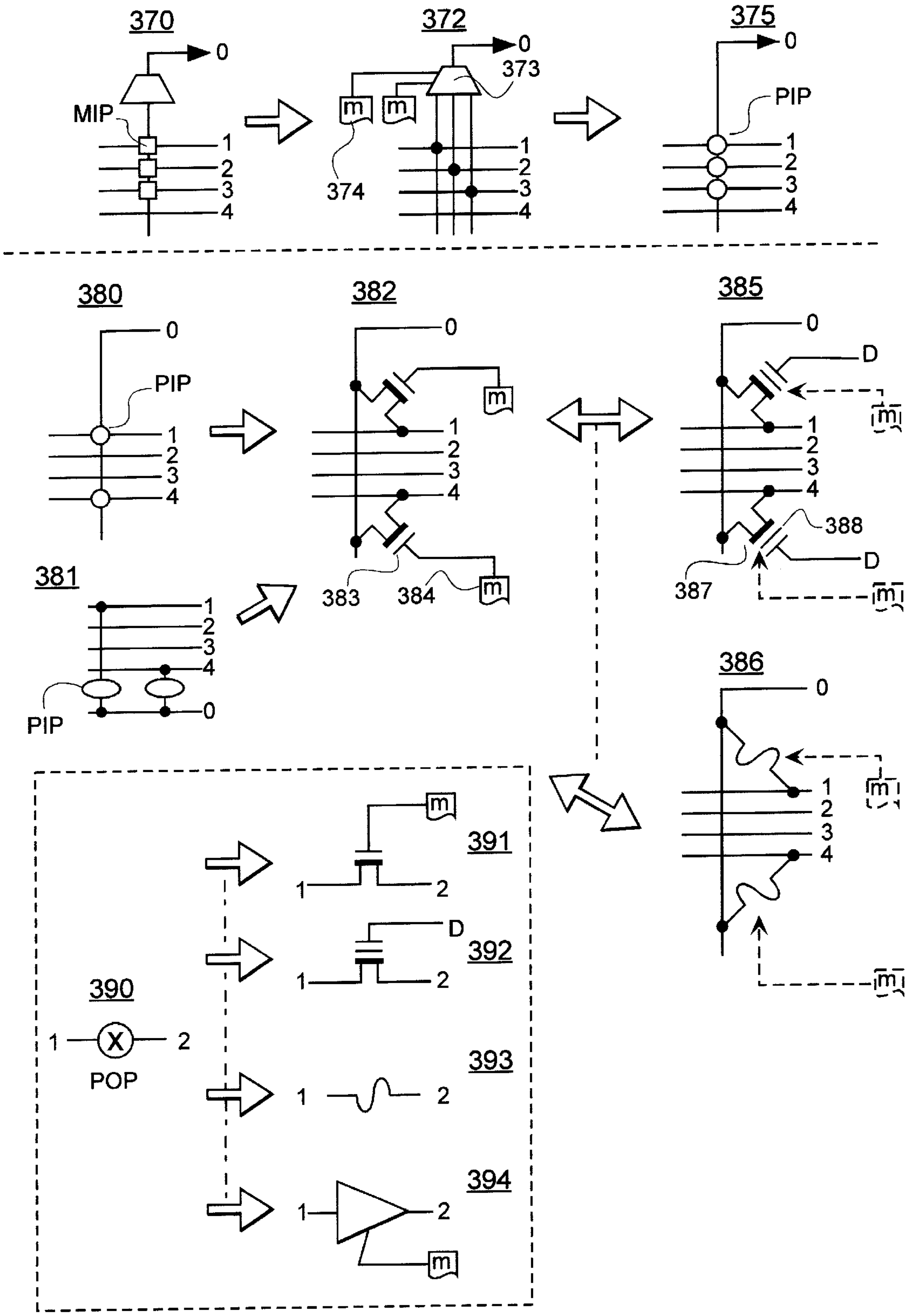
FIG. 3C provides a legend for some schematic symbols used in the present disclosure.

FIG. 3B shows the architecture of each CLB in structure 300 at a more abstract level. Layer 361 represents a peripheral import/export (PIE) layer through which all input signals are acquired from surrounding interconnect lines 362. The function synthesizing core is shown at 369 as containing a plurality of m LUT's, where each LUT receives n input terms. Transition layer 365 separates PIE layer 361 from the function synthesizing core 369.

A total plurality of more than m·n input signals are collected as respective sets $I_{N1}$, $I_{S1}$, $I_{E1}$, and $I_{W1}$ (with each set $<$m·n) at the respective N,S,E,W sides of the CLB by PIE layer 361. Transition layer 365 collects and selectively reduces the initial total of signals down to a centralized number of m·n input signals. This smaller, centralized subset is represented by sub-subsets $I_{N2,\ IS2}$, $I_{E2}$, $I_{W2}$ (each being less than m·n, for example each being equal to mn/4).

The centralized subset of m·n input signals is then distributively supplied to the m LUT's at the core 369. Each $LUT_i$ of the plurality of m LUT's implements a function $f_i$(nT) of its respective n input terms, where i equals 1 through m.

Referring again to portion 330 of FIG. 3A, after the plural LUT's 304 produce their respective result signals, a centrally-disposed function-defining multiplexer 306 collects and combines the function outputs of LUT's 304 and distributes the combined results symmetrically back to the four peripheral ports, N, E, S and W. This outbound dissemination of result signals is carried out by a Configurable Output Star (COS) that spans from the core (369) back out to the CLB periphery (361). The illustrated COS represents sets of wires and selection switches that span out to all four sides for delivering the results produced by the function-defining multiplexer 306. An additional 16-bit LUT 308 is included centrally within each CLB for providing a wide-gated output function that is formed by cascading into LUT 308 results acquired from LUT's 304. Result signals from this wide-gated output function are also symmetrically distributed to the four peripheral ports N, E, S and W of each CLB by the Configurable Output Star (COS).

Referring to exploded view 320, a southwardly directed line of COS 326 feeds output line-driver 325. The output wire of line-driver 325 spans over the adjacent interconnect lines (e.g., 322). A plurality of programmable interconnect points (PIP's) are used for coupling the output signal to selected ones of the adjacent interconnect lines in accordance with user-provided instructions stored within the configuration memory.

Some topological observations can be made about the symmetrical architecture 300 shown in FIG. 3A. First, the centrally-disposed plurality 304 of LUT's and the centrally-disposed function-defining multiplexer 306 represent a set of function-providing resources that are equally accessible irrespective of which direction the input signals enter from into each CLB (from N, E, S or W). Second, a balanced set of output resources 325 (which are parts of 'output macrocells'—not fully shown) are provided in each of the four peripheral ports (N, E, S, W) of each CLB so that certain combined functional results can be symmetrically output from any one or more of the four peripheral ports (N, E, S, W).

Additionally, the memory requirements at the core of the CLB include the $m \cdot 2^n$ bits needed for implementing the m lookup tables (LUT's) 304. This is illustrated in FIG. 3B wherein each $LUT_i$ of a plurality of m LUT's implements a corresponding function $f_i(nT)$ of n input terms. Inherently, the number $m \cdot 2^n$ of bits at the center of each CLB grows exponentially if one wishes to scale n to higher values. The minimum number of input lines to be distributed around the perimeter of each CLB, $m \cdot n$, grows linearly with n and m. Thus, as n scales up, the number of bits in the core of each CLB in architecture 300 expands faster than the minimal number of input lines distributed about the CLB perimeter. This can present a problem for large scale implementations of architecture 300.

The symmetrical arrangement of input and output resources about the periphery of each CLB 310 provides equal degrees of freedom for placement, partitioning and routing. As explained above, this can advantageously help the FPGA configuring software to complete its job. However, because of the central disposition of LUT's 304 and 308, all LUT-input signals invariably flow the full distance from the peripheral ports (N, E, S, W) through transition layer 365 into the center 369 and all LUT-developed signals invariably flow the full distance back out again from core 369, through transition layer 365 to PIE layer 361, irrespective of whether simpler or more complex functions are being developed, and irrespective of whether the resultant output signals are destined for output onto high-speed direct connect lines or output onto potentially-slower longlines. Moreover in the architecture 300 of FIG. 3A, each of the four peripheral ports (N, E, S, W) has its own longline driving amplifier (e.g., 325), which same amplifier 325 is also used for driving short-haul conductor segments.

Another topological observation to be made respecting architecture 300 (FIG. 3A) is that there is a symmetrical distribution of horizontal and vertical interconnect buses cutting between the respectively-facing N-S and E-W ports of all immediately adjacent CLB's. This inherently places distance between such counter-facing N-S and E-W ports.

Also, there is a 'sidedness' to each port. If one wishes to cascade functions of the CLB by for example moving a signal output from the N port of a CLB 310 to the E or S port of the same CLB 310 via the interconnect, the routing algorithm has to generally circumnavigate about the corners of the CLB. This tends to add delay because of signal passage through switch boxes.

Yet another topological observation about architecture 300 is that there are no shared line-driving amplifiers. Each of the N, E, S and W ports of each CLB has its own dedicated set of port-internal line-driving amplifiers for driving signals out onto the adjacent interconnect resources.

The interconnect resources of architecture 300 are granulated to include so-called double-wide short-haul general interconnect segments (also identified in FIG. 3A as '2×L' lines) and longlines. Four-way switch boxes are provided in staggered fashion at the intersections of the double-wide lines. This combination of interconnect resources is schematically illustrated at 350. (Important note: the definition of 2×L as used in FIG. 3 does not apply to higher numbered figures. As will be seen, in FIG. 4B the 2×L lines shown therein each spans four CBB's.)

Note that a first horizontal bus (top of FIG. 3A) services the north side ports of relative row 0 and the south side ports of relative row −1. A second horizontal bus (middle) services the south side ports of relative row 0 and the northern ports of relative row 1. A third horizontal bus (bottom) services the southern ports of relative row 1 and the northern ports of relative row 2. Thus, at least three separate, horizontal buses are needed to service each 2-by-2 matrix of CLB's.

In similar fashion, three vertical buses are similarly called for to service the respective western and eastern ports of relative columns −1 through +2.

Switch boxes such as that at 355 are placed between the neighboring four corners of every set of four CLB's (0,0 through 1,1) in architecture 300. This layout has a tendency to push the 4 CLB's (0,0–1,1) radially apart relative to box 355. Packing density of CLB's may suffer as a result.

Also, vertical and horizontal interconnect buses cut through each respective quartet of CLB's (0,0–1,1) to cross at switch boxes such as the illustrated 355. The cutting-through of interconnect buses also has a tendency to push the 4 CLB's (0,0–1,1) radially apart from box 355, particularly if the design is scaled up to give each of the vertical and horizontal interconnect buses more lines. Such scaling-up also tends to make switch box 355 larger because it will generally have more switches for providing routing between the larger numbers of interconnect wires.

In summation it is seen that, although the symmetrically-arranged architecture 300 of FIG. 3A enables FPGA configuring software (such as 200 of FIG. 2) to more efficiently configure FPGA's because resources are symmetrically distributed in a balanced way relative to all four points of the compass (N, E, S, W), problems develop as one tries to scale the design to provide for more interconnect wires per bus or as one tries to scale the design to provide for higher level functions (larger values of n for each $f_i(nT)$) within each CLB.

Evolution of the New Architecture

Figure 4A:
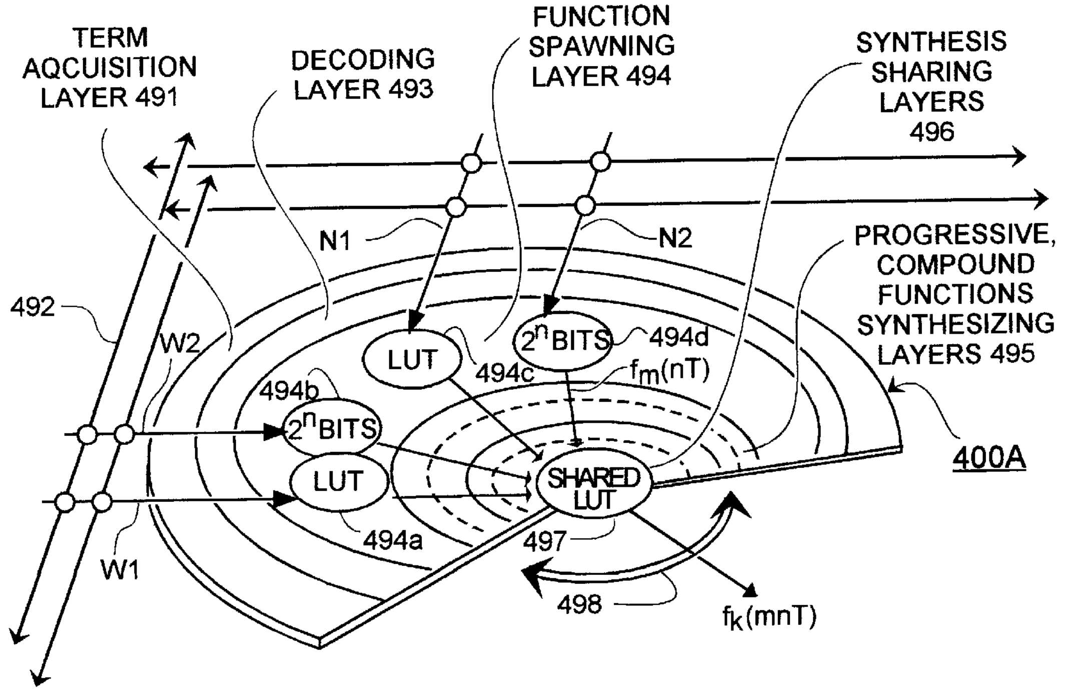
FIG. 4A diagrams a distributed, function synthesizing aspect of embodiments in accordance with the invention, which aspect may be contrasted with the core-based function synthesizing approach of FIG. 3B.

FIG. 4A diagrams at the abstract level, the evolution of a distributed, progressive function synthesizing aspect of the present invention. This aspect may be contrasted with the core-centric function synthesizing approach taken in FIG. 3B.

In FIG. 4A, a new structure 400A is developed by pushing the m LUT's out of the core and distributing them about a more peripheral layer 494. In this case, the values of m and n (the number of LUT's and the number of input terms handled by each LUT) can be different from those of FIG. 3B. More specifically, either or both of m and n can be larger without putting the same pressure on area utilization in the center as was placed by the core-centric implementation of FIG. 3B. Layer 494 is referred to as a function spawning layer for reasons that will become apparent.

A shared LUT 497 may remain near the core of structure 400A. The shared LUT 497 outputs a function $f_k$(mnT). Function $f_k$(mnT) is obtained by cascading the m outputs of the peripheral LUT's (layer 494) or derivatives thereof through LUT 497.

New structure 400A does not have an equivalent of the transition layer 365 of FIG. 3B. Instead of allowing for routing of input term signals from all four sides (N, E, S, W) of structure 400A to a core, each of the function spawning LUT's (494_a_–494_d_ in layer 494) generally receives its own set of input term signals from the peripherally adjacent interconnect 492.

For example, function spawning LUT 494_a_ is located by the west side of structure 400A and as such receives an input signals set W1', which set is obtained exclusively from the adjacent interconnect 492 on the western side of structure 400A. Function spawning LUT 494_c_ is located by the north side of structure 400A and therefore receives an input signals set N1', which set is exclusively obtained from the adjacent interconnect on the northern side of structure 400A. Similar observations apply to LUT's 494_b_, 494_d_ and their respective input signals sets, W2' and N2'.

The above observation respecting the 'sided' input connections of LUT's 494_a_–494_d_ may be contrasted with the situation in FIG. 3A where omnidirectional routing means 323 are connected to each core LUT for allowing that LUT to receive a mixture of input signals from all four sides of the CLB. This observation does not of course mean that no LUT of layer 494 can receive an input signals set with mixed sidedness (e.g., routed from both west and north interconnect). It is merely an observation about the general trend of connection for the function spawning LUT's 494_a_–494_d_ of layer 494. This observation also does not mean that local feedback lines (not shown, see FIG. 4B) cannot be provided for circumnavigating the north and west sides of structure 400A to bring local output signals from one side to the other.

Layer 494 is referred to as a function spawning layer because the development of function signals is first initiated (spawned) at the interconnect-adjacent periphery of structure 400A and then progressively advanced to synthesize function signals of higher levels of complexity as one moves radially from the interconnect-adjacent periphery (491) of structure 400A towards its interconnect-distal area (e.g., towards center 497).

The interconnect-adjacent peripheral layer 491 acquires input terms from the immediately-adjacent interconnect lines 492. Acquired signals pass through a decoding layer 493 into function spawning layer 494. The m LUT's of function spawning layer 494 process the passed-through signals of their respective sides to develop a first plurality of as many as m, first-level function signals each of the form $f_i$(nT), where the number of input terms, nT of each spawning LUT is equal to a first value, say 3. (It is within the contemplation of the invention to have a higher, initial spawning value for nT such as 4 or 5 Terms. An nT value of 3 is preferred for reasons that will become apparent below.)

In an outer part of subsequent layers 495, respective pairs of the first level function signals may be combined or 'compounded' to form higher level function signals each of the form $f_L$({n+1}T). Such compounding is optional and is determined by user-configuration instructions.

If no compounding occurs, then decoding layer 493 may be operated in an essentially transparent mode that sends respective sets of peripherally acquired input term signals directly to respective ones of the function spawning LUT's (494). If compounding does occur, then decoding layer 493 sends subsets of peripherally acquired input term signals directly to some of the function spawning LUT's (494), causes others of the LUT's to share input term signals, and intercepts and forwards into deeper synthesizing layers 495 yet others of the peripherally acquired input term signals. This process will be detailed later.

The decoding layer 493 is preferably user-configurable to allow for different combinations of sharing of input term signals. For example, via decoding; two LUT's each having 3 input-terminals may be caused to share a common set of 3 input term signals. Alternatively, the same two LUT's may be caused to share a common set of only 2 input term signals and to each respond to a different input term signal at their respective third input terminal. As another decoding option, the same two LUT's may be caused to share only 1 input term signal at their respective first input terminals and to each respond to different input term signals at their respective second and third input terminals. These decoding options can provide for an advantageous operation. The 3-to-3 strapping together or sharing of input term signals allows the two 3-input LUT's to behave as part of a 4-input LUT or as part of an adder/subtractor circuit. The 2-to-2 strapping together of input term signals allows the two 3-input LUT's to behave as part of an adder circuit. The 1-to-1 strapping together of input term signals allows the two 3-input LUT's to behave as part of a 4-to-1 multiplexer. These configurations are detailed below.

As one moves progressively deeper into the function synthesizing layers 495 of FIG. 4A, compounded function signals can be further compounded to form yet higher level function signals. Such yet higher level function signals are functions of a greater number of inputs than are the second level function signals formed at the outer part of synthesis layers 495. As such, each of the yet higher level function signals may be expressed by the form: $f_K$(kT), where k>n+1. Again at each progressive level, compounding is optional so that a user (or FPGA configuring software) can choose different combinations of configurations from a spectrum of possibilities.

This spectrum of possibilities has at one end, the production of a relatively large number of simpler function signals, namely, m times $f_i$(nT) where m is the number of spawning LUT's (494_a_–494_d_) and n is the number of independent input term signals that may be processed by each of the m LUT's. This spectrum has at an opposed end, the production of a relatively small number of complex function signals, namely, m/($2^j$) times $f_{i+j}$({n+j}T) where j>1 and m/($2^j$) is an integer greater than or equal to 1.

The synthesized mix of simple and/or complex function signals is next forwarded to one or more synthesis sharing layers 496 of structure 400A. A number of different operations can occur here in layers 496. For example, the synthesized mix of simple and/or complex function signals may be returned back to interconnect-adjacent layer 491 for output back to the interconnect 492. Alternatively, or additionally the synthesized mix may be used for performing chained operations such as the production of forward rippling, carry bits or the implementation of wide-input NOR gates. Alternatively, or additionally the synthesized mix may be forwarded to a higher level, super structure for further compounding or special outputting.

Such a higher level, super structure is not shown in FIG. 4A. (It will be in FIG. 4B.) What is shown in FIG. 4A however, is the additional step of converting structure 400A into a 'slice' or 'wedge' that will fit slice-wise into a subsuming super structure. This formation of a slice or wedge is represented by the sectorizing-angle symbol 498. The amount of sectorizing (or conversion into a wedgeable sector) can vary. In one embodiment, structure 400A is reduced to a 90 degree sector. The sector can be that of a square, or a circle, or another regular geometric construct. Sectorizing to sector angles other than 90° is within the contemplation of the invention. See FIG. 4D.

The VGB, an Embodiment of a 90° Sectorized Wedge

Figure 4B:
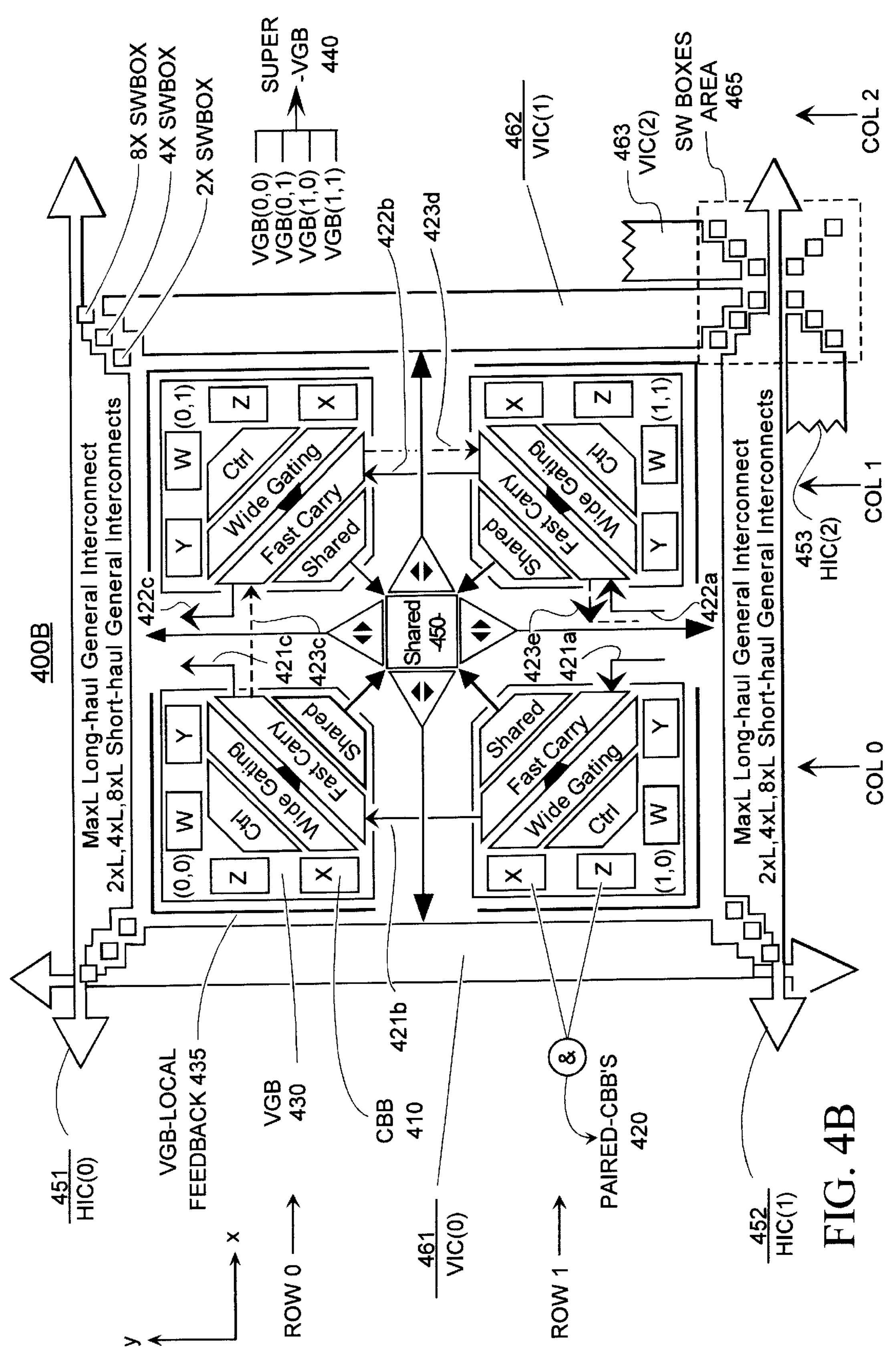
FIG. 4B illustrates more details of an L-organized super-VGB and surrounding interconnect resources of an FPGA device in accordance with the present invention.
Figure 5A:
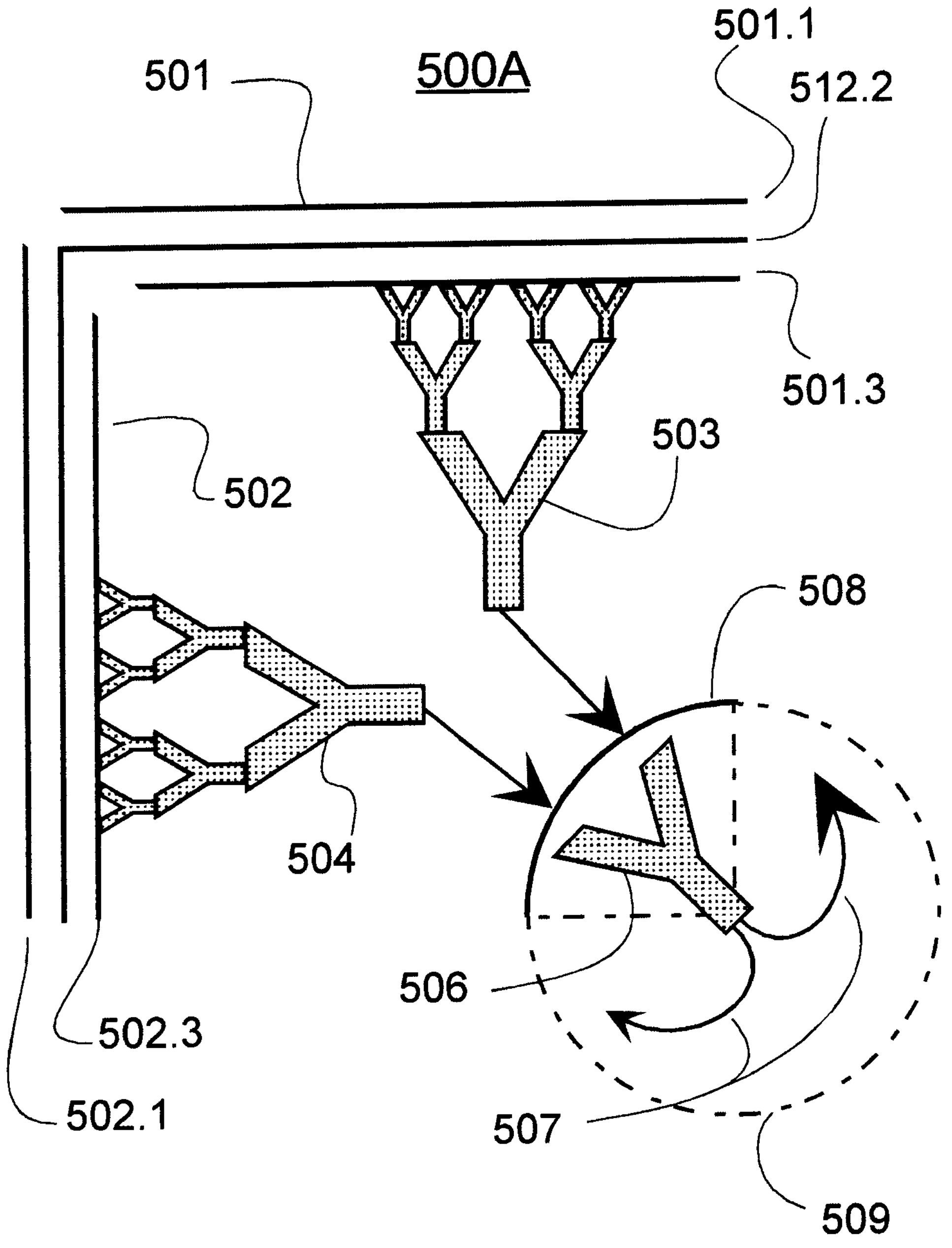
FIG. 5A diagrams at an abstract level, how graduated resource folding and result sharing are engendered by the L-organization of Variable Grain Blocks in accordance with the present invention.
Figure 5B:
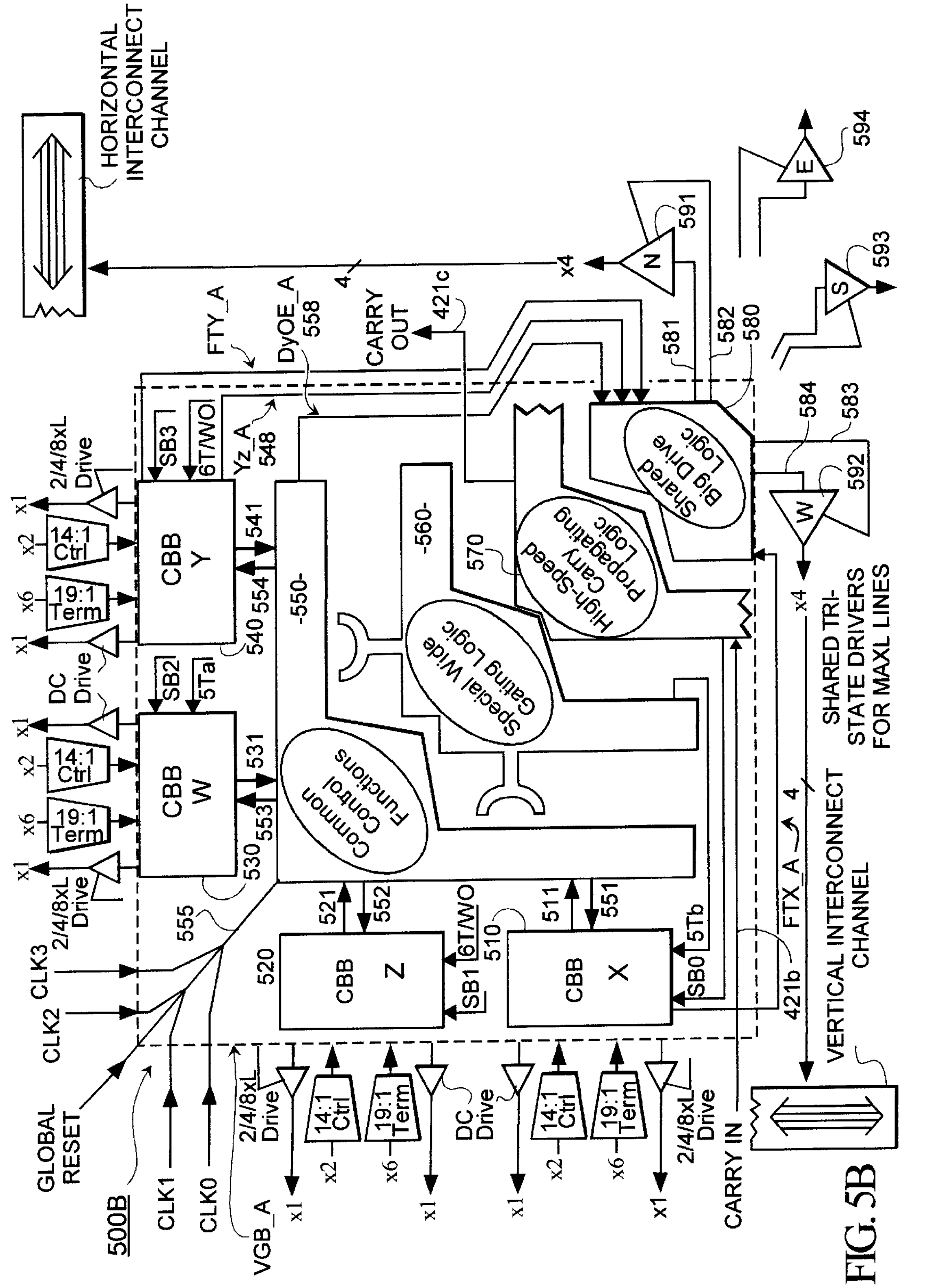
FIG. 5B shows further details of L-organization within a quadrant of an super-VGB structure such as that shown in FIG. 4B.

Embodiments of the 900 sectorized type of wedge are seen at 430 in FIG. 4B and at 500B in FIG. 5B. Each of these embodiments 430/500B is referred to as a Variable Grain Block or VGB. In FIG. 4B, an L-organized section of VGB 430 is occupied by four Configurable Building Blocks (CBB's) that are respectively named: X, Z, W, and Y. This L-organized section may be seen as defining the interconnect-adjacent acquisition layer 491, the decoding layer 493, the spawning layer 494, and a preliminary part of progressive functions synthesizing layers 495 of FIG. 4A. A diagonally-disposed, wide-gating part of VGB 430 may be seen as defining deeper parts of the functions synthesizing layers 495. The shared section which links to shared core 450 may be seen as defining part of the synthesis sharing layers 496.

As can be seen in FIG. 4B, VGB 430 is wedged into a subsuming super structure that is referred to here as super-VGB 440. Super-VGB 440 contains four, mirror-opposed VGB's. The L-organized section of each VGB neighbors a corresponding crossing of orthogonal interconnect channels 451, 452, 461, 462.

Before exploring more details of this new architecture, the legend of FIG. 3C will be explained. Unless otherwise stated, a single line going into a multiplexer symbol such as shown at 370 of FIG. 3C represents an input bus of plural wires. Each open square box such as the MIP shown at 370 represents a point for user-configurable acquisition of a signal from the crossing line (e.g., 1, 2, 3). One implementation is shown at 372. Multiplexer 373 is controlled by configuration memory bits 374. The number of configuration memory bits 374 can vary depending on the number of MIP's (multiplexer input points) and whether selection decoding is carried out or not. One embodiment that has no selection decoding is shown at 375. Here, a PIP (programmable interconnect point) is placed at each MIP occupied intersection of output line 0 with crossing lines 1–4. Each of these PIP's is understood to have a single configuration memory bit controlling its state. In the active state the PIP creates a connection between the crossing lines. In the inactive state the PIP leaves an open between the illustrated crossing lines. Each of the crossing lines remains continuous however in its respective direction (x or y).

PIP's (each of which is represented by a hollow circle covering a crossing of two continuous lines) may be implemented in a variety of manners as is well known in the art. Two PIP's are shown at 380 for programmably creating a coupling between line 0 and respective ones of lines 1 and 4. In one embodiment shown at 382, pass transistors such as MOSFET 383 have their source and drain coupled to the crossing lines while the transistor gate is controlled by a configuration memory bit such as 384. In an alternate embodiment shown at 385, nonvolatilely-programmable floating gate transistors such as 387 have their source and drain coupled to the crossing lines. The charge on the floating gate 388 represents the configuration memory bit. A dynamic signal D or a static turn-on voltage may be applied to the control gate as desired. In yet another alternate embodiment shown at 386, nonvolatilely-programmable fuses or anti-fuses have their ends connected to the crossing lines. Each of examples 382, 385 and 386 demonstrates a bidirectional PIP for which signal flow between the crossing lines (e.g., 0 and 1) can move in either direction. Where desirable, PIP's can also be implemented with unidirectional signal coupling means such as AND gates, tri-state drivers (see 394), and so forth.

An alternate symbol for a PIP is constituted by a hollow ellipse covering a strapping connection between two parallel lines such as shown at 381. The schematic of 381 is an alternate way of representing the circuit of 380.

Another symbol used herein is the POP such as shown at 390. POP stands for 'Programmable Opening Point' and it is represented by a hollow circle with an 'X' inside. Unless otherwise stated, each POP is understood to have a single configuration memory bit controlling its state. In the active state the POP creates an opening between the colinear lines (1,2) entering it. In the inactive state the POP leaves closed an implied connection between the colinear lines (1,2) entering it. Possible implementations of POP's are shown at 391 through 394. In EEPROM implementation 392, the control gate signal D will be typically tied to the channel-inducing state so that the charge on the floating gate controls the POP state exclusively. The tri-state driver implementation of 394 is unidirectional of course. Many other alternatives will be apparent to those skilled in the art.

Figure 3D:
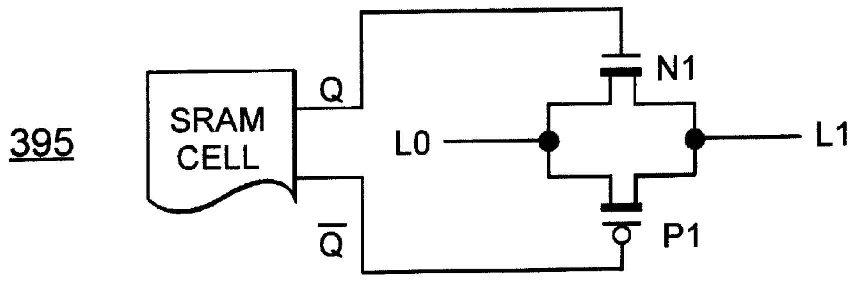
FIGS. 3D and 3E provide schematics for transmission gate type PIP's driven by complementary outputs of an SRAM cell.

FIG. 3D shows yet another implementation of a bidirectional PIP at 395. Lines L0 and L1 are the programmably interconnectable entities. In this particular case, the controlling memory is an SRAM cell (Static Random Access Memory) having opposed Q and Q-bar outputs. The Q output drives the gate of an N-channel MOSFET, N1 of the PIP. The Q-bar output drives the gate of an P-channel MOSFET, P_1 of the PIP. In general, transistor P_1 should be made with a larger channel width than that of transistor N_1 to compensate for the lower mobility of carriers in the P-channel of the P_1 device.

Figure 3E:
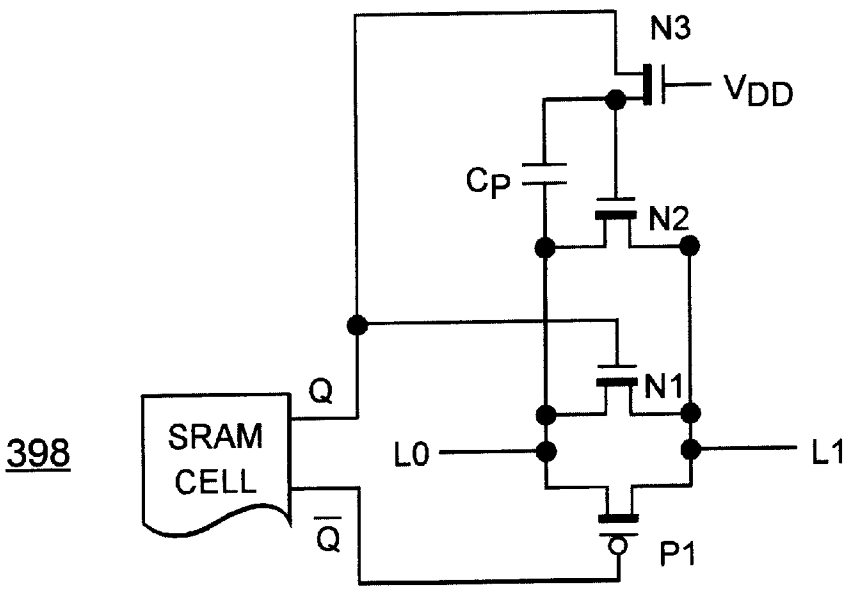

FIG. 3E shows yet another implementation of a bidirectional PIP at 398. Like reference symbols are used where appropriate for elements having like counterparts in FIG. 3D. The PIP shown at 398 may be referred to as a bootstrapped transmission gate. The parasitic gate-to-source capacitance $C_P$ of additional N-transistor N_2 may be used improve the conductivity of the PIP between L0 and L1 when Q is high (and Q-bar is at a lower voltage) and a low-to-high transition appears at L0 for transmission onto L1. Capacitance $C_P$ couples the low-to-high transition to the gate of N_2. N_3 had pre-established a slightly below threshold voltage on the gate of N_2 by virtue of N_3 having its drain coupled to the high Q, the source of N_3 being connected to the gate of N_2, and the gate of N_3 being coupled to $V_{DD}$, the high voltage rail of the device. The capacitively coupled low-to-high transition boosts the voltage of N_2's gate above threshold and turns N_2 on. This assists the normally slower P_1 device with passing the low-to-high transition from L0 to L1. As such P_1 can be made with a channel width that is comparatively smaller than the width used for the PMOS device in the PIP 395 of FIG. 3D.

Referring now to FIG. 4B, this figure provides a mid-scopic view of a novel, tile-able structure 400B in accordance with the present invention. By 'tile-able' it is meant that structure 400B is capable of being tiled across a plane to define a tightly packed matrix. The mid-scopic view of FIG. 4B is to be understood as being taken at a magnification level that is in between those of more microscopic views (such as that of FIG. 6) and more macroscopic views (such as that of FIG. 8). The more microscopic views reveal greater levels of detail which may not be seen in more macroscopic views. The more macroscopic views reveal gross architectural features which may not be seen in more microscopic views. It is to be understood that for each more macroscopic view, there can be many alternate microscopic views and that the illustration herein of a sample microscopic view does not limit the possible embodiments of the macroscopic view.

The mid-scopic view of FIG. 4B shows four VGB's brought tightly together in mirror opposition to one another. The four, so-wedged together VGB's are respectively designated as (0,0), (0,1), (1,0) and (1,1). The four VGB's are also respectively and alternatively designated herein as VGB_A, VGB_B, VGB_C, and VGB_D.

Reference number 430 points to VGB_A which is located at relative row and column position (0,0). Some VGB internal structures such as CBB's Y, W, Z, and X are visible in the mid-scopic view of FIG. 4B. Further VGB internal structures such as each VGB's common controls developing (Ctrl) section, each VGB's wide-gating supporting section, each VGB's carry-chaining (Fast Carry) section, and each VGB's coupling to a shared circuit 450 of a corresponding super-structure (super-VGB) are also visible in the mid-scopic view of FIG. 4B. The darkened connections between the carry-propagating and wide-gating sections indicates that some circuits may be shared in an overlapping manner between the two.

The mid-scopic view of FIG. 4B additionally shows four interconnect channels surrounding VGB's (0,0) through (1,1). The top and bottom, horizontally extending, interconnect channels (HIC's) are respectively identified as 451 and 452. The left and right, vertically extending, interconnect channels (VIC's) are respectively identified as 461 and 462. Two other interconnect channels that belong to other tiles are partially shown at 453 and 463 so as to better illuminate the contents of switch boxes area 465. Switch boxes area 465 contains an assortment of 2×L switch boxes, 4× switch boxes and 8× switch boxes.

As seen broadly in FIG. 4B, the group of four VGB's, (0,0) through (1,1) are organized in mirror image relationship to one another relative to corresponding vertical and horizontal centerlines (not shown) of the group and even to some extent relative to diagonals (not shown) of the same group. Vertical and horizontal interconnect channels (VIC's and HIC's) do not cut through this mirror-wise opposed congregation of VGB's. As such, the VGB's may be wedged-together tightly.

VGB (0,1) may be generally formed by flipping a copy of VGB (0,0) horizontally. VGB (1,1) may be similarly formed by flipping a copy of VGB (0,1) vertically. VGB (1,0) may be formed by flipping a copy of VGB (1,1) horizontally, or alternatively, by flipping a copy of VGB (0,0) vertically. The mirror-wise symmetrical packing-together of the four VGB's (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGB's to be chained together to form multi-nibble adders, subtractors or counters. (A nibble is a group of 4 bits. A byte is two nibbles or 8 bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGB's. Thus, CBB's X, Z, W, and Y are not interchangeable for all purposes.

The unidirectional propagation of carry bits is indicated for example by special direct connect lines 421*a*, 421*b* and 421*c* which propagate carry bits upwardly through the Fast Carry portions of VGB's (0,0) and (1,0). The unidirectional propagation is further indicated by special direct connect lines 422*a*, 422*b* and 422*c* which propagate carry bits upwardly through the Fast Carry portions of VGB's (0,1) and (1,1).

Such unidirectional ripple-through of carry bits may continue across the entire FPGA device so as to allow addition, subtraction or count up/down results to form in bit aligned fashion along respective columns of the FPGA device. Bit aligned results from a first set of one or more columns can be submitted to other columns (or even resubmitted to one or more columns of the first set) for further bit aligned processing.

Consider an example where a plurality of VGB's in column 0 produce a sum or difference result of the form A+B where A is a first binary number that is input to that column 0 and B is a second binary number that is input to column 0. Each VGB holds 4 bits or a nibble's worth of the result signal as will be explained later. Assume that at the same time, plural VGB's of column 2 (not fully shown) are producing a sum or difference result of the form C±D where C is a third binary number and D is a fourth binary number.

In this example, respective bits $A_i$ and $B_i$ are added together (or subtracted if the latter operation is instead called for by an operation-controlling input term) in a corresponding row i of VGB's. Respective bits $C_i$ and $D_i$ are added together (or subtracted) in the same row i, but at a different column (e.g., column 2). Then the results of columns 0 and 2 are folded horizontally by direct-connect signal transfer to become inputs of a third column (e.g., column 1). The third column can then be programmed to produce a next level result, such as (A±B)±(C±D) for example, because the significances of all numbers run in the same direction across the FPGA.

In an alternate embodiment, propagation of rippled-through carry bits is zig-zagged through successive columns of VGB's as indicated by the dashed direct connect lines 423*c*, 423*d* and 423*e*. This alternate, zig-zagging design allows large binary numbers (e.g., A, B) to be folded bidirectionally along plural columns of VGB's. In this zig-zagged design, the carry bits ripple up a first column (e.g., col. 0), cross over at the top of the zig-zag (e.g., at 423*c*) to the next successive column (e.g., col. 1), and then ripple down that next successive column. The following sequence of carry-propagation through lines (and of course, through their respective, carry-processing sections) is an example of zig-zagged flow: 421*a*, 421*b*, 423*c*, 423*d* and 423*e*. If desired, the zig-zagging can continue at the bottom of the down-rippling column with a further cross over of carry propagation to another up-rippling column. Cyclical algorithms may also be implemented where the cross over of carry propagation returns to the bottom of the initial up-rippling column after hitting bottom in a last down-rippling column. The zig-zagging path of carry propagation can be fixed (via direct connect lines) or made programmable. The programmable approach is less preferred because it tends to provide slower propagation speed for the forward-rippling carry bits.

Referring to FIG. 5B, a few more examples of the imperfect symmetry will be gleaned from this more microscopic view before returning to FIG. 4B. Note that element 510 (which is also referred to as the X CBB) receives a sum bit SB0 from carry-chaining section 570. This SB0 bit represents the least significant result bit of an addition or subtraction operation that starts in CBB 510 and completes in section 570. Element 520 (the Z CBB) likewise receives a next more significant sum bit SB1 from section 570. Element 530 (the W CBB) receives a yet more significant sum bit SB2 from section 570. And element 540 (the Y CBB) receives the most significant sum bit SB3 of the VGB from section 570. Each of CBB's 510–540 has the capability to output its respectively received sum bit SB0–SB3 to points outside the VGB via direct connect drive amplifiers and also via tri-state drive amplifiers as will be explained later. (See FIGS. 14A–14D.) Given that bits SB0 through SB3 have different significances, it is seen that CBB's 510–540 are not always swappable on a mirror symmetrical basis. The mode wherein CBB's 510–540 are operating as part of an adding or subtracting or counting chain is one example.

It is also seen in FIG. 5B that CBB's 520 and 540 commonly receive a same synthesized signal designated as '6T/WO' while CBB's 510 and 530 respectively receive separate synthesized signals designated as '5Ta' and '5Tb'. This is another example of imperfect mirror symmetry as it applies to a wide-gating functionality. The 6T/WO signal can be a function of as many as 16 input terms of the VGB while each of the 5Ta and 5Tb signals is a function of no more than 5 input terms of the VGB. The remainder of FIG. 5B will be explored at a later point.

Returning to the more macroscopic view of FIG. 4B, it is seen that the L-shaped internal structure of each VGB (which structure includes the X, Z, W, and Y Configurable Building Blocks) neighbors an intersection of orthogonally extending interconnect resources (channels). One example of such an orthogonal intersection is the crossing of HIC (0)—which Horizontal Interconnect Channel is also referenced as 451—with VIC(0), where the latter Vertical Interconnect Channel is also referenced as 461. Other such orthogonal intersections occur at the following respective crossings: 451–462, 452–461 and 452–462.

The southeast quadrant of the 451–461 intersection is neighbored by the L-shaped internal structure of VGB(0,0). The southwest quadrant of the 451–462 intersection is neighbored by the L-shaped internal structure of VGB(0,1). The northeast quadrant of the 452–461 intersection is neighbored by the L-shaped internal structure of VGB(1,0). And the northwest quadrant of the 452–462 intersection is neighbored by the L-shaped internal structure of VGB(1,1).

The X and Z CBB's define a vertical first leg of the L-structure of their respective VGB. The W and Y CBB's define a horizontal second leg of the L-structure.

CBB's W and Y are basically the same but do not have to be entirely the same. As explained above, there are some input and output capabilities which the W CBB may have that the Y CBB does not have, and vice versa. For example, in the embodiment of FIG. 5B it is seen that W receives a wide-gated signal, 5Ta, while Y does not. Y receives a wide-gated signal, 6T/WO, while W does not. CBB Y couples by way of so-called feedthrough lines (FTY) to section 580 while CBB W does not.

Note in FIG. 4B that the placement of W and Y is flipped when going from VGB(0,0) to VGB(0,1). The placement of W and Y is similarly flipped when going from VGB(1,0) to VGB(1,1). That places the FTY-possessing, Y CBB's of different VGB's adjacent to one another. Such adjacent Y CBB's may be folded together with the aid of a DyOE control signal as will be seen.

Just as with W and Y, the X and Z CBB's are basically the same but do not have to be entirely the same. There are some input and output capabilities that X may have which Z does not, and vice versa. See FIG. 5B. One of those differences in the embodiment of FIG. 5B is that the X CBB's couple by way of respective feedthrough lines (FTX) to section 580 while the Z CBB's do not. Mirror opposed symmetry of the VGB's in each super-VGB means that the FTX-possessing, X CBB's of different VGB's are placed adjacent to one another. Such adjacent X CBB's may be folded together with the aid of a DyOE control signal as will be seen.

Figure 4C:
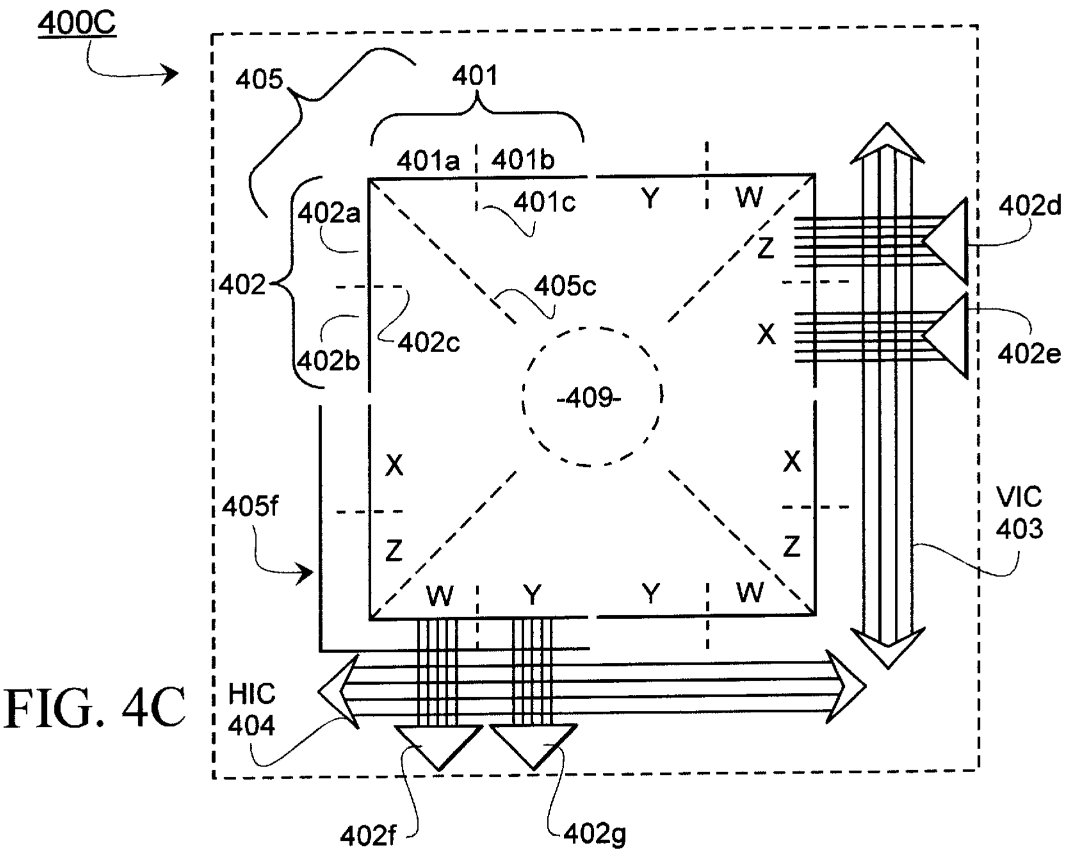
FIG. 4C diagrams in schematic form how four L-organized VGB's may be packed together in mirror opposed fashion to define a tile-able building block (a super-VGB and surrounding interconnect resources) of an FPGA device in accordance with the present invention.

FIG. 4C diagrams in a simpler schematic form how each VGB has basic symmetry and how four L-organized VGB's may be packed tightly together in mirror opposed fashion to define a tile-able building block 400C. (Block 400C includes the super-VGB and its immediately surrounding interconnect resources.)

The L-organized structure within VGB 405 is represented by legs 401 and 402. Leg 401 is partitionable into generally equivalent subportions 401*a* and 401*b*. Subportions 401*a* and 401*b* respectively correspond to CBB's W and Y. One level of resource folding or compounding may occur about the center line 401*c* of leg 401. This is when the resources of subportions 401*a* and 401*b* are compounded to define a first set of paired-CBB's.

In similar fashion, leg 402 is partitionable into generally equivalent subportions 402*a* and 402*b*. Subportions 402*a* and 402*b* respectively correspond to CBB's Z and X. A level of resource folding or compounding may occur about the center line 402*c* of leg 402. This is when the resources of subportions 402*a* and 402*b* are compounded to define a second set of paired-CBB's. Subportions 402*a* and 402*b* do not need to be compounded at the same time that subportions 401*a* and 401*b* are compounded, and vice versa. The configuration of VGB 405 can therefore define four separate CBB's, or two CBB's on leg 401 plus one set of paired-CBB's on leg 402, or two CBB's on leg 402 plus one set of paired-CBB's on leg 401, or two sets of paired-CBB's each on a respective one of legs 401 and 402.

Diagonal line 405*c* defines a center for a next progressive level of resource folding. If two sets of paired-CBB's are formed on respective legs 401 and 402, the resources of these two sets can be further folded together to define a set of quadrupled-CBB's.

A same description applies to the legs and center lines of the other three VGB's shown in FIG. 4C. Their respective leg subportions are identified by corresponding ones of the X,Z,W,Y designations. As seen, the four mirror-opposed VGB's are wedged together to define a tightly-packed, square shaped super-structure (a super-VGB).

Respective diagonal lines such as 405*c* of the respective, wedged-together VGB's converge on a core, sharing area 409 of the super structure. Further resource folding can occur within area 409 to create, for example a set of octupled-CBB's from two neighboring sets of quadrupled-CBB's. Sharing area 409 also may contain shared big line driving amplifiers such as 591 through 594 of FIG. 5B.

Each of the leg subportions (e.g., 401$a$–402$b$) includes configurable input signal acquiring means such as 402$d$ and 402$e$ for acquiring from side-adjacent interconnect (such as VIC 403) a user-configuration defined subset of input signals. The acquired input signals can include control signals as well as LUT input terms. The acquired input signals can be obtained from a diverse set of adjacent interconnect and intraconnect lines, including 2×L lines, 4×L lines, 8×L lines, MaxL lines, direct connect lines, and feedback lines. (The feedback lines are an example of local 'intraconnect' for the respective VGB as shown at 405$f$. They provide connections only within the VGB. The same feedback lines provide connections between the VGB-internal CBB's and/or CBE's and thus the same feedback lines are 'interconnect' with respect to those VGB-internal CBB's and CBE's.)

Each of the leg subportions (e.g., 401$a$–402$b$) includes configurable, sequential signal outputting means (CSE means) such as 402$f$ and 402$g$ for exporting to side-adjacent interconnect (such as HIC 404) a user-configuration defined subset of synthesized function signals. The exported signals can include control signals as well as LUT input terms. The exported signals can be driven from the sequential signal outputting means (402$f$, 402$g$) onto a diverse set of adjacent interconnect and intraconnect lines, including 2×L lines, 4×L lines, 8×L lines, direct connect lines, and feedback lines.

VGB-local feedback lines fold around the L-organized structures of their respective VGB's such as shown at 405$f$. This permits a signal output onto feedback lines from a south side of a VGB to be cascaded for example to the west side of the same VGB.

In one embodiment, MaxL lines are specially driven by core-situated big drive amplifiers (e.g., 591–594 of FIG. 5B) rather than being driven by amplifiers in the sequential signal outputting means (CSE's 402$f$, 402$g$) of the superstructure periphery.

It is to be understood that tile-able structure 400C includes an additional VIC (vertical interconnect channel) on its east side and an additional HIC (horizontal interconnect channel) on its north side. These additional elements were not shown so as to avoid illustrative clutter. Similarly, the feedback lines (405$f$) about each VGB, and the signal importing/exporting means (402$d$/402$g$) of every leg subportion were not shown in order to avoid illustrative clutter. Note that when subportions such as 401$a$, 401$b$ are folded together, their respective signal importing/exporting means (402$d$/402$g$) may be incorporated into the subsuming structure that was created by the fold-together operation, thus giving the latter structure more signal importing/exporting resources.

Figure 4D:
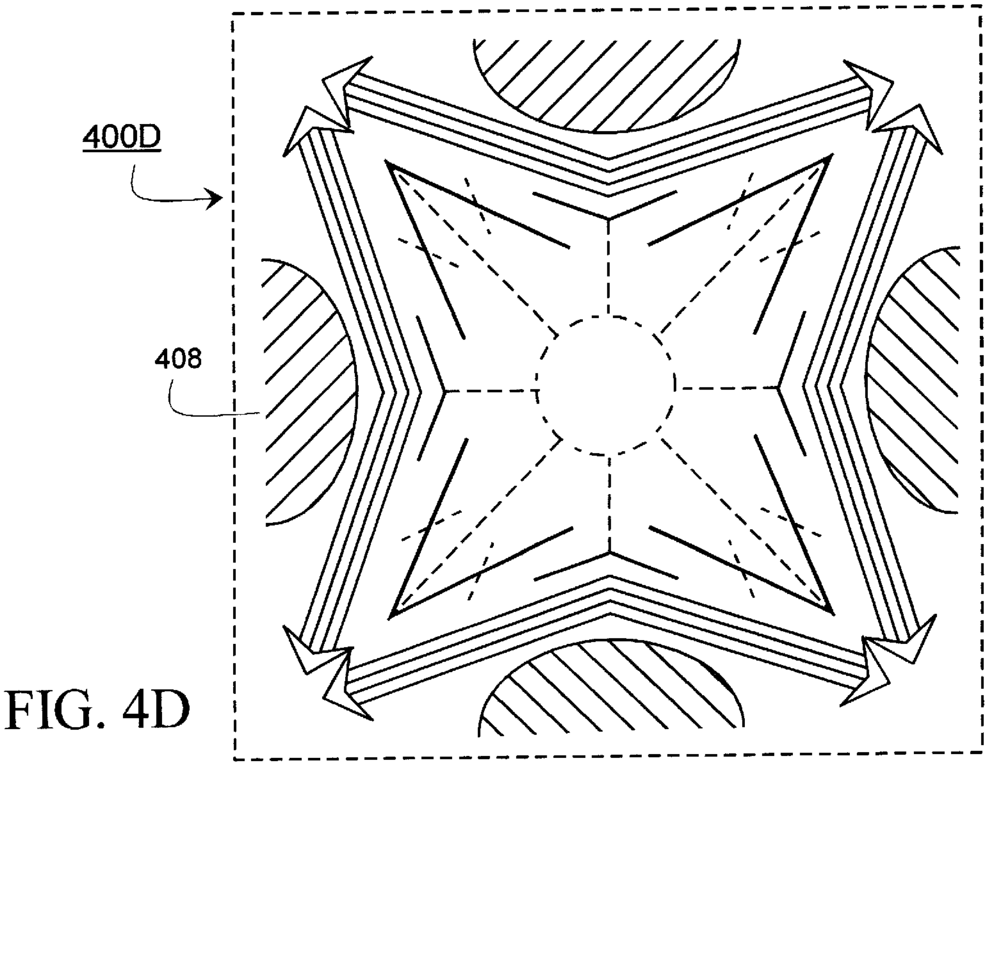
FIG. 4D diagrams an alternate design wherein 8 VGB's are wedged together in mirror opposed fashion and wherein additional common space is provided between super-VGB tiles.

The square-shaped organization of tile-able structure 400C ( FIG. 4C) is not the only way to organize an FPGA in accordance with the invention. FIG. 4D shows an alternative tile-able structure 400D in which there are eight VGB's with sector angles less than 90° wedged together with alternate ones of the VGB's not adjoining a crossing of orthogonal interconnect lines. Regions 408 represent void areas which can be filled with configuration memory and/or interconnect line drivers and/or signal repowering amplifiers for boosting signals traveling along various lines of the adjoining interconnect.

Figure 6:
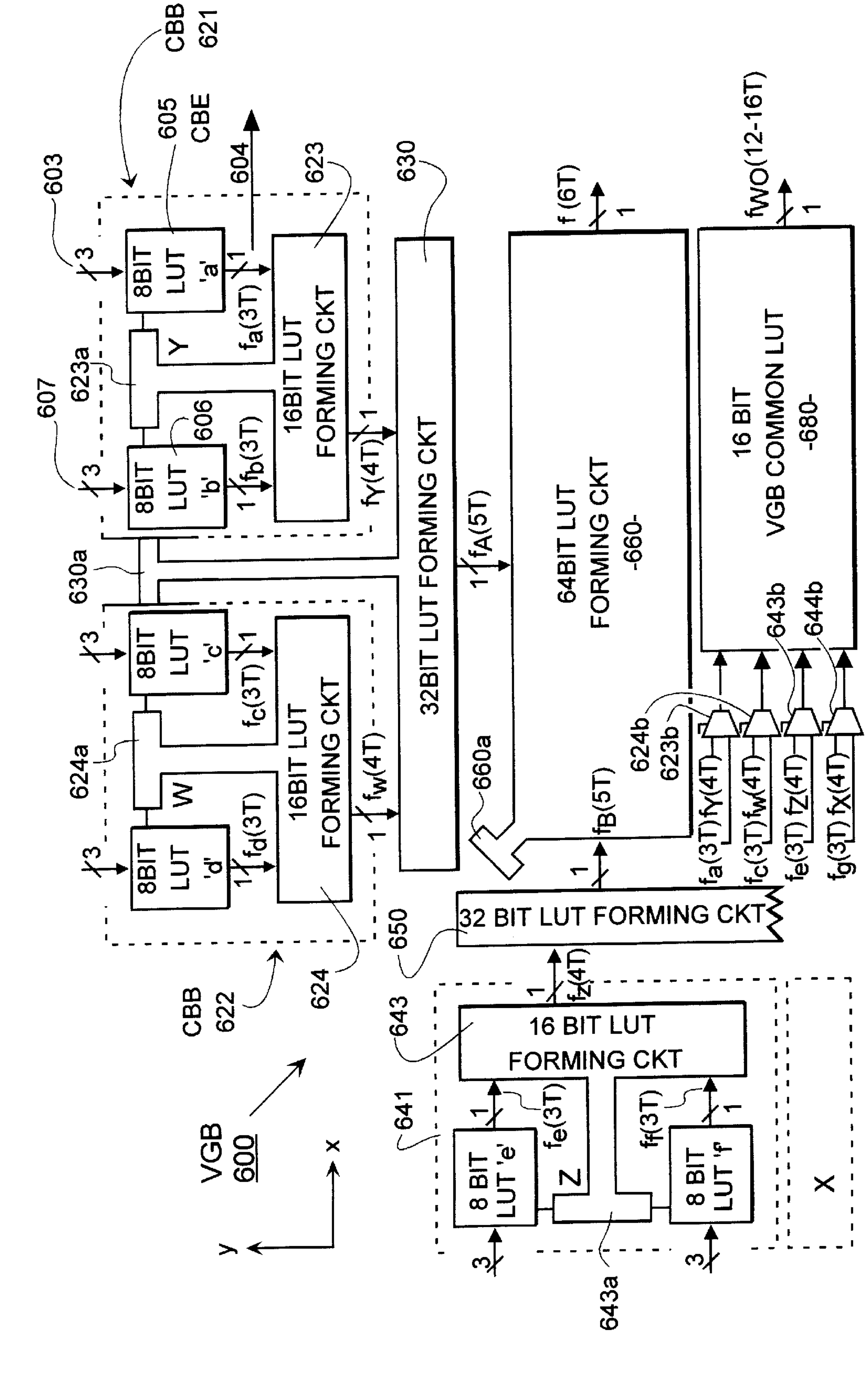
FIG. 6 illustrates how resource folding develops fractally using multiple LUT's of an L-organized, Variable Grain Block (VGB) in accordance with the invention.

Referring to FIG. 6, a more detailed explanation is now given of how progressive function synthesizing may develop from the periphery of a super-VGB 440 towards its core. In this example, smaller LUT's (lookup tables) will be folded together to emulate the behavior of larger LUT's, and the larger LUT's will be further folded, and so forth.

The illustrated VGB 600 includes four Configurable Building Blocks (CBB's). CBB 621 (Y) is shown to contain two 8-bit LUT's, respectively identified as 'a' on the right and 'b' on the left. The designation, '8-bit LUT' means here that there are eight memory cells each programmable by the user of the FPGA. There a three input terms supplied into the 8-bit LUT for selecting one of the $2^3$ memory cells as the value to be output. The output signal of LUT 'a' is denoted as $f_a$(3T). This notation indicates that $f_a$( . . . ) is a function of 3 input terms (3T) . The output signal of LUT 'b' is similarly denoted as $f_b$(3T).

LUT 'a' defines part of a first Configurable Building Element (CBE) 605. The CBE 605 further includes an input term acquiring means 603 for selectively acquiring at least some of its input terms. A more detailed example of such an input term acquiring means is a set of three of the 19-to-one (19:1) input term multiplexers shown in FIG. 5B. Three such 19:1 multiplexers can be used to selectively connect to as many as 57 adjacent interconnect lines (AIL's). In one embodiment, however selective connectivity is provided to 56 AIL's with two of the multiplexers offering redundant connectivity to one of the 56 AIL's. See FIG. 10.

CBE 605 of FIG. 6 is shown to be connectable to an output exporting means 604 for transmitting a result signal $f_a$(3T) derived from its LUT 'a' out of the VGB. A more detailed example of such an output exporting means is the Configurable Sequential Element (CSE) shown in FIG. 5C, to be discussed later.

Figure 5C:
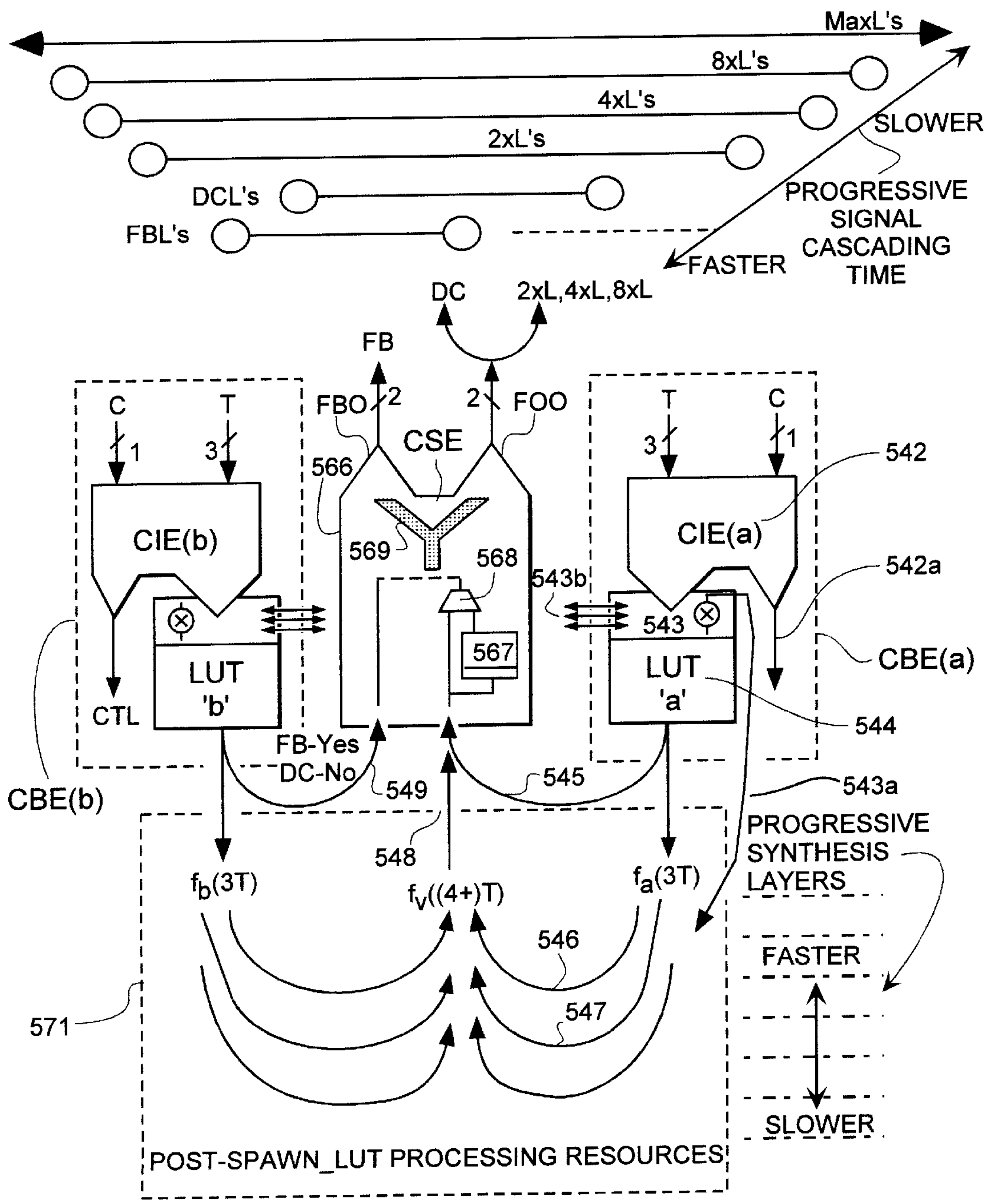
FIG. 5C illustrates selected parts of a CBB, and selected parts of its encompassed pair of CBE's, and schematics for surrounding function synthesizing structures and immediately neighboring interconnect lines.

Further in FIG. 6, the second LUT 'b' is understood to similarly define part of a second CBE 606. The second CBE 606 has its own input term acquisition means 607. However, second CBE 606 is connectable to the output exporting means 604 for transmitting its result signal $f_b$(3T) derived from LUT 'b' out of the VGB. Thus, output exporting means 604 is a resource that is shared by CBE's 605 and 606. FIG. 5C shows one embodiment of such sharing of a Configurable Sequential Element(CSE) between two CBE's.

CBB 622 (W) of FIG. 6 is shown to also have two 8-bit LUT's like those of CBB 621. The LUT's of the W CBB are respectively identified as 'c' on the right and 'd' on the left. The output signal of LUT 'c' is denoted as $f_c$(3T) while the output signal of LUT 'd' is denoted as $f_d$(3T).

A first combining circuit 623 is provided within CBB 621 (Y) for selectively folding together the resources of 8-bit LUT's 'a' and 'b' and thereby allowing the Y CBB to behave as if it contained a 16-bit LUT instead of just two 8-bit LUT's. The output signal of this emulated 16-bit LUT is denoted as $f_Y$(4T).

Similarly, a second combining circuit 624 is provided within CBB 622 (W) for selectively folding the resources of 8-bit LUT's 'c' and 'd' and thereby allowing the W CBB to behave as if it contained a 16-bit LUT. The output signal of this emulated 16-bit LUT is denoted as $f_W$(4T).

Although it is not explicitly shown in FIG. 6—except for the example at 604—each of the LUT output signals, $f_a$(3T), $f_b$(3T), $f_c$(3T) $f_d$(3T) $f_Y$(4T) and $f_W$(4T) may be selectively output from the VGB 600 or such signals may used for feedback purposes within the VGB. VGB local feedback buses such as the L-shaped structure shown at 435 in FIG. 4B allow for high-speed transmission from one CBE/CBB to a next within a same VGB, of the LUT output signals $f_a$(3T)/$f_Y$(4T) produced by each CBE/CBB. FIG. 5C indicates how each CSE can drive the local feedback lines (FBL's) of its respective VGB and also drive adjacent direct connect lines (DCL's) and further drive bidirectional interconnect lines of assorted lengths (2×L's, 4×L's and 8×L's)

that are immediately adjacent to the CSE. Once a CSE sourced signal is placed on the local feedback lines (FBL's) of its VGB, the so-directed signal can be quickly propagated for cascading into a next CBE and/or CBB of the same VGB.

The soon described, other function output signals of FIG. 6, namely: $f_e$(3T), $f_f$(3T) , $f_g$(3T), $f_h$(3T), $f_Z$(4T), $f_X$(4T), $f_A$(5T), $f_B$(5T), f(6T), and $f_{WO}$(12–16T) may also be so selectively output from the VGB for coupling to adjacent FBL's, DCL's, 2×L's, 4×L's and 8×L's.

Each of combining circuits 623 and 624 has a pre-LUT decoding section and a post-LUT processing section. The pre-LUT decoding sections are used to selectively perform a certain amount of input signal decoding which is needed to make the smaller-sized LUT's a/b and c/d combine to behave as larger-sized LUT's. Accordingly, each of combining circuits 623 and 624 is shown to have a respective, pre-LUT decoding section, 623*a* and 624*a*, which extends to intercept and decode the 3 input signals of each CBE. When they are not intercepted, the 3 input bits of each CBE flow into their respective LUT (a, b, c or d) . However, when selectively-activated interception occurs, 3 input terms of one 8-bit LUT in the a/b or c/d pairs are copied as inputs to the other LUT. At the same time, two others of the original 6 input terms that are respectively submitted to the a/b or c/d pair are ignored. The sixth input term is used for selecting the output of one or the other LUT in each of the a/b or c/d pair so that the resultant 16-bit LUT appropriately responds to four of the six (=3+3) original input bits. A circuit for carrying out such a decoding scheme is seen at 1023 of FIG. 10.

The post-LUT processing section of each of combining circuits 623 and 624 includes a multiplexer that receives $f_a$(3T) and $f_b$(3T) {or $f_c$(3T) and $f_d$(3T)} as its inputs and selects one of these for its output in response to the intercepted, sixth input bit. The sixth input bit thereby functions as the most significant address bit of the emulated 4-input LUT in this mode. See FIG. 11A.

The joining together of two 8-bit LUT's to emulate a 16-bit LUT defines a first level of resource folding or function synthesis. At the next level of resource folding, a third combining circuit 630 is provided to combine the operations of the Y CBB 621 and W CBB 622 such that the four 8-bit LUT's of the combined CBB's 621–622 behave as a single, 32-bit LUT. Again, some input decoding is needed to emulate this behavior and hence, the third combining circuit 630 is shown to have a pre-LUT decoding section 630*a* extending up to selectively intercept and manipulate the 12 input bits of LUT's 'a' through 'd'. The post-LUT processing section of combining circuits 630 includes a multiplexer that receives $f_Y$(4T) and $f_W$(4T) as its inputs and selects one of them for its output. The output signal of the emulated 32-bit LUT is denoted as $f_A$(5T).

When the third combining circuit 630 is used to emulate the 32-bit LUT operation, each of the four 8-bit LUT's in the Y-W duet (621–622) is 'consumed' and thus not available at the same time for different duties. This is an example of a folding operation that combines and consumes the available resources along a single leg of the L-organized VGB (the horizontal leg in the instance of the just discussed Y-W duet).

Just as the resources of Y-W duet can be folded to provide operations emulating that of a 32-bit LUT or that of two 16-bit LUT's, the resources of the X and Z CBB's can also be selectively folded together to provide such CBB and paired-CBB's operations.

FIG. 6 shows only the Z CBB 641 including a 16-bit LUT forming circuit 643 coupled to the two 8-bit LUT's, 'e' and 'f' within Z. It is understood that a like-structured, X CBB (partially shown) is placed below the Z CBB in FIG. 6 with similar resources including two 8-bit LUT's, 'g' and 'h'. A 32-bit LUT forming circuit 650 (partially shown) combines the operations of the Z and X CBB's to generate the illustrated five-term function signal, $f_B$(5T).

It should now be understood that each of the 32-bit LUT forming circuits, 630 and 650, fractally repeats the resource folding operations of its respective 16-bit LUT forming circuits. This process of fractal folding is repeated yet again by a 64-bit LUT forming circuit 660 that is provided within each VGB. Circuit 660 can selectively fold together the resources of the Y-W duet and the resources of the X-Z duet to emulate a 64-bit LUT. Again, some input decoding is needed to emulate this behavior and hence, combining circuit 660 is shown to have a pre-LUT decoding section 660*a* extending diagonally out to selectively intercept and manipulate the 24 input bits of LUT's 'a' through 'h'. The post-LUT processing section of combining circuits 660 includes a multiplexer that receives $f_A$(5T) and $f_B$(5T) as its inputs and dynamically selects one of them for its output. The output signal of the emulated 32-bit LUT is denoted as f(6T). This f(6T) signal can be any Boolean function of up to 6 independent input term signals. (When used herein, the phrase 'dynamically select' indicates run-time selection within an operating FPGA as opposed to the static, configuration-time selection that occurs when the configuration memory of a blank FPGA is being configured by FPGA configuring software.)

The 64-bit LUT forming operation of combining circuit 660 constitutes one example of how the resources of each of the legs in the L-organization of a VGB are merged, first leg by leg, and thereafter centrally, to provide more complex levels of functionality.

Merged functionality within each VGB can also include a cascading of outputs from one or more of the peripheral lookup tables 'a' through 'h' to a centrally-located LUT 680. Such an LUT is shown as 16-bit VGB common LUT 680 within VGB 600. A selectable four of the following signals may be fed into the 4 inputs of the 16-bit VGB common LUT 680: $f_a$(3T), $f_c$(3T), $f_e$(3T), $f_g$(3T), $f_Y$(4T), $f_W$(4T), $f_Z$(4T) and $f_X$(4T). In response, the VGB common LUT 680 produces a higher-ordered function signal denoted as $f_{WO}$ (12–16T). The number of input terms that contribute to $f_{WO}$(12–16T) can be as large as 16 terms when the four higher ordered signals, $f_Y$(4T), $f_W$(4T), $f_Z$(4T) and $f_X$(4T) are selected. Signal $f_{WO}$(12–16T) is also referred to herein as the special wide output (WO) signal. Unlike f(6T), the $f_{WO}$ (12–16T) signal can represent only a partial subset of all Boolean functions of the corresponding 12 to 16 input term signals.

In the illustrated embodiment, multiplexer 623*b* selects one of signals $f_a$(3T) and $f_Y$(4T) as a first input for LUT 680. Multiplexer 624*b* selects one of signals $f_c$(3T) and $f_W$(4T) as a second input for LUT 680. Multiplexer 643*b* selects one of signals $f_e$(3T) and $f_Z$(4T) as a third input for LUT 680. Multiplexer 644*b* selects one of signals $f_g$(3T) and $f_X$(4T) as a fourth input for LUT 680. The respective select controls for multiplexers 623*b*, 624*b*, 643*b* and 644*b* can be driven by configuration memory bits (fuses) or by dynamic signals or by both.

In one embodiment, multiplexers 623*b*, 624*b*, 643*b*, 644*b* each define the f(4T) generating multiplexer of respective combining circuits 623, 624, 643 and 644 (the last one understood to be in CBB X which is not shown). In that embodiment, multiplexer 623*b* receives signals $f_a$(3T) and $f_b$(3T) at its inputs instead of the illustrated $f_a$(3T) and $f_Y$(4T). When the select control of 623 is driven by a dynamic signal, the output of 623 corresponds to $f_Y$(4T). When the select control of 623 in that embodiment is instead overriding-wise driven by a fuse (a configuration memory bit), the dynamic signal is blocked and the output of 623 consistently (statically) represents $f_a$(3T). See FIG. 11A. The select controls of remaining multiplexers 624*b*, 643*b* and 644*b* are similarly driven by a combination dynamic signal and fuse in that embodiment.

From the above, it is seen that the VGB 600 of FIG. 6 offers a wide spectrum of output choices spanning from that of outputting many low-termed function signals such as $f_a$(3T) through $f_h$(3T) to that of outputting a high-termed function signal such as f(6T) or $f_{WO}$(12–16T). VGB 600 also offers a wide spectrum of inputting choices because functions of same complexity can be synthesized from input term signals that are acquired either from a first side (north) of VGB 600, or from a second side (west) of VGB 600, or from a combination of input term signals that are acquired from both the first and second sides (NW) of VGB 600.

Figure 5D:
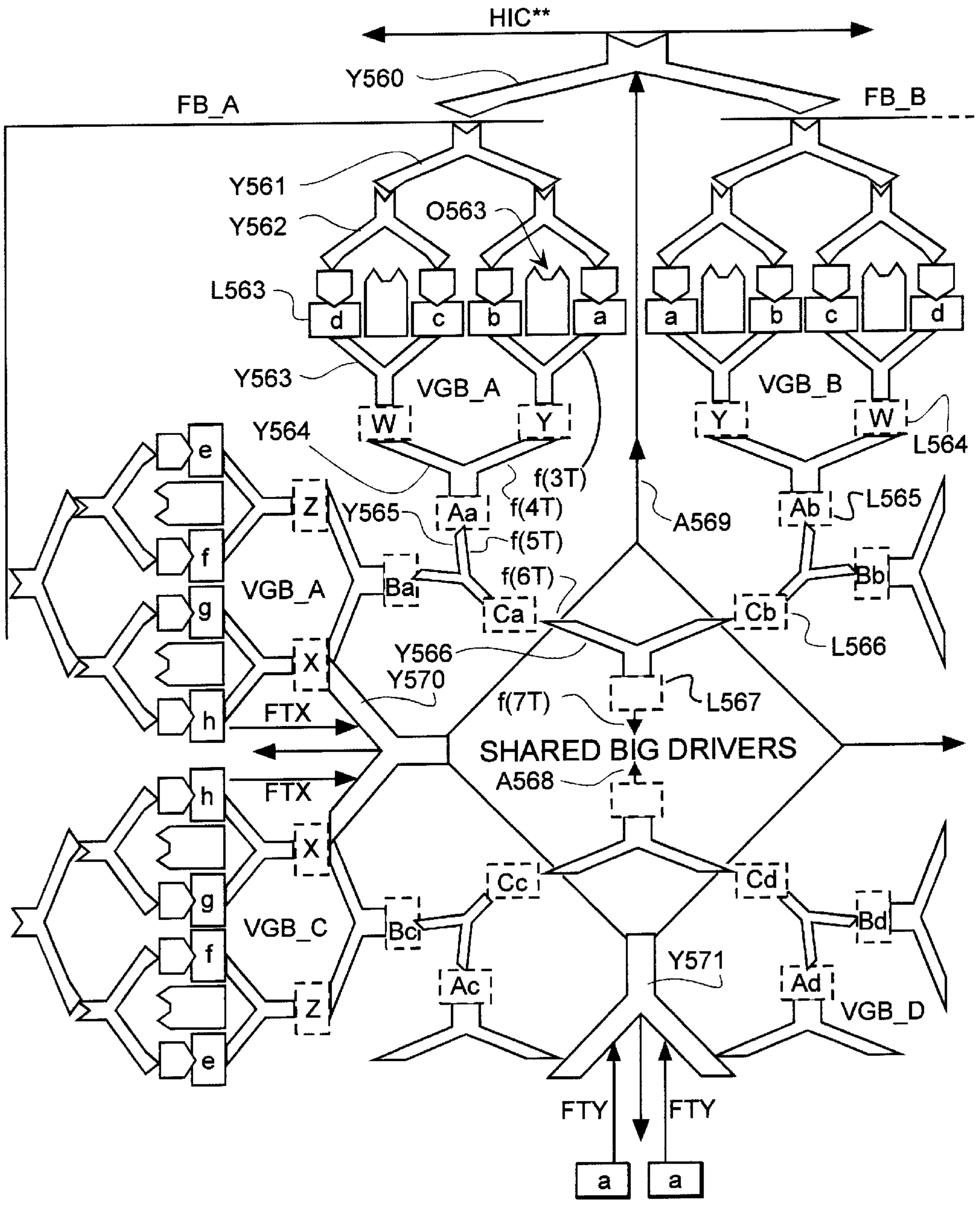
FIG. 5D diagrams at an abstract level, how flexible interconnect routing and resource folding is provided by a super-VGB structure.

The interrelation between the L-shaped organization of each VGB such as 600 and resource folding operations described for FIG. 6 might be now better appreciated by reviewing the process from more abstract levels such as depicted by the schematics of FIGS. 5A and 5D.

Referring first to FIG. 5A, the L-organized, resource folding and result sharing structure is designated as 500A. Linear section 501 represents the horizontal peripheral leg of the L-shaped organization. Linear section 502 represents the vertical peripheral leg of the L-shaped organization. Within section 501, line 501.1 represents a layer of input-term acquiring resources. Line 501.3 represents a layer of function spawning resources (first level LUT's) located on horizontal leg 501. Within section 502, line 502.1 represents a layer of input-term acquiring resources. Line 502.3 represents a layer of function spawning resources (first level LUT's) located on vertical leg 502. Line 512.2 represents a decoding layer that is operatively interposed between layers 501.1 and 501.3 and continues around the corner of the L-shaped organization so as to be further operatively interposed between layers 502.1 and 502.3.

Pattern 503 represents a first, progressive resource folding structure and it is schematically illustrated in the shape of a capital letter, Y. Pattern 503 has a fractally repeating nature. This nature is represented by having each upper stroke of the base capital Y defining an upstanding further capital Y structure, and so on.

Resource folding structure 503 progressively combines the distributed resources found along the horizontal leg 501 in accordance with its illustrated fractal symbol. In other words, the resources of adjacent elemental units (e.g., CBE's) may be selectively folded together at a first, peripheral level of structure 503 when desired during FPGA configuring operations to form second level compounded entities. And the resources of adjacent ones of the second level compounded entities (e.g., CBB's) may be selectively folded together at a second, more progressive or deeper level of structure 503 to form third level compounded entities.

If desired for a larger scaled embodiment (not explicitly shown) where there are 4 or more second level compounded entities (e.g., CBB's) distributed on each leg of a VGB, the resources of linearly adjacent pairs of such third level compounded entities (e.g., paired-CBB's; all being on a same side of the larger scale VGB) may be selectively folded together at a third, yet-more progressive or deeper level of structure 503 to form fourth level compounded entities and so forth.

These progressive foldings of resources by the fractal-Y shaped structure 503 are all 'sided' to the north side leg 501. Stated otherwise, the progressive function synthesizing operations carried out by structure 503 use input term signals acquired essentially from the north side leg 501. This is to be contrasted with the essentially core-centric organization of FIG. 3A where the LUT input set 302 is routable from all four sides of the corresponding CLB structure.

In FIG. 5A, a second resource folding structure is shown at 504 to similarly combine resources from the western vertical leg 502 in a like, fractally repeated manner. The progressive function synthesizing operations carried out by the second structure 504 use input term signals acquired essentially from the west side leg 502. The advantage of having such side-restricted acquisition of input term signals and corresponding function synthesis is speed, compactness (see discussions of FIG. 5C.) and swappability during placement and routing.

It is within the contemplation of the invention to additionally have a Y structure like 503–504 for forming same level function signals but acquiring its input term signals from both of legs 501 and 502. This alternate Y structure (not shown) is less preferred however because it is not necessarily partitionable into equivalently swappable granules. At the lowest level it will have some elemental units (e.g., CBE's) acquiring input term signals from the north and others acquiring input term signals from the west. From the view point of the placement and routing algorithm, these north-sided and west-sided elemental units may not be swappable because certain input term signals may have already been routed exclusively along a particular side (north or west). The FPGA configuring software will not have as many degrees of freedom in choosing placement under such situations.

It is preferable in accordance with the invention to use combinations of input term signals from multiple sides when forming the more complex function signals. Such more complex function signals may require more input term signals than can be acquired from only one side of the VGB. Pattern 506 represents a third resource folding structure which combines the folded resources of structures 503 and 504, and thus inherently combines their differently sided, input acquiring resources. This third resource folding structure 506 is schematically illustrated as a capital Y that aligns with the diagonal of the L-shape defined by legs 501 and 502. Note that at this level, the progressive function synthesizing operations carried out by structure 506 can use input term signals acquired essentially from both the north side leg 501 and the west side leg 502.

Return arcs 507 represent the return back to the peripheral legs 501 and 502 of the synthesis results obtained from the progressive resource foldings carried out by one or more of elements 503, 504 and 506.

A solid quarter arc 508 is further drawn in pattern 500 to schematically represents the VGB's connection and contribution to shared resources of its subsuming super-VGB. The remainder of the super-VGB is represent by the dashed three-quarters arc 509. This indicates that mirror-opposed VGB's are congregated towards the center of the super-VGB (the center of circle 508/509) so as to define a tightly packed aggregate of VGB's. Synthesis of more and more complex function signals advances progressively toward the center of the super-VGB.

Referring back to FIG. 6, it should now be apparent how the resource folding and result sharing pattern 500A of FIG. 5A corresponds to the LUT foldings represented by FIG. 6.

A 2-layer version of element 503 (FIG. 5A) corresponds to elements 623, 624 and 630 (FIG. 6). A 2-layer version of element 504 corresponds to elements 643, 644, and 650 (where 644 is implied, but not shown). Element 506 corresponds to element 660 and/or to element 680. Leg 501 corresponds to LUT's 'a' through 'd' and their respective configurable input elements (CIE's, see FIG. 5C.) Leg 502 corresponds to LUT's 'e' through 'h' (the last two not shown) and their respective CIE's. Element 507 (FIG. 5A) corresponds to the transmission of the synthesized signals $f_A$(5T), $f_B$(5T), f(6T) and $f_{WO}$(12–16T) to the respective CSE's of the CBB's. See FIG. 5C.

Resource combining and result sharing does not have to be limited in application to just the folding together of LUT resources of the various CBE's. Signals acquired by the individual input resources (CIE's—See FIG. 5C) of the CBE's can also be merged for common benefit. For example, in accordance with the invention, control signals may selectively acquired from one or both of the horizontal and vertical interconnect channels by the respectively adjacent CBB's and merged into a VGB-centered, controls developing section 550 (FIG. 5B). The peripherally-acquired, and centrally merged control signals can thereafter be returned to the VGB periphery for use by individual CBB's. This controls developing process is now explored with reference to FIG. 5B and FIG. 7.

FIG. 5B shows various details of a first Variable Grain Block 500B (also referred to as VGB_A) at a more microscopic viewing level than that of FIG. 4B. It is understood that the other VGB's, namely, _B, _C and _D of each super-VGB have similar resources arranged in respective mirror-opposed symmetry with those of the illustrated VGB_A.

The common controls developing section 550 collects a first plurality of control signals 511, 521, 531 and 541 from respective CBB's 510 (X), 520 (Z), 530 (W), and 540 (Y). These control signals are acquired by way of respective, controls input multiplexers (14:1 Ctrl) of the respective CBB's X,Z,W,Y. There are two such controls input multiplexers (14:1 Ctrl) dedicated to each CBB. Each pair of controls input multiplexers may be considered part of the CBB to which they are dedicated as are the dedicated direct-connect (DC) drive amplifier, the 2/4/8×L drive amplifier, and the six 19:1 terms input multiplexers (19:1 Term) of each CBB. In FIG. 5C, each CIE such as 542 is shown to be responsible for acquiring one control signal and 3 input term signals from the adjacent interconnect and/or VGB intraconnect resources.

The common controls developing section 550 of FIG. 5B further collects a second plurality of control signals 555 directly from the adjacent horizontal and vertical interconnect channels (HIC and VIC) without using the signal selecting resources of the surrounding CBB's. Signals 555 include GR, CLK0, CLK1, CLK2 and CLK3. CLK0 and CLK1 are clock signals that come directly off the vertical interconnect channel. CLK2 and CLK3 are clock signals that come directly off the horizontal interconnect channel. GR is a Global Rest signal that is universally available to all VGB's and therefore has no directional constraints. It is accordingly shown as coming in diagonally into the VGB. Such diagonal disbursement of the GR signal is not generally the best way to distribute GR. It can be alternatively carried in one or both of the vertical or horizontal interconnect channels. In one embodiment, the GR signal is carried by a dedicated GR longline provided in each of the VIC's.

Common controls developing section 550 processes the collected signals 511, 521, 531, 541, and 555, and then returns corresponding common control signals back to the CBB's as indicated by return paths 551 through 554. In one embodiment, individual return paths 551–554 are replaced by a common return bus that transmits the same returned control signals to all the CBB's of the VGB 500B.

Common controls developing section 550 of VGB_A also produces a 'for-sharing' dynamic control signal 558 (DyOE_A) which signal is forwarded to the super-VGB's shared logic section 580. A portion of this shared logic section 580 is seen in FIG. 5B. It is understood that the common controls sections of the other VGB's within the subsuming super-VGB, namely VGB's: _B, _C, and _D, respectively supply additional for-sharing, dynamic control signals DyOE_B, DyOE_C and DyOE_D (not shown) to shared logic section 580.

Each CBB also directs at least one of its respective output signals to shared logic section 580. Line 548 which feeds signal Yz_A to 580 is an example. It is understood that the remaining CBB's, namely, X, Z, and W of the same VGB_A respectively feed signals Xz_A, Zz_A, and Wz_A to 580. It is further understood that the CBB's of the other VGB's within the subsuming super-VGB, namely VGB's: _B, _C, and _D, respectively supply additional signals of like designations, Xz_J, Zz_J, Wz_J, and Yz_J to their respective sections 580, where _J designates here the respective one of VGB's _B, _C, and _D.

The designation 'DyOE' for signals such as 558 is intended to imply here that such a signal performs an output enabling function and that such a signal additionally performs a dynamic selection function as will be seen later. The designation 'Yz_A' for signals such as 548 is intended to imply here that such a signal may be output by a tri-state amplifier (or another like device having a high-Z/ high output-impedance state) such as the illustrated quartet of northern HIC-driving amplifiers 591 and/or such as the illustrated quartet of western VIC-driving amplifiers 592.

Selected ones of the Xz_J, Zz_J, Wz_J, and Yz_J signals may be routed to respective ones of input terminals (e.g., 581 and 584) of the longline driving amplifiers 591 through 594. At the same time, selected ones of the DyOE signals may be routed to respective ones of the output-enable control terminals (e.g., 582 and 583) of the longline driving amplifiers 591 through 594. Shared resources 591 through 594 may thus be used by any of the CBB's for outputting a result signal onto VGB-adjacent longlines. Although FIG. 5B only shows the connections of the respective northern quartet 591 and western quartet 592 of driving amplifiers to the north HIC and west VIC, it is understood that the southern quartet 593 and eastern quartet 594 of driving amplifiers similarly connect to a respectively adjacent, south HIC and east VIC.

Figure 7A:
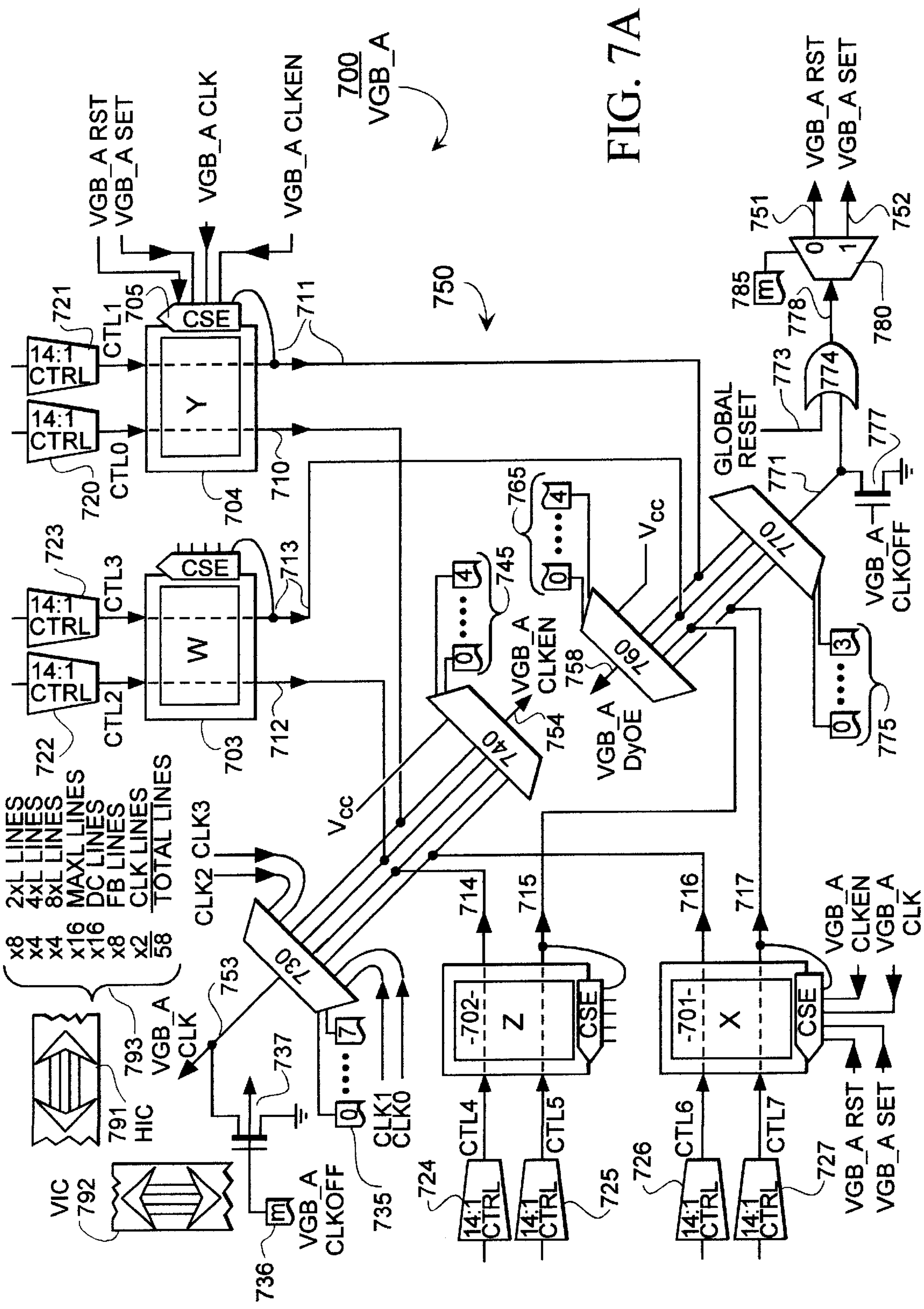
FIG. 7A illustrates a first way in which resource sharing and sharing of common results may be carried out for control signals acquired through sides of an L-organized, VGB in accordance with the invention.

Referring to FIG. 7A, a more detailed view of one embodiment of the common controls developing section 550 for VGB_A is shown. In this embodiment 750, the returned control signals include a VGB_A RST (reset) signal 751, a VGB_A SET signal 752, a VGB_A CLK (clock) signal 753 and a VGB_A CLK_EN (clock enable) signal 754. These returned control signals 751–754 are returned to the Configurable Sequential Elements (CSE's) of each CBB within the corresponding VGB. One such CSE is shown at 705 as part of the Y CBB 704 with the VGB_A RST, VGB_A SET, VGB_A CLK, and VGB_A CLK_EN signals being fed to it. The CSE's of the remaining CBB's 701(X), 702(Z) and 703(W) are understood to receive the same returned control signals 751–754.

In addition to the returned common control signals 751–754, each CSE receives a local control signal from its own CBB. Thus, CSE 705 receives local control signal 711 (which is alternatively denoted as CTL1) from its corresponding Y CBB 704. The CSE of the W CBB 703 similarly receives a local control signal 713 (CTL3). The CSE of the Z CBB 702 similarly receives a local control signal 715 (CTL5). The CSE of X CBB 701 similarly receives a local control signal 717 (CTL7).

Other locally-acquired control signals of the CBB's 701–704 are respectively shown at 716, 714, 712 and 710. These locally-acquired control signals 710–717 are each obtained from locally-adjacent interconnect lines by means of a control-signal acquiring resource (CIE) of the respective CBB. CBB Y (704), for example, is seen to have two 14-to-1 control-acquiring multiplexers 720 and 721. Multiplexers 720 and 721 cross with the locally-adjacent horizontal interconnect channel (HIC) 791 in a partially populating manner. See FIG. 10.

By 'partially populating', it is meant here that HIC 791 contains more interconnect lines than are connected to by any one of multiplexers 720 and 721. Each of multiplexers 720 and 721 contains a unique subset of programmable-interconnect-points (PIP's) that form a partially-filled crossbar with HIC 791 rather than a fully-populated crossbar with HIC 791. Use of such partially-populated crossbars in place of fully-populated crossbars is known in the art. The advantage is reduced capacitive loading on the interconnect lines. The disadvantage is reduced flexibility in choosing which interconnect lines (of HIC 791) will serve as a source for an acquired control signal.

In the illustrated example, HIC 791 (the horizontal interconnect channel) contains the following resources: eight double-length (2×L) lines, four quad-length (4×L) lines, four octal-length (8×L) lines, sixteen full-length (MaxL) lines, sixteen direct-connect (DC) lines, eight feedback (FB) lines and two dedicated clock (CLK) lines. This total of 58 lines is summarized at 793 in FIG. 7A.

From among these 58 lines, the two dedicated clock (CLK) lines do not participate in the partially populating scheme of each of multiplexers 720 and 721 or in the partially populating scheme of each of the linearly adjacent, multiplexers 722 and 723. The remaining 56 HIC lines may be subdivided into four unique subsets of 14 lines each (4×14=56). In accordance with the invention, each of control-acquiring multiplexers 720–723 has its respective 14 inputs (MIP's) connected to a respective one of the four unique subsets of lines. Thus, a control signal may be acquired from any one of the locally-adjacent 56 HIC lines by at least one of the adjacent four multiplexers 720–723.

The adjacent vertical interconnect channel (VIC) 792 contains a same mix of interconnect resources (although not the same lines) and further carries the global reset (GR) line. Except for this GR line and the two dedicated CLK lines, the remaining 56 lines of VIC 792 may be subdivided into four unique subsets of 14 lines each. And in accordance with the invention, each of control-acquiring multiplexers 724–727 has its respective 14 inputs (MIP's) connected to a respective one of the four unique subsets of VIC lines. Thus, a control signal may be acquired from any one of the locally-adjacent 56 VIC lines by at least one of the adjacent four multiplexers 724–727. However, it should be understood that once one of four multiplexers 724–727 is consumed for acquiring a first control signal from its unique subset of VIC lines, connection to the remaining lines of that unique subset via that consumed multiplexer is no longer possible.

Figure 10:
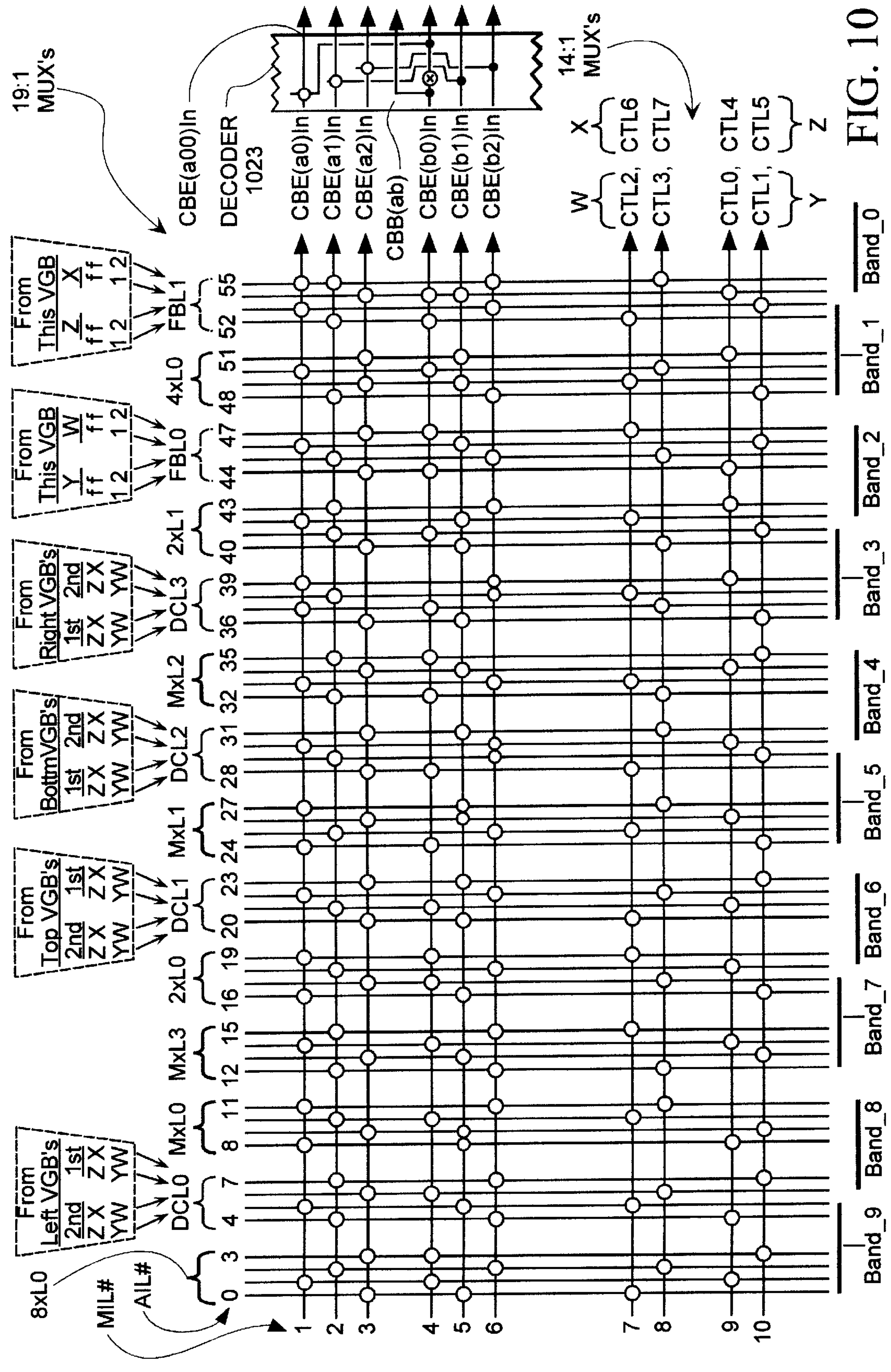
FIG. 10 illustrates a partial-populating scheme for the input-term and control-signal acquiring multiplexers of the respective X, Z, W, Y Configurable Building Blocks.

FIG. 10 illustrates one partial-populating scheme in accordance with the invention for the 56 lines of each HIC or VIC. It is within the contemplation of the invention to use other partial populating patterns. It is also within the contemplation of the invention to have overlap between acquirable line sets by using control acquiring multiplexers with more MIP's if desired, but of course that also increases space utilization within the integrated circuit.

Because each of the control-signal acquiring multiplexers 720 through 727 (FIG. 7A) is capable of acquiring control signals from a unique subset of lines in respective one or the other of HIC 791 and VIC 792, the combination of multiplexers 720 through 727 can acquire control signals from an even larger unique subset of adjacent interconnect lines (AIL's). In accordance with the invention, the control-signal acquiring capabilities of all the peripheral multiplexers 720–727 are made common to the VGB 700.

As such, it is seen that a resource-merging multiplexer 730 is provided in section 750 with eight inputs for respectively receiving the following signals: 714 and 716 (respectively from multiplexers 724 and 726 of the Z and X CBB's), 710 and 712 (respectively from multiplexers 720 and 722 of the Y and W CBB's), CLK0 and CLK1 (directly from VIC 792), and CLK2 and CLK3 (directly from HIC 791). Multiplexer 730 may output a selected one of these eight inputs onto the VGB_A CLK line 753. Alternatively, line 753 may be pulled low by N-channel transistor 737. The gate of transistor 737 is driven by configuration memory bit 736. Signal 736 (VGB_A CLKOFF) is also applied to the gate of a later-described, second transistor 777.

The eight inputs of multiplexer 730 may be independently selected or not in accordance with the setting of eight corresponding configuration memory bits 0 through 7, which bits are indicated at 735. (A multiplexer with such capabilities is shown in FIG. 3C at 375. Line 0 floats if no PIP is activated.) The logic levels on line 753 define the VGB_A CLK signal that is commonly applied to the CSE's of the corresponding VGB_A. When line 753 is pulled low by transistor 737, corresponding flip-flops (not shown) in each of the CSE's (e.g., 705) are blocked from changing state.

A second resource-merging multiplexer 740 is provided in section 750 for also receiving control signals 710 (CTL0), 712 (CTL2), 714 (CTL4) and 716 (CTL6). Multiplexer 740 has a fifth input which receives the Vcc signal (logic 1). Five configuration memory bits 745 may be respectively used to designate which of the inputs of multiplexer 740 will appear on its output line 754 (VGB_A CLKEN_). When line 754 is high (at Vcc), the commonly controlled flip-flops in the CSE's of VGB_A are enabled to respond to the clock signal on line 753.

A third resource-merging multiplexer 770 of section 750 has four input terminals respectively connected to receive the following control signals: 711 (CTL1 from multiplexer 721), 713 (CTL3 from multiplexer 723), 715 (CTL5 from multiplexer 725) and 717 (CTL7 from multiplexer 727). Four configuration memory bits 775 may be respectively used for causing one or none of the four inputs to appear on output line 771. N-channel transistor 777 is further coupled to line 771 for driving line 771 low (to logic 0) when the VGB_A CLKOFF memory bit 736 is high.

Line 771 connects to a first input of OR gate 774. A second input of OR gate 774 receives the global reset signal (GR) by way of line 773. The output of OR gate 774 is applied to an input 778 of de-multiplexer 780. Configuration memory bit 785 controls de-multiplexer 780. If memory bit 785 is in the logic zero state, the dynamic signal on output line 778 appears on output line 751 of the de-multiplexer 780 while output line 752 remains in the inactive, default state (no SET). Conversely, if memory bit 785 is in the logic 1 state, the dynamic signal on output line 778 is transferred to output line 752 (VGB_A SET) while line 751 remains in the inactive, default state (no RESET).

De-multiplexer 780 therefore enables either of the global reset (GR) signal on line 773 or the local reset signal on line 771 to be programmably directed to act as a set or reset signal for the commonly controlled flip-flops (not shown) of all the CSE's in VGB_A 700. The CLKOFF configuration bit 736 can be used to block the local reset signal from appearing on line 771.

A fourth resource-merging multiplexer 760 is provided within section 750 for receiving the following input signals: 711 (CTL1) , 713 (CTL3), 715 (CTL5) and 717 (CTL7) . Multiplexer 760 additionally receives the Vcc level at a fifth input. Five configuration memory bits 765 determine which, if any, of the five inputs of multiplexer 760 will appear on output line 758 (VGB_A DyOE). The VGB_A DyOE signal 758 is supplied to the shared logic section 580 of the VGB as indicated by 558 in FIG. 5B.

Figure 7B:
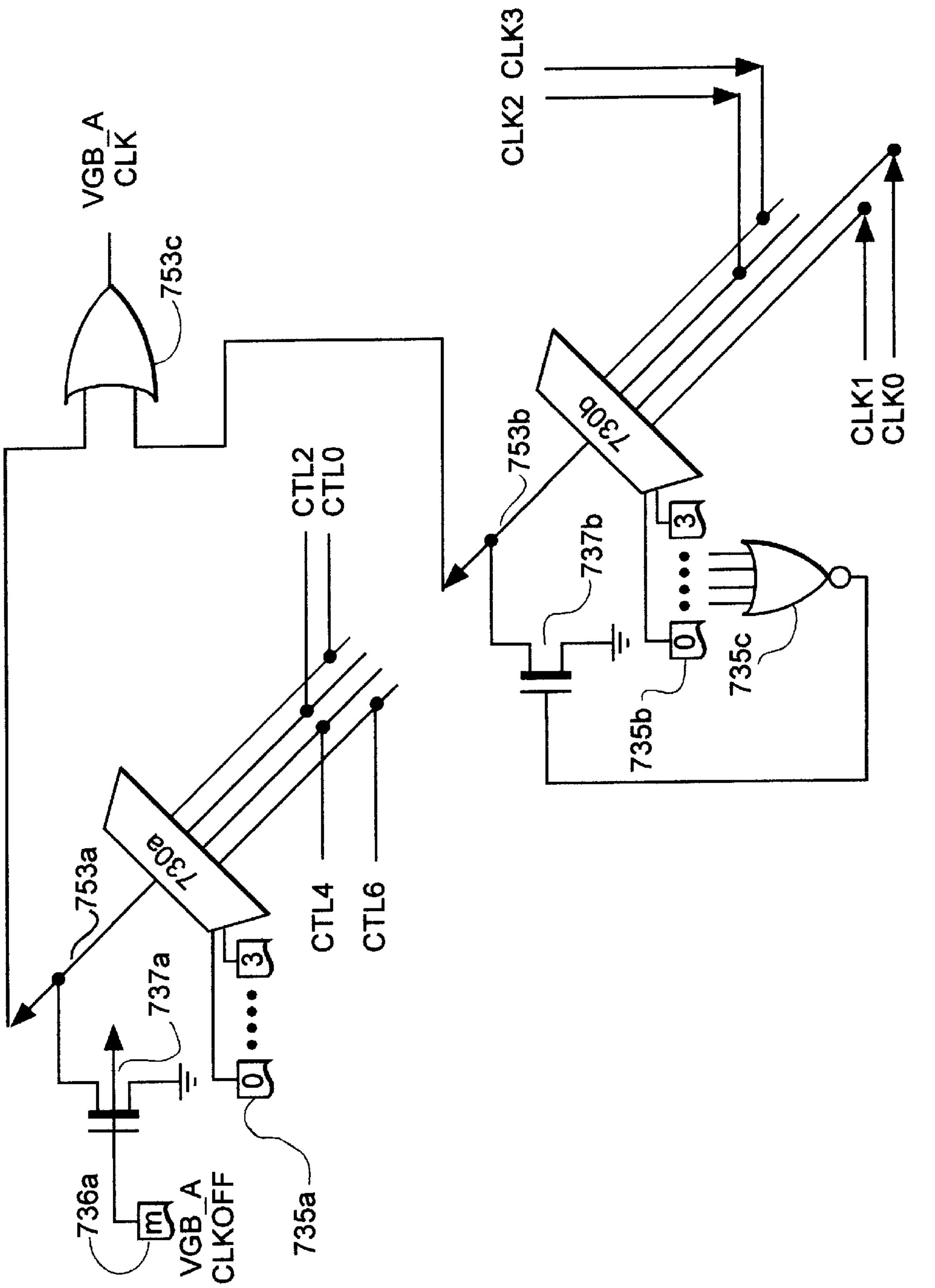
FIG. 7B illustrates an alternate second way in which a common clock signal may be generated.

Referring to FIG. 7B, a alternate circuit for generating the VGB_A CLK signal is shown. Two 4-input multiplexers are provided as indicated at 730*a* and 730*b* respectively for selecting one of signals CTL0, CTL2, CTL4, CTL6; and for selecting one of signals CLK0, CLK1, CLK2, CLK3 in accordance with respective configuration of configuration memory bits 735*a* (4 bits) and 735*b* (4 bits. If all of memory bits 735*b* are set to logic 0, NOR gate 735*c* outputs a logic 1 to pull down transistor 737*b* so as to bring line 753*b* low. Line 753*b* drives one input of OR gate 753*c* while line 753*a* drives another. The output of OR gate 753*c* provides the VGB_A CLK signal. Elements 736*a* and 737*a* perform essentially the same functions as like elements 736 and 737 in FIG. 7A. The difference in FIG. 7B is that activation of the CLKOFF bit 736*a* does not block use of one of signals CLK0, CLK1, CLK2, CLK3 for generating the VGB_A CLK signal.

Returning to FIG. 5A, it is seen that this abstract depiction can also apply to the merging of peripherally-acquired control signals into a VGB-centralized section such as common control section 550 (FIG. 5B). The merging of signal-acquiring capabilities such as those of the peripheral, control-acquiring multiplexers 720–727 can occur along a single leg (501 or 502) of the L-organization as well as along both legs. FPGA configuring software can use this symmetric granularity to equivalently place a control-supplying line on either side of a given VGB and to use the control-acquiring resource of a corresponding one of CBB's X, Z, W, and Y to deliver a needed control signal (e.g., CLKEN) to a specific CSE. At the same time the FPGA configuring software can make use of the following respective control signals: CTL1, CTL3, CTL5, CTL7; which signals are individually coupled to the CSE's (e.g., 705) of the respective X, Z, W, and Y CBB's for use therein. Although in one embodiment, the individually coupled control signals (CTL1, CTL3, CTL5, CTL7) are usable only as alternative clock enable controls (in place of the VGB common, CLKEN signal 754), it is within the contemplation of the invention that individually coupled control signals may be used as alternatives for others of the commonly-produced control signals (751–754).

Returning to FIG. 5C, there are further consequences that follow from the provision of function spawning resources (e.g., CBE's) at the periphery of the L-organized section of each VGB and from the progressive synthesis of more complex functions as one moves deeper into the VGB. More specifically, the signal propagation times that are associated with the steps of: (a) acquiring input-term signals from a first subset of interconnect lines, (b) passing the acquired signals through one or more LUT's, and (c) returning LUT-derived result signals to other interconnect lines, can vary depending on how much routing or other processing occurs before an input term is delivered to an LUT and how much further routing or other processing occurs after the LUT produces its result.

In FIG. 5C, the delay of input-term acquisition for a first CBE(a) is represented by CIE section 542. The delay of pre-LUT decoding is represented by section 543. (Section 543 includes a POP for blocking an intercepted input term signal 543*a* and forwarding that intercepted signal 543*a* to deeper synthesis layers. Section 543 further includes an inputs sharing means 543 which allows sharing of acquired input term signals between CBE's. These items are shown in FIG. 10.)

The delay of passing acquired input term signals through the respective LUT 'a' is represented by section 544 of FIG. 5C. Path 545 represents the quickest return path for directing the LUT's immediate-result signal $f_a(3T)$ back to a corresponding Configurable Sequential Element (CSE) 566.

Within the CSE 566, the signal carried by path 545 can then flow through a CSE-internal flip flop 567 or it can bypass the flip flop by way of multiplexer 568. The output of multiplexer 568 splits as indicated by Y-structure 569 for output to two feedback lines (FBL's) or for feedout (FOO) to a direct connect (DC) line or for feedout to assorted other interconnect resources (the 2×L, 4×L and 8×L lines).

FIG. 5C shows the immediately-adjacent interconnect and VGB-intraconnect resources arranged hierarchically according to relative transmission speeds. The generally fastest and/or shortest types of lines are drawn closest to the output ports (FBO/FOO) of the Configurable Sequential Element (CSE) while the generally slower and/or longer types of lines are drawn progressively further away. It is to be understood that signal transmission speed can be a function of drive power as well as line loading. Thus, the mere fact that a particular interconnect line is shorter than another does not guarantee that the first will allow signals to get to their intended destinations faster than the second.

As seen in FIG. 5C, the VGB's local feedback lines (FBL's) typically define the shortest and least capacitively loaded interconnect lines by way of which a result signal derived from one of the CBE's and/or CBB's can be cascaded to another CBE and/or CBB of the same Variable Grain Block. Because they generally have the lowest capacitive loading, the VGB's local feedback lines (FBL's) may be driven by a low fan-out output port of the CSE. This output port is designated as FBO. If speed is important, an LUT result signal may be cascaded via path 545 to a next such LUT (in the same VGB) by way of the FBO output port and by way of the corresponding, local feedback lines (FBL's) of the VGB.

The so-called direct connect lines (DCL's) are generally longer and/or more capacitively loaded than the FBL's. At the same time, the DCL's are generally shorter and/or less capacitively loaded than other interconnect lines such as the illustrated 2×L lines, 4×L lines and 8×L lines. Because of this, a separate, appropriately-powered, line driving amplifier (see DC Drive in FIG. 5B) is provided within the feedout output port (FOO) for driving the DCL's. If the LUT result signal of short path 545 has to reach a point outside the local VGB but within reach of an immediately adjacent DCL, such forwarding of the signal via the DCL's is preferred when speed is of the essence. In one embodiment, each DC Drive amplifier is tuned so that CBE to CBE delay is essentially the same when routed either by way of the feedback lines (FBL's) or by way of the direct connect lines (DCL's).

The so-called bidirectional general interconnect lines in the 2×L through 8×L categories are generally shorter and/or less capacitively loaded than the MaxL lines. Because of this, a separate, appropriately-powered, line drive amplifier (see 2/4/8×L Drive in FIG. 5B) is provided within the feedout output port (FOO) for driving the 2×L through 8×L categories of immediately adjacent lines. Each 2/4/8×L Drive amplifier is differently powered than a corresponding one of the DC Drive amplifiers.

The FPGA's maximum-length longlines or MaxL lines are the longest, and therefor generally most capacitively loaded of the interconnect lines. Because of this, separate, appropriately-powered, line drive amplifiers (see 591–594 in FIG. 5B) are provided within the shared core of the super-VGB for driving the MaxL lines category of immediately adjacent lines. Each MaxL Drive amplifier is generally more powerful than a corresponding one of the 2/4/8×L Drive amplifiers.

FIG. 5C also shows the relative delay time of the progressive function synthesizing layers within the VGB. As indicated, the fastest turn around time is generally realized by routing the LUT's immediate-result signal $f_a(3T)$ immediately to the CSE 566 via path 545. If the LUT's immediate-result signal $f_a(3T)$ is to be further compounded with result signals derived from other LUT's in a post-LUT processing section 571, then the return of the correspondingly synthesized result signal, $f_v((4+)T)$ by way of path 548 can take longer.

Signal $f_v((4+)T)$ represents any one of earlier discussed, progressively synthesized signals such as $f_Y(4T)$, or $f_A(5T)$ or f(6T) or $f_{WO}(12–16T)$. The delay associated with the first level of post-LUT synthesis is represented by 546. The greater delay associated with more progressive levels of synthesis is represented by 547. The $f_v((4+)T)$ signal returned by path 548 can then flow through the CSE's flip flop 567 or bypass the flip flop by way of multiplexer 568 to reach output fanout section 569. Output fanout section 569 then forwards the synthesis result signal (545–547,549) for output from the CBB. The choice of subsequent forwarding lines (FBL's, DCL's, 2×L's, 4×L's, 8×L's, or MaxL's) that are used to further carry the signal forwarded by fanout section 569 is dependent on the progressive time delay factors described above for the $f_a(3T)$ signal.

In the particular embodiment of FIG. 5C, the 'b' CBE is not fully equivalent to the 'a' CBE. The fastest return path 549 of CBE(b) bypasses elements 567 and 568, goes directly to output structure 569. Signals returned by path 549 of this embodiment cannot feedout to a direct connect (DC) line although they can connect to an FB line or to one of the 2×L through 8×L lines.

It is within the contemplation of the invention however to alternatively have an arrangement wherein CBE(a) and CBE(b) do have identical access to all the output sequencing resources of the Configurable Sequential Element (566). See for example, FIG. 14E. In such alternative embodiments, a second flip flop such as 567 and a second bypass multiplexer such as 568 are provided for servicing CBE(b). The trade-off, of course is increased area utilization within the integrated circuit, which could lead to larger sized dies, and possibly lower yields in mass production.

Although not shown in FIG. 5C, signals returned by either of the 'a' or 'b' LUT's on respective paths 545, 549 or the $f_v((4+)T)$ signal of path 548 can be fed to the longest length interconnect lines (MaxL lines) via the super-VGB shared drives. See FIG. 17A.

FIG. 5D shows in the abstract how resource folding within each VGB meshes with symmetrical routability of input terms via the adjacent interconnect resources.

Layer L563 represents the function spawning periphery of a super-VGB, which as indicated contains respective CBE entities, 'a', 'b', 'c', and 'd' for VGB_A and is understood to contain like CBE's of the other VGB's. Each immediately successive Y-shaped icon, such as Y563 represents the next-progressive synthesis operation in which result signals of a higher layer are compounded. Thus, in operation Y563, first level signals such as $f_a(3T)$ and $f_b(3T)$ are folded together or compounded to form the next level of more complex function signals such as $f_Y(4T)$.

Layer L564 represents the next more complex level of foldable resources within the super-VGB structure, namely, the X, Z, W, and Y CBB's. Each respective CBB J of these can produce a corresponding, function signal $f_J(4T)$, where J represents here the respective one of X, Z, W, and Y. Synthesis operation layer Y564 merges the $f_J(4T)$ function signals into next, folded-entity layer: L565. Entity layer L565 contains sets of paired-CBB's such as Aa and Ba of VGB_A, or Ab and Bb of VGB_B.

The next progressive, synthesis operation layer Y565 merges the $f_K(5T)$ function signals into the next folded-entity layer L566, where K corresponds to Aa, Ba, etc. Entity layer L566 contains sets of quadrupled-CBB's such as Ca of VGB_A, or Cb of VGB_B.

The next progressive, synthesis operation layer, Y566 merges the $f_L(6T)$ function signals into a next folded-entity layer, L567. Here, L corresponds to Ca, Cb, etc. Entity layer L567 contains sets of octupled-CBB's such as Dab and Dcd.

The illustrated folding together of the northwest VGB_A and the northeast VGB_B to form entity Dab is one possible way of compounding VGB's. In an alternate embodiment, the Y566 synthesis operation layer instead merges the northwest VGB_A with the southeast VGB_D to form a corresponding, next-level entity Dad (not shown). The Y566 synthesis layer of this alternate embodiment (not shown) further merges the northeast VGB_B with the southwest VGB_C to form a corresponding, next-level entity Dbc (not shown). The alternate formation of Dad and Dbc was not shown because it was pictorially more convenient and more intuitively instructive to show icon Y566 as an upstanding Y that delivers its synthesis results into the shared center of the super-VGB.

The alternate embodiment uses such diagonal folding together of VGB resources in order to bring into the equation of formed entity Dad (not shown) the northwestern signal acquiring resources of VGB_A and the southeastern signal acquiring resources of VGB_D. Formed entity Dad (not shown) can thereby produce its corresponding function signal $f_{Dad}(7T)$ from input term signals acquired from the north and south HIC's as well as from the east and west VIC's that surround the super-VGB.

Diagonal folding similarly brings into the equation of formed entity Dbc (not shown) the northeastern signal acquiring resources of VGB_B and the southwestern signal acquiring resources of VGB_C. Formed entity Dbc (not shown) can thereby also produce its corresponding function signal $f_{Dbc}(7T)$ from input term signals acquired from the north and south HIC's and the east and west VIC's that surround the super-VGB. Each of function signals $f_{Dad}(7T)$ and $f_{Dbc}(7T)$ corresponds to the output of a 128-bit LUT given that $2^7=128$.

Although not shown in FIG. 5D, it is within the contemplation of the invention to fold together the synthesis results of level L567 so as to form a yet more complex function signal, $f_{Eabcd}(8T)$ which function signal (not shown) corresponds to the output of a 256-bit LUT. It is also within the contemplation of the invention to have more than four VGB-like wedges in a super-VGB-like structure (say for example 8 wedges such as in FIG. 4D) and to continue progressive synthesis along the pattern set forth above so as to form yet more complex function signals such as f(9T).

FIG. 5D further shows in the abstract how synthesis results may be directed towards a shared big drives area A568, where area A568 is centrally located within the super-VGB structure. The shared big drives of area A568 includes MaxL line driving amplifiers such 591–594 of FIG. 5B. The connection of the big drive outputs to the surrounding VIC's and HIC's (interconnect channels) is denoted by for example, arrowed line A569.

It is understood that function spawning layer L563 includes a shared Configurable Sequential Element (CSE) for each pair of CBE's and that these CSE's (represented by icons such as that at O563) output their respective signals to the adjacent interconnect lines.

Aside from the folding together of elements inside each VGB, it is possible to fold together elements of adjacent VGB's. The Y-shaped icon that is labeled Y570 represents one such folding of the X resources of VGB_A and VGB_C. Dynamic output enable lines such as DyOE 558 of FIG. 5B may be used for this inter-VGB folding. See also FIGS. 13 and 17A. The Y-shaped icon that is labeled Y571 represents another such folding of the Y resources of VGB_C and VGB_D.

Additionally, so-called, FTX feedthrough lines from the ‘h’ CBE's of VGB's A and C may be fed through to directly drive the shared big drivers of each super-VGB. So-called, FTY feedthrough lines from the ‘a’ CBE's of the adjacent A and B VGB's may also be used for such feed through to directly drive the shared big drivers of each super-VGB as will be seen when feedthrough lines are detailed below. See items FTY1-Y2, FTX4-X5 of FIG. 12A and the same items in FIGS. 17A–17B.

Icon Y562, which is drawn above layer L563, represents the ability of FPGA configuring software to route input term signals with essential equivalency to either one of the two CBE's in each Configurable Building Block (e.g., to CBE(c) or to CBE(d)) and to thereby have the freedom of placing an f(≦3T) circuit chunk in either CBE of a given CBB.

Similarly, icon Y561 represents the ability of FPGA configuring software to route input term signals with essential equivalency to either one of the two CBB's in each leg of a given VGB. The FPGA configuring software thereby have the freedom of placing an f(≦4T) circuit chunk in either CBB of a given leg of a given VGB.

The L-organized feedback lines of each VGB, such as the illustrated FB_A of VGB_A, may be used by the FPGA configuring software to route input term signals with essential equivalency to either one of the two legs of each L-organized VGB.

Icon Y560, which is drawn above FB_A and FB_B, represents the ability of FPGA configuring software to route input term signals with essential equivalency to either one of the two VGB's that side a given interconnect line within a given super-VGB. The symbol HIC** is understood to be representative of adjacent horizontal interconnect lines when north or south sides of a super-VGB structure are involved and to be representative of adjacent vertical interconnect lines when east or west sides of a super-VGB structure are involved.

Figure 8:
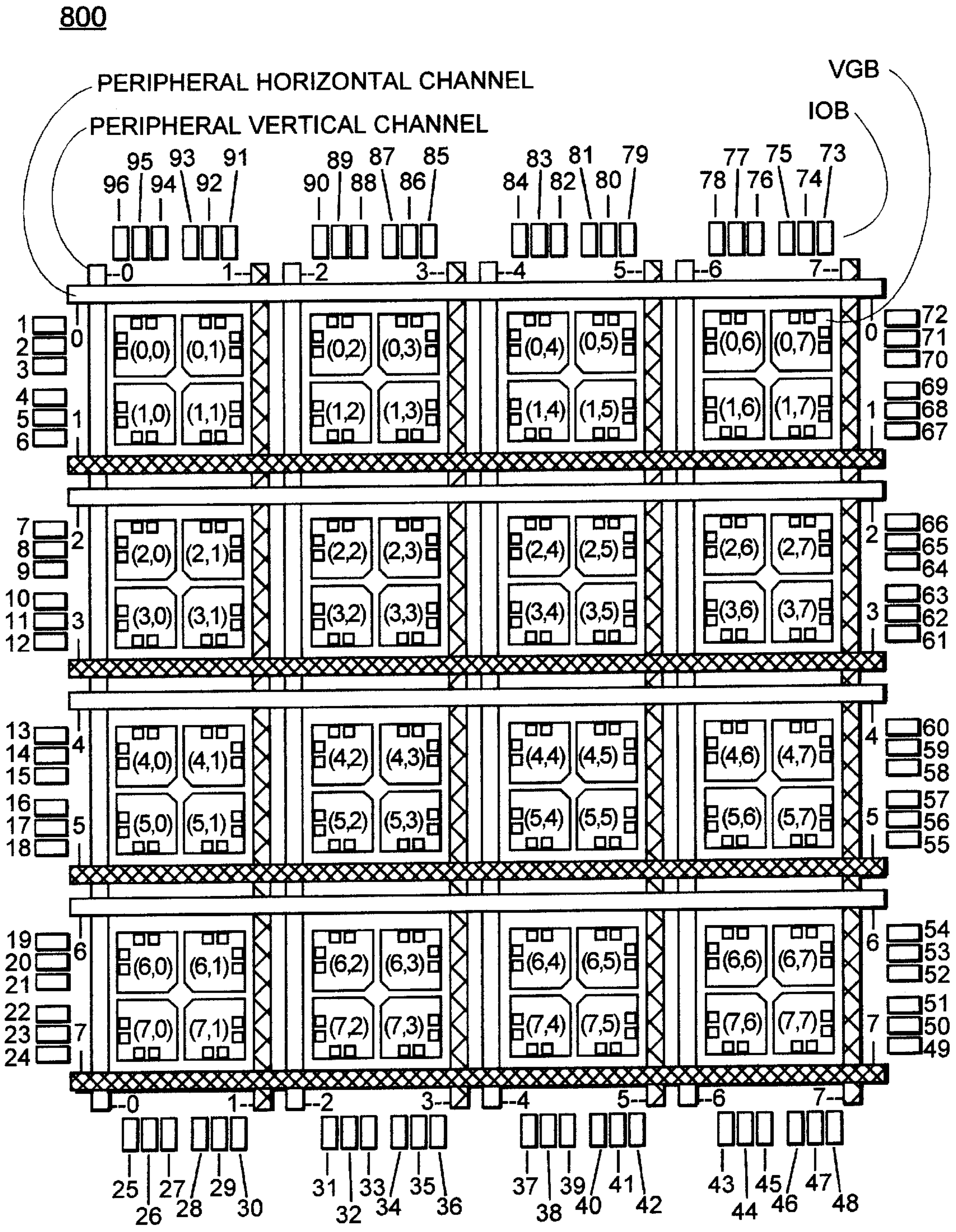
FIG. 8 illustrates a first FPGA in accordance with the invention having an 8×8 matrix of VGB's (a 4×4 tiled matrix of super-VGB's and surrounding interconnect resources)

FIG. 8 shows a macroscopic view of an FPGA device 800 in accordance with the invention. The illustrated structure is formed on a monolithic integrated circuit. In one embodiment having a matrix of 20-by-20 VGB's, the integrated circuit is formed on a semiconductor die having an area of about 120,000 $mils^2$ or less. The integrated circuit includes at least five metal layers for forming interconnect. The direct connect lines and longlines of the interconnect are preferably implemented entirely by the metal layers so as to provide for low resistance pathways and thus relatively small RC time constants on such interconnect lines. Logic-implementing transistors of the integrated circuit have channel lengths of 0.35 microns or less. Amplifier output transistors and transistors used for interfacing the device to external signals may be larger, however.

FPGA device 800 is defined as a regular matrix. In the illustrated embodiment there are four super-VGB's in each row and also four super-VGB's in each column. Each super-VGB contains four VGB's. Each super-VGB is bounded by two horizontal and two vertical interconnect channels (HIC s and VIC s). This combination of super-VGB and surrounding interconnect resources is tiled as seen. The tiling provides adjacent pairs of interconnect channels within the core of the device 800. Peripheral channels (HIC0, HIC7, VIC0, VIC7) are not paired. Switch matrix boxes (not shown, see FIG. 9) are formed at the intersections at the respective vertical and horizontal interconnect channels. In one embodiment, the switch matrix boxes use the bootstrapped transmission gate circuit of FIG. 3E for forming configurable connections through such switch boxes.

At the periphery of the device 800, there are three input/output blocks (IOB's) for each row of VGB's and for each column of VGB's. The IOB's in the illustrated embodiment are shown numbered from 1 to 96. The VGB's are numbered according to their column and row positions. The centrally-shared resources of each super-VGB are represented by the diamond-shaped hollow at the center of each super-VGB. Longline driving amplifiers are understood to occupy these diamond-shaped hollows to have their respective outputs coupling vertically and horizontally to the adjacent HIC's and VIC's of their respective super-VGB's.

Each super-VGB in FIG. 8 has four CBB's along each of its four sides. The four CBB's of each such interconnect-adjacent side of the super-VGB's can store a corresponding four bits of data in their respective CSE's so as to define a nibble of data for output onto the adjacent interconnect lines. Each VGB contains four CBB's which can acquire and process a nibble's worth of data. One of these processes is nibble-wide addition within each VGB as will be described below. Another of these processes is implementation of a 4:1 multiplexer as will be described below. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. One more specific example is formation of a barrel-shifter in one or more columns of CBB's (using implemented 4:1 multiplexers) followed by formation of an adder with self feedback in an adjacent column of VGB's. The combination can define an efficiently packed, binary multiplier. The horizontal interconnect can carry multiplication results in parallel to further, column oriented circuits as appropriate by way of a diversified set of different-length interconnect lines.

Figure 9:
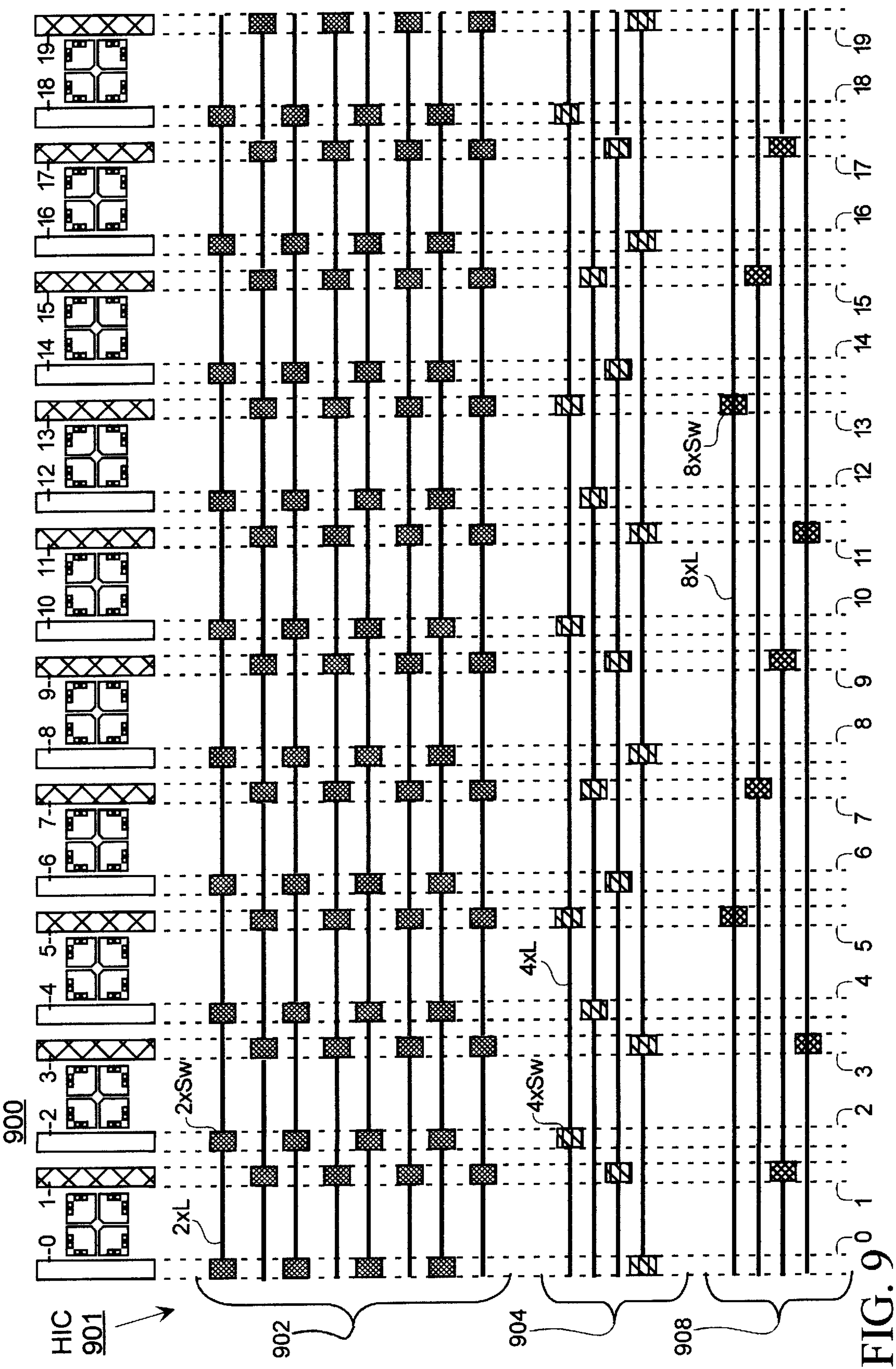
FIG. 9 shows a distribution of different-length horizontal interconnect lines (2×L, 4×L, 8×L) and associated switch boxes as aligned relative to vertical interconnect channels in a 20×20 matrix of VGB's (10×10 super-VGB's)

FIG. 9 shows a distribution 900 of different-length horizontal interconnect lines (2×L, 4×L, 8×L) and associated switch boxes of a single horizontal interconnect channel (HIC) 901, as aligned relative to vertical interconnect channels in an FPGA of the invention. This particular FPGA has a 20×20 matrix of VGB's (10×10 super-VGB's). Core channels 1 through 18 are laid out as adjacent pairs of odd and even channels. Peripheral channels 0 and 19 run alone along side IOB's (See FIG. 8). Although not shown in FIG. 9, it should be understood that each switch box has both horizontally-directed and vertically-directed ones of the respective 2×L, 4×L, and 8×L lines entering into that respective switch box. (See region 465 of FIG. 4B.)

HIC 901 is understood to have 58 lines as set forth at 793 in FIG. 7. However, only the eight 2×L lines, the four 4×L lines, and the four 8×L lines of HIC 901 are shown in FIG. 9.

Group 902 represents the 2×L lines of HIC 901 and their corresponding switch boxes. All 2×L lines span the distance of essentially two adjacent VGB's. Most 2×L lines terminate at both ends into corresponding 2× switch boxes (2×Sw's) . The terminating 2×Sw boxes are either both in even-numbered channels or both in odd-numbered channels. Exceptions occur at the periphery where either an odd or even-numbered channel is nonexistent. As seen in embodiment 900, interconnections can be made via switch boxes from the 2×L lines of HIC 900 to any of the odd and even-numbered vertical interconnect channels (VIC's) 0–19. 2×L lines may be used by adjacent quadruplets of CBB's for carrying out a through-the-AIL strapping function which is described below.

Group 904 represents the 4×L lines of HIC 901 and their corresponding switch boxes. Most 4×L lines span the distance of essentially four, linearly-adjacent VGB's and terminate at both ends into corresponding 4× switch boxes (4×Sw's) . The terminating 4×Sw boxes are either both in even-numbered channels or both in odd-numbered channels. As seen in embodiment 900, interconnections can be made via switch boxes from the 4×L lines of HIC 900 to any of the odd and even-numbered vertical interconnect channels (VIC's) 0–19.

Group 908 represents the 8×L lines of HIC 901 and their corresponding switch boxes. Most 8×L lines (7 out of 12) span the distance of essentially eight, linearly-adjacent VGB's. A fair number of other 8×L lines (5 out of 12) span distances less than that of eight, linearly-adjacent VGB's. Each 8×L line terminates at least one end into a corresponding 8× switch box (8×Sw). The terminating 8×Sw boxes are available in this embodiment only in the core odd-numbered channels (1, 3, 5, 7, 9, 11, 13, 15 and 17). Thus, in embodiment 900, interconnections can be made via switch boxes from the 8×L lines of HIC 900 to any of the nonperipheral, odd-numbered vertical interconnect channels (VIC's).

There are multiple ways to consider each VGB. Examples include viewing each VGB either as a whole entity having 4 CBB's or as a diagonally divisible entity that has 2 CBB's on each of its interconnect-adjacent sides. Under the diagonally divisible view, each VGB can be considered as having a corresponding 2 bits of produced data when observed from one side at a time. Under this 'one sided' view, the 2×L lines of a given channel can each be used in a 'through-the-AIL strapping' mode (see text of FIG. 12A) to supply a common control or common input term signal to the channel-adjacent CBB's of two adjacent VGB's for the purpose of producing nibble-wide (4-bits wide) result signals from the channel-adjacent CBB's. Y-to-Y CBB's coupling such as shown at 1320 of FIG. 13 could for example be provided through a horizontal 2×L line. Further under this 'one sided' view, the 4×L lines of a given channel can each be used in a 'through-the-AIL strapping' mode to supply a common control or common input term signal to the channel-adjacent CBB's of four adjacent VGB's for the purpose of producing byte-wide (8-bits wide) result signals. And yet further under this 'one sided' view, the 8×L lines of a given channel can each be used in a 'through-the-AIL strapping' mode to supply a common control or common input term signal to the channel-adjacent CBB's of eight adjacent VGB's for the purpose of producing word-wide (16-bits wide) result signals.

Each VGB can be alternatively viewed as corresponding to 4 bits (one nibble) of produced data when considered two sides (4 CBB's) at a time. Under this alternate view, the 2×L lines can each supply a control or input term signal for producing byte-wide result signals. Further under this alternate view, the 4×L lines can each supply a control or input term signal for producing word-wide result signals. And yet further under this alternate view, the 8×L lines can each supply a control or input term signal for producing doubleword-wide (32-bits wide) result signals.

FIG. 10 illustrates a partial-populating scheme for the input-term and control-signal acquiring multiplexers of the respective X, Z, W, and Y Configurable Building Blocks of one embodiment in accordance with the invention. The adjacent interconnect lines (AIL's) are respectively numbered as 0 through 55. The two dedicated CLK lines of each interconnect channel and the additional GR line in each VIC are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 10 represent the interconnect lines of the next adjacent channel. The exception is at the periphery of the matrix (see FIG. 8) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W. However, if a strapping-through-the-interconnect trick is to be used such as represented by PIPY5-W5*a* in FIG. 12A, it is preferable to follow the first embodiment wherein AIL's 0–55 represent interconnect lines of the most immediately adjacent channel for each of CBB's X, Z, W, and Y.

Multiplexer input lines (MIL's) are numbered in FIG. 10 as 1 through 10. MIL's 1–3 correspond to the three 19:1 input term acquiring multiplexers of a first CBE (e.g., 'a') in each of the X, Z, W, Y CBB's. MIL's 4–6 correspond to the three 19:1 input term acquiring multiplexers of a second CBE (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's.

The illustrated partially-populated distribution of PIP's over the intersections of AILS's 0–55 and MIL's 1–10 should be self-explanatory in view of the legend shown in FIG. 3C.

AIL's 0–3 represent the four 8×L lines in each interconnect channel. AIL's 4–7 represent a first group (DCL0) of four of the 16 direct connect lines in each interconnect channel. The remaining DCL's are represented by the 20–23 (DCL1), 28–31 (DCL2) and 36–39 (DCL3) sets of AIL's. AIL's 8–11 represent a first group (M×L0) of four of the 16 MaxL lines in each interconnect channel. The remaining MxL's are represented by the 24–27 (M×L1), 32–35 (M×L2) and 12–15 (M×L3) sets of AIL's.

AIL's 16–19 represent a first group (2×L0) of four of the 8 2×L lines in each interconnect channel. The other four 2×L lines are represented by the 40–43 (2×L1) group. AIL's 44–47 represent a first group (FBL0) of four of the 8 feedback lines in each interconnect channel. The other four feedback lines are represented by the 52–55 (FBL1) group. AIL's 48–51 represent the four 4×L lines in each interconnect channel.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next, not immediately-neighboring VGB that is to the left of the current VGB. AIL 4 is driven by either the Z or the Y DC driver of the next-adjacent VGB that is to the left of the current VGB.

Each of MIL's 0–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer. A representative part of that layer is shown at 1023.

Note that for each of AIL's 0–55 there are at least two PIP connections to two different MIL's, one of which is placed in the MIL# 1–3 set and another of which is in general, differently placed in the MIL# 4–6 set. In other words, are at least two possible MIL's which can be used to acquire an input term signal moving along a given AIL and feed the acquired signal to one or the other of two possible LUT's ('a' or 'b'). Thus if one of the two 19:1 multiplexers that can couple to a given AIL is already consumed, or the corresponding LUT is already consumed, the FPGA configuring software has the possibility of alternatively using the other multiplexer and/or LUT for implementing a circuit chunk that requires a particular input term signal moving along the given AIL.

Each of AIL's 54 and 55 have at least three PIP connections to a respective three different MIL's. Feedback signals from the f1 and f2 lines of the X CSE therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1)In, CBE(a2)In, CBE(b0)In, CBE(b1)In, and CBE(b2)In in FIG. 10. Note that CBE(b0)In is different from the others in that a POP (Programmable Opening Point) is provided for it in decoder section 1023. CBB(ab) represents an intercepted signal that may be used for compounding or folding together the 'a' and 'b' parts of the corresponding CBB.

Note also that in the case where the PIP's of the signal-acquiring multiplexers of FIG. 10 are of the bidirectional type (e.g., FIGS. 3D or 3E), simultaneous activation of two or more PIP's on a same AIL (during FPGA configuration time), creates a bidirectional strapping interconnection between the corresponding MIL's of those PIP's. Such a use of the PIP's of the signal-acquiring multiplexers of FIG. 10 falls herein under the description, 'through-the-AIL strapping'. Not every embodiment however can use this kind of through-the-AIL strapping in a generic way to strap from one MIL to a next a signal that had been generically sourced onto a line other than the strapping AIL. One of the requirements is that the PIP's in the signal-acquiring multiplexers of FIG. 10 be conductive enough (large enough in terms of RC time constant) to get signals through within the system-specified time. If these PIP's are too small, such use of through-the-AIL strapping should be avoided. On the other hand, if the signal that is being strapped onto the two MIL's was sourced onto the strapping AIL from an appropriate AIL drive amplifier, the size of the PIP's of the signal-acquiring multiplexers of FIG. 10 should not be an impediment to carrying on through-the-AIL strapping because the drive amplifier is designed to drive the signal in timely fashion through those loads.

Note further that in the case where the PIP's of the signal-acquiring multiplexers of FIG. 10 are again of the bidirectional type (e.g., FIGS. 3D or 3E), simultaneous activation during FPGA configuration time of two or more PIP's on a same MIL (multiplexer input line), can create a bidirectional strapping interconnection between the corresponding AIL's of those PIP's. Such a use of the PIP's of the signal-acquiring multiplexers of FIG. 10 is referred to herein as 'through-the-MIL strapping'. The latter function may be particularly useful when a signal is being acquired via a direct connect line (DCL) from another VGB and it is desirable to simultaneously couple such a DCL-carried signal to another kind of AIL within the interconnect channel, say to a vertical 2×L line when the direct connect source was a horizontally displaced VGB. Again, not every embodiment can use through-the-MIL strapping. If the PIP's of the signal-acquiring multiplexers are too small, and the DC drive amplifiers are not powerful enough to drive the added load, the through-the-MIL strapping function should be avoided and other means should be used for routing signals. For example, switch boxes may include PIP's for providing configuration-defined coupling of a signal sourced on a passing-through direct connect line (not shown) to passing-through 2×L, 4×L and/or 8×L lines.

Figure 11A:
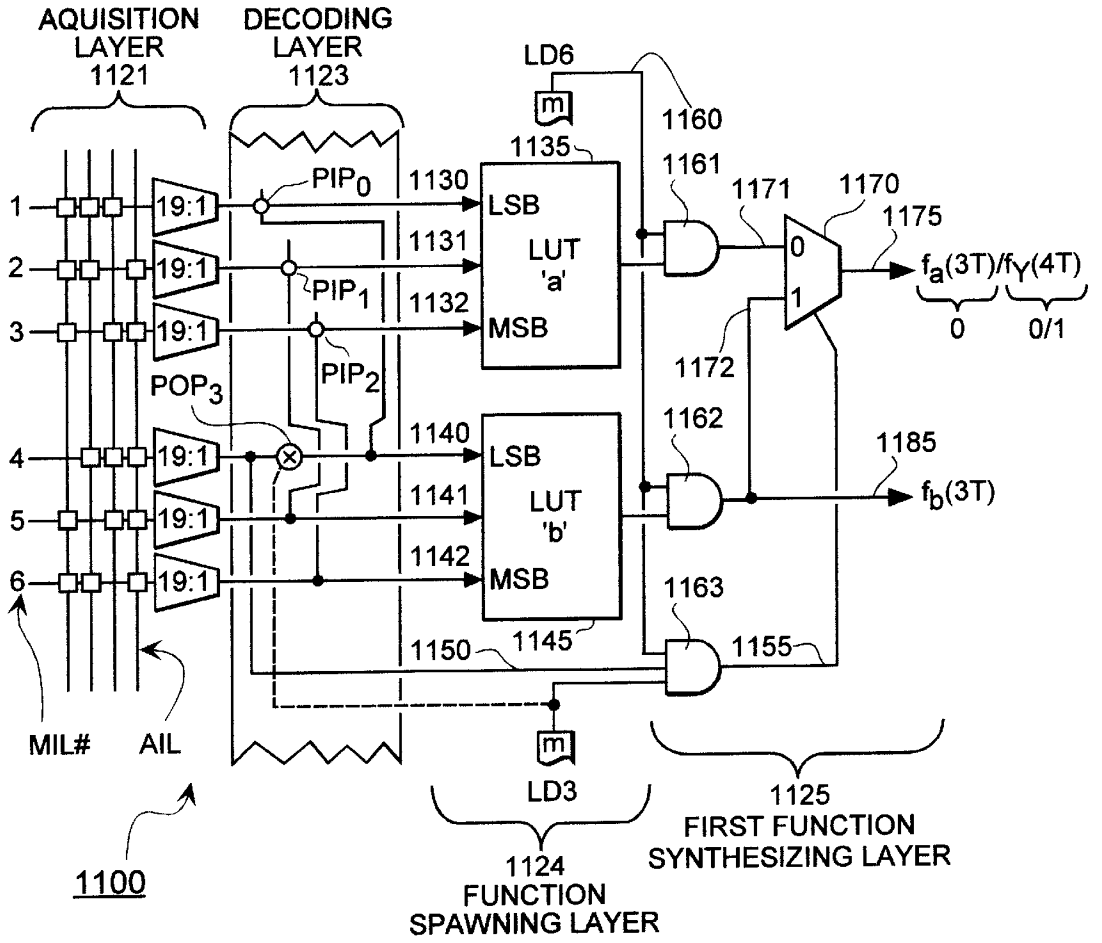
FIG. 11A is a schematic showing a first level folding circuit in accordance with the invention.

Referring to FIG. 11A, the same representative part of the decoding layer that was shown as 1023 in FIG. 10 is now shown at 1123. The function spawning layer that contains a set of function spawning lookup tables (1135, 1145) is now shown at 1124. A first of the function synthesizing layers is shown at 1125. The input term signals acquiring layer is shown at 1121 to include the 19:1 multiplexers formed on respective MIL's 1–6. The combination of parts 1121, 1123, 1124 and 1125 is designated as 1100.

Decoding layer 1123 includes first through third programmable interconnect points, $PIP_0$, $PIP_1$ and $PIP_2$. The corresponding configuration memory bits of these PIP's are not shown. $PIP_0$ may be used for programmably establishing a link from line 1130 to line 1140. $PIP_1$ may be used for programmably establishing a link from line 1131 to line 1141. $PIP_2$ may be used for programmably establishing a link from line 1132 to line 1142. Decoding layer 1123 further includes a programmable opening point designated as $POP_3$. The corresponding configuration memory bit of $POP_3$ is shown at LD3 and the controlling connection from LD3 to $POP_3$ is indicated by a dashed line. $POP_3$ may be used for programmably breaking a connection between MIL# 4 and line 1140. Since each of $PIP_0$, $PIP_1$, $PIP_2$ and $POP_3$ is independently configurable, a number of different operating modes are possible.

In a first mode (the transparent decoding mode), all of PIP's 0, 1 and 2 are deactivated so as to not make respective connections between line 1130 and 1140, between line 1131 and 1141, between line 1132 and 1142. POP 3 is also deactivated so as to not create a respective opening between MIL# 4 and line 1140. The respective 3 output signals of the top three 19:1 multiplexers (MIL's 1–3) then couple to the respective 3 input terminals (1130–1132) of LUT 1135 in this transparent decoding mode. At the same time, the respective 3 output signals of the bottom three 19:1 multiplexers (MIL's 4–6) couple to the respective 3 input terminals (1140–1142) of LUT 1145. Note for the case where PIP's take on the bidirectional, pass-transistor configuration of 382 (FIG. 3C), that the capacitive loads of each of MIL's 1–3 are not added to the capacitive loads of respective ones of MIL's 4–6 in the transparent decoding mode. Thus propagation times for input term signals acquired from the adjacent interconnect lines (AIL's) to the inputs of LUT's 'a' (1135) and 'b' (1145) can be relatively small. This corresponds with fast path 545 of FIG. 5C.

Note that the number of 19:1 multiplexers (MIL's 1–6) matches the number of independent LUT inputs, 1130–1132 and 1140–1142. When the transparent decoding mode is active, each 19:1 multiplexer of the acquisition layer 1121 is efficiently consumed by a corresponding one of LUT inputs, 1130–1132 and 1140–1142. Thus there is a balanced match of signal acquiring resources (1121) and signal consuming resources (1124) when the transparent decoding mode is active.

In the transparent decoding mode, LUT 1135 produces the $f_a$ (3T) function signal in response to its respective 3 inputs as fed in from MIL's 1–3. LUT 1145 produces the $f_b$(3T) function signal in response to its respective 3 inputs as fed in from MIL's 4–6.

The first function synthesizing layer 1125 includes first through third AND gates 1161–1163, a multiplexer 1170 and a default line 1160 that is driven by configuration memory bit LD6. Each of AND gates 1161–1163 has an input connected to default line 1160 so that a logic 0 in configuration memory bit LD6 forces logic 0 outputs from AND gates 1161–1163. (An alternate embodiment could use OR gates and reverse logic, of course.) Configuration memory bit LD6 should be set to logic 1 when section 1100 is being used for a function spawning process.

On the other hand, if section 1100 is not being used, LD6 should be set to the logic 0 state by the FPGA configuring software and at the same time, all the MIP's of the corresponding 19:1 multiplexers should be left open (inactivated). This provides advantages. First, the FPGA configuring software does not have to spend significant time tying up loose ends for unused sections so as to eliminate switching noise from such loose ends. Second, the capacitive loadings of MIL's 1–6 are not added to the overall capacitances of the adjacent interconnect lines (AIL's) . Third, elements of unused sections such as the LUT's may be placed in a power-saving, high impedance state.

As explained above, configuration memory bit LD3 is at logic 0 in the transparent decoding mode. One input of AND gate 1163 is driven by LD3. Output 1155 of AND gate 1163 therefore drives the select control terminal of multiplexer 1170 to output the signal of its '0' input 1171, which input passes through AND gate 1161 from the output of LUT 1135. Multiplexer 1170 therefore outputs the $f_a$(3T) signal onto line 1175 when the transparent decoding mode is present and LD6 is active (set to logic 1). At the same time, AND gate 1162 outputs the $f_b$(3T) signal onto line 1185. Signals $f_a$(3T) and $f_b$(3T) are of course determined by user-configuration of the configuration memory bits in LUT's 'a' and 'b'. One such possible configuration is to make each of LUT's 'a' and 'b' behave as a 2:1 dynamic multiplexer. See FIG. 11B.

In a second mode (the fully-strapped decoding mode), each of $PIP_0$, $PIP_1$, and $PIP_2$ is activated so as to make respective connections between line 1130 and 1140, between line 1131 and 1141, between line 1132 and 1142. $POP_3$ is also activated so as to create a respective opening between MIL# 4 and line 1140. The respective 3 output signals of the top three 19:1 multiplexers (MIL's 1–3) then couple to the respective 3 input terminals (1130–1132) of LUT 1135 and also to the respective 3 input terminals (1140–1142) of LUT 1145 in this fully-strapped decoding mode. The MIP's of 19:1 multiplexers 5 and 6 should be left deactivated (not connecting) in this mode. One MIP of 19:1 multiplexer 4 (MIL# 4) should be activated to bring an acquired input term signal onto line 1150.

As a slight variation on the above mode, the corresponding MIP's of either one of 19:1 multiplexers 2 and 3 is left deactivated (not connecting) while a MIP in a respective one of 19:1 multiplexers 5 and 6 is activated. The combinations of possibilities means that the input term signal acquiring capabilities of MIL's 2 and 5 are folded together and that the input term signal acquiring capabilities of MIL's 3 and 6 are folded together. As seen in FIG. 10, MIL# 5 may acquire input term signals from adjacent interconnect lines different than those serviced by MIL# 2. Similarly, MIL# 6 may acquire input term signals from adjacent interconnect lines different than those serviced by MIL# 3.

AND gate 1163 couples the acquired input term signal of line 1150 to the select control terminal of multiplexer 1170 in this fully-strapped decoding mode. The second input 1172 of multiplexer 1170 is coupled to line 1185. Output line 1175 accordingly produces $f_a$(3T) when the acquired input term signal of line 1150 is logic 0 and it produces $f_b$(3T) when the acquired input term signal of line 1150 is logic 1. With appropriate use of the signal on MIL# 4 as the most significant address bit for a desired 16-bit LUT and the signals on MIL's 1–3 as the less significant address bits, section 1100 functions as a 16-bit LUT that outputs $f_Y$(4T) on line 1175 in this fully-strapped decoding mode. The emulated 16-bit LUT has input term acquiring capabilities greater than those of the individual 'a' and 'b' LUT's because of the exchangeability of 19:1 multiplexers 2 and 5, and because of the exchangeability of 19:1 multiplexers 3 and 6.

In the fully-strapped decoding mode, output line 1185 continues to output the $f_b$(3T) function signal. As such, for overlapping ones of $f_Y$(4T) and $f_b$(3T), section 1100 can simultaneously function as both a 16-bit LUT that outputs $f_Y$(4T) and an 8-bit LUT that outputs $f_b$(3T). An example of overlapping functionality for $f_Y$(4T) and $f_b$(3T) will be seen when details of a carry logic circuit are discussed below.

Figure 11B:
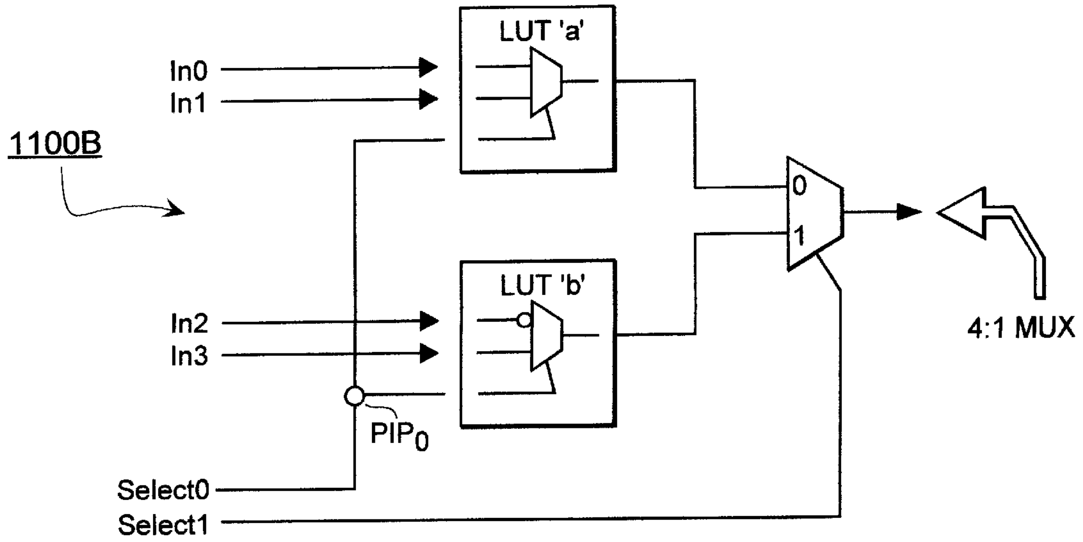
FIG. 11B diagrams how the circuit of FIG. 11A may be used emulate a 4:1 multiplexer.

Referring to FIG. 11B, a third decoding mode is referred to herein as the 4:1 MUX-emulating mode. In this third mode, $PIP_0$ is activated (to make a connection) while $PIP_1$ and $PIP_2$ are each deactivated. $POP_3$ is activated (to make an opening between MIL# 4 and line 1140). In one variation of this third decoding mode, LUT's 'a' and 'b' are configured to behave as 2:1 multiplexers with lines 1130 and 1140 being the respective selection control lines. These lines 1130 and 1140 are strapped together by the activated $PIP_0$ to define a Select0 control line of a 4:1 multiplexer. MIL# 4 (1150) becomes the Select1 control line of the 4:1 multiplexer as shown while MIL's 2, 3, 5 and 6 define desired ones of inputs In0, In1, In2 and In3 of the illustrated 4:1 multiplexer. As seen, any one or more of the In0, In1, In2 and In3 inputs can behave as an inverting input by appropriate configuration of the underlying LUT's 'a' and 'b'. In a variation on FIG. 11B, one of input pair In0–In2 and pair In1–In3 can be strapped together by activating the corresponding one of $PIP_1$ and $PIP_2$.

Referring to FIG. 1C, it will now be shown how a combination 1100C of four 4:1 circuits, each being formed by the method shown in FIG. 11B, may be used to granularly-wise emulate within a given VGB either: (a) a single 13:1 multiplexer, or (b) a combination of a 10:1 multiplexer and a 4:1 multiplexer, or (c) a combination of an 8:1 multiplexer and two 4:1 multiplexers, or (d) a combination of two 8:1 multiplexers, or (e) a combination of four 4:1 multiplexers.

The last three combinations, (c), (d) and (e) are fairly straightforward. For combination (e), each of the X, Z, W, and Y Configurable Building Blocks of the given VGB independently emulates a 4:1 multiplexer having its respective inputs: In0, In1, In2 and In3 (denoted as In0:3) and further having its respective selection controls: Sel0 and Sel1 (denoted as Sel0:1).

Figure 11C:
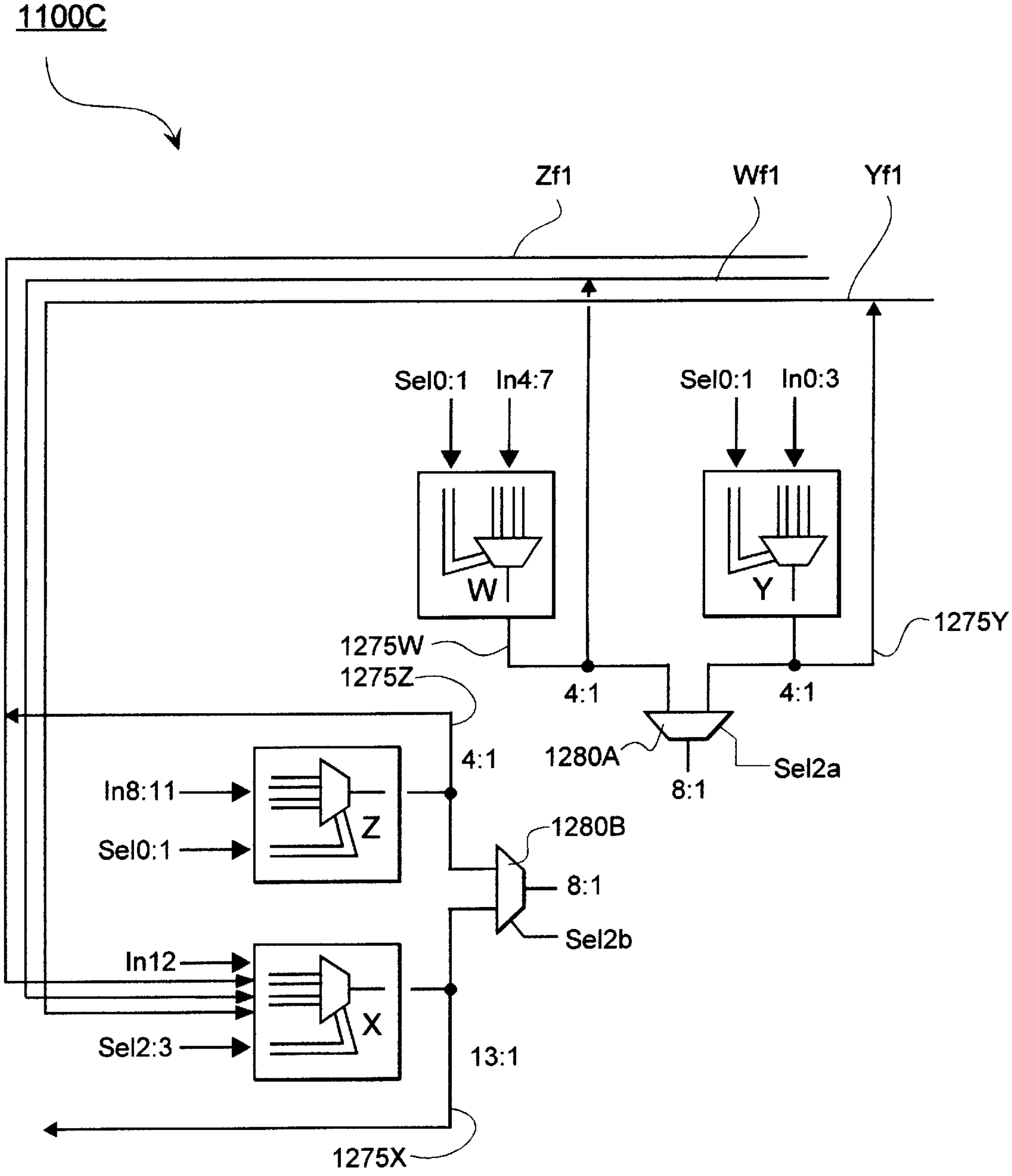
FIG. 11C diagrams how four 4:1 circuits such as in FIG. 11B may be used to granularly-wise emulate a 13:1 multiplexer, or a combination of a 10:1 multiplexer and a 4:1 multiplexer, or a combination of a 8:1 multiplexer and two 4:1 multiplexer.

To emulate an 8:1 multiplexer, two 4:1 multiplexers such as Y and W in FIG. 11C have their respective selection controls strapped together to simultaneously receive Sel0:1. Selectable input sets In0:3 and In4:7 are coupled to respective inputs of the Y and W 4:1 multiplexers. VGB intraconnect lines such as 1275Y and 1275W (see also FIG. 12B) couple the 4:1 selections to a next level multiplexer 1280A (see again FIG. 12B). A third selection signal, Sel2a supplements the Sel0:1 signals to form the 8:1 multiplexer output at the output of next level multiplexer 1280A. Methods for strapping inputs together and so forth will be discussed shortly in connection with FIGS. 12A, 12B and 13.

It should now be apparent that an 8:1 multiplexer may be similarly formed along the other leg of the same VGB using Z and X, and a second, next level multiplexer 1280B. Also, a pair of 4:1 multiplexers may be implemented on one leg while an 8:1 multiplexer is implemented on the other leg.

A single 13:1 multiplexer may be formed as follows, using feedback lines Yf1, Wf1 and Zf1 of the given VGB. Each of CBB's X, Z, W, and Y implements a 4:1 multiplexer. CBB's Z, W, and Y receives selection control signals Sel0:1 as shown in FIG. 1C. Y receives input signal set In0:3. W receives input signal set In4:7. Z receives input signal set In8:11. X receives input signal Inl2 at one of its four inputs and the outputs of the 4:1 multiplexers Z, W, and Y at its other three data inputs. The latter 3 signals may be transferred by way of local feedback lines Yf1, Wf1 and Zf1 or by other VGB intraconnect or interconnect means as appropriate. The routing of signals from lines 1275Y, 1275W and 1275Z to the feedback lines will be discussed below. The two selection control inputs of the X 4:1 multiplexer receive selection control signals Sel2:3. These may dynamically select either one of twelve data signals, In0:11 passed through respective ones of 4:1 multiplexers Z, W, and Y or the thirteenth data signal, Inl2 for output onto line 1275X.

Formation of combination (b), which has a 10:1 multiplexer and a 4:1 multiplexer takes a similar approach. This time, the outputs of Y and W feed 2 inputs of X while the remaining 2 inputs of X receive the ninth and tenth data input signals. The two selection control inputs of the Z 4:1 multiplexer may receive independent selection control signals instead of Sel0:1. Thus Z becomes an independent 4:1 multiplexer that resides in a same VGB with a 10:1 multiplexer. It will later become apparent (see FIG. 12A) how the selection control inputs of the Y and Z 4:1 multiplexers may be conveniently strapped together to form a 10:1 multiplexer that uses Y and Z to receive the first 8 of the 10 data input signals. Any 3 of the CBB's in a VGB may be used to form a 10:1 multiplexer as desired.

Figure 11D:
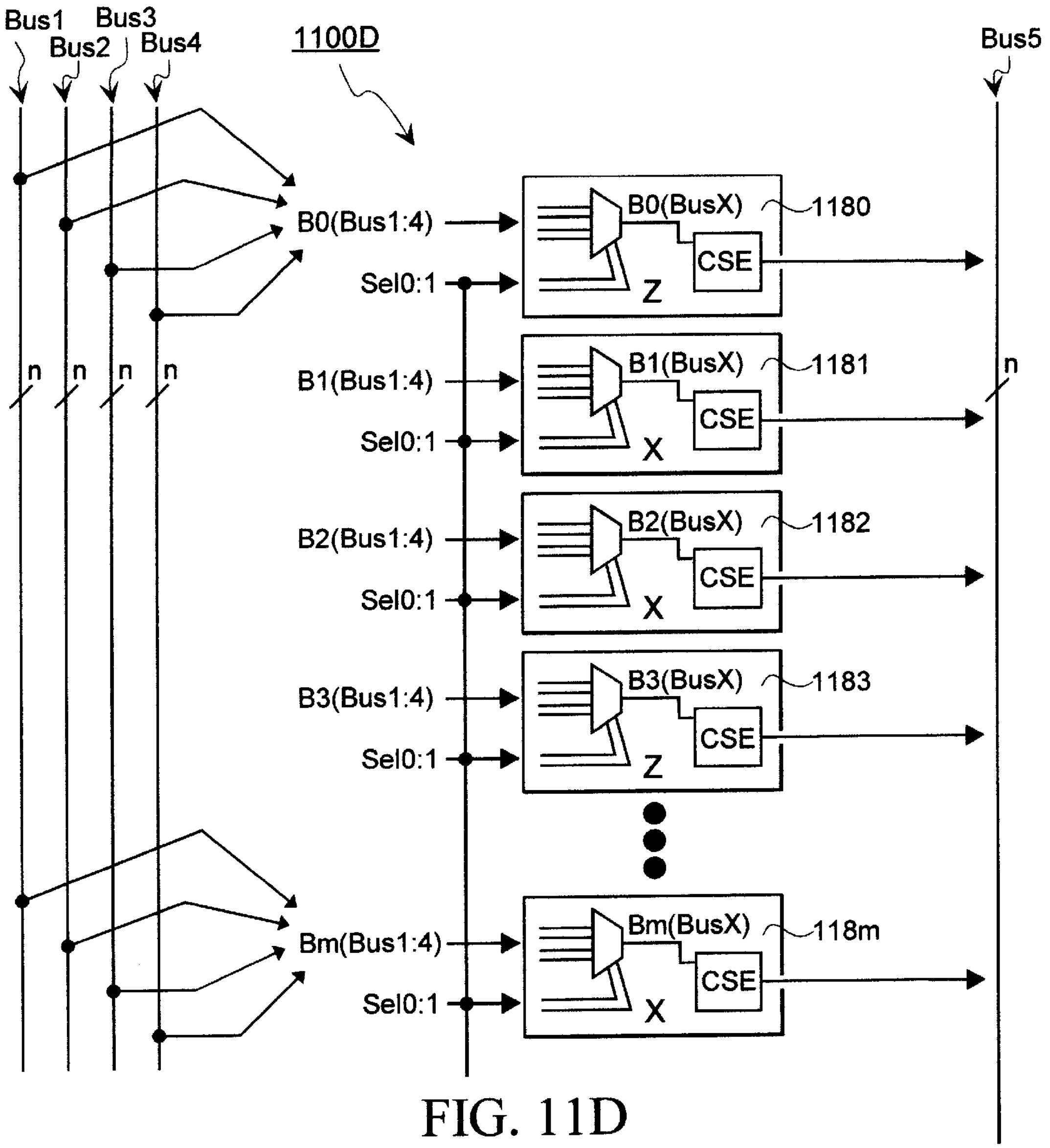
FIGS. 11D and 11E provide illustrative examples of data path steering respectively using CBB's implementing 4:1 multiplexers and 2:1 multiplexers.

The dynamic multiplexers depicted by FIGS. 11B or 11C may be used for a wide variety of run-time functions. One of the more useful functions is dynamic bus steering. FIG. 11D illustrates what is meant by dynamic bus steering. Each of Bus 1 through Bus 5 has n independent lines carrying respective bits B0 through Bm of that bus (m=n−1). Each line of Bus 1 through Bus 5 may be implemented by a 2×L, 4×L, 8×L or MaxL line within one or more vertical interconnect channels (VIC) or by direct connect lines.

In embodiment 1100D of FIG. 11D, CBB 1180 is configuration-defined to implement a first 4:1 multiplexer in accordance with FIG. 11B. The four data input terminals of the 4:1 multiplexer in 1180 respectively coupled to the bit B0 line of each of respective buses Bus 1 through Bus 4. The two dynamic selection terminals of the 4:1 multiplexer in 1180 are coupled to receive selection signals Sel0:1 for selecting one of Bus 1 through Bus 4. The dynamically selected bit, B0(BusX) is then forwarded to the corresponding bit B0 line of Bus 5 by way of the CBB's Configurable Sequential Element (CSE).

CBB's 1181, 1182, 1183, . . . , 118m of FIG. 11D are similarly configured and connected to steer respective bits B1, B2, B3, . . . Bm onto Bus 5 from a dynamically selected one of buses Bus 1 through Bus 4 in accordance with selection signals Sel0:1. Bus 5 may then further couple the steered signals to further processing means (e.g., an n-bit adder). Note that CBB's 1180 (Z), 1181 (X), 1182 (X), and 1183 (Z) are are in a same super-VGB, each adjacent to a same VIC. Of course it is also contemplated to provide for dynamic data path steering by using 4:1 multiplexers implemented in the Y and W CBB's, as is convenient for partitioning, placement and routing concerns.

Figure 11E:
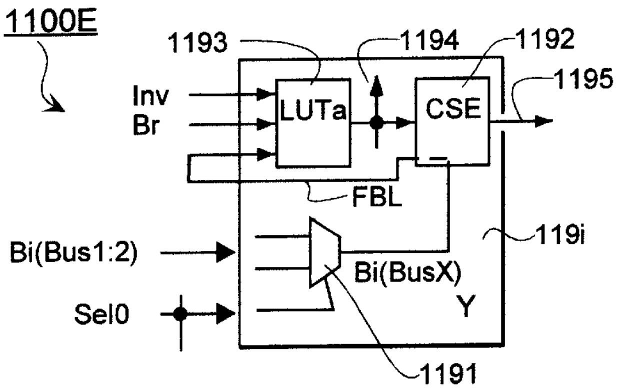

FIG. 11E shows a schematic portion of an alternate embodiment 1100E for data steering in which a 2:1 multiplexer 1191 is formed by LUTb of each respective CBB 119i. The 2:1 multiplexer 1191 is used for steering a respective bit Bi from one of buses, Bus 1 and Bus 2 into CSE 1192. CSE 1192 is configured to forward the steered bit, Bi(BusX) via a local feedback line (FBL) to one of three inputs of LUTa of the same CBB 119i. LUTa 1193 may perform a desired, post-steering processing function comensurate with the capabilities of LUTa prior to supplying a respective $f_a(3T)$ result signal to CSE 1192. The respective $f_a(3T)$ result signal may then be stored in a register of the CSE and/or output to one or more of the interconnect lines 1195 driven by CSE 1192. As such, a compact and highly efficient structure is illustrated by FIG. 11E wherein each of plural CBB's (only one shown as representative CBB 119i) performs both bus steering and post-steering processing.

One example of a possible, post-steering process (that is given here for illustrative purposes) is to perform a bit comparison test in LUTa 1193. Br is a supplied reference bit of comensurate significance to a steeered, test bit, Bi(BusX). Input Inv tells LUTa whether or not to invert test bit Bi(BusX) prior to performing an exclusive-NOR operation with reference bit Br. Such inversion might be desired because one bus uses positive logic while another uses 1's complement logic. The $f_a$(3T) result signal is then a logic '1' if the optionally-inverted test bit Bi(BusX) matches the reference bit Br, and a logic '0' if there is no match. In one embodiment, the 'logic_1_equals_a_match' flag is applied to a chain_mode circuit represented by 1194 to indicate continuation of an unbroken chain state. A more detailed description of the chain_mode circuit is found below with reference to FIGS. 19A–19D. The chain_mode circuit 1194 may then be used to detect a continuous match at a specified set of bit places in digital words having Bi(BusX) and Br as included bits. As such, a match test between a reference word (Br) and one of plural words provided on respective buses, Bus 1 and Bus 2 may be provided for in a highly efficient manner by taking advantage of the variable granularity of resources and interconnect capabilities provided in each CBB (and/or each VGB).

Figure 12A:
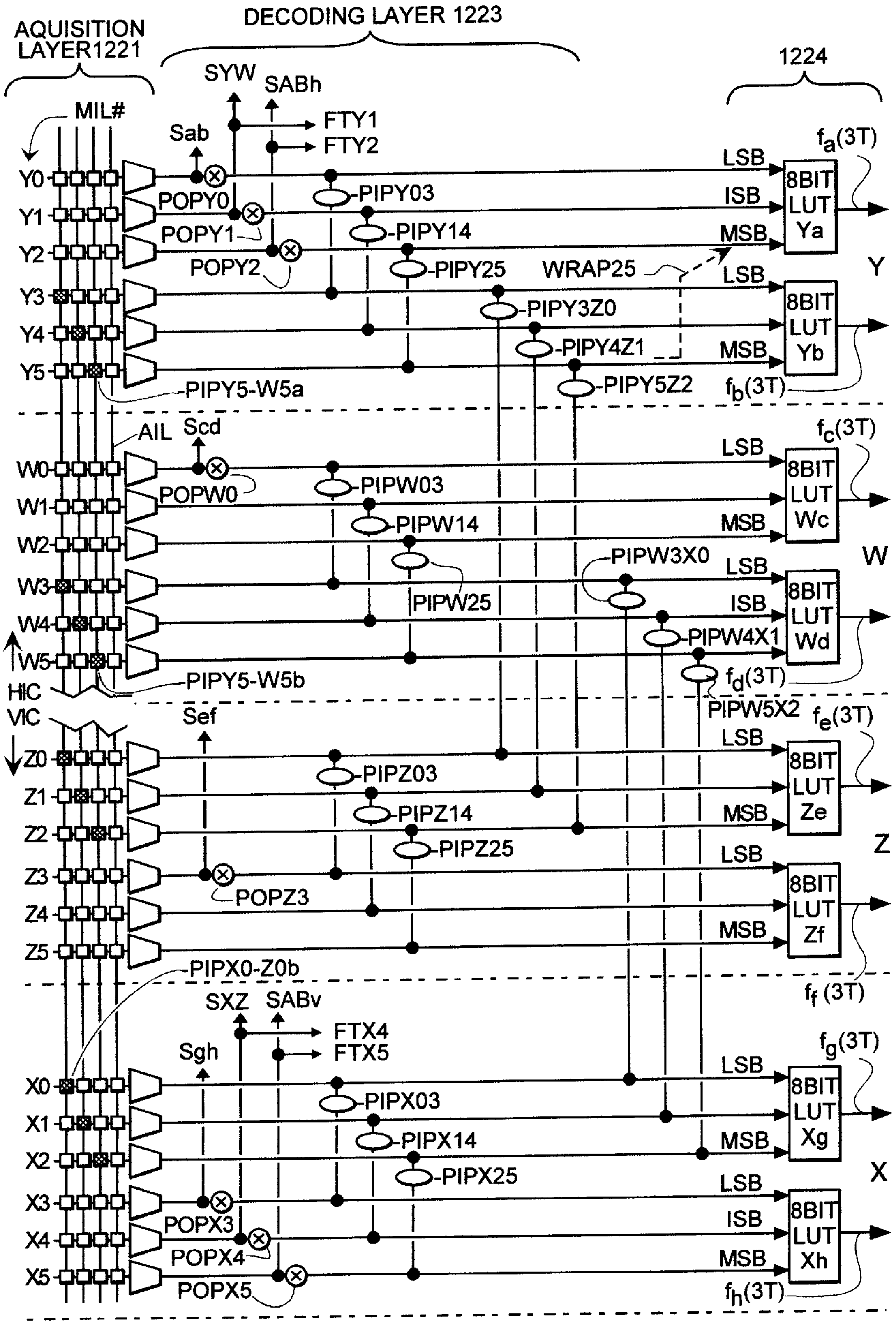
FIGS. 12A–12B combine to form a schematic of a three level folding circuit in accordance with the invention.
Figure 12B:
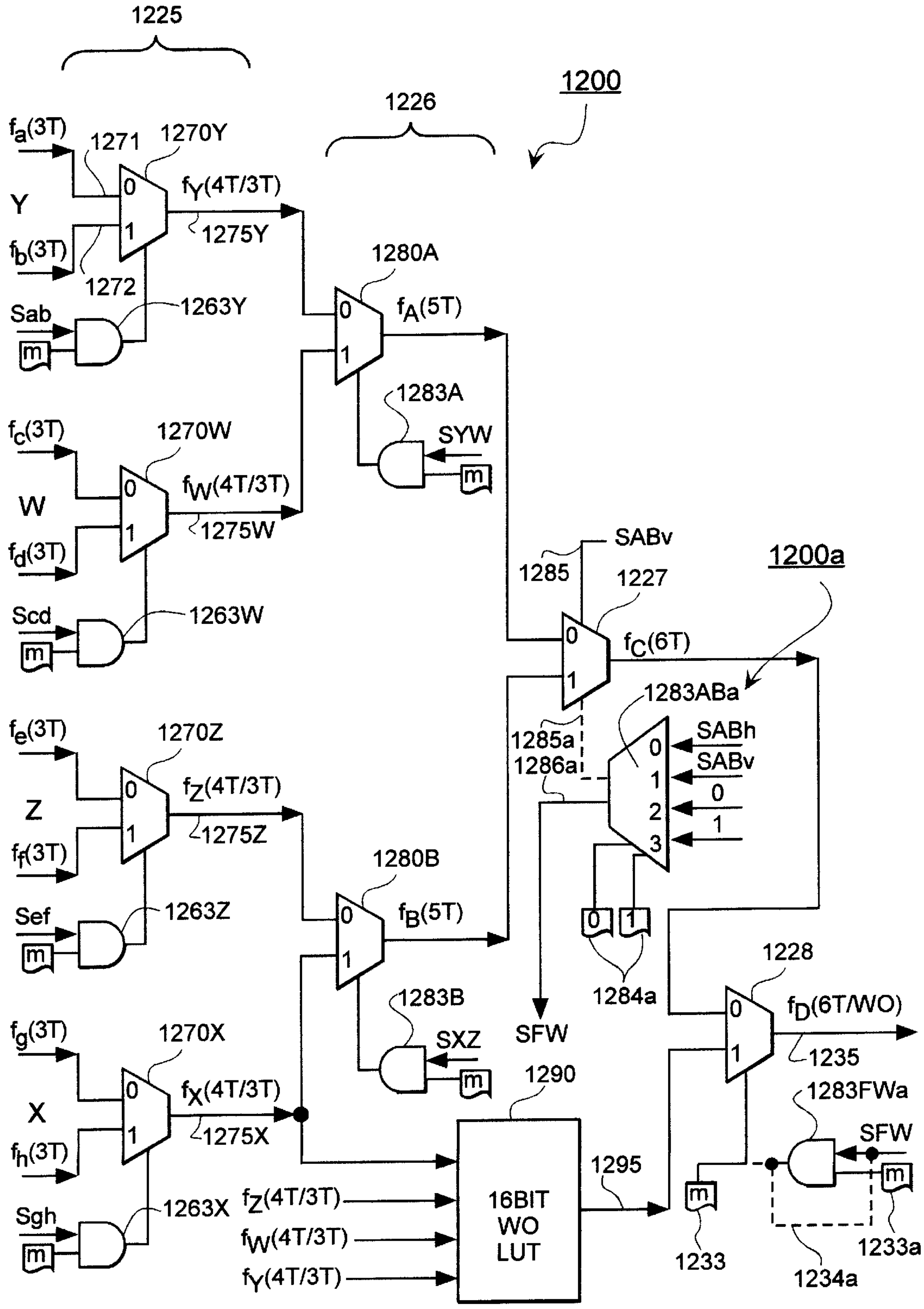

Referring to FIGS. 12A–12B, a multi-level synthesis circuit 1200 in accordance with the invention will now be described. Acquisition layer 1221 includes repeating patterns of twenty-four, 19:1 multiplexers whose respective input lines (MIL's) are labeled as Y0–Y5, W0–W5, Z0–Z5 and X0–X5. Note that MIL's Y0–Y5 and W0–W5 cross with the adjacent vertical interconnect channel (VIC) while MIL's Z0–Z5 and X0–X5 cross with the adjacent horizontal interconnect channel (HIC).

Function spawning layer 1224 includes a plurality of eight 3-bit LUT's respectively labeled as Ya, Yb, Wc, Wd, Ze, Zf, Xg and Xh. Respective pairs belong to corresponding ones of the Y, W, Z and X CBB's. The respective least significant and most significant input bits of each of the 3-input LUT's are designated as 'LSB' and 'MSB'. The input bit of intermediate significance is designated as 'ISB' for each LUT.

In the intervening decoding layer 1223, programmable opening points (POP's) are identified according to the number of the MIL for which they can create an intercepting break between the corresponding 3-bit LUT input and the respective 19:1 signal-acquiring multiplexer output. Similarly, programmable interconnect points (PIP's) are identified according to the numbers of the MIL's between which they can create a strapping connection. Instead of using the hollow circle symbol with crossing lines here, the hollow ellipse symbols with strapping lines of FIG. 3C at 381 are used, such as seen at the triplet of PIPY03, PIPY14 and PIPY25. These represent the elements that permit configuration-defined strapping together of respective input lines of corresponding LUT's.

Thus, POPY0 may be activated to permit the intercepting production of a Sab dynamic selection signal from MIL Y0, while at the same time PIPY03 may be activated to strap a different signal from Y3 onto the LSB input of LUT Ya. The so-intercepted, Sab dynamic selection signal may then be applied to the control terminal of multiplexer 1270Y (FIG. 12B) via AND gate 1263Y for dynamically selecting between the outputs of LUT 'a' and 'b'. Sab thereby becomes the fourth, most significant input term of an emulated 4-input LUT that outputs $f_Y$(4T) while signals from MIL's Y3, Y4 (or Y1) and Y5 (or Y2) may be used as less significant input terms of the emulated 4-input LUT. (Alternatively, intercepted signal Sab becomes the second selection control of an emulated 4:1 multiplexer while the strapped-together LSB's of LUT's Ya and Yb serve as the first selection control. See FIG. 11B.)

Similarly for the W Configurable Building Block, POPW0 can participate in the intercepting production of dynamic selection signal Scd, where Scd may be applied to multiplexer 1270W via AND gate 1263W (FIG. 12B). At the same time, PIPW03 may be activated to strap a different signal from W3 onto the LSB input of LUT Wc. In similar vein for the Z CBB, opening point POPZ0 can participate in the interceptive production of dynamic selection signal Sef, where Sef may be applied to multiplexer 1270Z via AND gate 1263Z. At the same time, PIPZ03 may be activated to strap a different signal from Z3 onto the LSB input of LUT Ze. And in yet similar vein for the X CBB, opening point POPX0 can participate in the production of dynamic selection signal Sgh, where Sgh may be applied to multiplexer 1270X via AND gate 1263X. At the same time, PIPX03 may be activated to strap a different signal from X3 onto the LSB input of LUT Xg.

As should be understood from FIG. 12B, first synthesis layer 1225 of FIG. 12B follows the function synthesizing method set forth in FIG. 11A. For sake of simplicity, the default-condition imposing structure of FIG. 11A, namely that composed of elements 1160, 1161 and 1162 is not shown in each of the four substructures of layer 1225 although they are understood to be present. The not-shown LD6 configuration memory bit of each of the X, Z, W, and Y sections of FIG. 12B may be used to independently place each such section in the default state. When the default state is not activated, it is understood that multiplexer 1270Y receives the $f_a$(3T) signal on input line 1271, the $f_b$(3T) signal on input line 1272. In response to the configuration signal (m) and the dynamic selection signal (Sab) applied to AND gate 1263Y, multiplexer 1270Y produces on its output line 1275Y either the signal $f_Y$(4T) or the signal $f_a$(3T). The signal on line 1275Y is accordingly denoted as $f_Y$(4T/3T).

Similarly, multiplexer 1270W produces on its output line 1275W a corresponding output signal of configuration-defined complexity, which signal is denoted as $f_W$(4T/3T). First layer multiplexer 1270Z correspondingly produces the signal $f_Z$(4T/3T) on its output line 1275Z. And multiplexer 1270X produces the signal $f_X$(4T/3T) on its corresponding output line 1275X.

In the next layer 1226 of function synthesis, multiplexer 1280A receives the signals of lines 1275Y and 1275W on its respective 0 and 1 input terminals. The selection control terminal of multiplexer 1280A is driven by AND gate 1283A, which gate receives a corresponding configuration memory bit (m) and dynamic selection signal SYW. Similarly, second layer multiplexer 1280B receives the signals of lines 1275Z and 1275X. Its corresponding AND gate 1283YW receives a respective configuration memory bit and dynamic selection signal SXZ.

In the illustrated embodiment of FIG. 12A, dynamic selection signal SYW is produced from MIL# Y1. POPY1 is typically activated to create a break at the same time so that PIPY14 can strap a different signal onto the ISB input line of LUT Ya. Dynamic selection signal SXZ is similarly produced from MIL# X4. POPX4 is typically activated to create a break at the same time so that PIPX14 can strap a different signal onto the ISB input line of LUT Xh.

The embodiment of FIG. 12A assumes that CBB's Y and W share the same AIL's in the immediately adjacent horizontal interconnect channel and that CBB's Z and X share the same AIL's in the immediately adjacent vertical interconnect channel. This AIL-sharing applies to feedback lines as well as other interconnect lines. In such a case, a wire-saving trick may be used to provide strapping between the inputs of CBB's Y and W of a same row, and alternatively or additionally to provide strapping between the inputs of CBB's Z and X of a same column. This trick eliminates a need for additional PIP's and wires for strapping together the LUT inputs of the Y and W CBB's or of the Z and X CBB's.

Instead of using inside-the-decoding layer PIP's (such as PIPY03 or PIPY3Z0), pairs of inside-the-acquisition-layer PIP's are activated on each shared AIL for carrying out the strapping function. Such 'through-the-AIL strapping' is demonstrated by the darkened squares in acquisition layer 1221. For example, simultaneous activation of PIPY5-W5*a* and PIPY5-W5*b* on a same AIL (where hyphenated symbols such as 'PIPY5-W5*a*' signify through-the-AIL wide-strapping of a Y MIL 'to' a W MIL) creates a strap between corresponding input lines Y5 and W5 of the Y and W CBB's via that same AIL. Once a through-the-AIL strapping is created, it may be continued inside of a CBB to POP'd lines where needed. Thus, after a wide strapping is created by activating both of PIPY5-W5*a* and PIPY5-W5*b*, the strapped-through signal which originated on W5 may be continued from Y5 to the MSB of LUT Ya by internal PIPY25 as indicated by the dashed arrowline marked, WRAP25. The latter WRAP25 operation is understood to occur while POPY2 is activated.

The darkened box denoted as PIPX0-Z0*b* in the crossing of the VIC with the X0 MIL is another example of the use of common AIL's to establish wide strapping, this time between the X0 and Z0 lines into the Z and X CBB's.

The just-described, 'through-the-AIL strapping' trick is not limited to creating LUT input strappings between CBB's of a same VGB. It can also be used to create LUT input strappings between CBB's of different VGB's. For example, the Y3, Y4, Y5 MIL's of a first VGB can be strapped to the corresponding Y3, Y4, Y5 MIL's of an immediately adjacent VGB by way of essentially all the adjacent interconnect lines except the FBL's. This is so because the smallest length of the other AIL's is 2×L, which length spans two adjacent VGB's.

For example, a 6-input LUT may be implemented by strapping together MIL's Y0–Y5 of two adjacent Y CBB's via the through-the-AIL strapping trick. Last-layer selection signals are obtained by using a DyOE signal (dynamic output enable signal) obtained from the common controls section 550 and applied to the shared logic section 580 (FIG. 5B). See element 1355 of FIG. 13.

Programmable opening points such as POPY1 and POPY2 (FIG. 12A) may also be used for interceptive production of feedthrough signals. Feedthrough lines such as FTY1 and FTY2 carry their respective feedthrough signals from the acquisition layer 1221 directly to a shared big drive. See FIGS. 17A–17B.

In FIG. 12B, after the respective $f_A$(5T) and $f_B$(5T) function signals are produced in synthesis layer 1226 by respective multiplexers 1280A and 1280B, these function signals are progressively forwarded to inputs 0 and 1 of multiplexer 1227. The dynamic selection control for multiplexer 1227 can come from either the vertical or horizontal interconnect channel adjacent to the VGB. In a first embodiment, dynamic selection signal SABv is obtained from MIL# X6 and fixedly routed to the selection control terminal of multiplexer 1227 as indicated by solid line 1285.

In an alternate second embodiment, dynamic selection signals SABv and SABh are respectively obtained from MIL's X6 and Y2, and these signals are routed to the selection control terminal of multiplexer 1227 by multiplexer 1283ABa as indicated by dashed line 1285*a*. Multiplexer 1283ABa can have only two data inputs or more as desired. Solid line 1285 is of course not present in the alternate second embodiment, and multiplexer 1283ABa plus its ancillary elements 1284*a*, 1285*a*, 1286*a* are not present in the first embodiment. Routing multiplexer 1283ABa is controlled by one or more of the configuration memory bits shown at 1284*a*. Whichever one of SABv and SABh that is not routed onto line 1285*a* is routed onto line 1286*a* to define a next layer, dynamic selection signal, SFW. If present, a second of the configuration memory bits shown at 1284*a* may be used in combination with the first to decode 4 states, two of which place either a constant 0 or 1 on line 1285*a*.

Layers 1226 and 1227 are understood to be disposed within the wide gating control section 560 (FIG. 5B) of the VGB. A 16-bit LUT 1290 that is also referred to herein as the 'wide-output' or WO_LUT 1290 is also disposed in this centralized wide gating section 560. WO_LUT 1290 receives the signals of lines 1275Y, 1275W, 1275Z and 1275X at its respective four input terminals. The corresponding output 1295 couples to one input of subsequent multiplexer 1228. The other input of multiplexer 1228 receives the $f_C$(6T) signal from multiplexer 1227.

In a first embodiment, configuration memory bit 1233 selects one or the other of the inputs of multiplexer 1228 as output signal $f_D$(6T/WO) for output onto line 1235.

In an alternate second embodiment, dynamic selection signal SFW is obtained from multiplexer 1283ABa (or directly from SABh) and is routed to the selection control terminal of multiplexer 1228 either directly as indicated by optional path 1234*a* or by way of AND gate 1283FWa. If AND gate 1283FWa is present, its second input of gate is driven by configuration memory bit 1233*a*. Of course, in the first embodiment, AND gate 1283FWa and/or elements 1286*a* and 1234*a* are not present, while 1233 and 1233*a* become one and the same.

Figure 13:
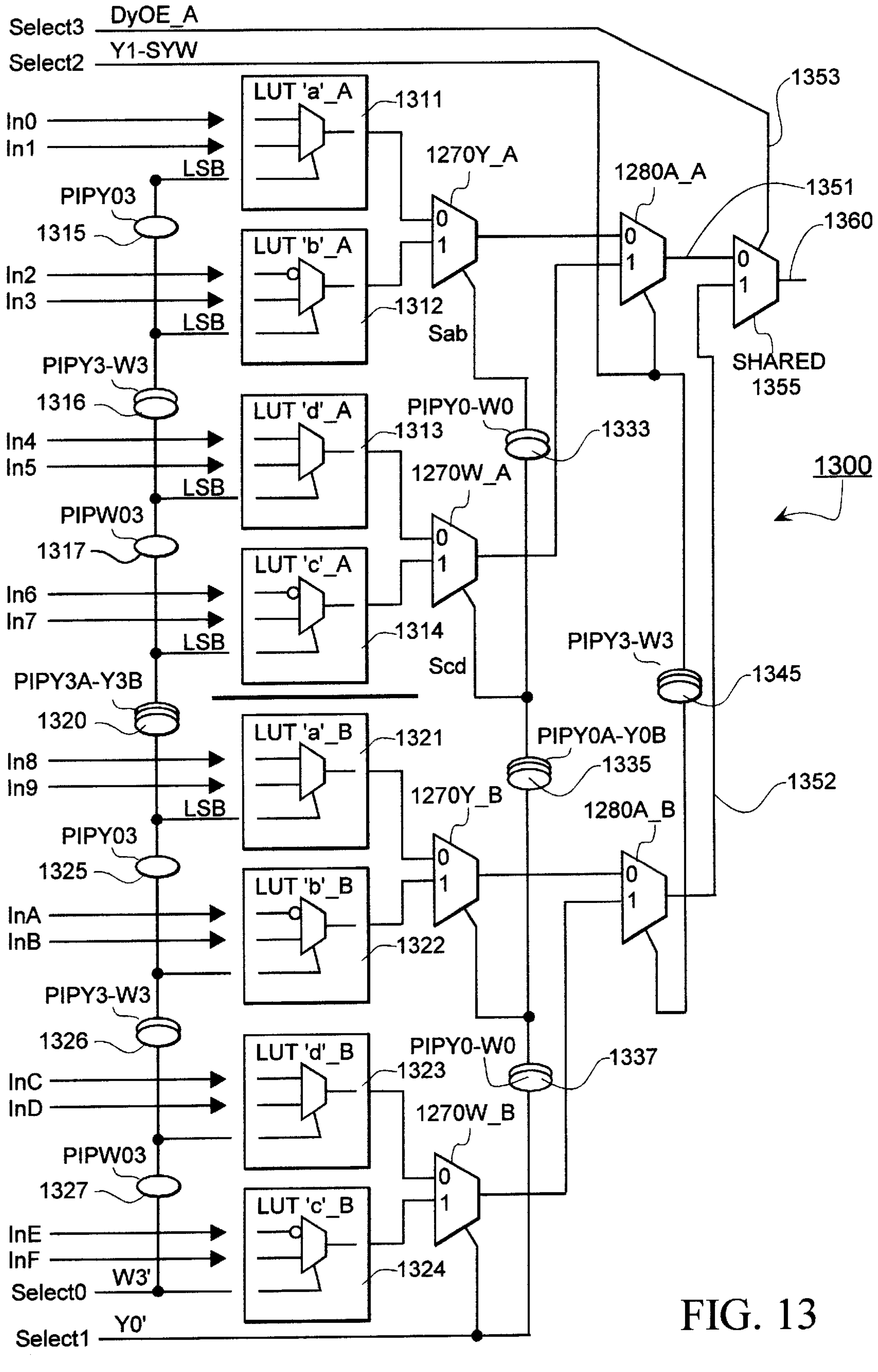
FIG. 13 demonstrates use of through-the-AIL strapping for implementing a 16:1 multiplexer.

Referring to FIG. 13, an example is shown of how a wide-input multiplexer 1300 may be implemented using the embodiment of FIGS. 12A–12B. This implementation 1300 uses the co-linear legs of two side-by-side VGB's, A and B. LUT's 1311–1314 are in VGB_A. LUT's 1321–1324 are in VGB_B. 4:1 multiplexers are formed in each of the two Y CBB's and W CBB's in a manner similar to that of FIG. 11B. In the case of LUT's 1311–1312, the LSB inputs of the respective LUT's define the select terminal for the LUT-implemented 2:1 multiplexer. A strapping connection between these two LSB inputs is provided by PIPY03, which element is also referenced as 1315. The double-ellipse symbol at 1316 represents a through-the-AIL strapping between the respective Y and W sections of VGB_A, which strapping is also referenced as PIPY3-W3. Transmission of the same selection signal (Select0) is continued between the C and D LUT's of VGB_A by the illustrated strapping connection PIPW03 shown at 1317.

The triple-ellipse symbol shown at 1320 represents a through-the-AIL connection between VGB_A and VGB_B. In the case of strap 1320, the connection is made between MIL Y3 of VGB_A and MIL Y3 of VGB_B. This is indicated by the nomenclature, PIPY3A-Y3B.

Transmission of the same selection signal is further continued within the Y section of VGB_B by PIPY03 shown at 1325. Further transmissions of the same Select0 signal are shown at 1326 and 1327. In this particular embodiment, the Select0 signal is acquired by way of MIL W3' within the W CBB of VGB_B. The same Select0 signal could have been alternatively acquired at W3 of VGB_A or Y3 of either VGB.

The Select1 signal is shown as being acquired by way of MIL Y0' within VGB_B. It is then submitted to the select control terminals of the following multiplexers: 1270W_B (within VGB_B), 1270Y_B, 1270W_A (within VGB_A) and 1270Y_A. Continuity of the Select1 signal is maintained by the strapping PIP's shown respectively at 1333, 1335 and 1337 (PIPY0-W0, PIPY0A-Y0B, PIPY0-W0 respectively).

The Select2 signal is shown being acquired via MIL Y1 of VGB_A and being supplied to the control terminal of multiplexer 1280A_A. Continuity of this Select2 signal is provided by the strapping structure of 1345 (PIPY3-W3) which provides an inter-VGB connection to the control terminal of multiplexer 1280A_B.

The corresponding output signals 1351 and 1352 of the respective 1280A multiplexer of both the _A and _B VGB's are supplied to respective input terminals of a shared multiplexer 1355 within the shared logic region (580) of the super-VGB. (See also element 1720 of FIG. 17A.) Line 1353 represents use of a DyOE signal acquired by a 14:1 control-acquiring multiplexer within VGB_A. (See FIG. 7A.) A like common control signal DyOE_B could have been alternatively used to produce the Select3 dynamic selection signal. This DyOE signal on line 1353 is supplied to the control terminal of the shared multiplexer 1355. Shared output 1360 thereby represents a 16-to-1 multiplexing result obtained from a selected one of respective inputs In0 through InF (where F here is a hexadecimal representation of the number 15) in response to the four selection signals, Select0–Select3.

The above-described 16:1 multiplexer structure 1300 is implemented along co-linear horizontal legs of adjacent VGB's using respective Y and Y Configurable Building Blocks. The same pattern may be repeated horizontally to provide a multiplicity of 16:1 multiplexers arranged co-linearly across a row of the FPGA matrix. The outputs of these 16:1 multiplexers can feed into further multiplexers formed elsewhere in the FPGA device, such as for example a simple 4:1 multiplexer as shown in FIG. 11B. It is, of course, within the contemplation of the invention to also form 16:1 multiplexers arranged vertically adjacent to a common interconnect using the Z and X sections of the VGB's. Implementations of many other types of multiplexing schemes are possible. FIG. 13 merely shows one such implementation to demonstrate the use of through-the-AIL strapping between adjacent VGB's as well as between adjacent CBB's in each VGB.

Figure 14A:
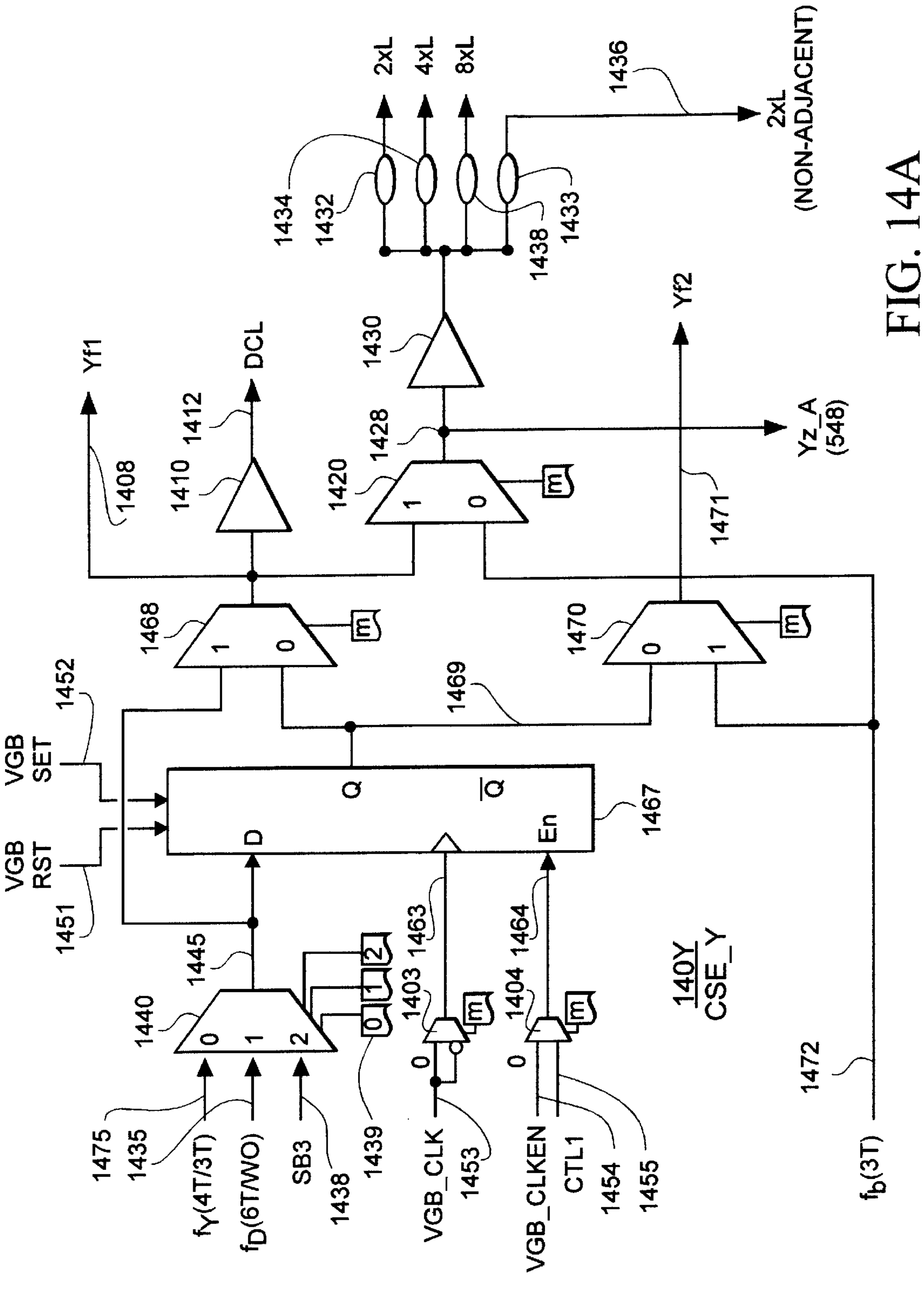
FIG. 14A is a schematic of a first Configurable Sequential Element for a Y Configurable Building Block.

FIG. 14A is a schematic of a Configurable Sequential Element (CSE) 140Y in accordance with the invention that may be used as the CSE of each Y CBB. CSE 140Y receives raw LUT outputs and/or function synthesis results for output to neighboring interconnect in synchronous or asynchronous fashion. The inputs of CSE 140Y include the raw LUT signal $f_b(3T)$ as shown at 1472. Signal 1472 may be obtained from line 1272 of FIG. 12B.

Another input signal of CSE 1401 is the $f_Y(4T/3T)$ signal shown at 1475. Signal 1475 may be obtained from corresponding line 1275Y of FIG. 12B. Signal 1475 is applied to a 0 input of multiplexer 1440. A 1 input of multiplexer 1440 receives a second synthesis result signal, $f_D(6T/WO)$ as shown at 1435. Signal 1435 may be obtained from line 1235 of FIG. 12B. A nibble bit of significance level 3 (SB3) is received at input 2 of multiplexer 1440 as indicated at 1438. The SB3 signal may be obtained from line 1988*d* of the adder circuit shown in FIG. 19D. The three configuration memory bits shown at 1439 are used to configure multiplexer 1440 to output a selected one of its input signals 0–2 on respective output line 1445.

(Note: In one embodiment every CSE_Y gets SB3 on its line 1438, every CSE_W gets SB2 on its line W1438, every CSE_Z gets SB2 on its line Z1438, and every CSE_X gets SB0 on its line X1438. In an alternate embodiment, that order of SB3-SB0 for Y, W, Z, and X holds true only for the top (north) VGB's of each super-VGB and reverses for the bottom (south) VGB's of each super-VGB. There are advantages and disadvantages to each approach. The alternate ordering of: SB3–SBO for X, Z, W, and Y respectively, places every other set of 4 sequential bits immediately adjacent to vertical AIL's, which may be helpful for certain routing problems.)

Multiplexer output line 1445 feeds the D input of flip-flop 1467. Line 1445 also feeds input 1 of the illustrated register-bypassing multiplexer 1468. A corresponding configuration memory bit (m) connects to the control terminal of multiplexer 1468. Line 1469 connects the Q output of flip-flop 1467 both to the 0 input of register-bypass multiplexer 1468 and to the 0 output of a Yf2 feedback-selecting multiplexer 1470. The $f_b(3T)$ signal 1472 is supplied to the 1 input of multiplexer 1470. Line 1471 connects the output of multiplexer 1470 to an adjacent feedback line of the VGB, that line being designated as Yf2.

Line 1472 additionally carries the $f_b(3T)$ signal to a 0 input of a 2/4/8×L output-selecting multiplexer 1420. The 1 input of multiplexer 1420 receives the output of multiplexer 1468 by way of line 1408. Line 1408 further drives an input of direct-connect (DC) driver 1410. Line 1408 further connects to an adjacent feedback line designated as Yf1. The output of DC driver 1410 drives an adjacent direct connect line (DCL) designated as 1412.

The output of the 2/4/8×L output-selecting multiplexer 1420 is designated as line 1428 and this line feeds an input of a 2/4/8×L output driving amplifier 1430. The signal on line 1428 is also directed to the shared logic section (580, FIG. 5B) as the signal designated by Yz_A (548). The underscore followed by the capital A indicates origin of the Yz signal from VGB_A. Of course, if CSE 140Y is in a different VGB, then line 1428 connects to the corresponding input of the shared logic (580) in that VGB.

The 2/4/8×L output driving amplifier 1430 connects to a plurality of output-coupling PIP's respectively designated as 1432, 1434, 1438 and 1433. In one embodiment, each of these output-coupling PIP's is implemented in accordance with the bootstrapped transmission gate design shown in FIG. 3E.

Figure 15:
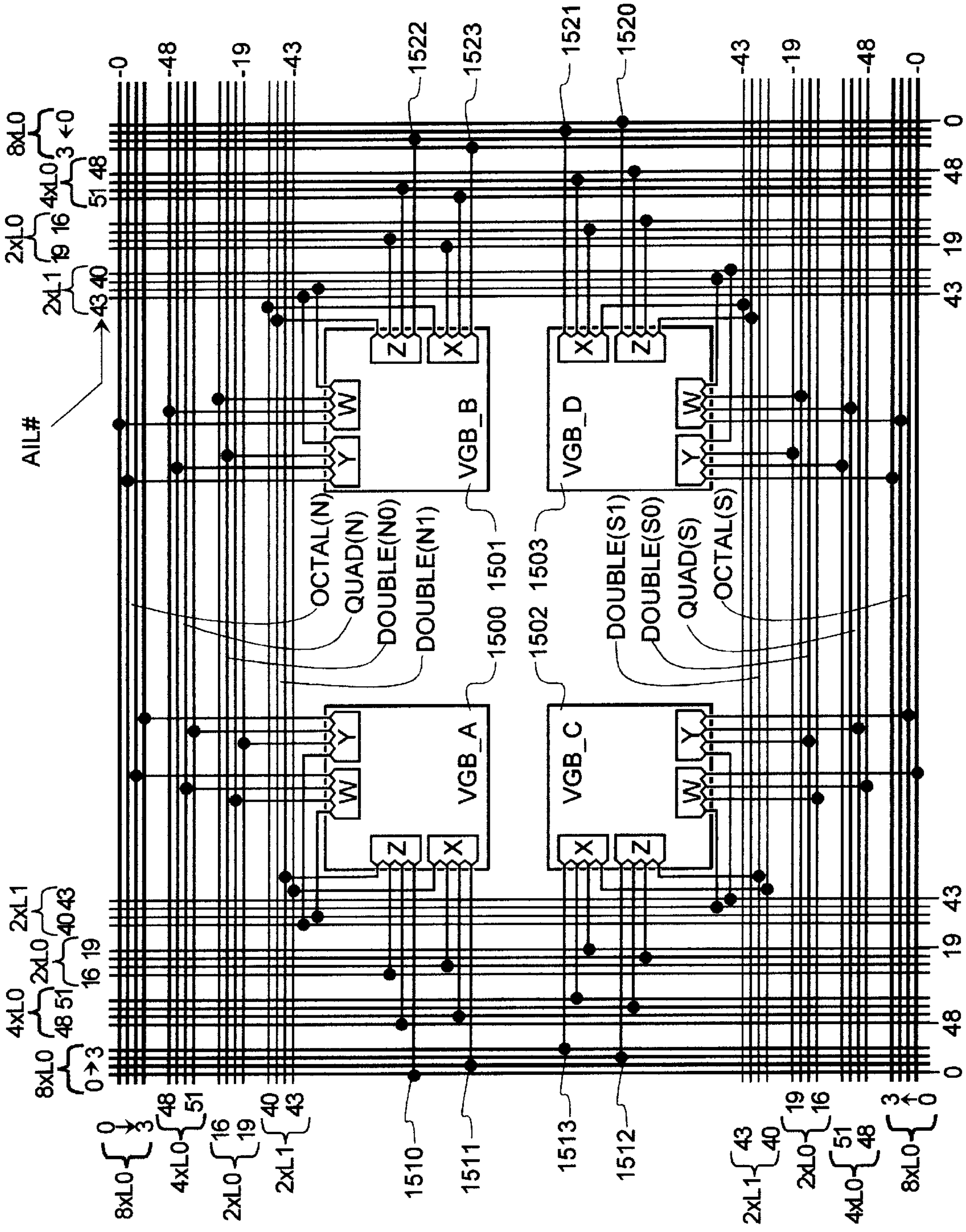
FIG. 15 is a schematic showing connections of CSE outputs within a super-VGB to adjacent 2×L, 4×L and 8×L lines.

Output-coupling PIP 1432 connects to an immediately adjacent 2×L line. Output-coupling PIP 1434 connects to an immediately adjacent 4×L line. Output-coupling PIP 1438 connects to an immediately adjacent 8×L line. Output-coupling PIP 1433 connects to another 2×L line which is not immediately adjacent. The non-adjacency of this second 2×L line is indicated by the L-oriented shape of symbol 143G. In one embodiment the non-adjacent 2×L line is in an orthogonally crossing interconnect channel such as shown in FIG. 15. The combination of the to-2×L coupling means 1436 and 1432 permits configurable routing of result signals to either one of othogonal interconnect channels, or alternatively, simultaneous broadcast of result signals to othogonal interconnect channels.

It is understood that each of the 2×L, 4×L and 8×L lines may or may not connect to further such lines by way of routing established through switch boxes within the FPGA matrix. Each of the driven 2×L, 4×L and 8×L lines may be therefore viewed as the beginning of resistance-capacitance (RC) ladder network of variable extent, that extent being defined by different routing configurations as implemented by FPGA configuring software.

In contrast to the variable loading that may be presented to the output of the 2/4/8×L output driving amplifier 1430, the load of DC line driver 1410 does not vary substantially. It is dictated primarily by the total number of direct connect lines (DCL's) that are directly connected to output line 1412.

In accordance with the invention, each of line-driving amplifiers 1410 and 1430 has its output stage designed to output more or less power in accordance with the different load that it drives on average. In one embodiment, the output stage of DC line driver 1410 features PMOS output transistors with channel widths of approximately 35 microns and NMOS output transistors with channel widths of approximately 15 microns. In the same embodiment, the output stage of line driver 1430 features corresponding P and N transistors with respective channel widths of approximately 20 and 10 microns. In the same embodiment, the output stages of feedback drivers 1468 and 1470 each features corresponding P and N transistors with respective channel widths of approximately 10 and 5 microns. In the same embodiment, the output stage of each longline drive of shared section 450 (FIG. 4B) features corresponding P and N transistors with respective channel widths of approximately 35 and 15 microns.

The reason that the DC line driver 1410 is given greater current output capability than the corresponding 2/4/8×L output driving amplifier 1430 in this embodiment is because the fixed capacitive load of the many direct-connect lines in this embodiment is greater than the average capacitive load that may be presented to line driver 1430. This latter average load is based on an assumption of random routing possibilities wherein the RC network ladder presented by the 2×L, 4×L and 8×L loads can include routing configurations that provide relatively small loads as well as larger ones. It is understood that any one or more of output-coupling PIP's 1432, 1434, 1438 and 1433 may be configured into the open state, and that for such a state, driver 1430 does not see the load of the corresponding 2×L, 4×L or 8×L lines and beyond.

It is understood that feedback lines 1408 and 1428 also present respective RC loads, but these loads are generally much smaller than those seen by line drivers 1410 and 1430. As such, the respective fan-out capabilities of multiplexer 1468 and 1470 can be significantly smaller than the fan-out capabilities of line drivers 1410 and 1430. Note that CSE 140Y can simultaneously output to adjacent interconnect and/or VGB intraconnect, the signals on lines 1408 and 1472.

The reset terminal 1451 and set terminal 1452 of flip-flop 1467 are respectively driven by the VGB_RST signal and VGB_SET signal. The latter signals may be respectively obtained from lines 751 and 752 of FIG. 7A. Clock input terminal 1463 of flip-flop 1467 is driven by configurable multiplexer 1403. The 0 input of multiplexer 1403 provides a non-inverted version of the VGB_CLK signal provided on line 1453. Selection of the 1 input of multiplexer 1403 places an inverted version of the VGB_CLK signal 1453 on line 1463.

The clock enable terminal 1464 of flip-flop 1467 is driven by configurable multiplexer 1404. Configuration-defined selection of the 0 input of multiplexer 1404 places the VGB_CLKEN signal 1454 on enable line 1464. Selection of the 1 input of multiplexer 1404 places the CTL1 signal 1455 on enable line 1464. Respective signals 1453 and 1454 may be obtained from lines 753 and 754 of FIG. 7A. Signal 1455 may be obtained from line 711 of FIG. 7A.

Figure 14B:
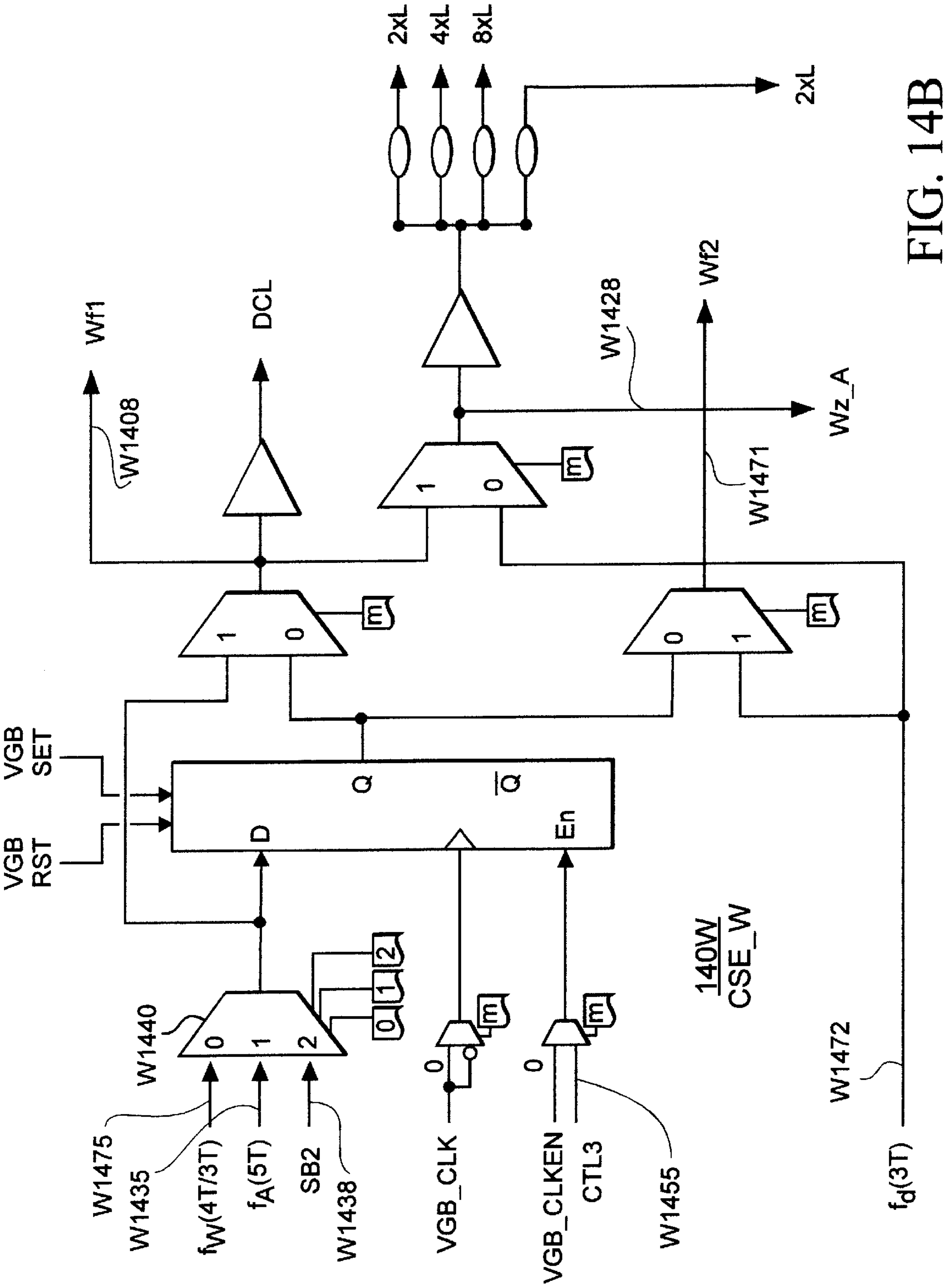
FIGS. 14B–14D are respective schematics of second through fourth CSE's for W, Z and X CBB's.
Figure 14C:
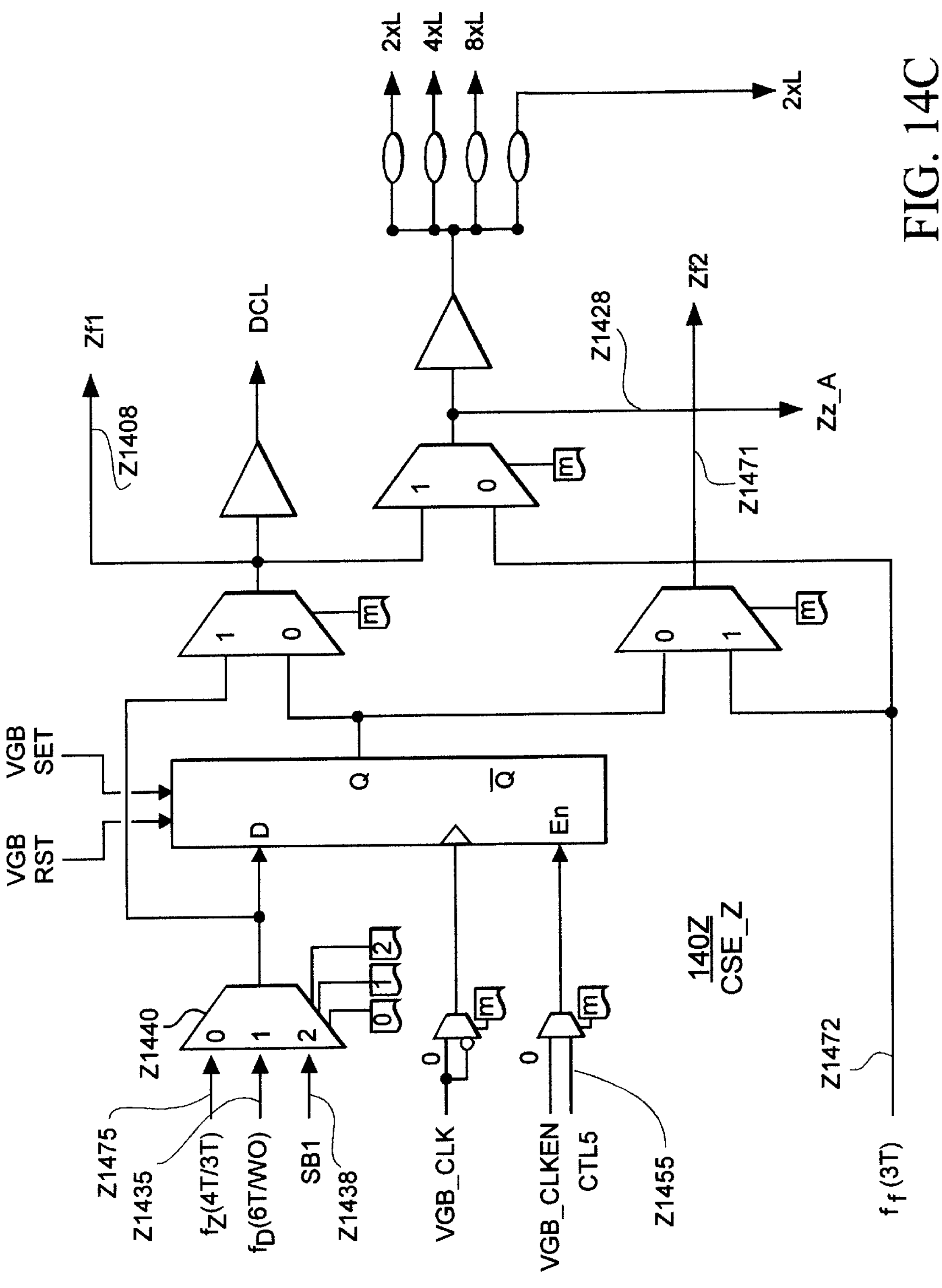
Figure 14D:
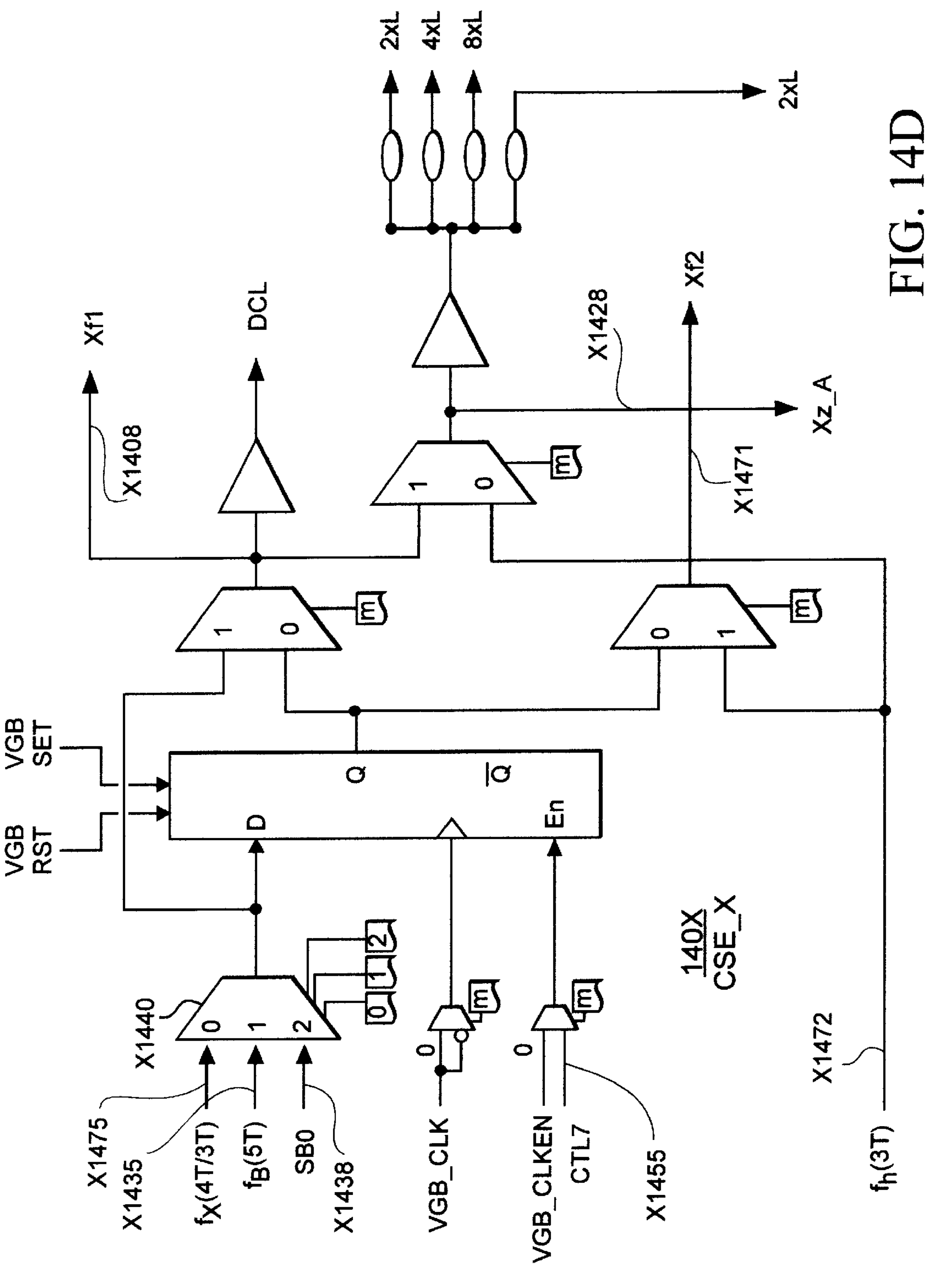

FIGS. 14B through 14D respectively show CSE_W, CSE_Z and CSE_X, each having a substantially similar structure as the CSE_Y shown in FIG. 14A. There are some minor differences, however, which are pointed to by corresponding reference symbols. In FIG. 14B, multiplexer W1440 receives on input line W1475 the $f_W$(4T/3T) signal which corresponds to the signal on line 1275W of FIG. 12B. Multiplexer W1440 further receives on line W1435 the $f_A$(5T) which corresponds to the output signal of multiplexer 1280A in FIG. 12B. Multiplexer W1440 further receives on respective line W1438 the SB2 significance bit which is of lower significance than the SB3 signal received by CSE_Y (FIG. 14A).

Additional differences in FIG. 14B include receipt of the CTL3 signal on line W1455 and receipt of the $f_d$(3T) signal on line W1472. Line W1428 outputs the Wz_A signal to the shared logic section (580). Lines W1408 and W1471 respectively output the Wf1 and Wf2 signals to the adjacent feedback lines of the encompassing VGB.

Similar differences occur in respective FIGS. 14C and 14D for the Z and X CSE's. CSE_Z receives the next-to-least significant bit SB1 while CSE_Z receives the least significant bit SB0. Note that CSE_Y and CSE_Z receive the more complex signal $f_D$(6T/WO) at their respective multiplexers 1440 and Z1440. In contrast, CSE_W and CSE_X respectively receive the less folded, and more sided, signals $f_A$(5T) and $f_B$(5T) at their respective multiplexers W1440 and X1440.

Figure 14E:
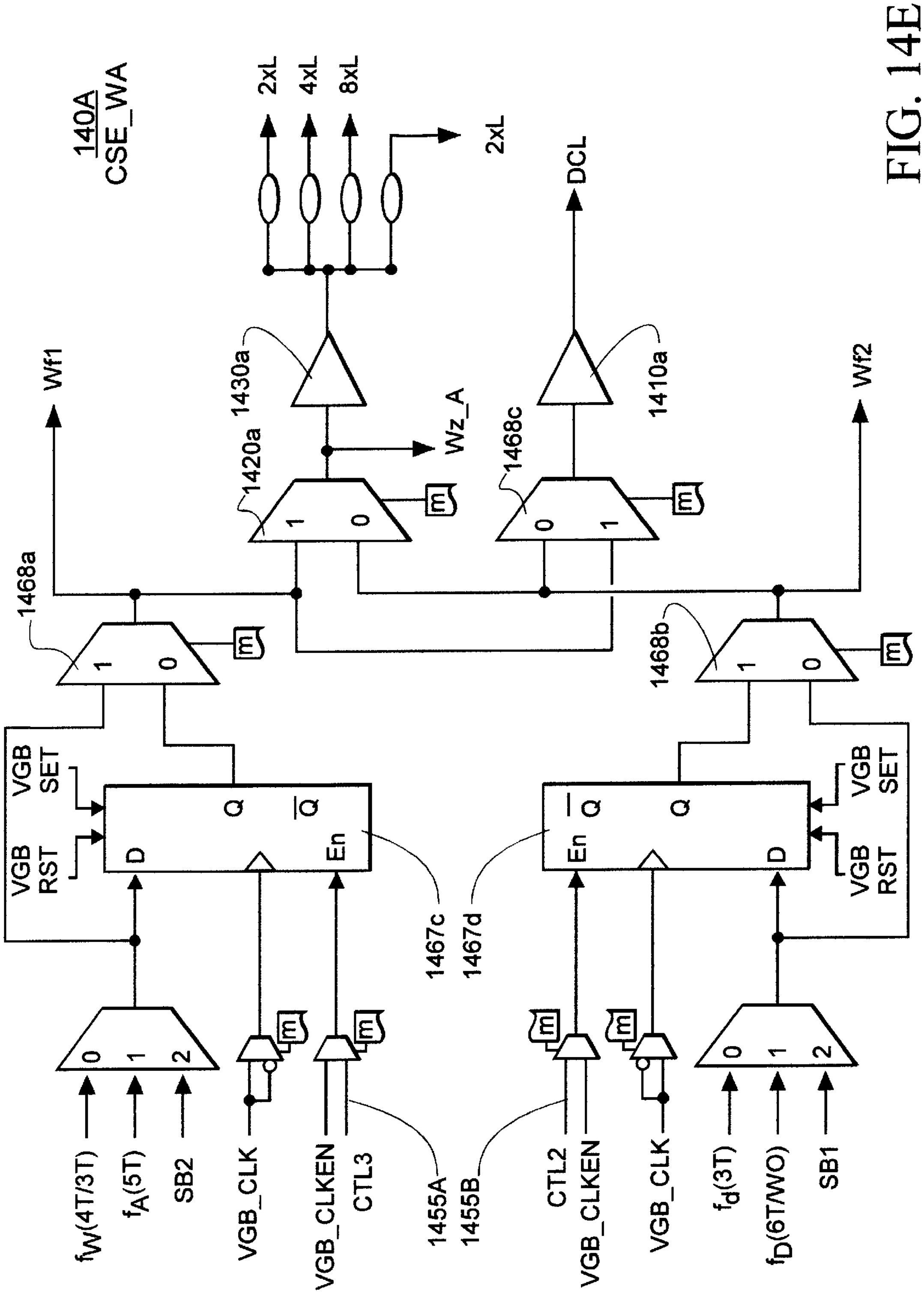
FIG. 14E is a schematic of an alternative Configurable Sequential Element for a W Configurable Building Block.

FIG. 14E shows an alternative (larger) design for a W CSE. This alternative design 140A is understood to be generically applicable to the Y, Z and X CSE's also. Note that here, the outputs of each of LUT's c and d gets access to a respective data-storing flip flop (1467*c* and 1467*d*) so that either signal may be output synchronously with the VGB_CLK as well as asynchronously. Both of the CTL2 and CTL3 control signals are available for respective individual control of clock enables to respective flip flops 1467*c* and 1467*d*. Nibble significance can run both forward and backwards as indicated by availability of both SB2 and SB1 in this alternative design for the W CSE. Although not shown, it is understood that the alternate Y CSE would get both SB0 and SB3, as would the alternate X CSE. The alternate Z CSE would get both SB1 and SB2. Note that both the f(6T/WO) and the f(5T) function synthesis results are available for output through the one CSE 140A synchronously or asynchronously. Moreover, register-bypass multiplexers 1468*a* and 1468*b* allow output to respective feedback lines Wf1 and Wf2 of either the synchronous output (Q) of respective flip flops 1467*c* and 1467*d* or the asynchronous input (D). DC-selecting multiplexer 1468*c* can be configured to select the output of either of multiplexers 1468*a* and 1468*b* for application to DC line driver 1410*a*. 2/4/8/M×L-selecting multiplexer 1420*a* can be configured to select the output of either of multiplexers 1468*a* and 1468*b* for application to 2/4/8×L lines driver 1430*a* to the shared logic as signal Wz_A. Of course, the alternate CSE design 140A of FIG. 14E consumes more circuit space than does the design 140W of FIG. 14B. The latter, smaller design is preferable where circuit space is tight and it is desirable to keep power consumption small. Further modifications to CSE design 140A can be made so as to give each CBE its own private DC line driver and/or its own private 2/4/8×L lines driver. But such further modifications would disadvantageously increase circuit space utilization and power consumption.

FIG. 15 shows the connections of the respective output-coupling PIP's 1432, 1434, 1438 and 1433 (see FIG. 14A) of each of the Y, W, Z and X CBB's to the surrounding 2×L, 4×L and 8×L interconnect lines surrounding the encompassing super-VGB. The layout is essentially symmetrical diagonally as well as horizontally and vertically. The octal length (8×L) lines are positioned in this embodiment further away from the VGB's 1500–1503 than are the 4×L and 2×L lines of the respective vertical and horizontal interconnect channels. AIL line 0 of each of the illustrated VIC's and HIC's is at the outer periphery and AIL numbers run generally from low to high as one moves inwardly. The quad length (4×L) lines are positioned in this embodiment further away from the VGB's than are the double length (2×L) lines of the respective VIC's and HIC's. It is within the contemplation of the invention to alternatively position the octal length (8×L) lines closest to VGB's 1500–1503, the quad length (4×L) lines next closest, and the double length (2×L) lines of the respective VIC's and HIC's furthest away from surrounded VGB's 1500–1503. The same pattern of course repeats in each super-VGB of the FPGA core matrix.

VGB_A (1500) can couple to same AIL's in the northern octals (Octals(N)) as can VGB_D (1503) in the southern octals (Octals (S)). A similar, diagonal symmetry relation exists between VGB_B (1501) and VGB_C (1502). Symmetry for the eastern and western octal connections is indicated by solid connection points 1510, 1511, 1513 and 1512 moving southwardly along the west side of the tile and by counterposed solid connection points 1520, 1521, 1523 and 1522 moving northwardly along the east side.

Note that the non-adjacent 2×L connections of this embodiment (lines corresponding to symbol 1436 of FIG. 14A) allow for coupling of a full nibble of data from any VGB to the 2×L lines in either or both of the adjacent VIC's and HIC's. Thus, bus-oriented operation may be efficiently supported by the L-organized CBB's of each VGB in either the horizontal or vertical direction. Each CBB of this embodiment has essentially equivalent access to output result signals to immediately adjacent 2×L, 4×L and 8×L lines as well as to nonadjacent 2×L lines (in the AIL 40–43 sets). Each pair of VGB's of a same row or column can output 4 independent result signals to a corresponding 4 lines in any one of the following 4-line buses: (a) the immediately adjacent 2×L0 group (AIL's 16–19), (b) the immediately adjacent 4×L group (AIL's 48–51), (c) the immediately adjacent 8×L group (AIL's 0–3), and (d) the not immediately adjacent 2×L1 group (AIL's 40–43).

Figure 16:
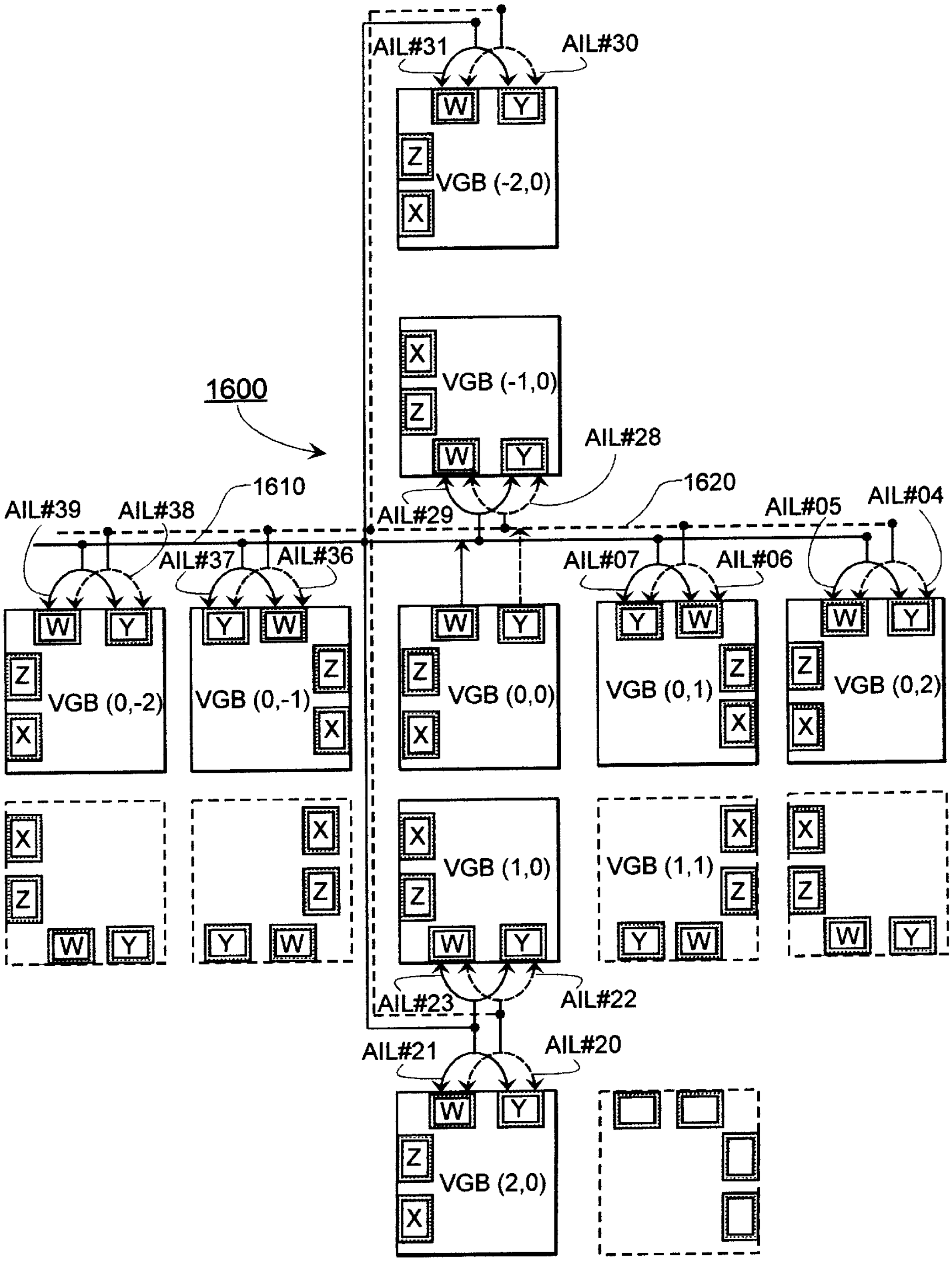
FIG. 16 is a schematic showing direct connections from W and Y CSE outputs of a first VGB to W and Y inputs of 8 neighboring VGB's.

FIG. 16 illustrates an embodiment 1600 of direct connections that may be used within the FPGA device disclosed here. Other direct connection schemes are also usable. In FIG. 16, solid line 1610 represents the DC output of the W CSE within reference VGB(0,0). Dashed line 1620 represents the DC output of the Y CSE within the same reference VGB(0,0) . Each of lines 1610 and 1620 extends continuously to the W and Y CBB's of eight other VGB's that neighbor reference VGB(0,0) both immediately and non-immediately. VGB's (0,−1) and (0,1) immediately neighbor VGB(0,0) in the same row. VGB's (−1,0) and (1,0) immediately neighbor VGB(0,0) in the same column. VGB's (0,−2) and (0,2) are next-adjacent to VGB(0,0) in the same row. VGB's (−2,0) and (2,0) are next-adjacent to VGB(0,0) in the same column. The relative AIL numbers of continuous lines 1610 and 1620 change as one moves from one to the next of the eight neighboring VGB's as shown. This is so because, by way of example, reference VGB(0,0) is first to the left of VGB(0,1) but second to the left of VGB(0,2). See FIG. 10. A similar pattern of direct connections is understood to exist for the respective DC outputs of CBB's Z and X of the reference VGB(0,0). See FIG. 10 again.

The direct connection scheme of FIG. 10 assists the FPGA configuring software as follows. A CBB-sized, signal-sourcing chunk may be placed equivalently in either of the W and Y CBB's of reference VGB(0,0) with equal capability to transmit its sourced signal to a receiving chunk in one of the eight neighboring VGB's: (0,1), (0,2), (0,−1), (0,−2), (1,0), (2,0), (−1,0), and (−2,0). A CBB-sized, signal-receiving chunk may be placed equivalently in either of the W and Y CBB's of any of the eight neighboring VGB's. Thus a wide range of placement and routing options are provided.

Also, if through-the-AIL strapping is desirable for a signal that is sourced by reference VGB(0,0) and is to be processed by pairs of VGB's such as (0,−2) and (0,−1), or such as (−2,0) and (−1,0), a DCL such as 1610 or 1620 can provide a convenient and high speed means for carrying out such through-the-AIL strapping. See FIG. 13 for an example of how through-the-AIL strapping may be used to implement large scale, dynamic multiplexers within a super-VGB using in-row adjacent VGB's such as (0,−2) and (0,−1), or using in-column adjacent VGB's such as (−2,0) and (−1,0).

Additionally, nibble-wide transmission of data from one column or row of VGB's to a next or next-adjacent column or row of VGB's may be carried out with the direct connections scheme 1600 of FIG. 16. It should be recalled that, while not shown, a same scheme of direct connections is provided for the Z and X CBB's. Thus, the W and Y CBB's of reference VGB(0,0) may output a first set of 2 independent bits to corresponding W and Y CBB's of the eight neighboring VGB's while the Z and X CBB's of reference VGB(0,0) may output a second set of 2 independent bits to corresponding Z and X CBB's of the eight neighboring VGB's. Result data may therefore be transferred in nibble-wide quantums by way of the repeated direct connections scheme 1600 from a first column of VGB's either left or right to a next or next-adjacent column of VGB's, or from a first row of VGB's either up or down to a next or next-adjacent row of VGB's, or it may be symmetrically broadcast as a nibble-wide quantum from a reference VGB(0,0) to as many as eight neighboring VGB's.

Figure 17A:
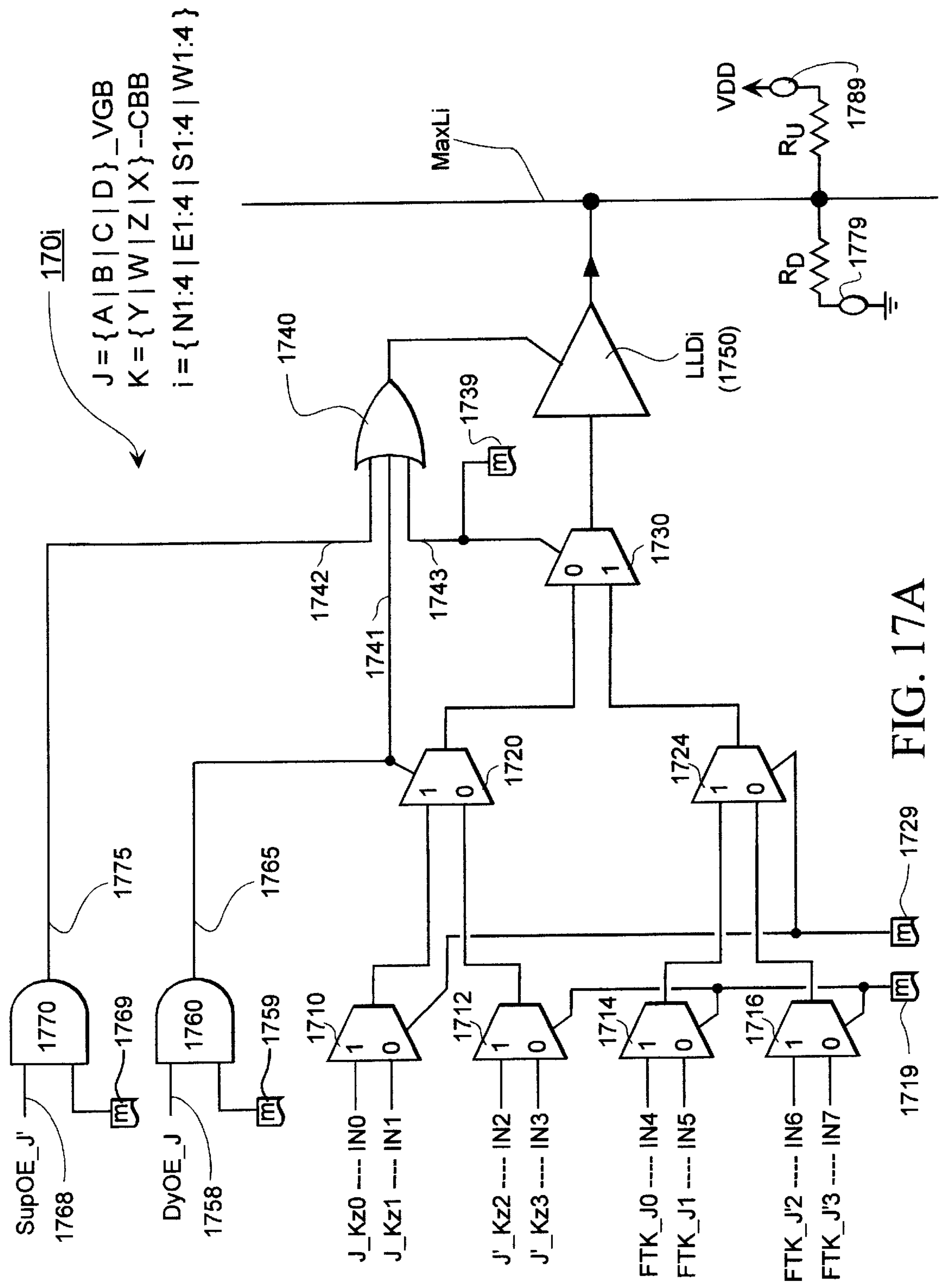
FIG. 17A is a schematic of shared, big drive logic for each MaxL line driver of a given super-VGB.

FIG. 17A is a schematic diagram of shared big drive, logic circuit 170*i* where i equals 1 through M for the respective plurality of M MaxL line drivers in the shared core 450 (FIG. 4B) of each super-VGB. In one embodiment, M=16. These 16 drivers are uniformly distributed as: (a) 4 northern MaxL line drivers for driving a respective 4 northern MaxL lines adjacent to the super-VGB; (b) 4 eastern MaxL line drivers for a respective 4 eastern, adjacent MaxL lines; (c) 4 southern MaxL line drivers for a respective 4 southern, adjacent MaxL lines; and (d) 4 western MaxL line drivers for a respective 4 western, adjacent MaxL lines.

In FIG. 17A, J or J1 represent one of the _A, _B, _C and _D VGB's of a given super-VGB. K designates one of the X, Z, W, and Y CBB's. FTK designates a feedthrough signal from a respective CBB. FIG. 17B provides a matrix showing a mix used in one embodiment. Other mixes are of course also possible. The respective inputs of multiplexers 1710–1716 are named as IN0 through IN7, or alternatively as J_Kz0 through J'_Kz3 and as FTK_J0 through FTK_J'3 as shown.

It is understood that multiplexers 1710 and 1714 form the shared logic section (580) within first VGB J while multiplexers 1712 and 1716 form the shared logic section (580') within second VGB J'. Multiplexers 1720 and 1724 are arranged outside of first and second VGB's J and J' since these multiplexers 1720, 1724 collect signals from both of VGB's J and J'.

Multiplexer 1720 may be used to dynamically select between the configuration-defined output of either multiplexer 1710 or multiplexer 1720. Configuration memory bit 1719 drives the selection control terminal of multiplexer 1712 as well as those of multiplexers 1714 and 1716. Configuration memory bit 1729 drives the selection control terminal of multiplexer 1710 as well as that of multiplexer 1724. The selection control terminal of multiplexer 1720 is driven by AND gate 1760. One input of AND gate 1760 is driven by configuration memory bit 1759. Another input of AND gate 1760 is driven by the DyOE_J signal on line 1758. This DyOE_J signal is a common-controls derived signal such as 758 of FIG. 7A. Given that multiplexer 1710 obtains a CSE output signal from a first VGB, J and that multiplexer 1720 obtains a CSE output signal from a second VGB, J', when configuration memory bit 1759 is at logic 1, the DyOE_J signal (1758) passes through onto line 1765 and as such may be used to dynamically select an output from one of VGB's J and J' as an input for longline driver LLDi (1750). When 1765 is high (logic 1), the output of 1710 is selected. When 1765 is low (logic 0), the output of 1720 is selected. This is indicated by the placement of the "1" and '0' symbols at the data inputs of multiplexer 1720. Such symbology is used throughout. As such, the basic operations of configuration memory bits 1719, 1729, 1739, 1759 and 1769 are understood from the schematic. As will be understood, configuration memory bit 1739 should be set low, while bit 1769 and line 1768 should be set high when it is desired to use line 1758 as a dynamic selection control.

When configuration memory bit 1739 is set high, the correspondingly-controlled multiplexer 1730 passes through one of the feedthrough signals (IN4 through IN7) selected by multiplexers 1714, 1716 and 1724. The high on bit 1739 also passes through input 1743 of OR gate 1740 to fixedly activate the output enable terminal of three-state longline driver 1750. Signals on lines 1741 and 1742 become don't-cares under this condition.

If bit 1739 is set low, a high on one of OR gate inputs 1741 and 1742 may alternatively pass through gate 1740 to activate the OE terminal of tri-state driver 1750. If all of configuration memory bits 1739, 1759 and 1769 are set low, the tri-state driver 1750 (LLDi) is disabled and placed in a high output impedance state. In one embodiment, the output stage of tri-state driver 1750 features PMOS output transistors with channel widths of approximately 35 microns and NMOS output transistors with channel widths of approximately 15 microns.

Input line 1768 of AND gate 1770 represents an alternate or supplemental output enable. Like line 1758, line 1768 connects to one of the DyoE signals developed within the common control sections of the super-VGB. If configuration memory bit 1769 is set high while each of 1759 and 1739 is low, the output of multiplexer 1712 passes through 1720 and 1730 to become the input of driver 1750. The SupOE_J' signal of line 1768 may act at the same time as a dynamic output enable that activates and deactivates tri-state driver 1750.

If configuration memory bit 1759 is set high while each of 1769 and 1739 is low, output 1765 functions as both a dynamic output enable for tri-state driver 1750 and as a selector on multiplexer 1720. Obviously, the '0' input of 1720 is a don't-care in this situation because LLDi 1750 is disabled when 1765 goes low and by happenstance selects the '0' input of 1720.

In one embodiment, one or more of the MaxL lines may be configurably connectable to a weak pull-up resistor $R_U$ and/or to a weak pull-down resistor $R_D$ via respective PIP's 1779 and/or 1789 as shown. Those skilled in the art will appreciate that narrow-channel pass-transistors of appropriate P or N type may be used to integrally implement both the resistive portion and the PIP portion of these line urging means 1779 and/or 1789. When PIP 1789 is activated to resistively connect the MaxLi line to pull-up voltage $V_{DD}$, a wired-AND gate may be implemented on the MaxLi line if each line driver LLDi of that line has a zero at its input and the corresponding OE terminal of each such line driver LLDi receives an input signal of the wired-AND gate, for example, from line 1775. In the latter case, the SupOE_J' signal of line 1775 may be derived from a complex function signal that has been placed on an AIL of the super-VGB and has been acquired by one of the 14:1 control-acquiring multiplexers. (See FIG. 7A.) As such, wired-ANDing of a plurality of complex function signals may be realized along the MaxLi line when desired.

Conversely, when PIP 1779 is activated to resistively connect the MaxLi line to ground (logic '0'), a wired-OR gate may be implemented on the MaxLi line if each line driver LLDi of that line has a logic one at its input and the corresponding OE terminal of each such line driver LLDi receives an input signal of the wired-OR gate, for example, from line 1775.

In an alternate embodiment (one that is wired according to FIG. 18A–18D), no pull-ups or pull-downs are provided on the MaxLi lines within the core of the FPGA. Instead, configuration-activatable, weak pull-up resistors $®_U$) are provided only on a selected subset of longlines (4 lines in each VIC or HIC) within the peripheral interconnect channels. These peripheral NOR lines may be driven by adjacent IOB's and/or by the longline drivers of immediately adjacent super-VGB's to implement wide-input NOR functions.

Referring to the configurations matrix of FIG. 17B, note that the northern MaxL drivers N1:4 acquire their DyOE_J and SupOE_J' signals respectively from the northern VGB's _A and _B. Similarly, the eastern drivers E1:4 acquire their DyOE signals from eastern VGB's _B and _D; the southern drivers S1:4 acquire their DyOE signals from southern VGB's _D and _C; and the western drivers W1:4 acquire their DyOE signals from western VGB's _C and _A.

In similar vein, for the northern MaxL drivers N1:4, the IN0–IN3 signals are acquired respectively from the northern VGB's _B and _A. For drivers N1 and N3, dynamic selection is possible between the Y and X CBB's of VGB's _B and _A. For drivers N2 and N4, dynamic selection is possible between the Z and W CBB's. A corresponding pattern is shown for the other drivers, E1:4, S1:4 and W1:4.

Additionally, for the northern MaxL drivers N1:4, the IN4–IN7 feedthrough signals are acquired respectively from the FTX1 and FTX2 lines of northern VGB's _B and _A. (FTX1 and FTX2 here correspond respectively to FTX5 and FTX4 of FIG. 12A.) A corresponding pattern is shown for the other drivers, E1:4, S1:4 and W1:4.

Note that same source signals are seen multiple times in the matrix of FIG. 17B. For example, the A_Yz CSE output signal may be routed to any one or all of the following tri-state drivers: N1, N3, W1 and W4. The FTX1_A feedthrough signal may be routed to any one or all of the following tri-state drivers: N1, N2, N3 and N4. The below Table-1 and Table-2 show the respective routing options for the CSE outputs and the feedthroughs.

TABLE 1

| CSE Output Source | Dest 1 | Dest 2 | Dest 3 | Dest 4 |
|---|---|---|---|---|
| A_Xz | N1 | N4 | W1 | W3 |
| A_Yz | N1 | N3 | W1 | W4 |
| A_WZ | N2 | N4 | W2 | W3 |
| A_Zz | N2 | N3 | W2 | W4 |
| B_Xz | N1 | N4 | E1 | E3 |
| B_Yz | N1 | N3 | E1 | E4 |
| B_Wz | N2 | N4 | E2 | E3 |
| B_Zz | N2 | N3 | E2 | E4 |
| C_Xz | S1 | S4 | W1 | W3 |
| C_Yz | S1 | S3 | W1 | W4 |
| C_Wz | S2 | S4 | W2 | W3 |
| C_Zz | S2 | S3 | W2 | W4 |
| D_Xz | S1 | S4 | E1 | E3 |
| D_Yz | S1 | S3 | E1 | E4 |
| D_Wz | S2 | S4 | E2 | E3 |
| D_Zz | S2 | S3 | E2 | E4 |

Note from the above Table-1 that a nibble's-worth of data may be output from a given VGB through four, same-directed MaxL drivers to the adjacent MaxL lines. For example, CSE outputs: A_Xz, A_Yz, A_Wz, and A_Zz, may be simultaneously and respectively routed to: N1, N3, N4 and N2. Alternatively, CSE outputs: A_Xz, A_Yz, A_Wz, and A_Zz, may be simultaneously and respectively routed to: W3, W1, W2 and W4.

TABLE 2

| Feedthrough Source | Dest 1 | Dest 2 | Dest 3 | Dest 4 |
|---|---|---|---|---|
| FTX1_A | N1 | N2 | N3 | N4 |
| FTX2_A | N1 | N2 | N3 | N4 |
| FTY1_A | W1 | W2 | W3 | W4 |
| FTY2_A | W1 | W2 | W3 | W4 |
| FTX1_B | N1 | N2 | N3 | N4 |
| FTX2_B | N1 | N2 | N3 | N4 |
| FTY1_B | E1 | E2 | E3 | E4 |
| FTY2_B | E1 | E2 | E3 | E4 |
| FTX1_C | S1 | S2 | S3 | S4 |
| FTX2_C | S1 | S2 | S3 | S4 |
| FTY1_C | W1 | W2 | W3 | W4 |
| FTY2_C | W1 | W2 | W3 | W4 |
| FTX1_D | S1 | S2 | S3 | S4 |
| FTX2_D | S1 | S2 | S3 | S4 |
| FTY1_D | E1 | E2 | E3 | E4 |
| FTY2_D | E1 | E2 | E3 | E4 |

Note from the above Table-2 that a nibble's-worth of data may be fedthrough from parallel legs of a given pair of adjacent VGB's through four, same-directed MaxL drivers to the adjacent MaxL lines. For example, feed-through outputs: FTX1_A, FTX2_A, FTX1_B and FTX2_B, may be simultaneously and respectively routed to: N1, N2, N3 and N4. Alternatively, feedthrough outputs: FTY1_A, FTY2_A, FTY1_C and FTY2_C may be simultaneously and respectively routed to: W1, W2, W3 and W4.

Figure 17C:
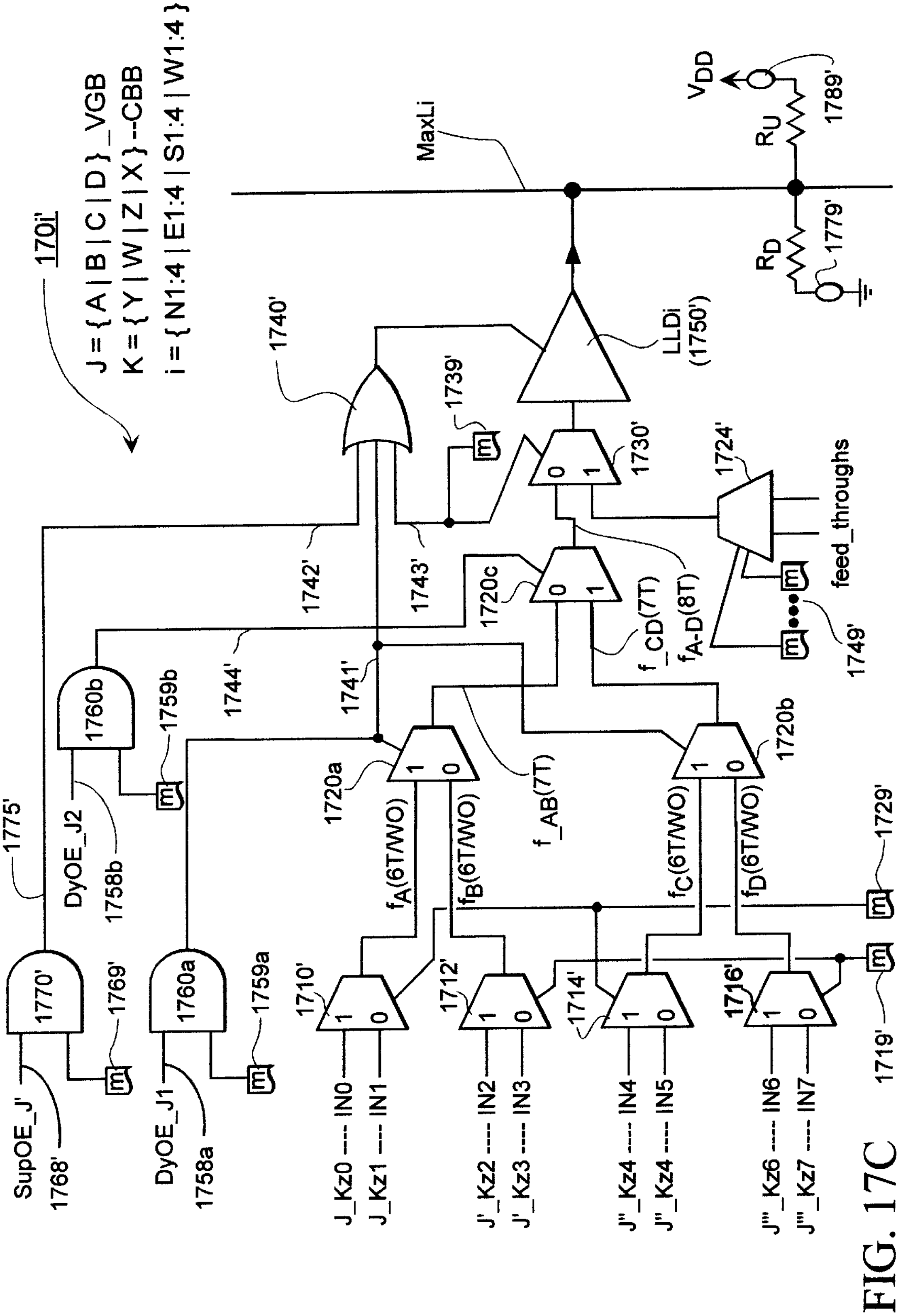
FIG. 17C is a schematic of an alternate shared, big drive logic for folding together the resources of 4 VGB's.

FIG. 17C is a schematic diagram of an alternate design for each shared big drive, logic circuit 170*i*' where i' equals 1 through M for the respective plurality of M MaxL line drivers in the shared core 450 (FIG. 4B) of each super-VGB. Like reference numerals in the '1700' number series are used in FIG. 17C for elements having like counterparts in FIG. 17A. As such, the functions of most of the like-numbered elements will be understood by implication.

A major difference in the alternate logic circuit 170*i*' of FIG. 17C is that dynamic selection is carried one level deeper to produce signal $f_{A\text{-}D}$(8T) at the output of multiplexer 1720*c*, where signal $f_{A\text{-}D}$(8T) can be any function of as many as 8 independent input terms. In essence, the function synthesis capabilities of all four VGB's (_A through _D) of the encompassing super-VGB are being folded together in the alternate shared logic circuit 170*i*'.

To produce the $f_{A\text{-}D}$(8T) signal, each of multiplexers 1710', 1712', 1714' and 1716' receives Kz signals from respective ones of VGB's _A through _D. Multiplexer 1710' produces a first 6-term (or wide-output) signal, $f_A$(6T/WO) which was synthesized in VGB_A. Multiplexer 1712' produces a second 6-term (or wide-output) signal, $f_B$(6T/WO) which was synthesized in VGB_B. Multiplexer 1714' produces a third 6-term (or wide-output) signal, $f_C$(6T/WO) which was synthesized in VGB_C. Multiplexer 1716' produces a fourth 6-term (or wide-output) signal, $f_D$(6T/WO) which was synthesized in VGB_D.

Multiplexer 1720*a* dynamically selects between $f_A$(6T/WO) and $f_B$(6T/WO) in response to selection control signal 1741' which is developed from DyOE_J1 by AND gate 1760*a*. In similar fashion, multiplexer 1720*b* dynamically selects between $f_C$(6T/WO) and $f_D$(6T/WO) in response to selection control signal 1741' (or in yet a further alternative embodiment, in response to a different selection control signal which is derived from another DyOE signal). The outputs of multiplexers 1720*a* and 1720*b* are therefore respectively denoted as $f_{AB}$(7T) and $f_{CD}$(7T) to indicate they can be any function of up to 7 independent input terms.

Multiplexer 1720c dynamically selects between $f_{AB}$(7T) and $f_{CD}$(7T) in response to selection control signal 1744' which is developed from DyOE_J2 by AND gate 1760*b*. DyOE_J1 can be produced by the common controls section of one VGB while DyOE_J2 can be simultaneously produced by the common controls section of a second VGB and SupOE_J' (1768') is simultaneously produced by the common controls section of a third VGB of the same super-VGB. The choice of which VGB produces which of signals DyOE_J1, DyOE_J2 and SupOE_J' can vary.

As is further seen in FIG. 17C, multiplexer 1730' statically selects either the $f_{A\text{-}D}$(8T) output signal of multiplexer 1720*c* or a feedthrough signal that is statically selected by, and provided by, multiplexer 1724'. The output of multiplexer 1730' is coupled to the input of tristate driver 1750'. Although not shown, it is understood that multiplexer 1724' is coupled to receive respective feedthrough signals (FTX and/or FTY) from each of VGB's _A through _D and to statically select one of those feedthrough signals in accordance with configuration data stored in the FPGA device's configuration memory at 1749'.

Figure 18A:
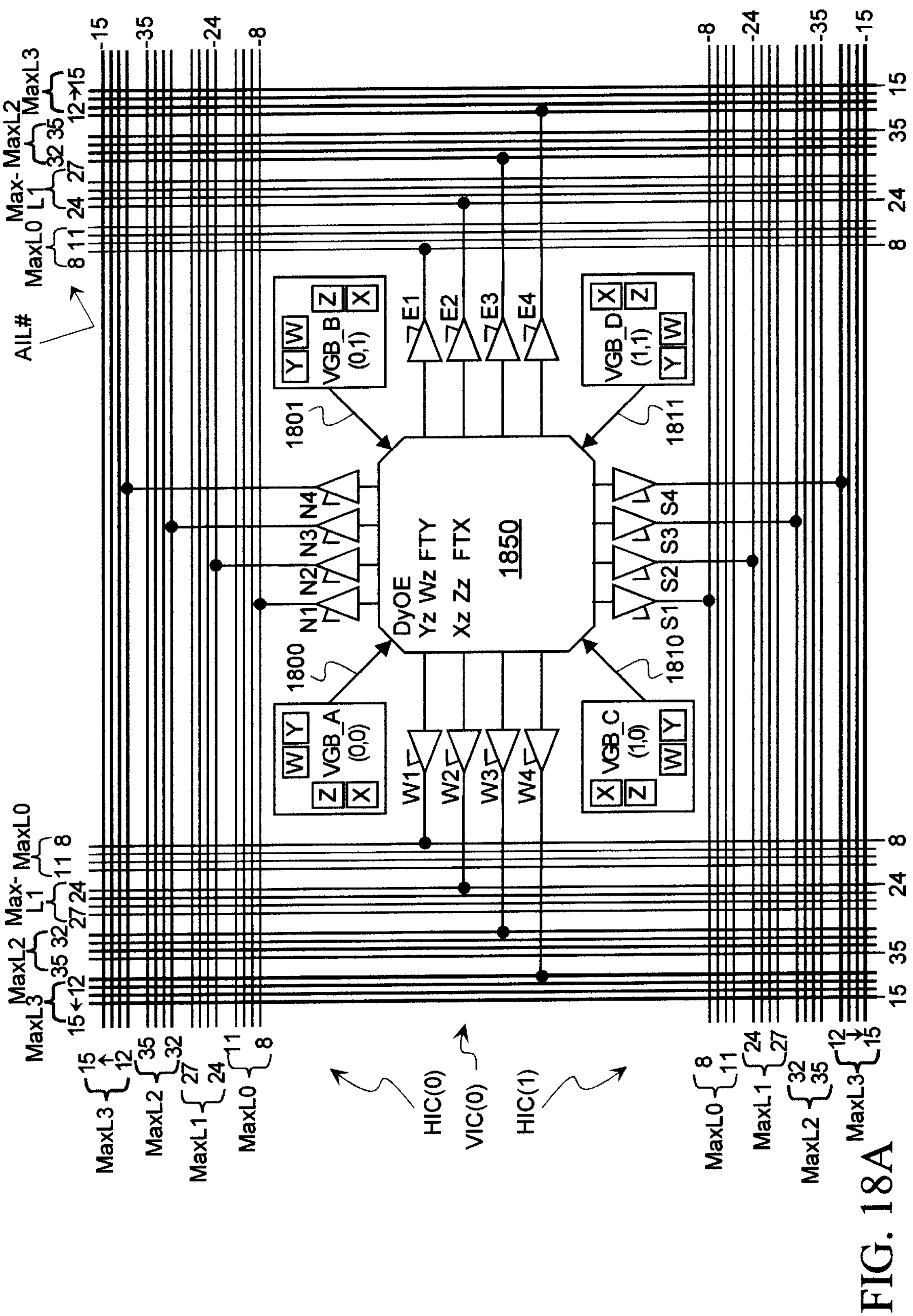
FIGS. 18A, 18B, 18C, and 18D respectively are schematics of connections of the shared, big drives to adjacent interconnect lines for super-VGB's (0,0), (1,1), (2,2) and (3,3) of a matrix of such super-VGB's.

Referring to FIG. 18A, a scheme for connecting the shared big drivers (MaxL drivers) to the adjacent MaxL interconnect lines is shown for the case of super-VGB (0,0). This super-VGB is surrounded by horizontal interconnect channels (HIC's) 0 and 1 and by vertical interconnect channels (VIC's) 0 and 1. The encompassed VGB's are enumerated as A=(0,0), B=(0,1), C=(1,0) and D=(1,1). The shared big logic is shown at 1850 and this illustrated block corresponds to the collection of circuits 170*i* sans the LLDi's for i covering: N1 through N4, E1 through E4, S1 through S4, and W1 through W4. Angled line 1800 represents the supplying of generically-identified signals: DyOE, Yz, Wz, Xz, Zz, FTY(1,2) and FTX(1,2) to block 1850 from VGB_A. Angled lines 1801, 1810 and 1811 similarly and respectively represent the supplying of the above generically-identified signals to block 1850 from VGB_B, VGB_C and VGB_D.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. MaxL drivers N1 through N4 respectively connect to the closest to the core line of respective groups MaxL0, MaxL1, MaxL2 and MaxL3 of the adjacent north HIC.

MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right to a next super-VGB (not shown), the N1–N4 connections move up by one line in each of the respective groups MaxL0–MaxL3, until the top most line is reached in each group, and then the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1–E4 and W1–W4 connections move outwardly by one line in each of the respective groups MaxL0–MaxL3, until the outer most line is reached in each group, and then the connections wrap around to the inner most line of each group for the next super-VGB down and the scheme repeats.

Figure 18B:
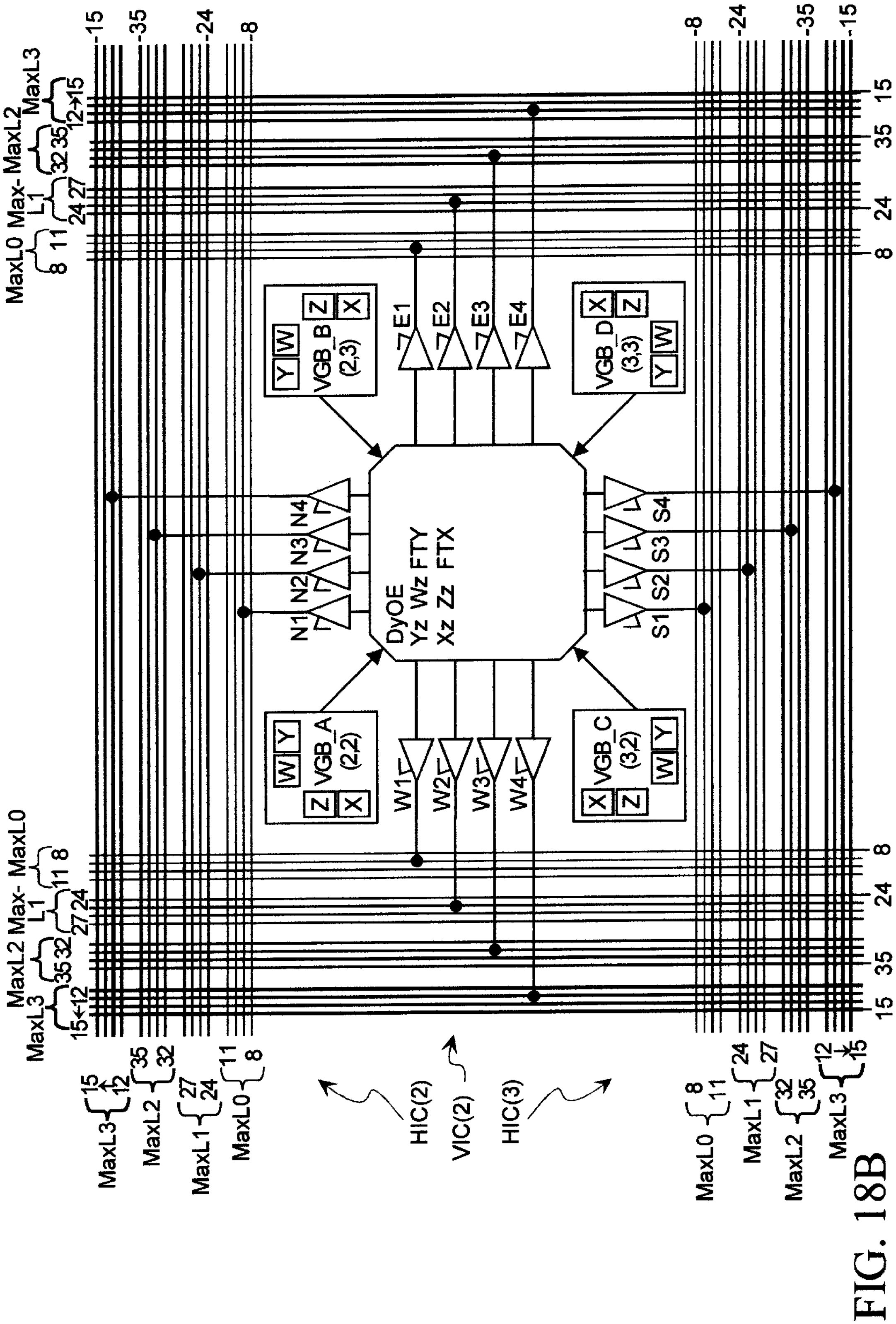

FIG. 18B shows a sampling of this out-stepping pattern of connections for the super-VGB surrounded by HIC's 2 and 3 and by VIC's 2 and 3. The encompassed VGB's are enumerated as A=(2,2), B=(2,3), C=(3,2) and D=(3,3).

Figure 18C:
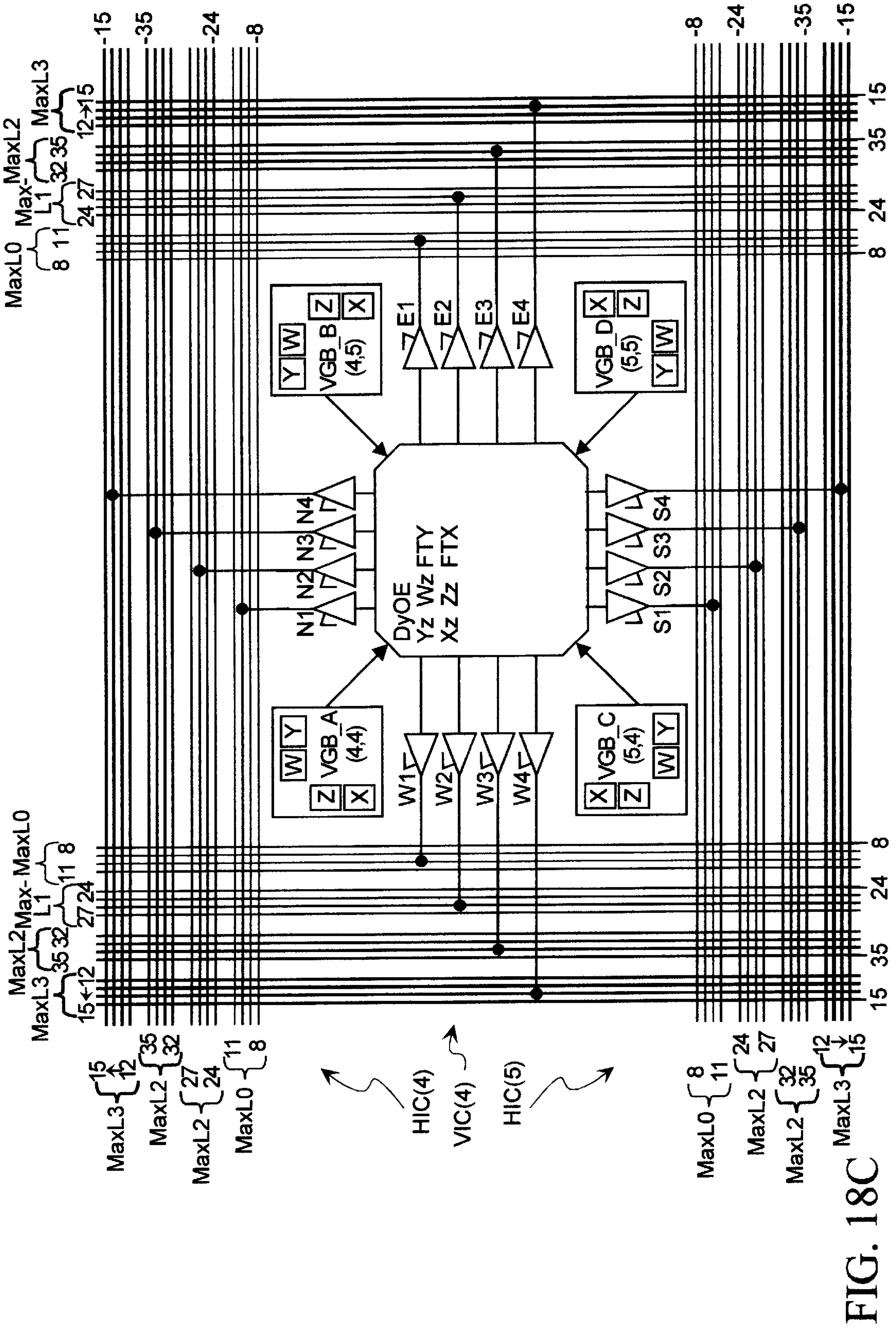

FIG. 18C shows a sampling of this out-stepping pattern of connect ions for the next super-VGB along the diagonal, which super-VGB is surrounded by HIC's 4 and 5 and by VIC's 4 and 5. The encompassed VGB's are enumerated as A=(4,4), B=(4,5), C=(5,4) and D=(5,5).

Figure 18D:
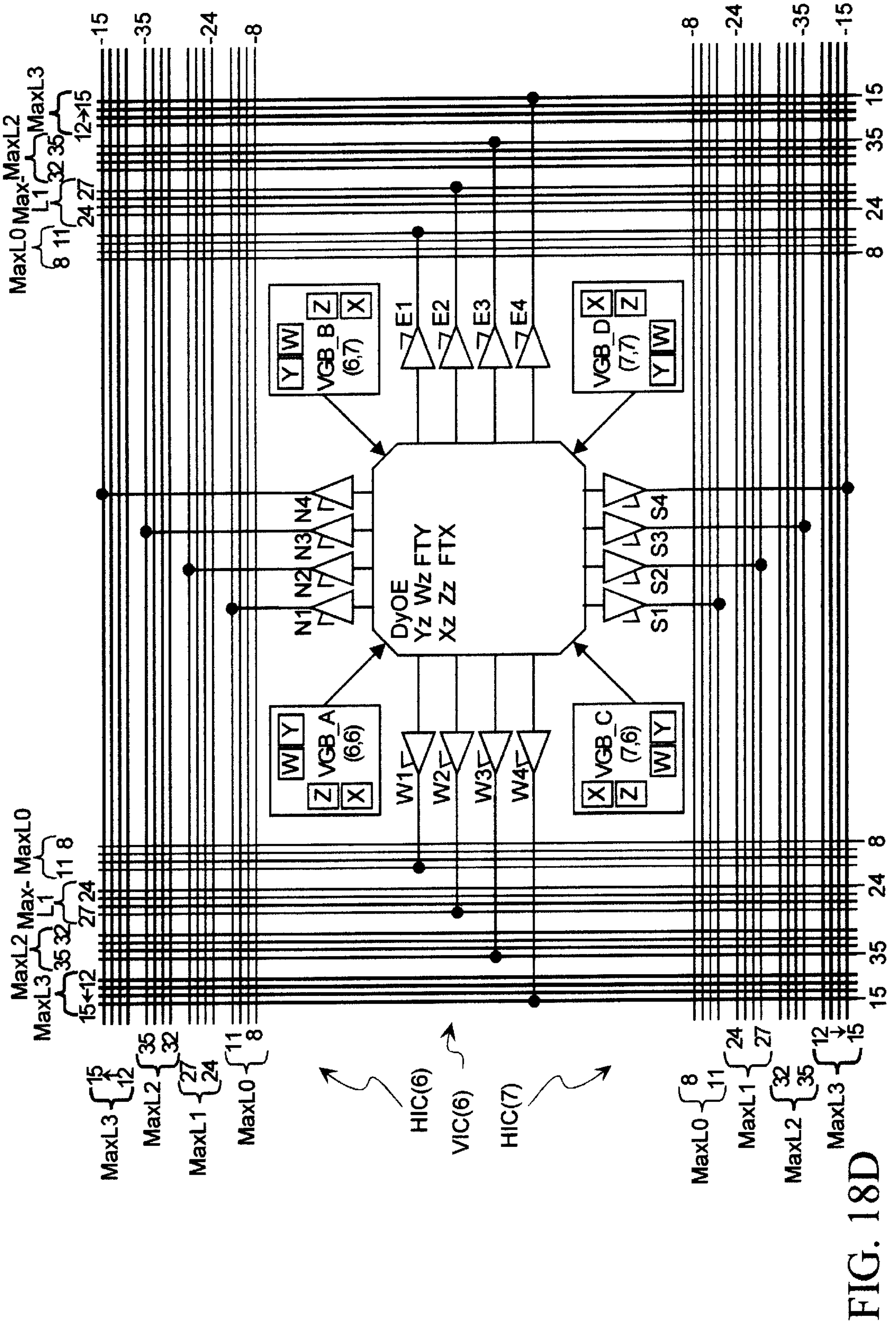

FIG. 18D shows a sampling of this out-stepping pattern of connections for the next super-VGB along the diagonal, which super-VGB is surrounded by HIC's 6 and 7 and by VIC's 6 and 7. The encompassed VGB's are enumerated as A=(6,6), B=(6,7), C=(7,6) and D=(7,7).

The combination of FIGS. 18A–18D demonstrates how all 16 MaxL lines of a given HIC can be driven by the northern or southern MaxL drivers of a horizontal succession of four super-VGB's. The combination of FIGS. 18A–18D also demonstrates how all 16 MaxL lines of a given VIC can be driven by the eastern or western MaxL drivers of a vertical succession of four super-VGB's. Bus-wide operations can be supported for nibble-wide buses by just one super-VGB acting as the bus driver. Bus-wide operations can be supported for byte-wide buses by a pair of super-VGB's acting as bus master. Bus-wide operations can be supported for 16 bit-wide buses by a quadruple of super-VGB's acting as bus master. For wider buses, the driving super-VGB's can be configured to behave as dynamic multiplexers that provide time-multiplexed sharing of the adjacent MaxL lines. For example, each of the X, Z, W, and/or Y CBB's of each longline-driving super-VGB can be configured as a 4:1 multiplexer in accordance with the scheme shown in FIG. 11B. The CSE output signals Xz, Zz, Wz, and/or Yz of these CBB's can then drive the shared big drives to provide neighboring VGB's with time shared access to the driven longlines of the respective, longline-driving super-VGB.

Note that there is a same number (e.g., 16) of MaxL drivers as there are CBB's (X,Z,W,Y times 4) within each super-VGB. At the same time there are twice as many CBE's as there are MaxL drivers in each super-VGB. A particular, coarsely-granulated configuration of the FPGA device may call for each CBB to consume a corresponding MaxL driver. This would make full efficient use of the MaxL driving resources of the super-VGB.

On the other hand, an alternate, more finely-granulated configuration of the FPGA device may call for a larger number of CBE's in a first super-VGB to each drive a corresponding MaxL driver. This would exceed the longline driving capabilities of the first super-VGB. However, it may be in the alternate configuration that there are an adjacent one or more other super-VGB's whose MaxL drivers are not fully consumed and are accessible via the feedthrough lines (FTX, FTY) to the CBE's of the first super-VGB. In such a case, the excess CBE's of the first super-VGB can make efficient use of unconsumed MaxL drivers in the neighboring super-VGB's.

It is therefore seen that the use of shared high-powered drive amplifiers for supporting the high-powered drive needs of a larger number of CBE's (instead of using dedicated high-powered drive amplifiers on a one per CBE basis), means that the amount of integrated circuit space consumed on a per CBE basis (or even on a per VGB basis) is reduced. At the same time, the central sharing approach of each super-VGB increases the likelihood that each high-powered amplifier will be used by one of the multiple CBE's, CBB's or VGB's in the super-VGB or in a neighboring super-VGB. This is more efficient than having the large area of a given high-powered amplifier wasted because no CBE, CBB or VGB uses that high-powered amplifier.

The combination of FIGS. 18A–18D also demonstrates how result signals may be configurably routed to the longlines (MaxL lines) of either one of othogonal interconnect channels, or alternatively, simultaneously broadcast to the longlines of such othogonal interconnect channels.

Figure 19A:
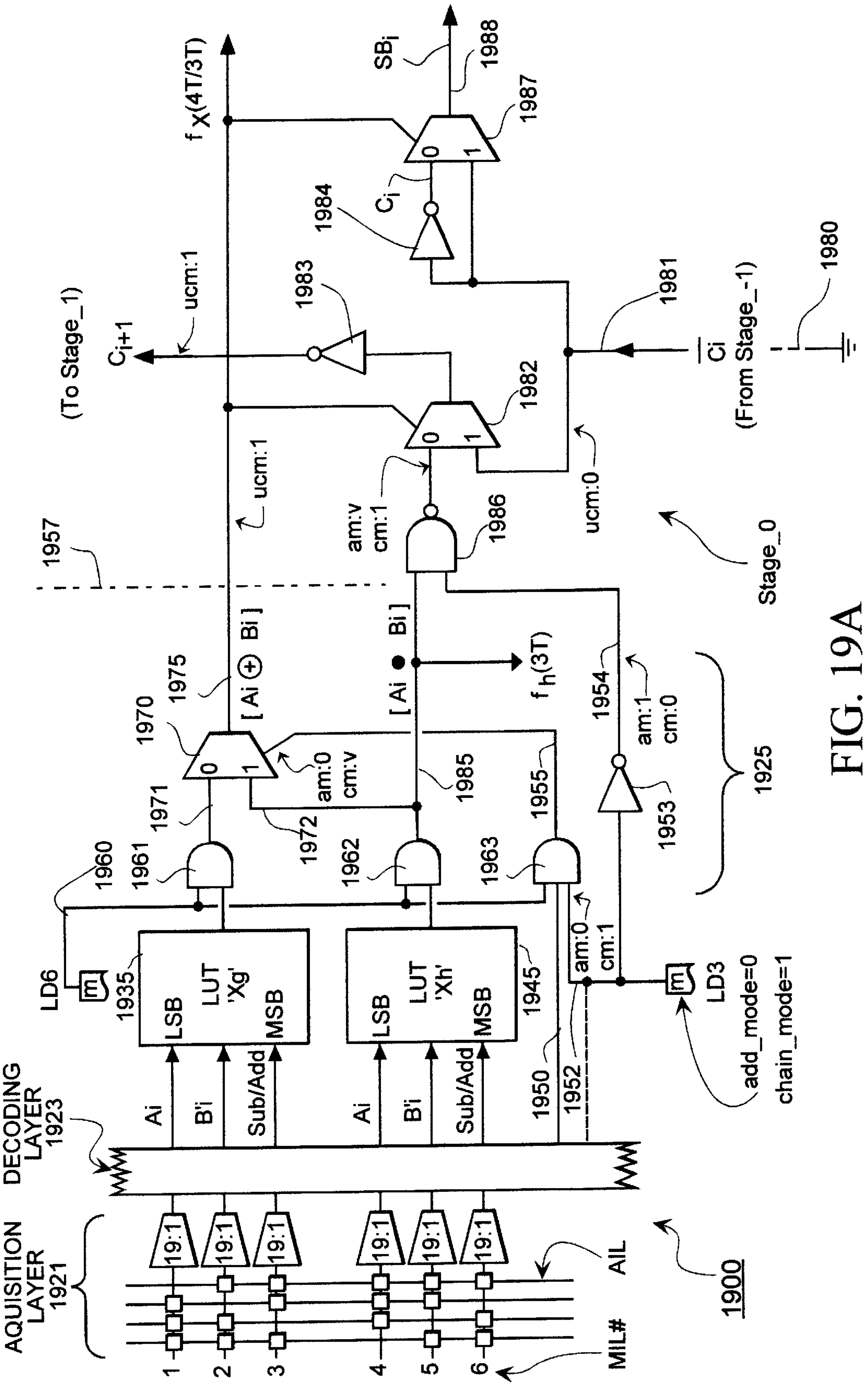
FIGS. 19A, 19B, 19C, and 19D respectively are schematics of four stages of a nibble wide adder/subtractor implementable within a VGB.

FIG. 19A is a schematic of a first stage 1900 (Nibble Stage_0) of a nibble-wide adder/subtractor that may be implemented using the X CBB and a corresponding part of carry propagating section 570 of FIG. 5B. The corresponding part of section 570 is shown to the right of dashed line 1957. To the left of line 1957 there are shown the portions of the acquisition layer (1921), decoding layer (1923), spawning layer (1935, 1945) and first function synthesis layer (1925) that join with the carry propagating section (570) to form circuit 1900. Like reference numbers in the '1900' number series are used to the left of line 1957 for elements having correspondingly numbered equivalents in FIG. 11A in the '1100' number series. As such, a detailed description of the same does not have to be repeated here.

Inverter 1953 may be an inherent part of configuration memory bit LD3 in the case where the LD3 memory element is implemented as an SRAM cell with complementary outputs. If not, inverter 1953 may be added separately as shown. During operation in the nibble-adder mode, memory bit LD3 is configured to logic '0'. This is indicated by the notation, add_mode=0. The same state is indicated for line 1952 as am:0.

There is a second mode for the illustrated circuitry that will be described later and referred to as 'chain_mode' or 'cm'. In chain_mode, the LD3 memory element is set to logic '1'. The same state is indicated for line 1952 as cm:1.

When add_mode is active, AND gate 1963 forces a '0' onto the selection control terminal 1955 of multiplexer 1970. This forced state is indicated for line 1955 by the attached notation: 'am:0/cm:v'. The cm:v notation indicates that the state of the selection control terminal 1955 is dynamically variable during chain mode. In both of add_mode and chain_mode, configuration memory bit LD6 is set to '1'.

Given the am:0 state of line 1955, the output of LUT Xg (1935) is consequently seen on line 1975 in add_mode. The output of LUT Xh (1945) is seen at the same time on line 1985.

For the nibble-adder mode, LUT Xg (1935) is configured to produce the function:

$$[A_i \oplus B_i] \qquad \{\text{Eq. 1a}\},$$

wherein ⊕ represents the exclusive OR Boolean function, $A_i$ is a first bit applied to an input of LUT Xg, and $B_i$ is a second bit derived from another signal, $B'_i$ that is applied to a second input of LUT Xg. A third input of LUT Xg receives a binary flag signal identified as 'Sub/Add'. Bit $B_i$ is generated within LUT Xg as follows:

$$B_i=[B'_i \oplus \text{Sub/Add}] \qquad \{\text{Eq. 1b}\}.$$

In other words, $B_i$ equals $B'_i$ when Sub/Add is false. $B_i$ equals the 1's complement of $B'_i$ when Sub/Add is true. Those skilled in the art will understand that a 2's complement or negation of a binary input value B may be obtained by taking the 1's complement and adding 1. The latter 1 may be added as a Nibble Stage_-1 carry bit.

Also for the nibble-adder mode, LUT Xh (1945) is configured to produce the function, $[A_i \bullet B_i]$, wherein • represents the Boolean AND function, and wherein bit $B_i$ is generated within LUT Xh again as $B_i=[B'_i \oplus \text{Sub/Add}]$. Alternatively, for the nibble-adder mode, LUT Xh (1945) may be configured to produce one of the simpler functions, $[A_i]$ or $[B_i]$ because $A_i=B_i$ when $[A_i \oplus B_i]$ equals zero.

The reasons for these configurations in the nibble-adder mode arise from the following mathematical truths for binary addition of input bits $A_i$, $B_i$, and carry bit $C_i$:

$$SB_i = [A_i \oplus B_i] \cdot /C_i + /[A_i \oplus B_i] \cdot C_i \qquad \{\text{Eq. 2a}\}$$

$$C_{i+1} = [A_i \oplus B_i] \cdot C_i + /[A_i \oplus B_i] \cdot [A_i \cdot B_i], \qquad \{\text{Eq. 2b}\}$$

wherein '/' represents inversion (the NOT function), $SB_i$ is the corresponding sum bit of significance i, and $C_{i+1}$ is the carry bit of significance i+1 that is forwarded to the next significant stage. The $[A_i \bullet B_i]$ term of equation {Eq. 2b} may be simplified to $[A_i]$ or $[B_i]$.

In FIG. 19A, a complement, $/C_i$ of the carry bit is received on line 1981 from a previous stage. If there is no previous stage, the $/C_i$ signal is fixed to logic '0' (ground) as indicated at 1980. (This fixed '0' state may be used in chain_mode to indicate an unbroken_chain condition. The latter definition is also denoted as ucm:0 in the illustration.) It is seen in FIG. 19A that above equation {Eq. 2a} is carried out in the nibble-adder mode by the coupling of line 1975 to the selection control terminal of multiplexer 1987. Inverter 1984 supplies the $C_i$ signal to the 0 data input of multiplexer 1987 while the $/C_i$ signal is supplied to the 1 data input by line 1981. If $[A_i \oplus B_i]$ is true, multiplexer 1987 outputs $/C_i$ to line 1988. If $[A_i \oplus B_i]$ is false, multiplexer 1987 outputs $C_i$.

It is further seen in FIG. 19A that above equation {Eq. 2b} is carried out in the nibble-adder mode by the coupling of line 1975 to the selection control terminal of multiplexer 1982. NAND gate 1986 supplies the $/[A_i \bullet B_i]$ signal to the 0 data input of multiplexer 1986 while the $/C_i$ signal is supplied to the 1 data input by line 1981. If $[A_i \oplus B_i]$ is true, multiplexer 1982 in combination with inverter 1983 outputs $C_i$ to the next stage (Nibble Stage_1) as signal $C_{i+1}$. If $[A_i \oplus B_i]$ is false, multiplexer 1982 in combination with inverter 1983 outputs $[A_i \bullet B_i]$ to the next stage as signal $C_{i+1}$. Note that the output carry signal, $C_{i+1}$ is of a logic polarity that is opposite to the logic polarity of the input carry signal, $/C_i$. When nibble-adder mode is not active, lines 1975 and 1985 may respectively carry the $f_X(4T/3T)$ and $f_h(3T)$ signals as should be apparent from discussions of FIG. 11A.

The carry ripple-through delay from line 1981 to the next stage is the defined by the propagation delays of multiplexer 1982 and inverter 1983. In one embodiment, multiplexer 1982 is implemented as two N-type MOSFET pass-transistors with complementary selection control signals applied to their respective gates. In another embodiment, multiplexer 1982 is implemented as two CMOS transmission gates with complementary selection control signals applied to their respective gates. Inverter 1983 is implemented as a CMOS amplifier that repowers the rippled-through carry after it suffers the threshold drop in multiplexer 1982. The coupling of the next-carry output signal ($C_{i+1}$) from inverter 1983 of each stage to the carry-in line 1981*b* of a next successive stage (see FIG. 19B) is preferably performed by a direct connection without passage through a configurable routing resource. Of course, such configurable routing resource may be included in the inter-stage coupling if the added delay is acceptable.

Figure 19B:
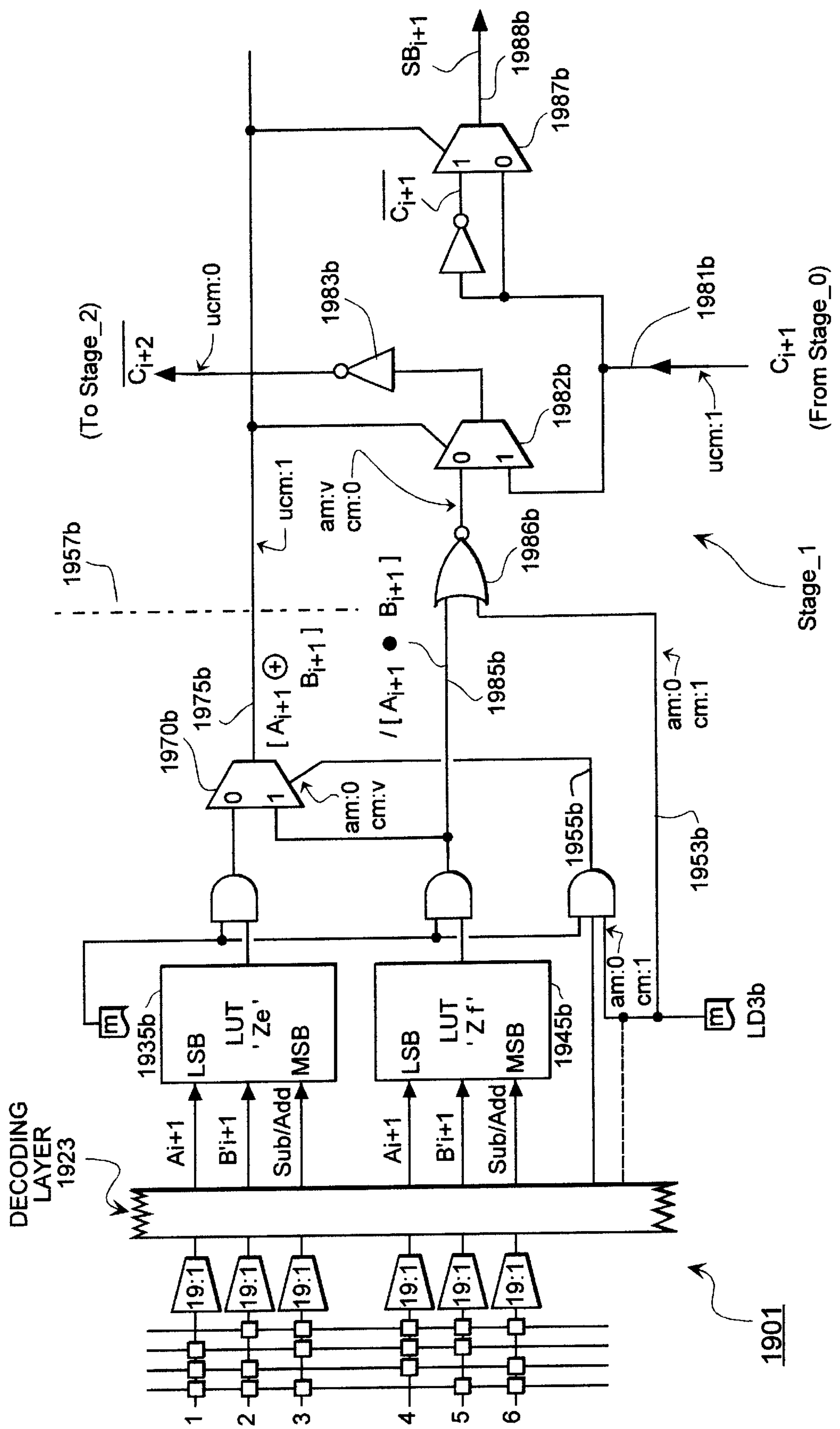

FIG. 19B is a schematic of the second stage 1901 (Nibble Stage_1) of the nibble-wide adder/subtractor, which stage may be implemented using the Z CBB and a corresponding part of carry propagating section 570 of FIG. 5B. The corresponding part of section 570 is shown to the right of dashed line 1957*b*.

Nonessential reference numerals are removed in FIG. 19B, but the correspondence with FIG. 19A is understood from the similarity of layout. There are a few differences to note for FIG. 19B as compared to FIG. 19A. First, LUT Zf (1945*b*) is configured to produce the complementary function, $/[A_{i+1} \bullet B_{i+1}]$. This signal (or its reduced equivalent, $/[A_{i+1}]$ or $/[B_{i+1}]$) is supplied to input line 1985*b* of NOR gate 1986*b*. The other input of NOR gate 1986*b* receives a '0' (as denoted by am:0) from configuration memory bit LD3*b* by way of line 1953*b*. Another difference is that the '1' and '0' orientation of data inputs for multiplexer 1987*b* are inverted. This is done to compensate for the inversion of the carry bit between successive stages. Inversion could be avoided by using two inverters in succession rather than the one inverter 1983 in the carry-rippling path (1981–1982–1983) of each stage. But such a substitution would disadvantageously increase carry-rippling delay.

Note further in FIG. 19B that LUT's 1935*b* (Ze) and 1945*b* (Zf) receive different input bits $A_{i+1}$ and $B'_{i+1}$ as compared to input bits $A_i$ and $B'_i$ of FIG. 19A. The Sub/Add control signal remains the same though. Through-the-AIL strapping may be used for connecting the Sub/Add control signal to all nibble-stages of a long binary adder/subtractor having stages such as seen in FIGS. 19A and 19B. The strapping PIP's (not shown) of the decoding layer 1923 may be used to apply the same $A_{i+j}$ and $B'_{i+j}$ input signals to the respective LUT's of each successive nibble stage j.

The least significant stage of an adder/subtractor may be started in any stage except the very lowest where $/C_i$ is tied to ground as indicated by 1980. In that very lowest stage, $C_i$ invariably equals zero. In any of the vertically higher stages the carry-in can be dynamically set as desired. Assume that Stage_1 (FIG. 19B) is the lowest stage of an adder/subtractor rather than Stage_0 (FIG. 19A) . In such a case, the $C_{i+1}$ signal on line 1981*b* (FIG. 19B) can be dynamically set to one or zero. This dynamic establishment of the state of $C_{i+1}$ is carried out in the immediately lower stage, Stage_0 (FIG. 19A) as follows. (Essentially the same process may be carried out in any higher stage.) The Xg LUT 1935 is configured to always output a logic '0' onto line 1975. (LD3 is still reset to zero in this mode as indicated by the am:0 attachment to line 1955.) As a result, multiplexer 1982 is forced to consistently select its 0 data input. The output of Xh LUT 1945 can then be used to consistently define the $C_{i+1}$ signal at the output of inverter 1983. Xh LUT 1945 may be configured to define the $C_{i+1}$ signal as any desired function of acquired inputs. In one embodiment, the Xh LUT 1945 is configured to define the $C_{i+1}$ signal as equal to the Sub/Add signal. This establishes the appropriate carry for performing adding or subtracting in the next stage.

Figure 19C:
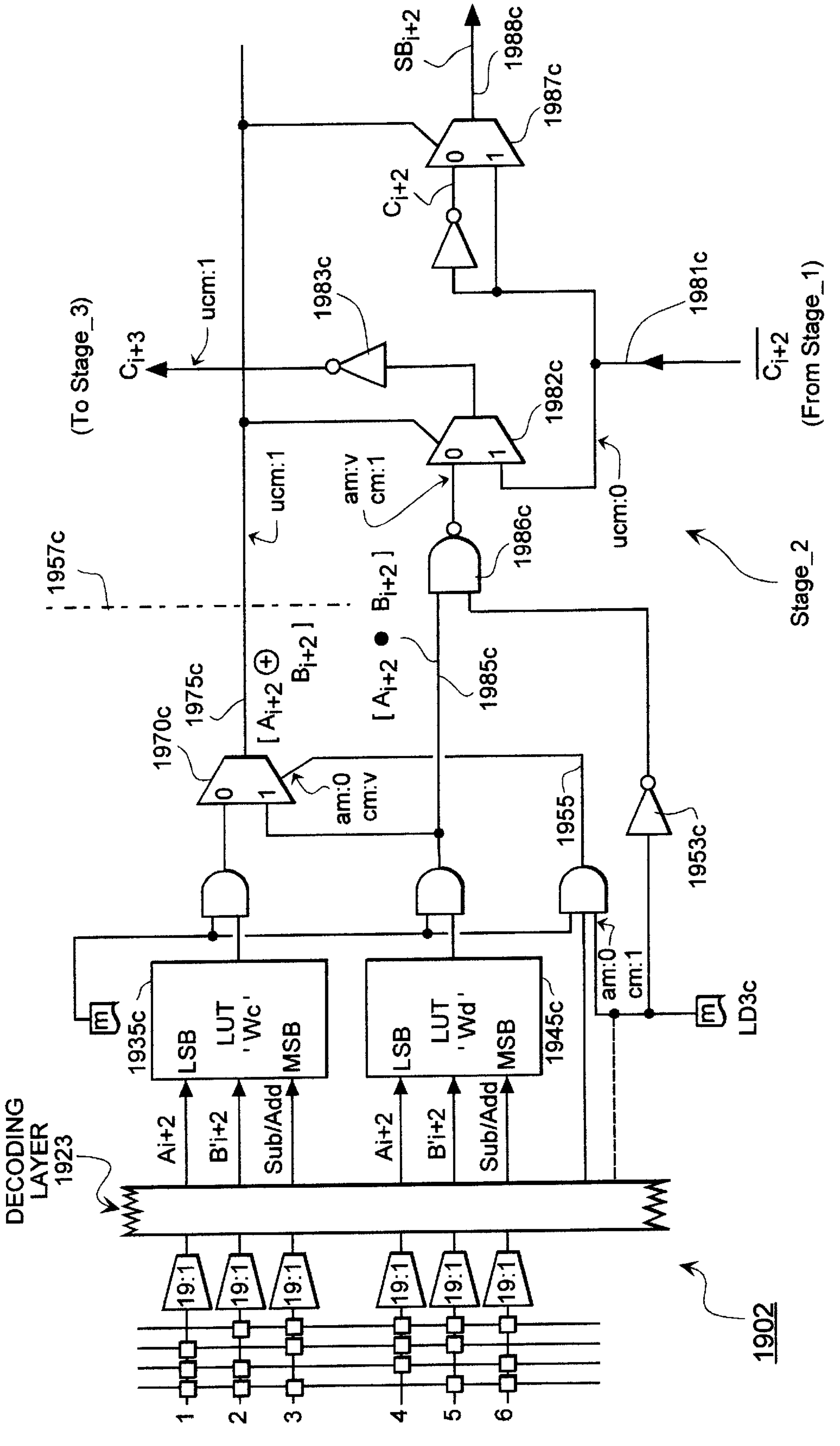

FIG. 19C is a schematic of the third stage 1902 (Nibble Stage_2) of the nibble-wide adder/subtractor, which stage may be implemented using the W CBB (LUT's 'c' and 'd') and a corresponding part of carry propagating section 570 of FIG. 5B. The corresponding part of section 570 is shown to the right of dashed line 1957*c*.

Nonessential reference numerals are removed in FIG. 19C, but the correspondence with FIG. 19A is understood from the similarity of layout. Unlike FIG. 19B, the third stage 1902 of FIG. 19C is structured essentially the same as that of first stage 1900. LUT Wd (1945*c*) produces the non-complemented function, $[A_{i+2} \bullet B_{1+2}]$. This signal (or its reduced equivalent, $[A_{i+2}]$ or $[B_{i+2}]$) is supplied to NAND gate 1986*c*. Complemented carry signal $/C_{i+2}$ is applied to the 1 data input of multiplexer 1987*c*.

Figure 19D:
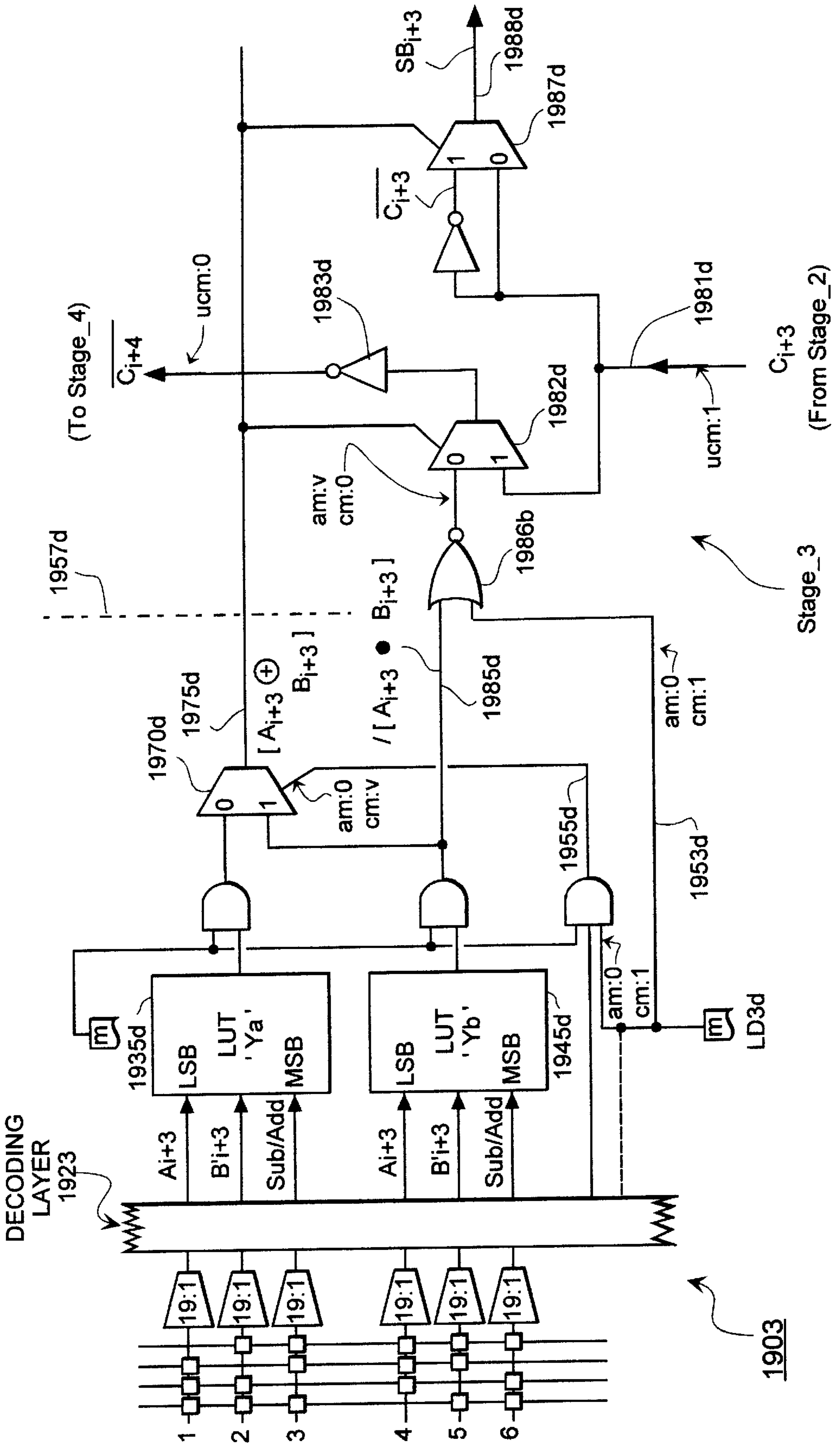

FIG. 19D is a schematic of the fourth stage 1903 (Nibble Stage_3) of the nibble-wide adder/subtractor, which stage may be implemented using the Y CBB (LUT's 'a' and 'b') and a corresponding part of carry propagating section 570 of FIG. 5B. The corresponding part of section 570 is shown to the right of dashed line 1957*d*.

Nonessential reference numerals are removed in FIG. 19D, but the correspondence with FIG. 19B is understood from the similarity of layout. LUT Yb (1945*d*) produces the complemented function, $/[A_{i+3} \bullet B_{i+3}]$. This signal (or its reduced equivalent, $/[A_{i+3}]$ or $/[B_{i+3}]$) is supplied to NOR gate 1986*d*. Non-complemented carry signal $C_{i+3}$ is applied to the 0 data input of multiplexer 1987*d*. The $/C_{i+4}$ output of inverter 1983*d* may go to a next stage (Nibble Stage_4) as shown. In one embodiment, that next Nibble Stage_4 is the same as Nibble Stage_0 of the immediately higher VGB of the same column of VGB's. This organization corresponds to elements 421*a*, 421*b* and 421*c* of FIG. 4B, where the combination of elements 421*a*, 421*b* and 421*c* represents a columnar rippling up of carry bits from one VGB to the next. Referring momentarily to FIG. 5B, elements SB0, SB1, SB2 and SB3 correspond to the nibble sum bits $SB_{i+0}$, $SB_{i+1}$, $SB_{i+2}$, and $SB_{i+3}$ of respective FIGS. 19A–19D. These same respective signals, SB0–SB3 are available as registered or unregistered outputs from the CSE's of respective FIG. 14D, 14C, 14B and 14A. The SB0–SB3 signals may be similarly stored in registers and or output using the alternate CSE design of FIG. 14E.

Referring again to FIG. 19A, operation in the chain_ mode will be described. Chain mode, as its name implies, provides a function wherein a set carry tries to propagate up an unbroken chain. At the point where the chain breaks, the carry is flipped to zero and that zero state continues up the rest of the chain. This broken chain state may be detected by sensing of the $SB_{i+j}$ bit at one stage above the top of the chain, where line 1975*i+j* is fixed to a zero or one in that one stage above. The sensing of a broken or unbroken chain may be used to determine if a certain one of multiple conditions has or has not occurred along the chain. A chain break occurs when one of the $f_K$(4T/3T) outputs along the chain goes to logic '0' (K=X, Z, W, or Y here).

In chain_mode, the output of NAND gate 1986 is fixed to logic '1' as indicated by the attached notation, cm:1. NAND gate 1986 in essence operates as a forced-state circuit having a predefined, fixed output state that is complementary to a state indicating an unbroken chain. If the chain had not been broken in an earlier stage, the incoming carry signal, $/C_i$ will be of the opposed logic '0' state. The flag state for indicating a thus-far unbroken chain is denoted as 'ucm:0' on line 1981.

Multiplexer 1982 now has at its 0 and 1 inputs, the two opposed states, namely, cm:1 and ucm:0. If line 1975 remains at logic '1', the chain is deemed unbroken and the set carry bit propagates up in uncomplemented form as $C_{i+1}$=1 from the output of inverter 1983. On the other hand, if 1975 has flipped to logic '0', the chain is deemed broken by the action of multiplexer 1982 selecting the cm:1 state at its 0 data input. The broken-chain indication propagates up in uncomplemented form as $C_{i+1}$=0 from the output of inverter 1983.

Referring to FIG. 19B, an essentially same process takes place, but in opposite polarity. The unbroken-chain is indicated on line 1981*b* and at the 1 input of multiplexer 1982*b* by the flag state, ucm:1. If the chain had been broken anywhere below, line 1981*b* would carry a logic '0'. The 0 data input of multiplexer 1982*b* receives the opposed cm:0 state from NOR gate 1986*b*. (Note that the forced-state circuit in this stage is implemented by NOR gate 1986*b* rather than by a NAND gate as was done in Stage_0.) If line 1975*b* remains at logic '1', the chain is unbroken and the set carry bit propagates up in complemented form as $/C_{i+2}$=0 from the output of inverter 1983. On the other hand, if line 1975*b* has flipped to logic '0', the chain is broken by the action of multiplexer 1982*b* selecting the cm:0 state at its 0 data input. The broken-chain indication propagates up in complemented form as $/C_{i+2}$=1 from the output of inverter 1983.

Once the chain is broken at a lower stage, all higher stages have no choice but to propagate the broken-chain indication. Referring to FIG. 19B, assume the signal on line 1981*b* has been switched to $C_{i+1}$=0. Multiplexer 1982*b* then has a logic 101 at each of its data inputs. The output of inverter 1983*b* will be a logic '1' irrespective of the state of line 1975*b*. A similar process will continue in Stage_2 (FIG. 19C) and higher.

Assume that each of the X, Z, W, and Y CBB's in a vertical chain of VGB's is configured to as a 4-input NOR gate. As long as all inputs of each NOR gate remains low, the corresponding output will be a logic '1' that is output on a corresponding one of lines 1975, 1975*b*, 1975*c*, 1975*d*, etc. If one or more inputs of any of the 4-input NOR gates flips high, the corresponding one of lines 1975, 1975*b*, 1975*c*, 1975*d*, etc. will output a chain-breaking signal and this can be sensed at the top of the chain when chain_mode is active. In essence, chain_mode can be used to emulate a NOR gate with as many inputs as may be implemented by the X, Z, W, and Y CBB's of the vertical chain. Other such wide-input functions may be similarly implemented with appropriate configuration of the LUT'S, as will be apparent to those skilled in the art after reading the above.

Figure 20A:
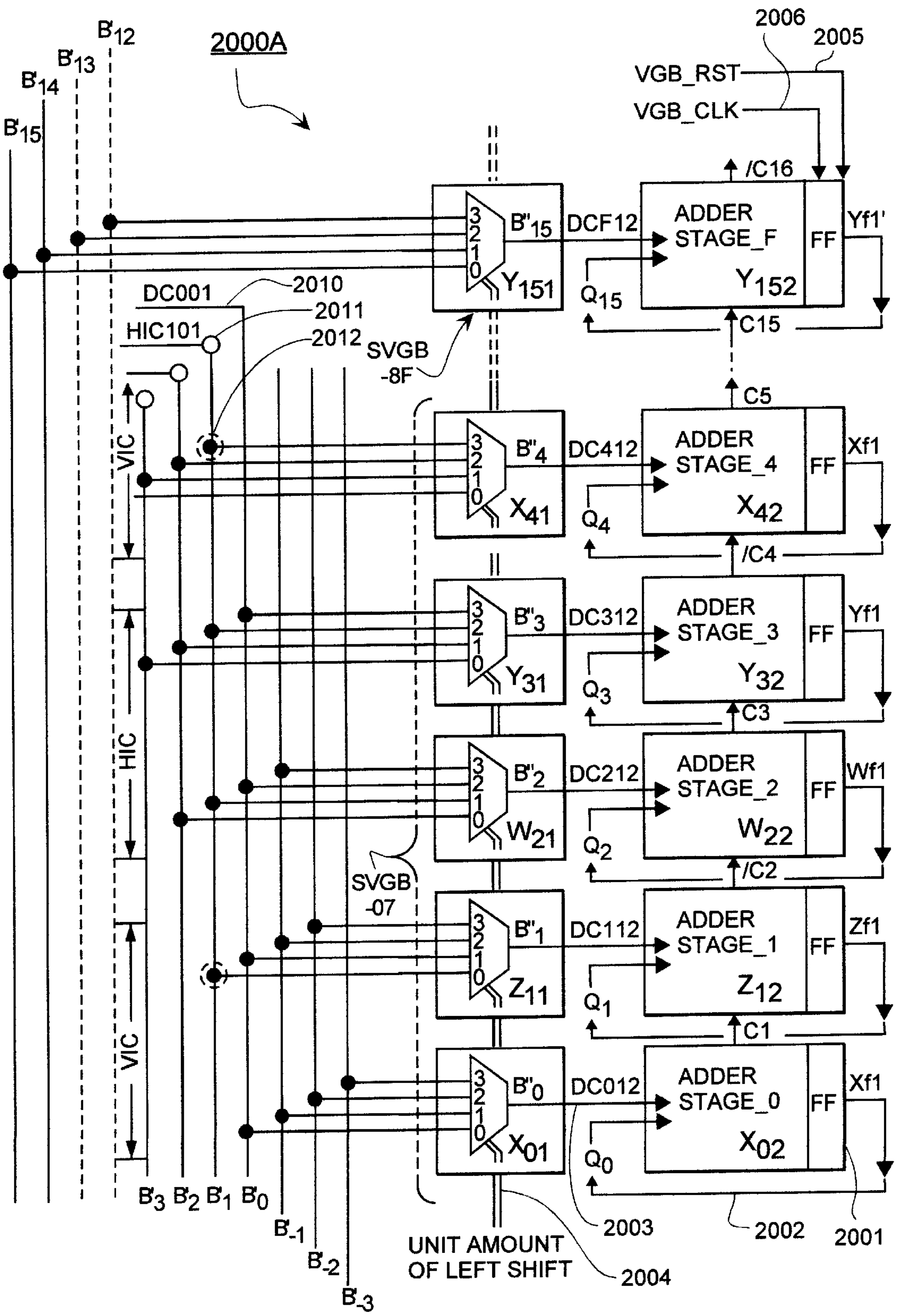
FIG. 20A demonstrates a packing scheme for a first barrel shifter and registered adder.

FIG. 20A illustrates how the Variable Grain Architecture may be used to efficiently pack the combination of a barrel shifter and a registered adder in a column of super-VGB's where each super-VGB delivers a byte (8 bits) of output data.

In the implementation 1200A shown, CBB's $X_{02}$, $Z_{12}$, $W_{22}$, and $Y_{32}$ are respectively positioned within one VGB at the a right bottom quadrant of a first super-VGB (SVGB-07) and are respectively configured to implement Nibble Stages 0, 1, 2 and 3 of an adder in accordance with FIGS. 19A–19D. CBB $X_{42}$ is positioned within another VGB at the a right upper quadrant of the first super-VGB (SVGB-07) and is configured to implement Nibble Stage 4 in accordance with FIG. 19A. The sequence continues through the illustrated CBB $Y_{152}$ and may continue higher if desired. CBB $Y_{152}$ is positioned within a right upper quadrant of a second super-VGB (SVGB-8F), the latter SVGB being immediately above the first super-VGB (SVGB-07) that encompasses CBB's $X_{02}$, $Z_{12}$, $W_{22}$, $Y_{32}$ and $X_{42}$. CBB $Y_{152}$ is configured to implement Nibble Stage 15 (F in hexadecimal notation) in accordance with FIG. 19D.

Block 2001 represents a flip flop (FF) within the CSE of CBB $X_{02}$. Other flip flops of other CBB's are similarly denoted with the FF abbreviation. Line 2002 represents a local feedback via FBL Xf1 of the registered output $Q_0$ of flip flop 2001 of CBB $X_{02}$ to the corresponding bit input of Nibble Stage_0. Other feedback lines of other CBB's are similarly denoted.

$Q_0$ represents here the least significant bit of an accumulator formed by the FF's of the adder-stage CBB's. $Q_1$ is the next significant bit and so forth. $Q_{15}$ is the MSB if the accumulator length stops at 16 bits. The so-formed accumulator may be reset (line 2005) if desired at the start of a multiply operation using the common controls-generated, VGB_RST signal of each respective VGB. The accumulator may be clocked with the common controls-generated, VGB_CLK signal of each respective VGB. It is seen by this how the common control section (550, 750) of each VGB provides a compact means for carrying out nibble-based processing within each VGB.

Line 2003 represents a direct connection (DCL) from the DC output of the CSE of a CBB $X_{01}$ to the $B''_0$ bit input of Nibble Stage_0. The designation, 'DC012' indicates here that the corresponding direct connect line carries a signal having bit position 0, and the transfer is from column 1 to column 2. The remaining direct connect lines up the chin are similarly labeled.

CBB's $X_{01}$, $Z_{11}$, $W_{21}$, and $Y_{31}$ are respectively positioned within one VGB at the left bottom quadrant of the first super-VGB (SVGBO7) and are respectively configured to implement part of a 4-place left barrel shifting circuit as follows. Lines 2004 represent the shift control of the barrel shifting circuit and carry a 2-bit control signal that defines the amount of shift as either: 0, 1, 2 or 3 bit positions to the left. The inputs of all the barrel-shifting, 4:1 multiplexers of FIG. 20A are labeled accordingly. The selection control terminals of these 4:1 multiplexers may be coupled one to the next by way of within-the-decoder strapping and/or by way of through-the-AIL strapping or by other appropriate routing. Each of the barrel-shifting, 4:1 multiplexers of FIG. 20A may be implemented in accordance with FIG. 11B.

Bits that are to be left-shifted by zero to three places are presented in order of significance as signals: $B'_{-3}$, $B'_{-2}$, $B'_{-1}$, $B'_0$, $B'_1$, $B'_2$, $B'_3$, $B'_4$, . . . $B'_{15}$, where $B'_{-3}$ is the least significant. Signal $B'_0$ is output from 4:1 multiplexer $X_{01}$ as output bit $B''_0$ when the shift amount commanded on lines 2004 is zero. Signal $B'_{-3}$ is output from 4:1 multiplexer $X_{01}$ as output bit $B''_0$ when the shift amount commanded on lines 2004 is three. Input bits $B'_{-3}$, $B'_{-2}$, and $B'_{-1}$ may be belong to the upper three quarters of a nibble that just to the right of the nibble defined by $B'_0$, $B'_1$, $B'_2$, $B'_3$, $B'_4$; or if there is none, they may be each set to zero.

For the case of 4:1 multiplexer $Z_{11}$, input signal $B'_1$ is produced as output bit $B''_1$ when the shift amount commanded on lines 2004 is zero. Input signal $B'_0$ is produced as output bit $B''_1$ when the shift amount commanded on lines 2004 is one. Input signal $B'_{-1}$ is produced as output bit $B''_1$ when the shift amount commanded on lines 2004 is two, and so forth. This shifting scheme continues up the illustrated chain of 4:1 multiplexers.

CBB's $X_{41}$ and $Y_{151}$ are shown respectively to the left of CBB's $X_{42}$ and $Y_{152}$. (More specifically, the respective X CBB's may be positioned next to left and right VIC's of their respective super-VGB's, while the Y CBB's are adjacent to respective HIC's.) For the case of 4:1 multiplexer $X_{41}$, input signal $B'_4$ (not shown) is produced as output bit $B''_4$ when the shift amount commanded on lines 2004 is zero. Input signal $B'_3$ is produced as output bit $B''_4$ when the shift amount commanded on lines 2004 is one, and so forth. For the case of 4:1 multiplexer $Y_{151}$, input signal $B'_{15}$ is produced as output bit $B''_{15}$ when the shift amount commanded on lines 2004 is zero. Input signal $B'_{14}$ is produced as output bit $B''_{15}$ when the shift amount commanded on lines 2004 is one, and so forth.

Because there is 3 out of 4 common overlap among between successive 4:1 multiplexers as one steps over the input set, $B''_{-3}$ through $B''_{15}$, within-the-decoder strapping and/or through-the-AIL strapping may be efficiently used where possible to link together the inputs of respective 4:1 multiplexers $X_{01}$ through $Y_{151}$.

Consider the case of line $B'_0$ in FIG. 20A. All 4 dot connections shown on this line go a same VGB (the one containing $X_{01}$, $Z_{11}$, $W_{21}$, and $Y_{31}$). As such, within-the-decoder strapping may be used to interconnect these 4 dots together. A single direct connect line connection (2010) to one of the MIL of one these 4 dots can supply the $B'_0$ input signal.

Consider next the case of line $B'_1$ in FIG. 20A. Three of the 4 dot connections shown on this line go a same VGB (the dots shown connecting to $Z_{11}$, $W_{21}$, and $Y_{31}$). As such, within-the-decoder strapping may be used to interconnect these 3 dots together. The fourth dot connection shown on line $B'_1$ goes to $X_{41}$, which CBB is in a next higher VGB. However, $X_{41}$ is adjacent to the same VIC (vertical interconnect channel) as $Z_{11}$. The $B'_1$ input signal may therefore be applied to a vertical 2×L line in that VIC and tied to both of $X_{41}$ and $Z_{11}$. Thereafter, within-the-decoder strapping may be used to interconnect the same signal to $W_{21}$ and $Y_{31}$. Dashed circle 2012 and the other unlabeled dashed circle on illustrated line $B'_1$ represent the through-the-AIL strapping of the $B'_1$ input signal to CBB's $X_{41}$ and $Z_{11}$.

It should be apparent now that a similar connection scheme will apply to the case of line $B'_3$ in FIG. 20A except that the through-the-AIL strapping will be by way of a horizontal AIL that ties $Y_{31}$ to the W CBB of the next higher variable grain block; and that the within-the-decoder strapping of 3 dots will occur in that next higher VGB. It should be further apparent now that similar connection schemes will apply to the cases of lines $B'_{-3}$ and $B'_{-1}$ in FIG. 20A.

The case of line $B'_2$ in FIG. 20A (and $B'_{-2}$) presents a more difficult situation because 2 of the 4 dot connections shown on this line go to the horizontal side of one VGB (e.g., the dots shown connecting to $W_{21}$ and $Y_{31}$) and the other 2 dot connections shown on this line go to the vertical side of a second VGB (e.g., the dots shown connecting to $X_{41}$ and $Z_{51}$, the latter not shown). Within-the-decoder strapping may be used to interconnect each subset of 2 dots together. However, general routing resources may need to be consumed to bring the $B'_2$ signal to both subsets. One possibility is the use of a direct connect line for one subset and a 2×L line for the other subset.

Figure 20B:
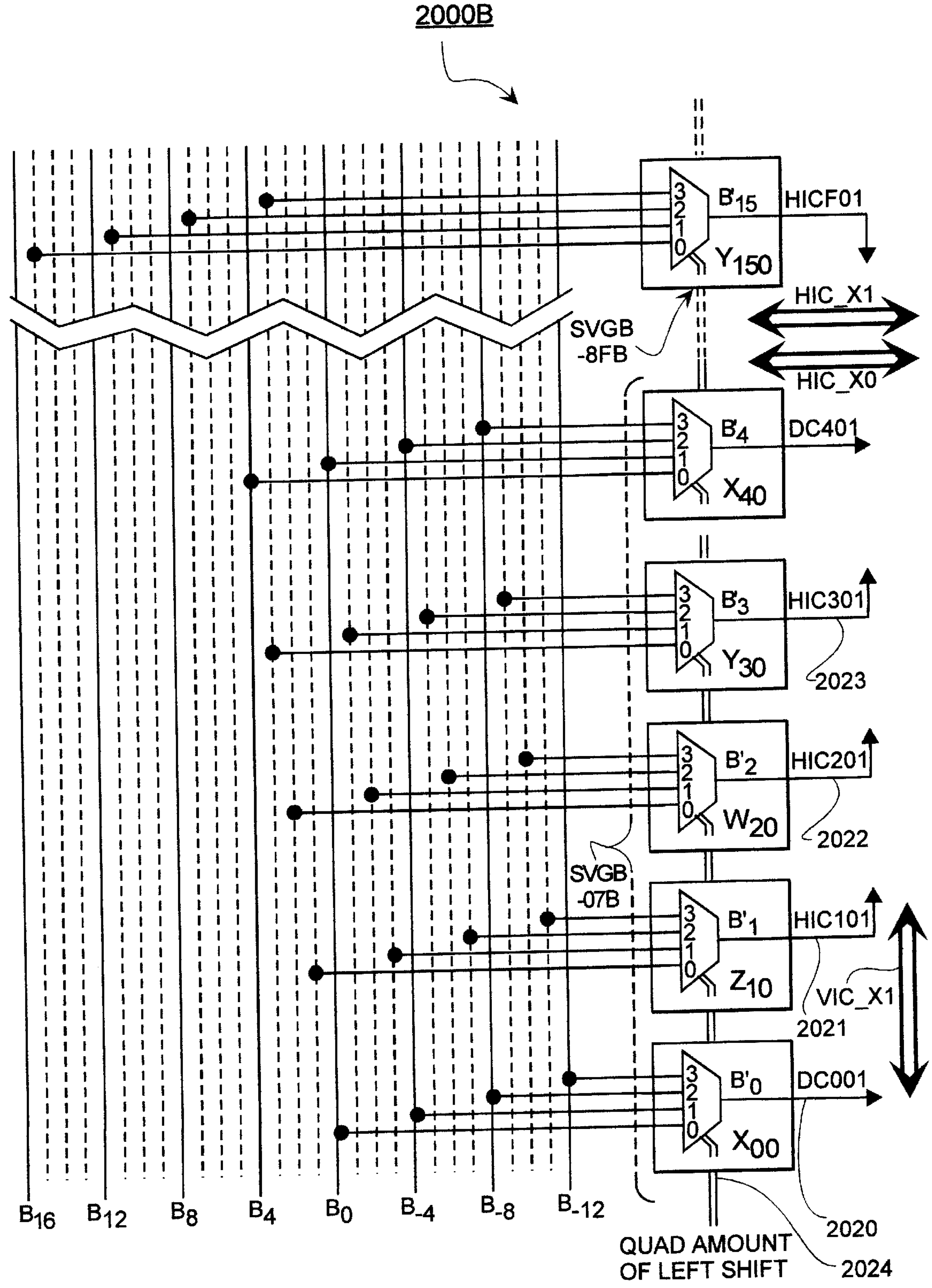
FIG. 20B demonstrates a packing scheme for a second barrel shifter that may be cascaded to that of FIG. 20A.

Referring now to FIG. 20B, a further barrel shifting circuit 2000B is shown that may serve as an input to the barrel shifter of FIG. 20A. Barrel shifting circuit 2000B shifts by a quantum of 4 bit places rather than by a quantum of 1 bit place. CBB's $X_{00}$, $Z_{10}$, $W_{20}$, and $Y_{30}$ are respectively positioned within a VGB at the right bottom quadrant of a super-VGB (SVGB07B) that is to the left of SVGB07 of FIG. 20A.

Connection from CBB $X_{00}$ (FIG. 20B) to $X_{01}$ (FIG. 20A) may be made over the even and odd VIC's that separate them (not shown) by the direct connect line shown at 2020 and labeled DC001. This same $B'_0$ sourcing line may continue as line 2010 in FIG. 20A. A same connection scheme may be used for every fourth bit as indicated by DC401. Of course other routings and placements are possible. Direct connection to FIG. 20A is not feasible in general from others of the shifted outputs (e.g., $B'_1$–$B'_3$) of FIG. 20B because the column of 4:1 multiplexer-implementing CBB's in FIG. 20B is adjacent to an odd-numbered VIC on its right (VIC_X1), while the column of 4:1 multiplexer-implementing CBB's in FIG. 20A is adjacent to an even-numbered VIC on its left. See FIG. 8. As such, some means should be used for coupling over the odd-numbered VIC_X1. The adjacent horizontal interconnect channels, HIC_X1 (odd) and HIC_X0 (even) may be used for this purpose. Symbol 2021 represents use of the L-oriented connection from $Z_{10}$ to a 2×L line in the nonadjacent HIC_X1. (See element 1436 of FIG. 14.) Symbols 2022 and 2023 represent use of a connection from $W_{20}$ and $Y_{30}$ respectively to a 2×L line in the adjacent HIC_X1. (See element 1432 of FIG. 14.) Symbol 2011 (FIG. 20A) represents a through-a-switch box connection from a horizontal line HIC101 to a vertical line (the one passing through 2012).

In FIG. 20B, CBB's $X_{00}$, $Z_{10}$, $W_{20}$, and $Y_{30}$ are respectively configured to implement part of the By_4-place left barrel shifting circuit 2000B as follows. Lines 2024 represent the shift control of the barrel shifting circuit and carry a 2-bit control signal that defines the amount of shift as either: 0, 4, 8 or 12 bit positions to the left. The inputs of all the barrel-shifting, 4:1 multiplexers of FIG. 20B are labeled accordingly by the times-4 amounts: 0, 1, 2 and 3. The selection control terminals of these 4:1 multiplexers may be coupled one to the next by way of within-the-decoder strapping and/or by way of through-the-AIL strapping. Each of the barrel-shifting, 4:1 multiplexers of FIG. 20B may be implemented in accordance with FIG. 11B.

Bits that are to be left-shifted by 0, 4, 8 or 12 places are presented in order of significance as input signals: $B_{-12}$, $B_{-11}$, . . . , $B_{-1}$, $B_0$, $B_1$, $B_2$, . . . $B_{15}$, where $B_{-12}$ is the least significant. Solid lines are drawn for those signals whose significance is a multiple of 4 while dashed lines are drawn for those in between. Signal $B_0$ is output from 4:1 multiplexer $X_{00}$ as output bit $B'_0$ when the shift amount commanded on lines 2024 is zero. Signal $B'_{-12}$ is output from 4:1 multiplexer $X_{00}$ as output bit $B'_0$ when the shift amount commanded on lines 2024 is three times 4. Input bits $B_{-12}$, $B_{-11}$, . . . , $B_{-1}$ may be belong to the upper three quarters of a 16-bit word that is just to the right of the word defined by $B_0$, $B_1$, . . . , $B_{15}$; or if there is none, they may be each set to zero.

The operation of circuit 2000B should be apparent from the above discussion of FIG. 20A. One difference is that within-the-decoder strapping may not be usable for coupling the inputs of the 4:1 multiplexers of FIG. 20B as it was in FIG. 20A. Through-the-AIL strapping may still be used however.

The By4-places barrel shifting circuit of FIG. 20B may be cascaded to the By1-places barrel shifting circuit of FIG. 20A to implement a combined barrel shifting circuit that shifts by any amount in the range of 0 to 15 places. Larger barrel shifters can be implemented by continuing along the scheme set forth by FIGS. 20A and 20B.

Figure 20C:
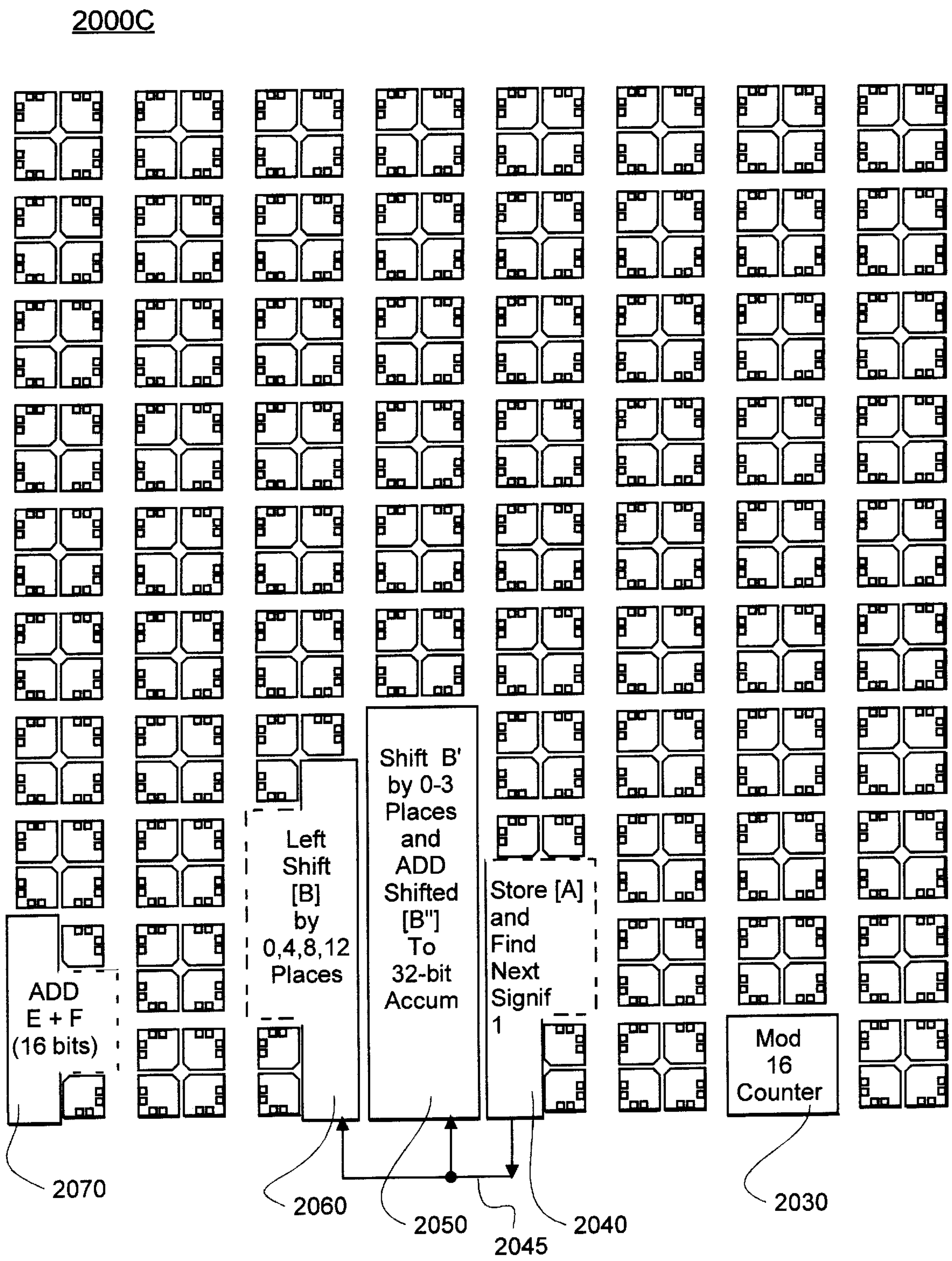
FIG. 20C demonstrates a packing scheme for a multiplier that combines the features of FIGS. 20A and 20B.

FIG. 20C illustrates a possible implementation of a 32 bit multiplier circuit in an FPGA 2000C having a matrix of 10×10 super-VGB's (partially shown). In this example, two 16-bit signals, A and B, are multiplied to form a 32-bit result.

Block 2040 consumes four vertically-aligned and adjacent VGB's of a first column of VGB's. The text showing the function of block 2040 spills over higher and wider, into next adjacent VGB's in the illustration due to space limitations. This is not intended to mean that block 2040 consumes those additional VGB's as well. As indicated by its text, block 2040 performs the functions of storing the 16-bit signal A and of also scanning A from its LSB to MSB looking for a next bit that is set to logic '1'. The bit position of that found logic '1' is sent via connections 2045 to the shift controls of barrel shifters formed in blocks 2050 and 2060. Some additional area may be used for a sequencing circuit that clocks between each shift and add, but this is not shown for sake of avoiding clutter. Note how small block 2040 is relative to the remainder of the FPGA. Block 2070 is shown for additional comparison as an adder that also consumes four vertically-aligned VGB's and adds together two 15-bit signals, E and F. A mod 16 counter is further shown at 2030 for comparison. Block 2030 may be formed using feedback lines to consumes one super-VGB (four VGB's).

Block 2050 consumes four vertically-aligned and adjacent super-VGB's to the left of block 2040. This may translate into two columns each consisting of 8 vertically-aligned and adjacent VGB's. This may further translate into two columns each consisting of 32 CBB's. Block 2050 performs the combined functions of left-shifting a 28-bit intermediate signal B' by 0, 1, 2 or 3 to produce a 32-bit result signal, B" and of adding that 32-bit result signal, B" to an accumulator in accordance with FIG. 20A.

Block 2060 consumes seven vertically-aligned and adjacent VGB's to the left of block 2050. This may be translated to mean one column consisting of 28 CBB's. Block 2060 performs the function of left-shifting a 16-bit input signal B by 0, 4, 8 or 12 bit places to produce the 28-bit intermediate signal B'. This is done in accordance with FIG. 20B.

The combination of blocks 2040, 2050 and 2060 therefore provides the basic building blocks for forming a high-speed multiplier with 32-bit output capability. The purpose here is to demonstrate the compactness, resource-utilization efficiency, and versatility of the Variable Grain Architecture. In particular, note in FIG. 20A that a respective 4:1 multiplexer is formed by each of CBB's $X_{01}$ through $Y_{151}$ and that a corresponding, directly connected to, adder stage is formed by each of CBB's $X_{02}$ through $Y_{152}$ without leaving behind unused CBB's (wasted resources) in the corresponding two columns of VGB's. Different types of circuitry (e.g., 4:1 multiplexers and adder stages) are thus implemented in a resource efficient manner through the use of same elemental components such as the 3-input LUT's of the function spawning layer (e.g., elements 1935, 1945 of FIG. 19A), the dynamic multiplexers (e.g., element 1970 of FIG. 19A) of the first function compounding layer, and the decoding layer (e.g., 1923 of FIG. 19A). Transference of nibble-wide data from one VGB to an adjacent or next-adjacent VGB is efficiently handled by the direct connect resources. Common driving of multiplexer selection control terminals is efficiently handled by the through-the-AIL strapping and/or the within-decoder strapping resources. As will become apparent after studying the details provided herein, the various resources of the Variable Grain Architecture may be used to efficiently pack together and interconnect a wide variety of different kinds of circuits, be they bus oriented or random logic.

Figure 21:
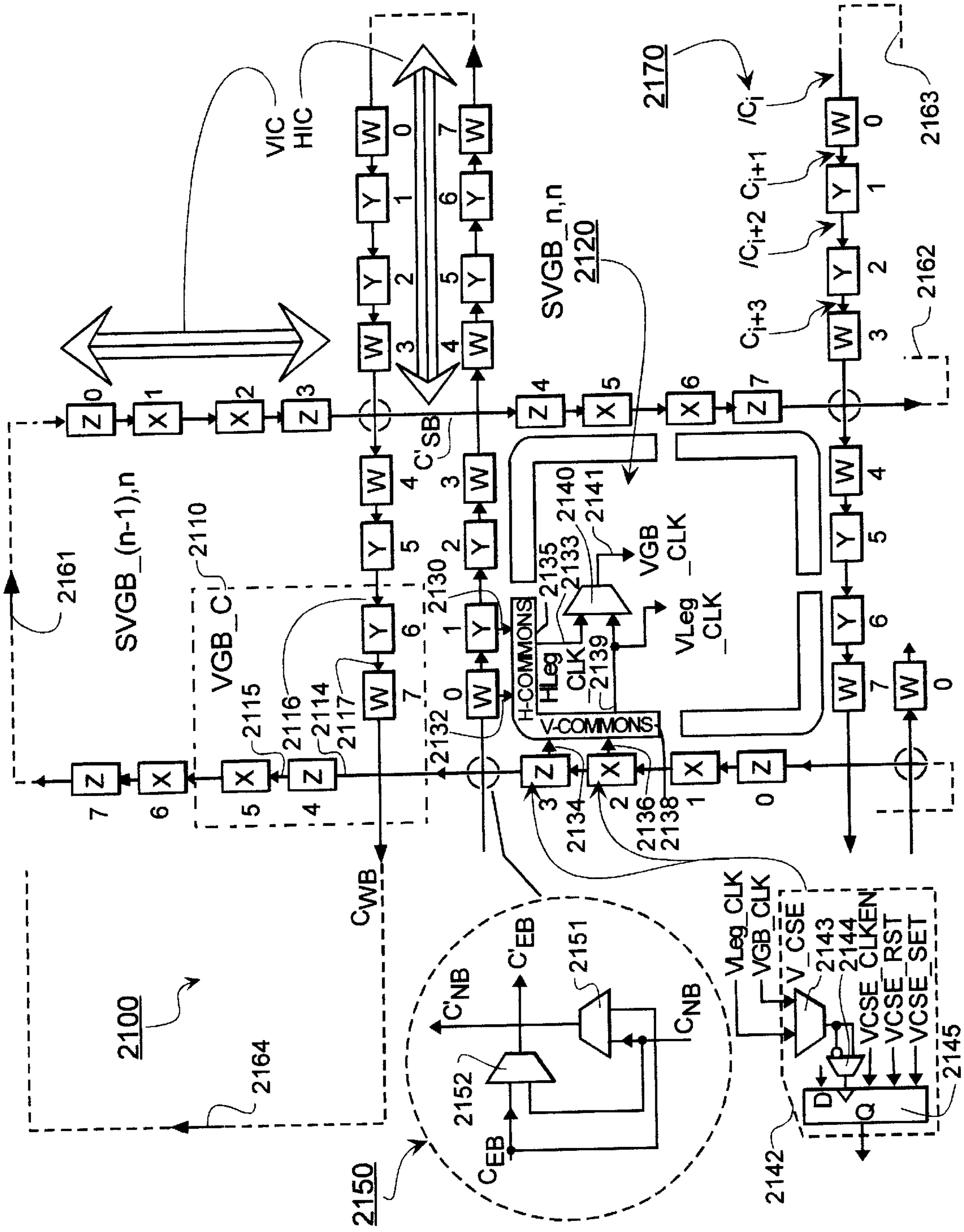
FIG. 21 illustrates an alternate scheme for carry chaining and/or common controls generation.

FIG. 21 illustrates an alternate scheme for direct connect chaining of carry bits (or of the broken/unbroken chain flags) through the vertically-directed and horizontally-directed legs of VGB's. In this alternate embodiment 2100, each VGB such 2110 can process two, consecutive and vertically propagating carry bits such as 2114 and 2115. Each VGB (e.g., 2110) can further process two, consecutive and horizontally propagating carry bits such as 2116 and 2117. These vertically propagating and horizontally propagating chains are generally independent of one another. However, in one variation of embodiment 2100, a cross-over means such as shown at 2150 may be used to programmably route vertically propagating bits onto horizontally bound chains or vice versa. In the general case where cross-over means 2150 is not used for a cross-over function, the Z and X CBB's produce the corresponding sum bits and next carry bits for a first result word that has the vertically propagating carry bits. The Y and W CBB's produce the corresponding sum bits and next carry bits for what is generally a different, second result word that has the horizontally propagating carry bits.

Note that in the illustrated, embodiment 2100 of FIG. 21, bit significance flips for the W/Y or Z/X duet of each successive VGB. For example, the W CBB of VGB_A (northwest corner) in SVGB_nn 2120 produces SB0 and the Y CBB of the same VGB_A produces the more significant SB1 for the corresponding east-bound chain. At the same time, Y CBB of VGB_B (northeast corner) in SVGB_nn 2120 produces SB2 and the W CBB of the same VGB_B produces the more significant SB3 for the same east-bound chain. The relative significance of the SB signal produced by each CBB is denoted by a corresponding digit in the range 0–7 which is placed bear the symbol for that CBB. Each W/Y or Z/X duet along each carry propagating chain is understood to use appropriate circuitry in accordance with FIGS. 19A/19B. An example of a west-bound chain having respective carry signals, $/C_i$, $C_{i+1}$, $/C_{i+2}$, and $C_{i+3}$, is shown at 2170.

Alternate embodiment 2100 is to be contrasted with the more densely packed, vertically-only propagating embodiment that is represented in FIG. 4B by successive lines: 421*a*, 421*b* and 421*c* (and also by successive lines: 422*a*, 422*b* and 422*c*). In the vertically-only propagating embodiment (421*abc*), each VGB such 430 (FIG. 4B) processes four, consecutive and vertically propagating carry bits, but generally no horizontally propagating carry bits. The density of same-directed, consecutive carry bits per VGB is therefore 4 for embodiment 421*abc* and only 2 for the alternate embodiment 2100 of FIG. 21. The number of direct connect wires needed for propagating carry bits between VGB's is twice as much in alternate embodiment 2100 as it is in embodiment 421*abc* of FIG. 4B. Thus, alternate embodiment 2100 tends to call for either a larger integrated circuit or fewer super-variable grain blocks (SVGB's) per integrated circuit as a result of it using more wires for direct connect coupling of carry bits. All other interconnect resources including the CBB-to-CBB direct connect of FIG. 16 are understood to remain the same for this comparison.

Alternate embodiment 2100 suffers from yet another drawback in terms of packing density. Because the horizontally-bound and vertically-bound carry chains of each VGB generally propagate carry bits for different result words, the corresponding CSE's of the horizontally-bound and vertically-bound carry chains should be flexibly configurable to respond to different clock signals, different clock-enable signals, different reset signals, and different set signals. As such, the common controls scheme of FIGS. 7A/7B should be modified to produce common control signals on a leg-by-leg basis rather than simply producing a common CLK, and/or CLK_EN and/or RST and/or SET signal (751–754) for the whole of the VGB.

This modification is shown in part for the production of a leg-based clock signal, VLeg_CLK for use by a Configurable Sequential Element (V_CSE) within a CBB belonging to a vertically-bound carry chain (either a Z or an X CBB). A similar approach is understood to be additionally usable for production of one or more of signals, VCSE_CLKEN, VCSE_RST and VCSE_SET.

Lines 2130 and 2132 feed into an H_Leg commons section 2135. The signal of line 2130 is a Y-acquired control signal corresponding to 710 (CTL0) of FIG. 7A or 7B. The signal of line 2132 is a W-acquired control signal corresponding to 712 (CTL2) of FIG. 7A/7B. H_Leg commons section 2135 corresponds to the northeast half of the common controls circuit 750 shown in FIG. 7A/7B with appropriate duplication of indivisible entities such as transistor 737. Multiplexer 730 of FIG. 7A is understood to be divided into a northeast half that goes into H_Leg commons section 2135 and receives only signals 2130, 2132 and CLK2, CLK3 as selectable inputs. The other so-formed half of multiplexer 730 goes into V_Leg commons section 2138. The H_Leg commons section 2135 is configurable to produce a corresponding H_Leg common clock signal (HLeg_CLK) on line 2133.

As should be understood now, the signal of line 2136 is a X-acquired control signal corresponding to 716 (CTL6) of FIG. 7A/7B. The signal of line 2134 is a Z-acquired control signal corresponding to 714 (CTL4) of FIG. 7A/7B. Although not shown, CLK0 and CLK1 also feed into V_Leg commons section 2138. The V_Leg commons section 2138 is configurable to produce a corresponding V_Leg common clock signal (VLeg_CLK) on line 2139.

Multiplexer 2140 receives the leg-common signals, HLeg_CLK (2133) and VLeg_CLK (2139) as inputs and produces a configuration-selected one of them as the VGB_CLK signal on line 2141. Unless otherwise indicated, each multiplexer shown in FIG. 21 has selection control terminals coupled to the configuration memory of the FPGA and is thereby statically controlled by user-provided configuration instructions. Multiplexer 2140 is understood to constitute part of a VGB common means that folds together the resources of H_Leg commons section 2135 and V_Leg commons section 2138 to produce a VGB common control signal (2141). Similar folding together is contemplated for producing other VGB common control signals, namely, VGB_CLKEN, VGB_RST and VGB_SET as desired.

Dashed block 2142 represents a Configurable Sequential Element that is provided within each of the X and Z CBB's, where the latter entities are serviced by V_Leg commons section 2138. Multiplexer 2143 is provided within V_CSE 2142 for selecting one of signals, VLeg_CLK (2139) and VGB_CLK (2141) as the clock signal fed to the CSE's register 2145. Multiplexer 2144 is provided within the V_CSE 2142 for selecting a positive or complemented version of the output of multiplexer 2143.

Other controls of the CSE's register 2145 may be similarly derived. Possible specifics for these other derivations should now be apparent to those skilled in the art and the specifics are therefore not shown in order to avoid illustrative clutter. The other controls of the CSE's register 2145 are simply denoted as: VCSE_CLKEN, VCSE_RST and VCSE_SET. The similar structure for the H_CSE that would be provided within each of the W and Y CBB's, where the latter entities are serviced by H_Leg commons section 2135 should now also be apparent to those skilled in the art and the specifics are therefore not shown in order to avoid illustrative clutter.

Provision of the leg-servicing common controls sections 2135 and 2138 within each VGB further pushes the alternate embodiment 2100 towards having either a larger integrated circuit or fewer super-variable grain blocks (SVGB's) per integrated circuit as compared to the more densely packed, vertically-only propagating embodiment 421*abc* of FIG. 4B.

On the other hand, in exchange for its poorer packing density, the alternate embodiment 2100 provides a more flexible, symmetrically distributed arrangement of carry-propagating (and/or broken-chain flag propagating) circuits. In alternate embodiment 2100, adder/subtractor circuit may be implemented with greater freedom of placement so that sum results form parallel to a desired HIC or VIC and so that bit significance flows in a desired direction (east or west bound, north or south bound). Also, because all stages of a given, vertically-directed or horizontally-directed chain are adjacent to like-directed AIL's, the through-the-AIL strapping function may be carried out more easily than in the vertically-only propagating embodiment 421*abc* of FIG. 4B, where the latter has alternating pairs of stages respectively adjacent to vertical interconnect (the X and Z stages) and to horizontal interconnect (the Y and W stages).

The zig-zagging carry-propagating pattern of FIG. 21 generally flows left to right for the vertically directed chains and bottom to top for the horizontally directed chains. Thus, dashed connection 2161 represents a left to right coupling at the periphery of the matrix from a north bound chain to the next south bound chain. Dashed connection 2162 represents a left to right coupling at the periphery of the matrix from a south bound chain to the next north bound chain. Dashed connection 2163 represents a bottom to top coupling at the periphery of the matrix from an east bound chain to the next west bound chain (2170). Dashed connection 2164 represents a bottom to top coupling at the periphery of the matrix from a west bound chain $C_{WB}$ to the next east bound chain. Horizontal to vertical linkages of either the configurable kind or fixed kind may be provided at the extreme southeast and northwest corners of the matrix so that the zig-zagging chains mesh into one another. A giant adder could then be formed that uses both vertically-directed and horizontally-directed chains to form its sum signal.

Cross-over means 2150 is an example of a horizontal to vertical linkage of the configurable kind. The inclusion of cross-over means 2150 at the southeast and northwest corners of each super-VGB, or in accordance with another, regular and tileable pattern, is optional. On the one hand it disadvantageously adds delay to the carry-propagating chains. On the other hand, it provides for greater freedom in the partitioning, placement and routing phases of FPGA configuration. In the optional cross-over means shown at 2150, multiplexer 2151 is configurable to either route an incoming, north bound carry bit $C_{NB}$ to become outgoing, north bound carry bit $C'_{NB}$ or to route an incoming, east bound carry bit $C_{EB}$ to become the outgoing, north bound carry bit $C'_{NB}$. The other multiplexer 2152 of cross-over means 2150 is configurable to either route an incoming, east bound carry bit $C_{EB}$ to become outgoing, east bound carry bit $C'_{EB}$ or to route the incoming, north bound carry bit $C_{NB}$ to become the outgoing, east bound carry bit $C'_{EB}$. At south east corners of super-VGB's the corresponding cross-over means (represented by circle with crossing lines passing through as cross hair) will of course route south bound carry signals $C_{SB}$ and west bound carry signals $C_{WB}$ in corresponding fashion.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A field programmable gate array (FPGA) device comprising:

(a) interconnect lines;

(b) a plurality of configurable building elements (CBE's) each disposed adjacent to a respective subset of the interconnect lines, with each given CBE comprising:

(b.1) configurable signal acquiring resources for selectively acquiring signals from a respective CBE-associated subset of adjacent ones of said interconnect lines, the signal acquiring resources supplying their respectively-acquired signals to the given CBE in a first mode; and (b.2) a configurable lookup table (LUT);

(b.3) wherein at least two of said CBE's respectively have different CBE-associated subsets of adjacent interconnect lines from which the respective CBE's can selectively acquire signals in said first mode; and (c) combining means for selectively folding together the signal acquiring resources of a respective two or more CBE's in a second mode so as to provide at least one of said two or more CBE's with comparatively larger signal acquiring capabilities than such at least one CBE has in the first mode from its respective signal acquiring resources and its respective CBE-associated subset of adjacent interconnect lines.

2. The FPGA device of claim 1 wherein:

(c.1) said combining means is further for selectively folding together the LUT's of a respective two or more CBE's so as to define a combined unit having a comparatively larger lookup address space than do either of the folded-together LUT's taken individually.

3. The FPGA device of claim 2 wherein:

(a.1) said interconnect lines include lines of first, second and third type; said first, second and third type lines being of respective continuous lengths that are comparatively smaller, intermediate, and longer than the lengths of the other two types; and (b. 1a) the signal acquiring resources of each of the at least two said CBE's respectively has first, second and third signal acquiring sub-resources for selectively acquiring signals from a respective CBE-associated subset of adjacent ones of said first, second and third type lines.

4. The FPGA device of claim 3 wherein:

(a.1) said interconnect lines include at least four lines of said second, intermediate length type;

(b.1a1) the signal acquiring resources of a first of the at least two CBE's can selectively acquire LUT input signals from a first subset of said at least four intermediate length lines; and (b.1 a2) the signal acquiring resources of a second of the at least two CBE's can selectively acquire LUT input signals from a second subset of said at least four intermediate length lines, the second subset being different from the first subset.

5. The FPGA device of claim 3 wherein:

(b.1a3) the signal acquiring resources of the first of the at least two CBE's can selectively acquire control input signals from a third subset of said at least four intermediate length lines; and (b.1a4) the signal acquiring resources of the second of the at least two CBE's can selectively acquire control input signals from a fourth subset of said at least four intermediate length lines, the fourth subset being different from the third subset.

6. The FPGA device of claim 1 wherein:

(a.1) said interconnect lines include lines of first, second and third type; said first, second and third type lines being of respective continuous lengths that are comparatively smaller, intermediate, and longer than the lengths of the other two types; and (b.1a) the signal acquiring resources of each of the at least two said CBE's respectively has first, second and third signal acquiring sub-resources for selectively acquiring signals from a respective CBE-associated subset of adjacent ones of said first, second and third type lines.

7. The FPGA device of claim 1 wherein:

(b.4) two or more CBE's are disposed adjacent to one another and adjacent to a same channel of interconnect lines for acquiring their respective signals from said same channel of interconnect lines.

8. The FPGA device of claim 7 wherein:

(b.4a) at least eight CBE's are disposed adjacent to one another and adjacent to said same channel of interconnect lines for acquiring their respective signals from said same channel of interconnect lines.

9. The FPGA device of claim 8 wherein:

(c.1) said combining means is further for selectively folding together the LUT's at least eight of said CBE's so as to define a combined unit having a comparatively larger lookup address space than do any of the folded-together LUT's taken individually.

10. The FPGA device of claim 1 and further comprising:

(d) a plurality of Configurable Sequential Elements (CSE's) each disposed adjacent to a respective subset of the interconnect lines, with each given CSE comprising:

(d.1) configurable signal feedout resources for selectively feeding out one or more output signals to a respective CSE-associated subset of adjacent ones of said interconnect lines; and (d.2) one or more registers each for storing a respective output signal;

wherein:

(b.4) at least two CBE's are disposed adjacent to and coupled to a respective CSE for sequencing respective result signals of the CBE's through the CSE for output onto the respective CSE-associated subset of adjacent ones of said interconnect lines.

11. The FPGA device of claim 10 wherein:

(a.1) said interconnect lines include lines of first, second and third type; said first, second and third type lines being of respective continuous lengths that are comparatively smaller, intermediate, and longer than the lengths of the other two types; and (d.1a) the signal feedout resources of each of the CSE's respectively has first, second and third signal feedout sub-resources for distributively and selectively feeding out output signals to the respective CSE-associated subset of adjacent ones of said first, second and third type lines.

12. A method for configuring a field programmable gate array (FPGA) device having:

(0.1) interconnect lines;

(0.2) a plurality of configurable building elements (CBE's) each disposed adjacent to a respective subset of the interconnect lines, with each CBE comprising:

(0.2.1) configurable signal acquiring resources for selectively acquiring signals from a respective CBE-associated subset of adjacent ones of said interconnect lines; and (0.2.2) a configurable lookup table (LUT);

(0.2.3) wherein at least two of said CBE's respectively have different CBE-associated subsets of adjacent interconnect lines from which the respective CBE's can selectively acquire signals; and (0.3) combining means for selectively folding together at least one of the signal acquiring resources and the LUT's of a respective two or more CBE's; said method comprising the step of:

(a) activating the combining means for at least two of said CBE's so as to thereby define a combined unit having a corresponding at least one of larger signal acquiring capabilities and larger lookup capabilities.

13. The FPGA configuring method of claim 12 wherein said activating step defines a combined unit having both of larger signal acquiring capabilities and larger lookup capabilities.

* * * * *

UNITED STATES PATENT AND TRADEMARK OFFICE

CERTIFICATE OF CORRECTION

PATENT NO. : 6,150,842
DATED : November 21, 2000
INVENTOR(S) : Om P. Agrawal et al.

It is certified that error appears in the above-identified patent and that said Letters Patent is hereby corrected as shown below:

Column 28,
Line 29, "A+B" should be -- A±B --.

Column 53,
Lines 20 and 57, "1C" should be -- 11C --.

Column 60,
Line 62, "143G" should be -- 1436 --.

Column 64,
Line 60, "J1" should be -- J' --.

Column 69,
Line 49, "connect ions" should be -- connections --.

Column 74,
Line 61, "101" should be -- '0' --.

Signed and Sealed this

First Day of January, 2002

*Attest:*

JAMES E. ROGAN
*Director of the United States Patent and Trademark Office*

*Attesting Officer*